US006379997B1

(12) United States Patent
Kawahara et al.

(10) Patent No.: US 6,379,997 B1

(45) Date of Patent: Apr. 30, 2002

(54) SEMICONDUCTOR DEVICE AND METHOD OF PRODUCING THE SAME AND SEMICONDUCTOR DEVICE UNIT AND METHOD OF PRODUCING THE SAME

(75) Inventors: Toshimi Kawahara; Sinya Nakaseko; Mitsunada Osawa; Mayumi Osumi; Hiroyuki Ishiquro; Yoshitugu Katoh; Junichi Kasai, all of Kawasaki; Shinichirou Taniguchi, Satsuma-gun; Yuji Sakurai, Murata-machi, all of (JP)

(73) Assignees: Fujitsu Limited, Kawasaki; Kyushu Fujitsu Electronics Limited, Kagoshima, both of (JP)

(*) Notice: Subject to any disclaimer, the term of this patent is extended or adjusted under 35 U.S.C. 154(b) by 0 days.

(21) Appl. No.: 09/593,658

(22) Filed: Jun. 13, 2000

Related U.S. Application Data

(60) Division of application No. 08/944,511, filed on Oct. 6, 1997, now Pat. No. 6,111,306, which is a continuation of application No. 08/483,053, filed on Jun. 7, 1995, now abandoned, which is a continuation-in-part of application No. 08/330,848, filed on Oct. 24, 1994, now Pat. No. 5,679,978.

(30) Foreign Application Priority Data

Dec. 6, 1993 (JP) ............................................. 5-305642
Dec. 5, 1994 (JP) ............................................. 6-301175

(51) Int. Cl.[7] ................................................ H01L 21/44

(52) U.S. Cl. ....................... 438/106; 257/668; 257/690; 257/696; 257/737; 257/796; 361/715; 361/745; 361/773; 29/810; 29/840

(58) Field of Search .......................... 438/106; 257/668, 257/690, 696, 796, 737; 361/773, 749, 715; 29/840, 810

(56) References Cited

U.S. PATENT DOCUMENTS

| | | | | | |
|---|---|---|---|---|---|
| 4,653,174 | A | | 3/1987 | Gilder, Jr. et al. | 29/574 |
| 5,347,159 | A | | 9/1994 | Khandros et al. | 257/696 |
| 5,355,580 | A | | 10/1994 | Tsukada | 29/840 |
| 5,382,829 | A | | 1/1995 | Inoue | 257/668 |
| 5,394,303 | A | * | 2/1995 | Yamaji | 361/749 |
| 5,440,452 | A | * | 8/1995 | Kitahara | 361/773 |
| 5,654,243 | A | * | 8/1997 | Yoneda et al. | 29/840 |
| 5,679,978 | A | | 10/1997 | Kawahara et al. | 257/796 |
| 5,907,187 | A | | 5/1999 | Koiwa et al. | 257/737 |
| 6,111,306 | A | * | 8/2000 | Kawahara et al. | 257/666 |

FOREIGN PATENT DOCUMENTS

| | | |
|---|---|---|
| EP | 0 517 247 A | 12/1992 |
| EP | 0 564 865 A1 | 10/1993 |
| FR | 2 103 917 | 4/1972 |
| GB | 2 218 570 A | 11/1989 |
| JP | 53 049950 A | 5/1978 |

(List continued on next page.)

*Primary Examiner*—Michael Lebentritt
*Assistant Examiner*—Pho M. Luu
(74) *Attorney, Agent, or Firm*—Arent Fox Kintner Plotkin, Kahn, PLLC

(57) ABSTRACT

A semiconductor device includes a semiconductor element, a holding substrate holding the semiconductor element, a frame body provided on the holding substrate so as to surround the semiconductor element and having a hole which communicates to a space formed between the holding substrate and the frame body and the frame body and the holding substrate form a housing, a plurality of leads having inner lead portions connected to the semiconductor element and outer lead portions extending outside the frame body, and a resin filling the space and encapsulating the semiconductor element and the inner lead portions. All of the outer lead portions extend outside the housing from one side of the housing.

11 Claims, 101 Drawing Sheets

FOREIGN PATENT DOCUMENTS

| | | | |
|---|---|---|---|
| JP | 54 126468 | 10/1979 | |
| JP | 64-41254 | 2/1989 | |
| JP | 3-252148 | 11/1991 | |
| JP | 4-245449 | 9/1992 | |
| JP | 4-306865 | 10/1992 | |
| JP | 5-21537 | 1/1993 | |
| JP | 5-21538 | 1/1993 | |
| JP | 5-29500 | 2/1993 | |
| JP | 5-121473 | 5/1993 | |
| JP | 0104309 | 4/1994 | ................. 257/668 |

* cited by examiner 113a
113a
101

137b
108
144
119
113a
106
113a
106
108
117
119
140
144
106
101

144
108
119
113
106
106
113a
108
119
144
114
114
103
116
101
114
114
103

113b
108
144
113a
119
106
104a
110a
106
113a
119
108
144
113b
113b
114
114
103
110b
114
101
114
103

FIG. 131A
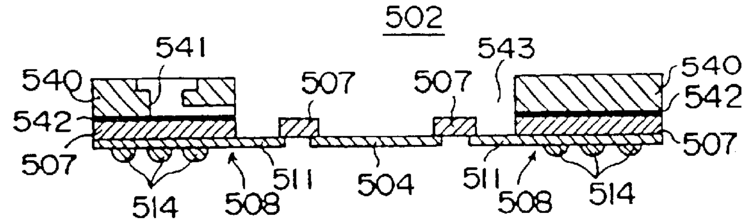
FIG. 131B
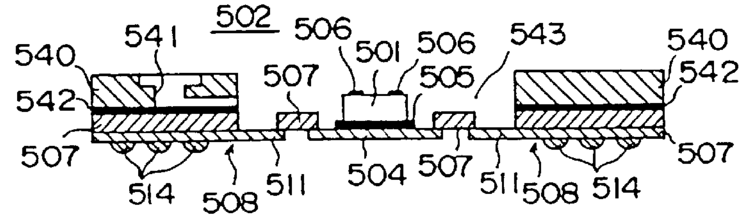
FIG. 131C
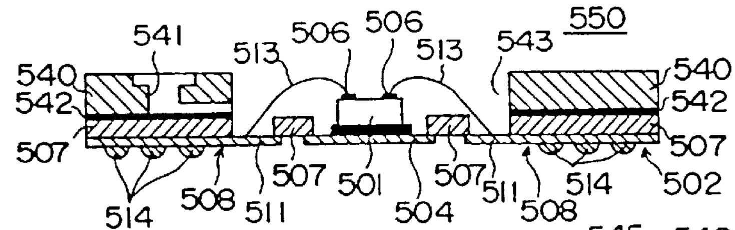
FIG. 131D
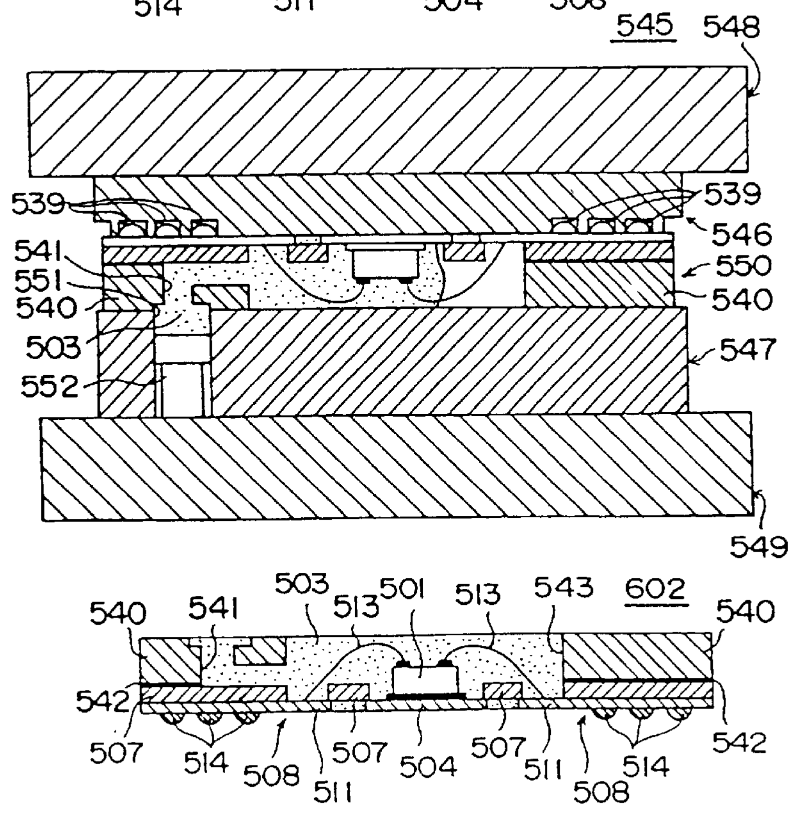
FIG. 131E

SEMICONDUCTOR DEVICE AND METHOD OF PRODUCING THE SAME AND SEMICONDUCTOR DEVICE UNIT AND METHOD OF PRODUCING THE SAME

This application is a divisional application filed under 37 CFR § 1.53(b) of parent application Ser. No. 08/944,511, filed Oct. 6, 1997 now U.S. Pat. No. 6,111,306, which in turn is a continuation of application Ser. No. 08/483,053, filed Jun. 7, 1995 now abandoned, which in turn is a continuation-in-part of application Ser. No. 08/330,848, filed Oct. 24, 1994, now U.S. Pat. No. 5,679,978.

BACKGROUND OF THE INVENTION

The present invention generally relates to semiconductor devices and methods of producing the same, and to semiconductor device units and methods of producing the same. More particularly, the present invention relates to a semiconductor device which encapsulates a semiconductor element by a resin and to a method of producing such a semiconductor device, and to a semiconductor device unit and a method of producing the semiconductor device unit.

Recently, there are demands to further reduce the size of electronic equipments such as personal computers, and as a result, there are increased demands to realize smaller semiconductor devices which are used in such electronic equipments.

In semiconductor devices, a substrate which holds a semiconductor element or the volume of an encapsulating resin is large compared to the size of the semiconductor element. For this reason, in order to reduce the size of the semiconductor device, it is necessary to appropriately reduce the size of the substrate or the encapsulating resin.

On the other hand, when the size of the semiconductor device is reduced, the heat radiation characteristic of the semiconductor device deteriorates. As a result, it is necessary to provide an efficient heat radiation means.

Therefore, there are demands to realize a semiconductor device which has a reduced size but can be formed with ease and has a satisfactory heat radiation characteristic.

A description will be given of an example of a conventional semiconductor device and a method of producing the same, by referring to FIGS. 1A through 1C. FIGS. 1A through 1C respectively show cross sections of the conventional semiconductor device at various stages of the production process.

As shown in FIG. 1C, a conventional semiconductor device 60 includes a semiconductor element 1, a mold resin 3, a lead frame 46 and the like. The semiconductor element 1 is die-bonded on a die-pad portion 39 which is formed on the lead frame 46. In addition, wires 10 are provided between electrode pad portions 40 on the top surface of the semiconductor element 1 and inner lead portions of the lead frame 46. The electrode pad portions 40 are shown in FIG. 1A. The mold resin 3 encapsulates the semiconductor element 1, the wires 10 and the inner lead portions of the lead frame 46, so as to protect the semiconductor element 1 and the wires 10.

The mold resin 3 is formed as shown in FIG. 1B. In FIG. 1B, an upper mold 20*a* and a lower mold 20*b* form a transfer mold. When the lead frame 46 mounted with the semiconductor element 1 and having the wires 10 bonded thereto as shown in FIG. 1A is loaded between the upper and lower molds 20*a* and 20*b*.

A plunger 22 arranged on the upper mold 20*a* heats and presses a resin tablet (mold resin 3) which is indicated by a dot-pattern, so that the melted resin tablet flows into a cavity part formed between the upper and lower molds 20*a* and 20*b* via a cull part 43, a runner part 44 and a gate part 45. The cavity formed between the upper and lower molds 20*a* and 20*b* has a shape corresponding to the outer shape of the semiconductor device 60. Hence, by filling the rein into this cavity part, the mold resin 3 is formed into a package having a predetermined shape.

According to the conventional resin filling method, the mold resin 3 remains at the cull part 43, the runner part 44 and the gate part 45, integrally to the package part of the semiconductor device 60. Accordingly, when the semiconductor device 60 is removed from the upper and lower molds 20*a* and 20*b* , the remaining resin is broken at the gate part 45 and the broken off resin is thrown away.

On the other hand, as is well known, the semiconductor element 1 generates heat when driven. In the case of the semiconductor device 60 which is produced in the above described manner, the heat generated from the semiconductor element 1 thermally conducts via the mold resin 3, and the heat radiation takes place particularly at the back surface of the package where the thickness of the mold resin 3 is thin. The back surface of the package is the bottom surface of the mold resin 3 in FIG. 1C.

As described above, the main function of the mold resin 3 is to protect the semiconductor element 1 and the wires 10. However, the mold resin 3 must also have a satisfactory adhesive strength. In other words, if the adhesive strength of the mold resin 3 with respect to the semiconductor element 1 and the wires 10 provided within the mold resin 3 is weak, the semiconductor element 1 and the wires 10 may move within the package. If the semiconductor element 1 and the wires 10 move within the package, it becomes impossible to positively protect the semiconductor element 1 and the wires 10, and the reliability of the semiconductor device 60 will deteriorate.

But when carrying out the transfer molding, it is essential to separate the upper and lower molds 20*a* and 20*b* from the molded package, and the upper and lower molds 20*a* and 20*b* can be separated more satisfactorily if the above adhesive strength is not too strong. For this reason, a mold release agent which facilitates the separation of the upper and lower molds 20*a* and 20*b* is conventionally added to the mold resin 3. The kind and quantity of this mold release agent that is to be added are selected to optimize the balance between the reliability of the semiconductor device 60 and the mold release (or parting) characteristic of the upper and lower molds 20*a* and 20*b* with respect to the molded package. More particularly, out of the cull part 43, the runner part 44 and the gate part 45, the mold release characteristic is poorest at the gate part 45 where the flow passage of the mold resin 3 is the narrowest. Hence, the kind and quantity of the mold release agent to be added are generally selected with reference to the mold release characteristic at the gate part 45.

However, as the size of the semiconductor device 60 is further reduced and the package becomes smaller, the cull part 43, the runner part 44 and the gate part 45 all become smaller, thereby deteriorating the mold release characteristic. For this reason, it is necessary to increase the amount of the mold release agent that facilitates the mold release as the package becomes smaller, but there was a problem in that the reliability of the semiconductor device 60 deteriorates if the amount of the mold release agent is increased for the reasons described above.

On the other hand, as for the heat radiation characteristic, the conventional semiconductor device 60 is designed to radiate heat via the back surface of the package. For this reason, there was a problem in that the heat generated from the semiconductor element 1 could not be released efficiently. In addition, there have been proposals to provide a plurality of radiator fins independently on the package, but the provision of the radiator fins increases the overall size of the semiconductor device 60, and there was a problem in that the provision of the independent radiator fins cannot realize the size reduction of the semiconductor device 60.

SUMMARY OF THE INVENTION

Accordingly, it is a general object of the present invention to provide a novel and useful semiconductor device and a method of producing the same, wherein the problems described above are eliminated.

Another and more specific object of the present invention is to provide a semiconductor device which can be made small while at the same time improving the mold release characteristic and the reliability of the semiconductor device, and to a method of producing such a semiconductor device.

It is also an object of the present invention is to provide a semiconductor device unit which can be made small while at the same time improving the mold release characteristic and the reliability of the semiconductor device unit, and to a method of producing such a semiconductor device unit.

Still another object of the present invention is to provide a semiconductor device which can be made small while at the same time realizing a satisfactory heat radiation characteristic, and to a method of producing such a semiconductor device.

A further object of the present invention is to provide a semiconductor device comprising a substrate having top and bottom surfaces, a semiconductor element mounted on the top surface of the substrate, and a resin package made of a resin and encapsulating the semiconductor element, where the substrate includes at least one resin gate hole enabling the resin to be introduced from the bottom surface of the substrate via the resin gate hole when encapsulating the semiconductor element by the resin. According to the semiconductor device of the present invention, it is possible to directly introduce the resin onto the substrate via the resin gate hole in the substrate when encapsuating the semiconductor element by the resin. Hence, it becomes unnecessary to provide a cull part, a runner part, a gate part and the like in the molds that is used for the resin mold. In addition, it is possible to reduce the contact area between the resin and the molds, and the kind and amount of mold release agent to be added to the resin may be selected without taking into account the mold release characteristic. As a result, it becomes possible to use a resin having a large adhesive strength, and the reliability of the semiconductor device can be improve even when the size of the semiconductor device is reduced.

Another object of the present invention is to provide a semiconductor device comprising a circuit, a semiconductor element having a top surface and mounted on the circuit, a frame body provided on the circuit and surrounding the semiconductor element in a state where a gap is formed between the semiconductor element and the frame body, and a resin package made of a resin filled on an inner side of the frame body and encapsulating the semiconductor element, where the frame body includes a resin gate hole which opens at a surface other than a surface confronting the top surface of the semiconductor element and enables the resin to be introduced on the inner side of the frame body via the resin gate hole when encapsulating the semiconductor element by the resin. According to the semiconductor device of the present invention, it is possible to reduce the contact area of the rein and the molds, because the semiconductor element is encapsulated by the resin by introducing the resin on the inner side of the frame body via the resin gate hole that opens at the surface of the circuit other than the surface confronting the top surface of the semiconductor element. Hence, the kind and amount of mold release agent to be added to the resin may be selected without taking into account the mold release characteristic. Therefore, it is possible to use a resin having a high adhesive strength, and the reliability of the semiconductor device can be improved even when the size of the semiconductor device is reduced.

Still another object of the present invention is to provide a method of producing a semiconductor device comprising the steps of (a) forming a resin gate hole penetrating a substrate and arranging wiring layers on a predetermined surface of the substrate, (b) mounting a semiconductor element on the predetermined surface of the substrate and electrically connecting the semiconductor element and the wiring layers, (c) loading the substrate mounted with the semiconductor element into molds so that an end of the resin gate hole opposite to the predetermined surface of the substrate faces a plunger pot of the molds, and filling a resin supplied from the plunger pot to a side of the substrate mounted with the semiconductor element via the resin gate hole, and (d) forming external connecting terminals on the circuit, the external connecting terminals being used to electrically connect the semiconductor device to an outside element. According to the method of the present invention, it is possible to directly introduce the resin onto the substrate via the resin gate hole in the substrate when encapsuating the semiconductor element by the resin. Hence, it becomes unnecessary to provide a cull part, a runner part, a gate part and the like in the molds that is used for the resin mold. In addition, it is possible to reduce the contact area between the resin and the molds, and the kind and amount of mold release agent to be added to the resin may be selected without taking into account the mold release characteristic. As a result, it becomes possible to use a resin having a large adhesive strength, and the reliability of the semiconductor device can be improve even when the size of the semiconductor device is reduced.

A further object of the present invention is to provide a method of producing a semiconductor device comprising the steps of (a) forming a substrate which makes contact with side surfaces of a semiconductor element and surrounds the semiconductor element to hold the semiconductor element, (b) providing a circuit electrically connected to the semiconductor element and having external connecting terminals for electrically connecting the semiconductor element to an outside element, and (c) encapsulating the semiconductor element by a resin. According to the method of the present invention, the contact area between the semiconductor element and the substrate is large because the substrate surrounds the semiconductor element. For this reason, it is possible to positively release the heat generated from the semiconductor element via the substrate, and the heat radiation characteristic of the semiconductor element can be improved. In addition, since the substrate for holding the semiconductor element is used to release the heat generated from the semiconductor element, it is possible to prevent the size of the semiconductor device from increasing.

Another object of the present invention is to provide a method of producing a semiconductor device comprising the steps of (a) forming a plurality of divided substrates forming a substrate, (b) forming the substrate which surrounds a semiconductor element by bonding the divided substrates to the semiconductor element using a bond material, (c) providing a circuit on the substrate and electrically connecting the circuit and the semiconductor element, (d) loading the substrate mounted with the semiconductor element into molds having a plunger pot, and filling a resin supplied from the plunger pot so as to encapsulate a surface of the semiconductor element electrically connected to the circuit, and (e) forming external connecting terminals on the circuit, where the external connecting terminals are used to electrically connect the semiconductor device to an outside element. According to the method of the present invention, it is possible to directly introduce the resin onto the substrate via the resin gate hole in the substrate when encapsuating the semiconductor element by the resin. Hence, it becomes unnecessary to provide a cull part, a runner part, a gate part and the like in the molds that is used for the resin mold. In addition, it is possible to reduce the contact area between the resin and the molds, and the kind and amount of mold release agent to be added to the resin may be selected without taking into account the mold release characteristic. As a result, it becomes possible to use a resin having a large adhesive strength, and the reliability of the semiconductor device can be improve even when the size of the semiconductor device is reduced.

Another object of the present invention is to provide a semiconductor device comprising a semiconductor element, a holding substrate holding the semiconductor element, a frame body provided on the holding substrate so as to surround the semiconductor element, where the frame body has a hole which communicates to a space formed between the holding substrate and the frame body and the frame body and the holding substrate form a housing, a plurality of leads having inner lead portions connected to the semiconductor element and outer lead portions extending outside the frame body, and a resin filling the space and encapsulating the semiconductor element and the inner lead portions, where all of the outer lead portions extend outside the housing from one side of the housing. According to the semiconductor device of the present invention, all of the leads extend outwards from the same side of the housing, and thus, it is possible to mount the semiconductor device in a standing position and improve the mounting density of the semiconductor device with respect to a mounting substrate.

Still another object of the present invention is to provide a semiconductor device unit comprising a plurality of semiconductor devices, and means for connecting the semiconductor devices in a stacked arrangement having a common surface, where each of the semiconductor devices comprise a semiconductor element, a holding substrate holding the semiconductor element, a frame body provided on the holding substrate so as to surround the semiconductor element, the frame body having a hole which communicates to a space formed between the holding substrate and the frame body, the frame body and the holding substrate forming a housing, a plurality of leads having inner lead portions connected to the semiconductor element and outer lead portions extending outside the frame body, and a resin filling the space and encapsulating the semiconductor element and the inner lead portions, where all of the outer lead portions extend outside the housing from one side of the housing, and all of the outer lead portions of each of the semiconductor devices extend from the common surface. According to the semiconductor device unit of the present invention, it is possible to improve the mounting density of the semiconductor devices with respect to a mounting substrate because a plurality of semiconductor devices can be mounted in the standing position.

A further object of the present invention is to provide a semiconductor device comprising a semiconductor element, a semiconductor element mounting substrate having a first surface mounted with the semiconductor element, a flexible wiring substrate wrapped around the semiconductor element mounting substrate, the flexible wiring substrate including a flexible base member, electrode portions formed on the base member and electrically connected to the semiconductor element, external connecting terminal portions formed on the base member and electrically connectable to an outside member, and wiring portions formed on the base member and electrically connecting the electrode portions and the external connecting terminal portions, and a resin encapsulating at least the semiconductor element. According to the semiconductor device of the present invention, the semiconductor element mounting substrate simply needs to have the function of supporting the semiconductor element mounted thereon, and the electrical connection between the semiconductor element and the external connecting terminals is made by the electrode portions, the external connecting terminal portions and the wiring portions of the flexible wiring substrate. Because the flexible wiring substrate is relatively inexpensive, it is possible to reduce the cost of the semiconductor device. In addition, the wiring can be drawn around with ease since the flexible wiring substrate wraps the semiconductor element mounting substrate inside and is arranged so that the electrode portions are automatically located adjacent to the semiconductor element and the external connecting terminal portions can be located at the bottom surface of the semiconductor element mounting substrate. Furthermore, the provision of the flexible wiring substrate does not interfere with the size reduction of the semiconductor device because the flexible wiring substrate is wrapped around the semiconductor element mounting substrate, and the semiconductor device can be made small.

Another object of the present invention is to provide a semiconductor device comprising a semiconductor element, a flexible wiring substrate wrapped around the semiconductor element, the flexible wiring substrate including a flexible base member, electrode portions formed on the base member and electrically connected to the semiconductor element, external connecting terminal portions formed on the base member and electrically connectable to an outside member, and wiring portions formed on the base member and electrically connecting the electrode portions and the external connecting terminal portions, and a resin encapsulating at least the semiconductor element. According to the semiconductor device of the present invention, it is possible to realize the so-called chip size package because the flexible wiring substrate is wrapped directly around the semiconductor element, and the semiconductor device can be made small.

Still another object of the present invention is to provide a semiconductor device comprising a semiconductor element, a semiconductor element mounting substrate having a first surface mounted with the semiconductor element, a second surface opposite to the first surface, a base member made of an insulator material, and a single-level first lead wiring layer formed on the second surface, wires electrically connecting the semiconductor element and the first lead wiring layer, a resin encapsulating the semiconductor element, and mechanical bumps formed on the first lead wiring layer as external connecting terminals and electrically connectable to an outside member. According to the semiconductor device of the present invention, it is possible to form the mechanical bumps with ease because the first lead wiring layer on which the mechanical bumps are formed is formed on the surface of the base member different from the surface on which the semiconductor element is mounted and the first lead wiring layer has a single-level structure.

A further object of the present invention is to provide a method of producing a semiconductor device unit comprising the steps of (a) providing a semiconductor element on a holding substrate which has a resin filling hole penetrating the holding substrate so that the holding substrate holds the semiconductor element, (b) providing leads on the holding substrate so that outer lead portions of the leads are intensively located only along one side of the holding substrate, (c) providing a frame body on the holding substrate with the leads so that the holding substrate surrounds the semiconductor element, (d) electrically connecting the semiconductor element and the leads, (e) filling a resin into a space formed between the holding substrate and the frame body via the resin filling hole so as to encapsulate the semiconductor element by the resin, and (f) stacking a plurality of semiconductor devices formed by the steps (a) through (e) to produce a semiconductor device unit having a common surface from which the outer lead portions of the semiconductor devices extend outwards. According to the method of the present invention, it is possible to make the resin encapsulation without the use of a complicated mold, because the resin is filled into the space formed by the holding substrate and the frame body via the resin filling hole. The resin encapsulating process can thus be carried out efficiently at a low cost.

Another object of the present invention is to provide a method of producing a semiconductor device unit comprising the steps of (a) providing a semiconductor element on a holding substrate which has a resin filling hole penetrating the holding substrate so that the holding substrate holds the semiconductor element, (b) providing leads on the holding substrate so that outer lead portions of the leads are intensively located only along one side of the holding substrate, (c) providing a frame body on the holding substrate with the leads so that the holding substrate surrounds the semiconductor element, (d) electrically connecting the semiconductor element and the leads, (e) stacking a plurality of semiconductor device assemblies formed by the steps (a) through (d) to form a stacked structure having a common surface from which the outer lead portions of the semiconductor device assemblies extend outwards, and (f) filling a resin in one operation into each space between adjacent semiconductor device assemblies of the stacked structure and into each space formed between the holding substrate and the frame body of each of the semiconductor device assemblies via the resin filling hole in at least one of the semiconductor device assemblies so as to encapsulate the semiconductor element of each of the semiconductor device assemblies by the resin, thereby producing a semiconductor device unit. According to the method of the present invention, the resin can be filled in one operation into the spaces between the adjacent semiconductor device assemblies after the semiconductor device assemblies are stacked. Thus, the resin encapsulating process can be carried out efficiently.

Still another object of the present invention is to provide a method of producing a semiconductor device comprising the steps of (a) forming a flexible wiring substrate from a flexible base member by providing electrode portions, external connecting terminal portions electrically connectable to an outside member, and wiring portions electrically connecting the electrode portions and the external connecting terminal portions on the flexible base member, (b) wrapping a semiconductor element mounting substrate inside by the flexible wiring substrate by bending the flexible wiring plate along the semiconductor element mounting substrate, (c) mounting a semiconductor element on the semiconductor element mounting substrate and electrically connecting the semiconductor element and the electrode portions of the flexible wiring substrate, (d) forming external connecting terminals on the external connecting terminal portions of the flexible wiring substrate, and (e) encapsulating the semiconductor element by a resin to produce the semiconductor device. According to the method of the present invention, the electrode portions, the external connecting terminal portions and the wiring portions can be formed on the base member using the printed wiring technique, for example. In addition, the semiconductor element mounting substrate can be wrapped by flexible wiring substrate by a simple process of bending the flexible wiring substrate along the semiconductor element mounting substrate. As a result, the semiconductor device can be produced at a low cost.

A further object of the present invention is to provide a method of producing a semiconductor device comprising the steps of (a) forming a semiconductor element mounting substrate by forming a semiconductor arranging hole and wire inserting holes at predetermined positions of a base member which is made of an insulator material, providing a conductive material on one surface of the base member, forming a single first lead wiring layer by patterning the conductive material into a predetermined pattern, and forming mechanical bumps on the first lead wiring layer for use as external connecting terminals, (b) mounting a semiconductor element on the semiconductor element mounting substrate and electrically connecting the semiconductor element and the first lead wiring layer by providing wires between the semiconductor element and the first lead wiring layer via the wire inserting holes, and (c) encapsulating the semiconductor element by a resin. According to the method of the present invention, the process of forming the semiconductor arranging hole and the wire inserting holes, the process of forming and patterning the first lead wiring layer, and the process of forming the mechanical bumps can all be carried out with ease. In addition, the process of providing the wires can easily be made by use of a general wire-bonding equipment. Further, known techniques such as potting and molding may be employed to carry out the resin encapsulating process. Therefore, the semiconductor device can be produced with a high production efficiency.

Other objects and further features of the present invention will be apparent from the following detailed description when read in conjunction with the accompanying drawings.

BRIEF DESCRIPTION OF THE DRAWINGS

FIG. 119 is a bottom view showing the forty-eighth embodiment of the semiconductor device;

FIG. 120 is a cross sectional view showing the forty-eighth embodiment of the semiconductor device along a line A—A in FIG. 118;

FIG. 121 is a cross sectional view showing the forty-eighth embodiment of the semiconductor device along a line B—B in FIG. 118;

Figure 122A:
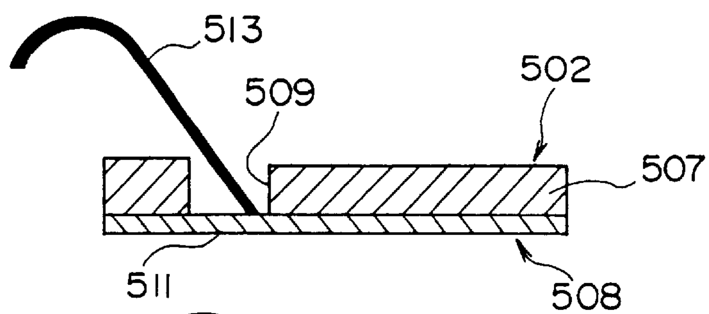
Figure 122B:
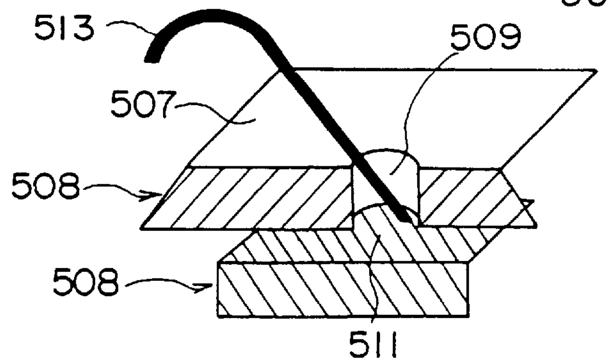
Figure 123:
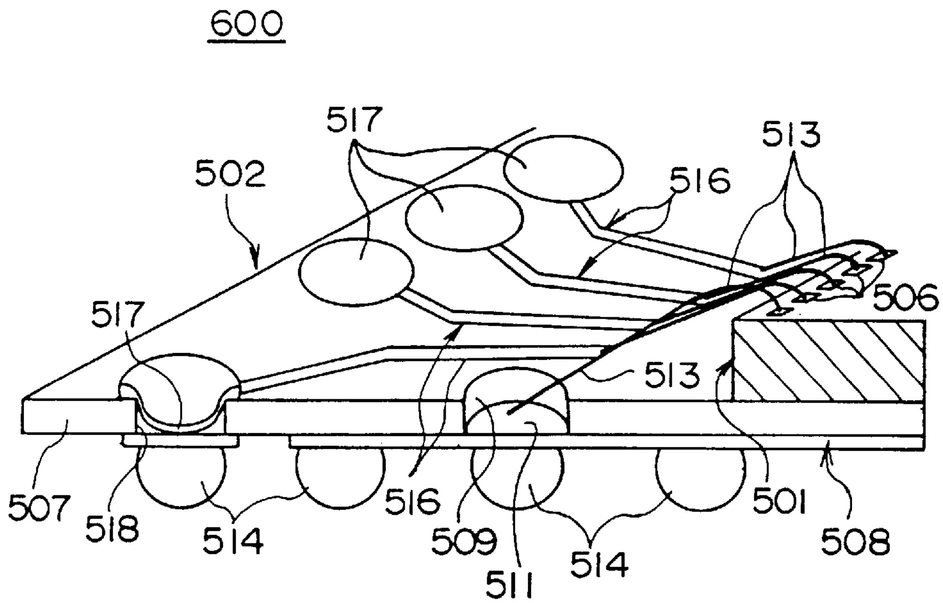
Figure 124:
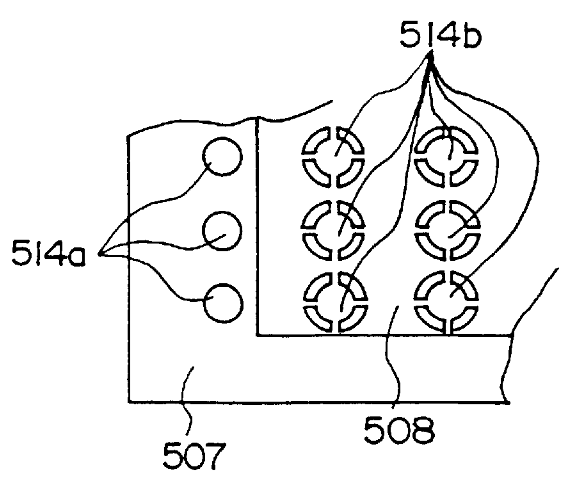
Figure 126A:
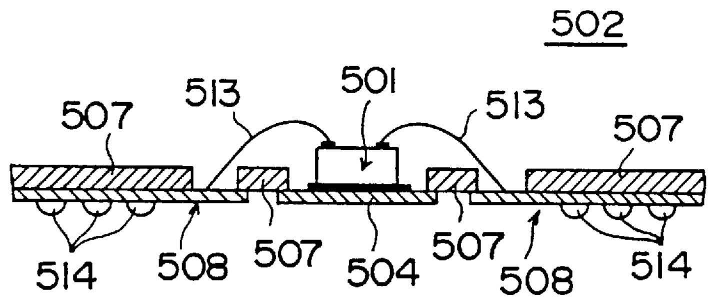
Figure 126B:
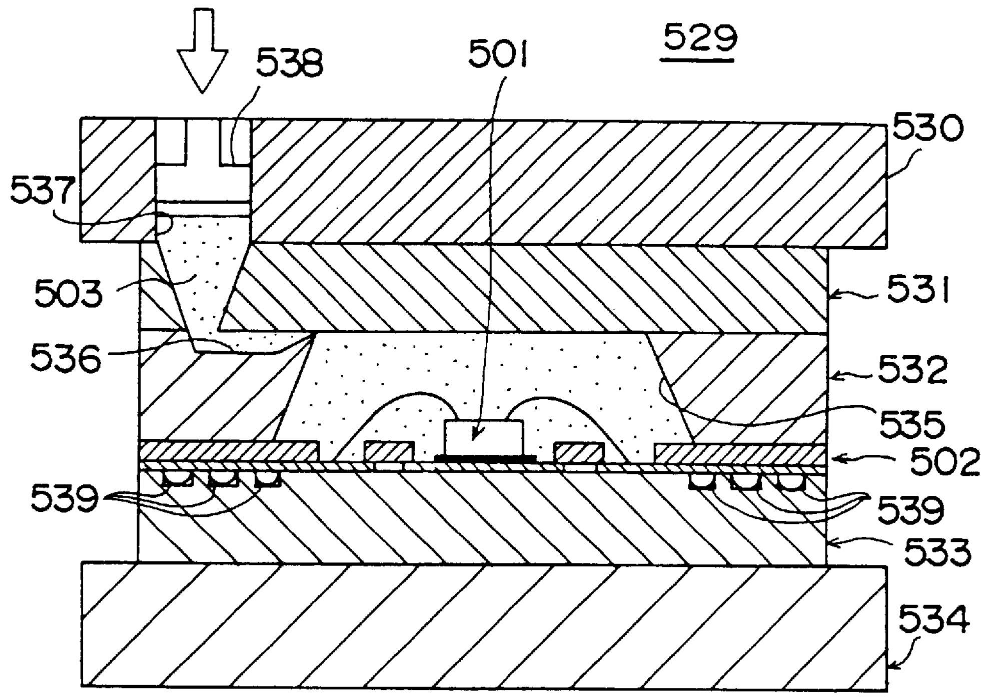
Figure 126C:
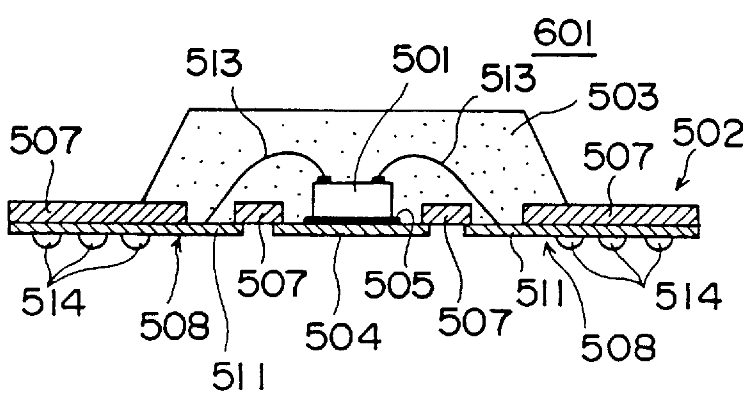
Figure 127:
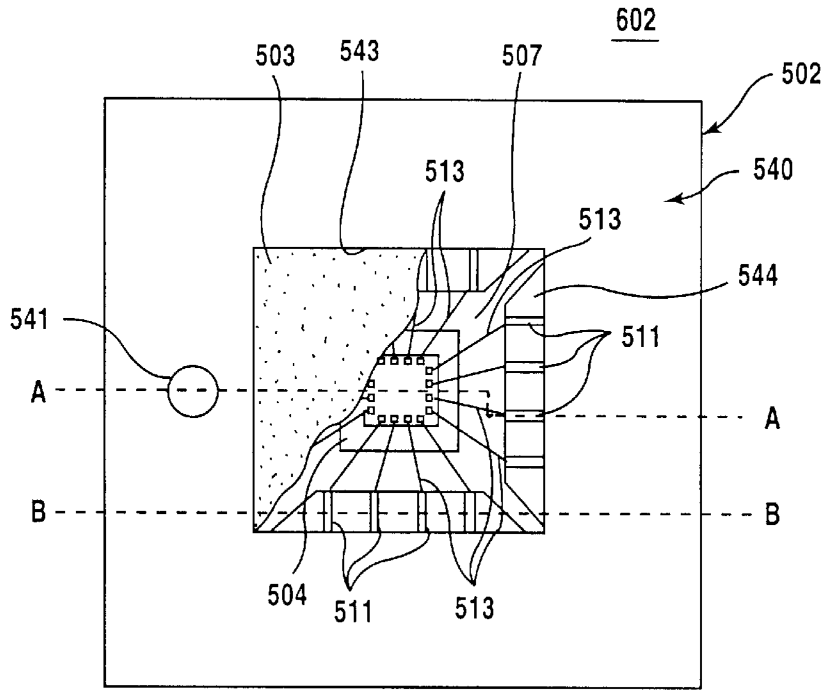
Figure 128:
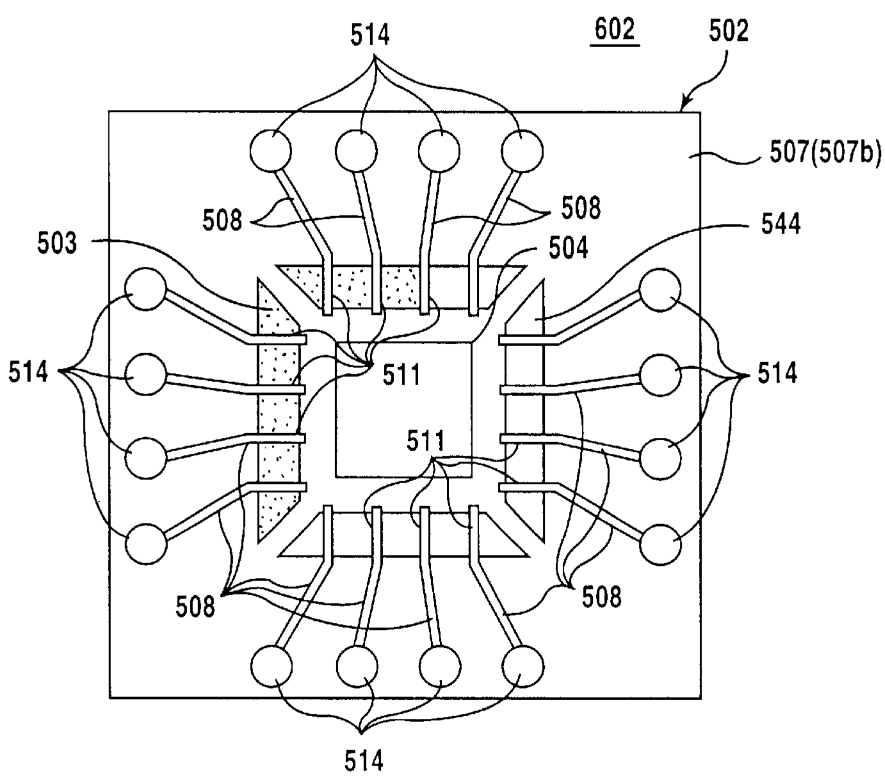
Figure 129:
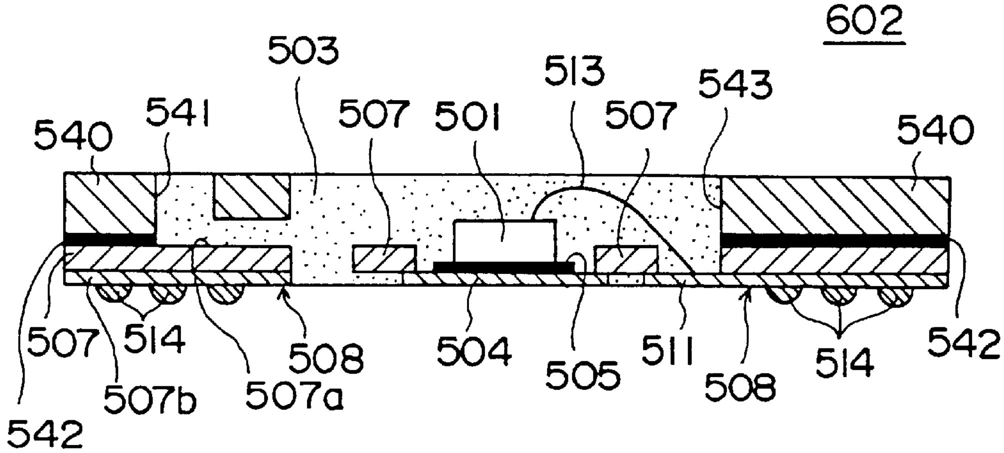
Figure 130:
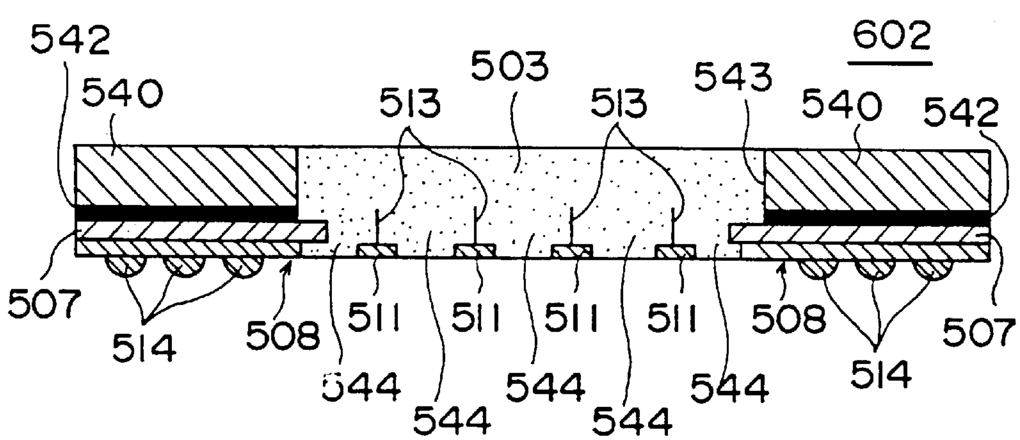
Figure 133:
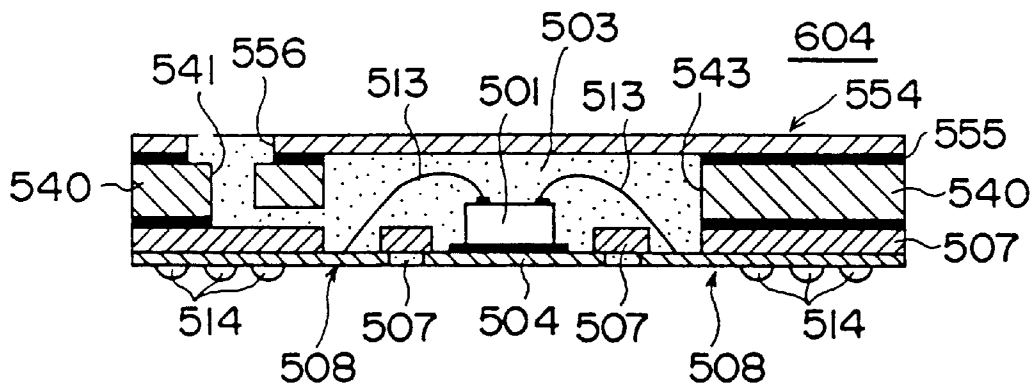
Figure 134:
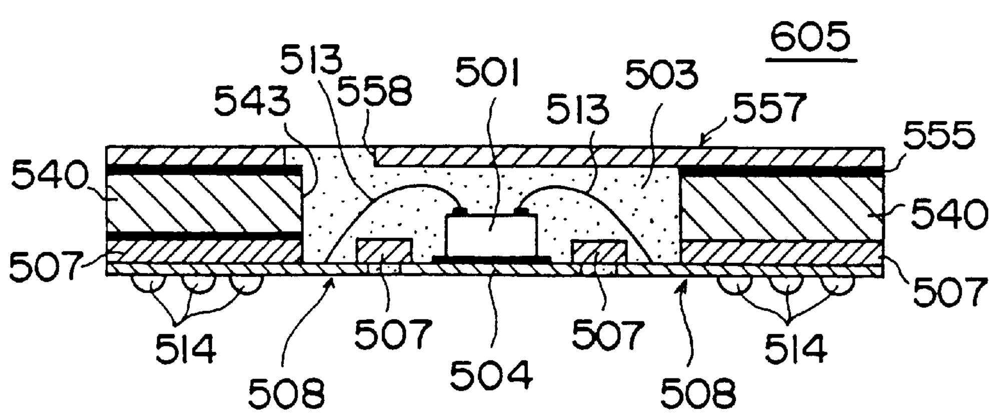
Figure 137:
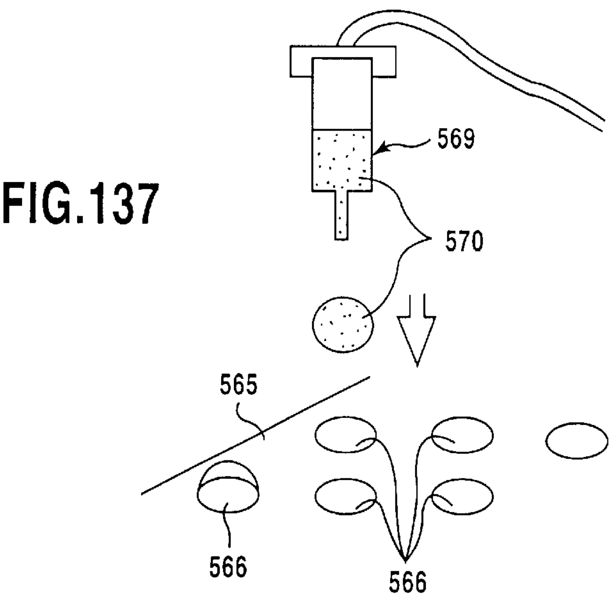
Figure 138:
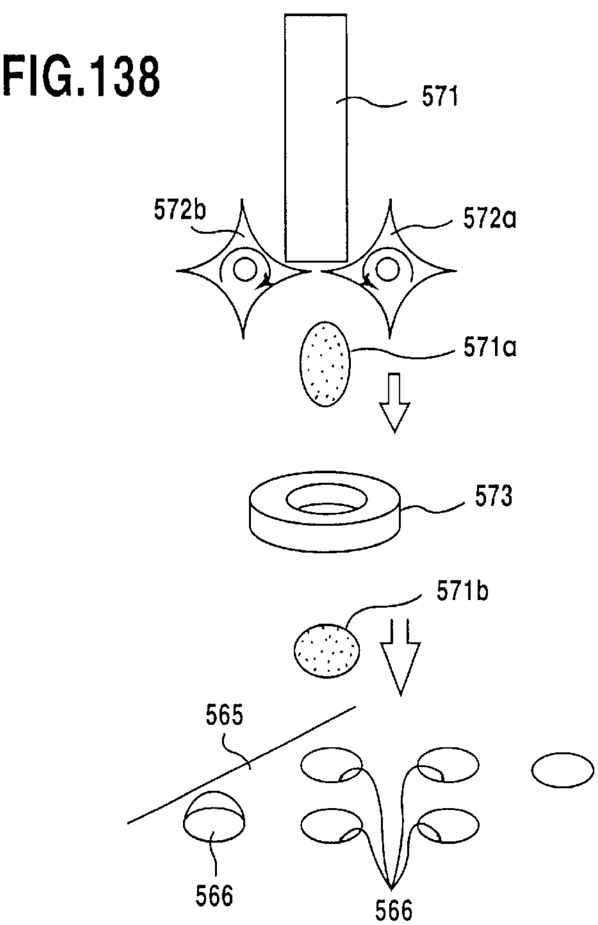

FIGS. 122A and 122B respectively are a cross sectional view and a perspective view on an enlarged scale showing an inner lead portion and a wire;

FIG. 123 is a diagram for explaining a modification of the forty-eighth embodiment of the semiconductor device;

FIG. 124 is a diagram for explaining the modification of the forty-eighth embodiment of the semiconductor device;

FIGS. 125A through 125L respectively are diagrams for explaining a thirteenth embodiment of the method of producing the semiconductor device according to the present invention;

FIGS. 126A through 126C respectively are diagrams for explaining a modification of a resin encapsulating process;

FIG. 127 is a plan view, with a part cut away, showing a forty-ninth embodiment of the semiconductor device according to the present invention;

FIG. 128 is a bottom view showing the forty-ninth embodiment of the semiconductor device;

FIG. 129 is a cross sectional view showing the forty-ninth embodiment of the semiconductor device along a line A—A in FIG. 127;

FIG. 130 is a cross sectional view showing the forty-ninth embodiment of the semiconductor device along a line B—B in FIG. 127;

FIGS. 131A through 131E respectively are diagrams for explaining a fourteenth embodiment of the method of producing the semiconductor device according to the present invention;

FIGS. 132A through 132D respectively are diagrams for explaining a modification of the fourteenth embodiment of the method of producing the semiconductor device;

FIG. 133 is a cross sectional view showing a fiftieth embodiment of the semiconductor device according to the present invention;

FIG. 134 is a cross sectional view showing a fifty-first embodiment of the semiconductor device according to the present invention;

FIGS. 135A through 135F respectively are diagrams for explaining a first embodiment of a conductive metal layer forming process;

FIGS. 136A through 136F respectively are diagrams for explaining a second embodiment of the conductive metal layer forming process;

FIG. 137 is a diagram for explaining the second embodiment of the conductive metal layer forming process;

FIG. 138 is a diagram for explaining the second embodiment of the conductive metal layer forming process;

FIGS. 139A through 139F respectively are diagrams for explaining a third embodiment of the conductive metal layer forming process; and FIGS. 140A through 140D respectively are diagrams for explaining a fourth embodiment of the conductive metal layer forming process.

DESCRIPTION OF THE PREFERRED EMBODIMENTS

FIGS. 2 through 33 are diagrams for explaining a first aspect of the present invention, and FIGS. 34 through 72 are diagrams for explaining a second aspect of the present invention. First, a description will be given of the first aspect of the present invention, by referring to FIGS. 2 through 33.

Figure 1A:
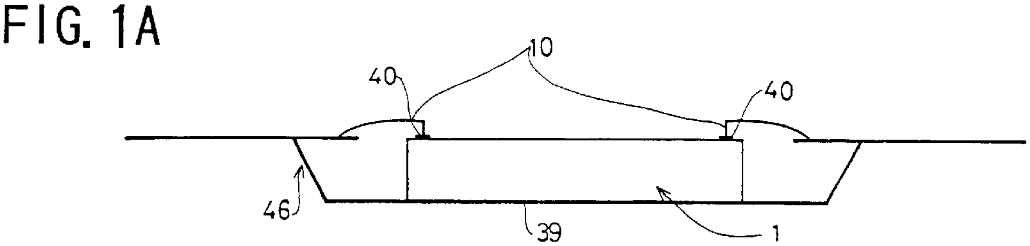
FIGS. 1A, 1B and 1C respectively are cross sectional views for explaining an example of a conventional semiconductor device and a method of producing the same.
Figure 1B:
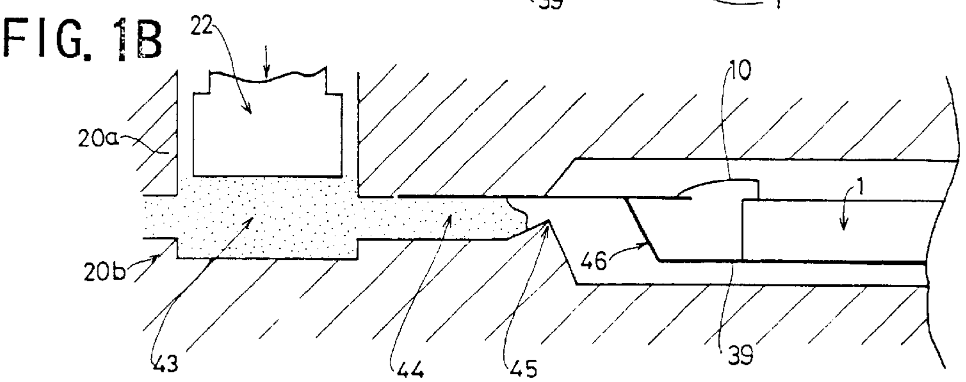
Figure 1C:
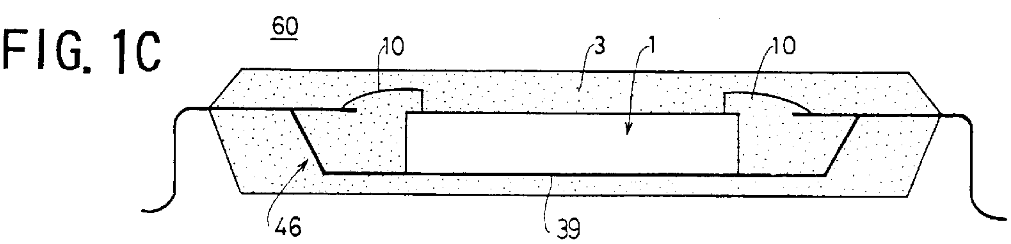
Figure 2:
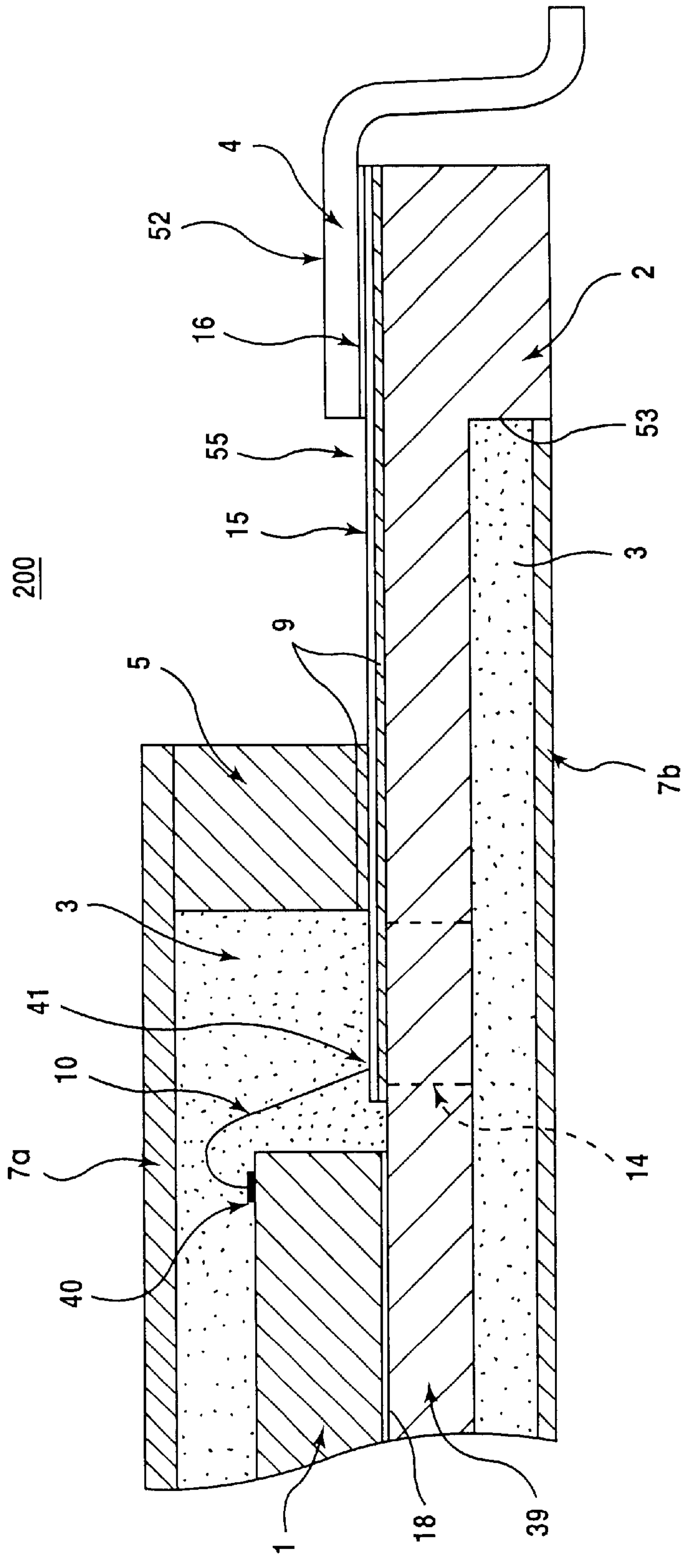
FIG. 2 is a cross sectional view showing an important part of a first embodiment of a semiconductor device according to the present invention.
Figure 3:
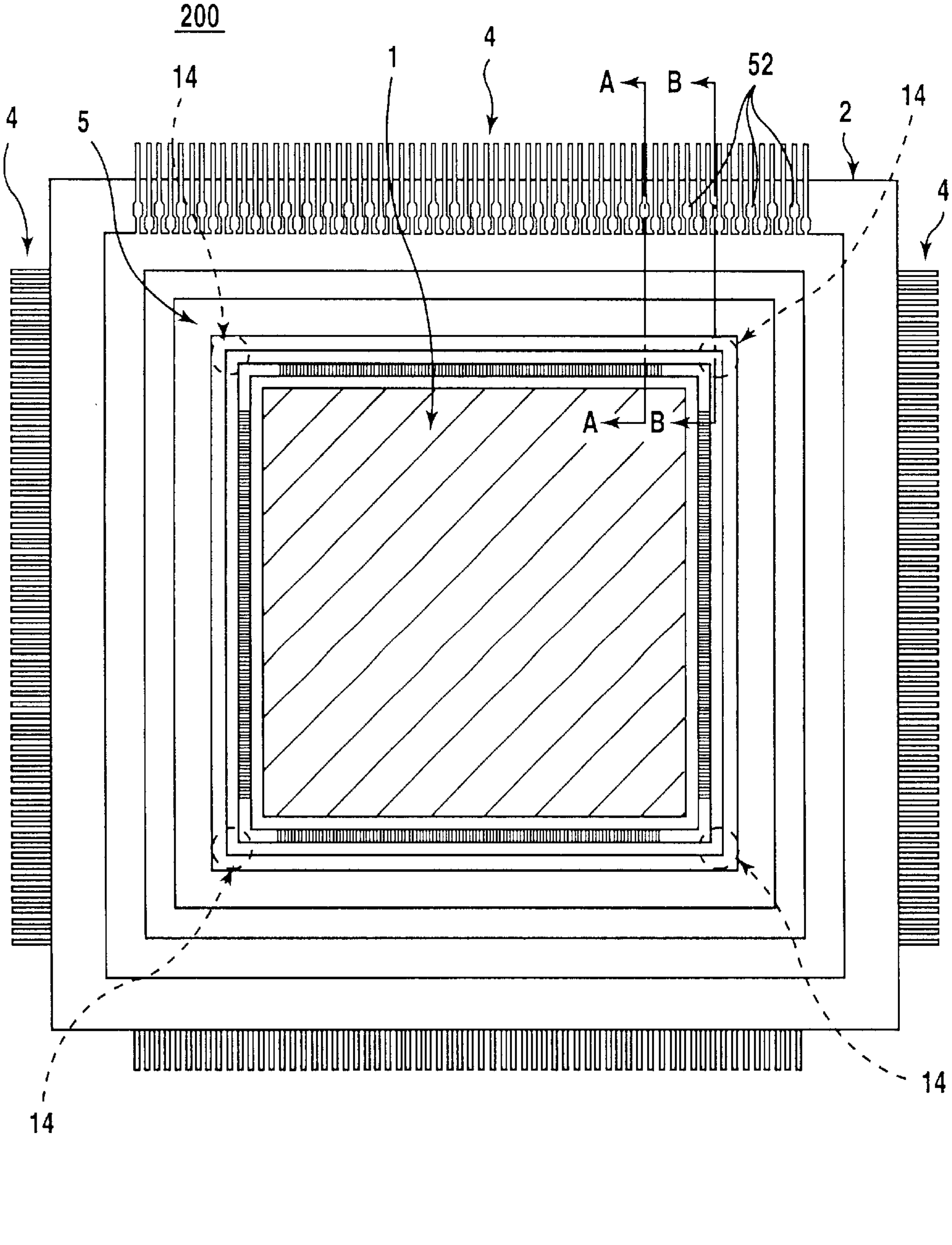
FIG. 3 is a plan view showing the first embodiment of the semiconductor device.
Figure 4:
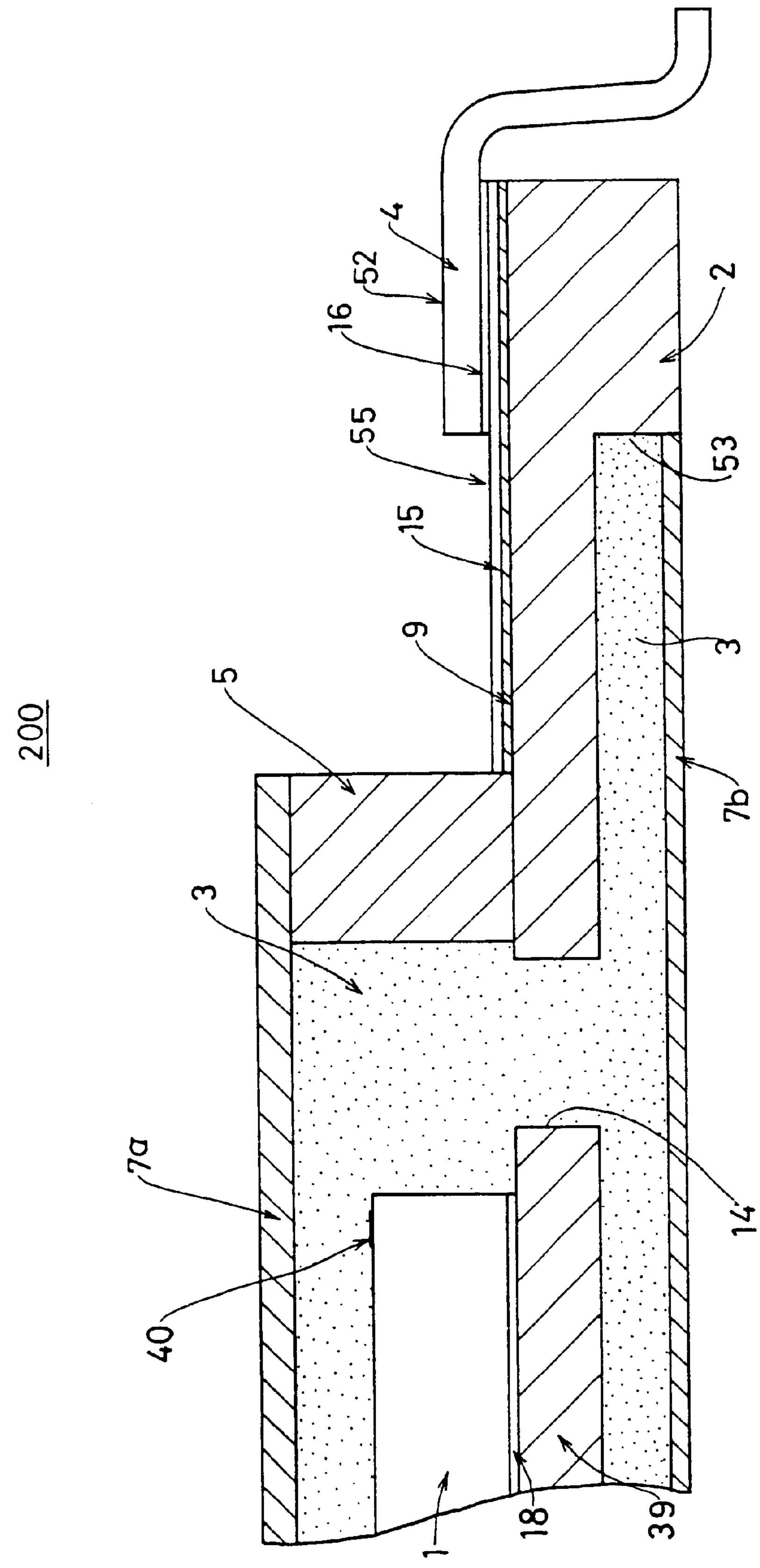
FIG. 4 is a cross sectional view showing another important part of the first embodiment.

FIGS. 2 through 4 show a first embodiment of a semiconductor device according to the present invention employing the first aspect of the present invention. FIG. 3 shows a plan view of the first embodiment of the semiconductor device. FIG. 2 shows a cross sectional view along a line A—A in FIG. 3, and FIG. 4 shows a cross sectional view along a line B—B in FIG. 3.

In FIGS. 2 through 4, a semiconductor element 1 of a semiconductor device 200 is fixed on a die-pad 39 of a base substrate 2 by a die-bond layer 18. This substrate 2 is made of a metal material having a satisfactory thermal conductivity, and a resin filling recess 53 is formed on the lower portion of this substrate 2. In addition, resin gate holes 14 penetrate the substrate 2. The upper end of the resin gate hole 14 opens to the side of the substrate 2 provided with the semiconductor element 1, and the lower end of the resin gate hole 14 opens within the resin filling recess 53, as may be seen from FIG. 4.

A multi-level (or multi-layer) wiring (or interconnection) circuit 55 is arranged on the side of the substrate 2 provided with the semiconductor element 1. This multi-level circuit 55 is made up of insulator layers 9 and a wiring layer 15, and in this embodiment, the wiring layer 15 is sandwiched between the insulator layers 9. The inner end portion of the multi-level circuit 55 is electrically connected to electrodes pad 40 on the top surface of the semiconductor element 1 via wires 10. Outer leads 4 which become external connecting terminals for connecting the semiconductor device 200 and connecting terminals formed on a mounting substrate (not shown) are arranged on the outer end portion of the multi-level circuit 55. The outer leads 4 are bonded on the wiring layer 15 by a conductive bonding agent 16, and are bent downwards into a gull-wing shape. The top surface of the outer lead 4 forms a test pad portion 52 to which a probe pin connects when carrying out a test or the like.

A frame body 5 is arranged at a predetermined position on the top portion of the substrate 2 so as to surround the semiconductor element 1, and an upper lid member 7*a* is arranged on the upper portion of this frame body 5. The frame body 5 and the upper lid member 7*a* are both made of a metal material having a satisfactory thermal conductivity. The frame body 5 and the upper lid member 7*a* are bonded by soldering, bonding, welding or the like.

Figure 33A:
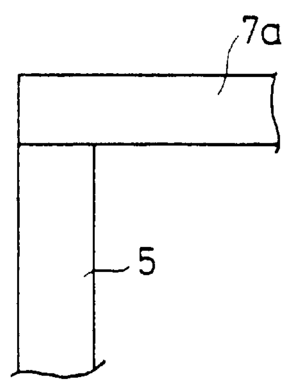
FIGS. 33A, 33B, 33C, 33D and 33E respectively are cross sectional views for explaining methods of connecting a frame body and an upper lid member.
Figure 33B:
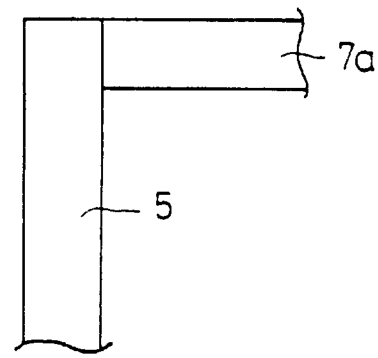
Figure 33C:
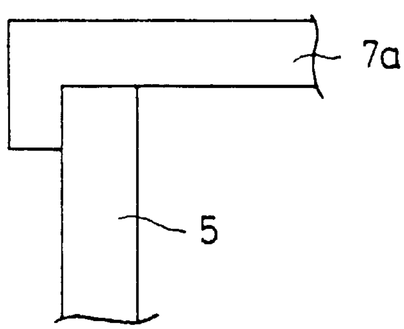
Figure 33D:
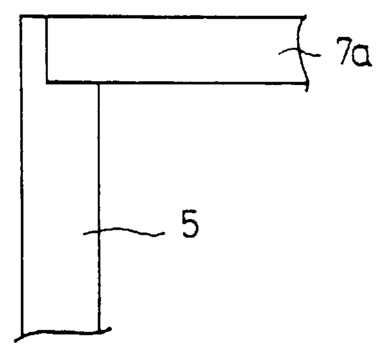
Figure 33E:
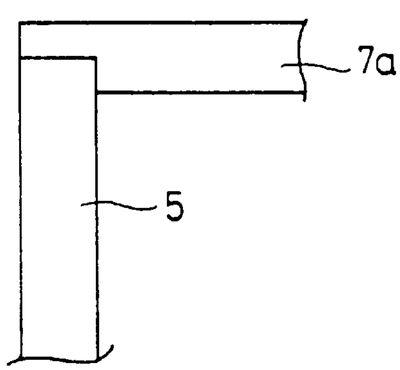

FIGS. 33A through 33E show bonded states of the frame body 5 and the upper lid member 7*a*. FIG. 33A shows a case where the two are bonded in a state where the upper lid member 7*a* is placed on top of the frame body 5. FIG. 33B shows a case where the two are bonded in a state where the upper lid member 7*a* is place on the side of the frame body 5. FIG. 33C shows a case where a flange is provided on an outer peripheral portion of the upper lid member 7*a* and this flange is bonded on the outer top edge portion of the frame body 5. FIG. 33D shows a case where a stepped portion is formed on the top edge portion of the frame body 5, and the top lid member 7*a* is inserted into and bonded to this stepped portion. Further, FIG. 33E shows a case where a stepped portion is formed on the outer side edge portion of the upper lid member 7*a*, and this stepped portion is inserted into and bonded to the frame body 5.

Returning now to the description of FIGS. 2 through 4, the frame body 5 and the upper lid member 7*a* are provided on the side of the substrate 2 provided with the semiconductor element 1. Hence, the semiconductor element 1 is positioned within a space formed by the substrate 2, the frame body 5 and the upper lid member 7*a*. A resin 3 indicated by a dot-pattern is filled into this space formed by the substrate 2, the frame body 5 and the upper lid member 7*a*.

As will be described later in conjunction with a method of producing the semiconductor device 200, the resin 3 is filled from the resin filling recess 53 and is fills the space formed by the substrate 2, the frame body 5 and the upper lid member 7*a* via the resin gate holes 14. In other words, the resin 3 is directly filled into the space formed by the substrate 2, the frame body 5 and the upper lid member 7*a* via the resin filling recess 53 and the resin gate holes 14. In addition, a lower lid member 7*b* is arranged at the bottom portion of the resin filling recess 53 that is filled with the resin 3. This lower lid member 7*b* prevents the resin 3 from leaking outside the substrate 2.

Because it is possible to fill the resin 3 directly into the side of the substrate 2 provided with the semiconductor element 1 via the resin filling recess 53 and the resin gate holes 14, it is unnecessary to provide a cull part, a runner part, a gate part and the like on the molds that are used when filling the resin 3. In addition, the contact area between the resin 3 and the molds can be reduced, thereby making it possible to select the kind and amount of mold release agent to be added to the resin 3 without having to take into consideration the mold release characteristic.

Therefore, it is possible to use as the resin 3 a resin having a high adhesive strength, and the reliability of the semiconductor device 200 can be improved even when the size of the semiconductor device 200 is reduced. Moreover, since there will be no resin remaining at the cull part, the runner part, the gate part and the like of the molds, it is possible to minimize the consumption of the resin 3 and accordingly reduce the cost of the semiconductor device 200. In this embodiment, a resin having a high adhesive strength and added with no mold release agent is used as the resin 3.

Figure 5:
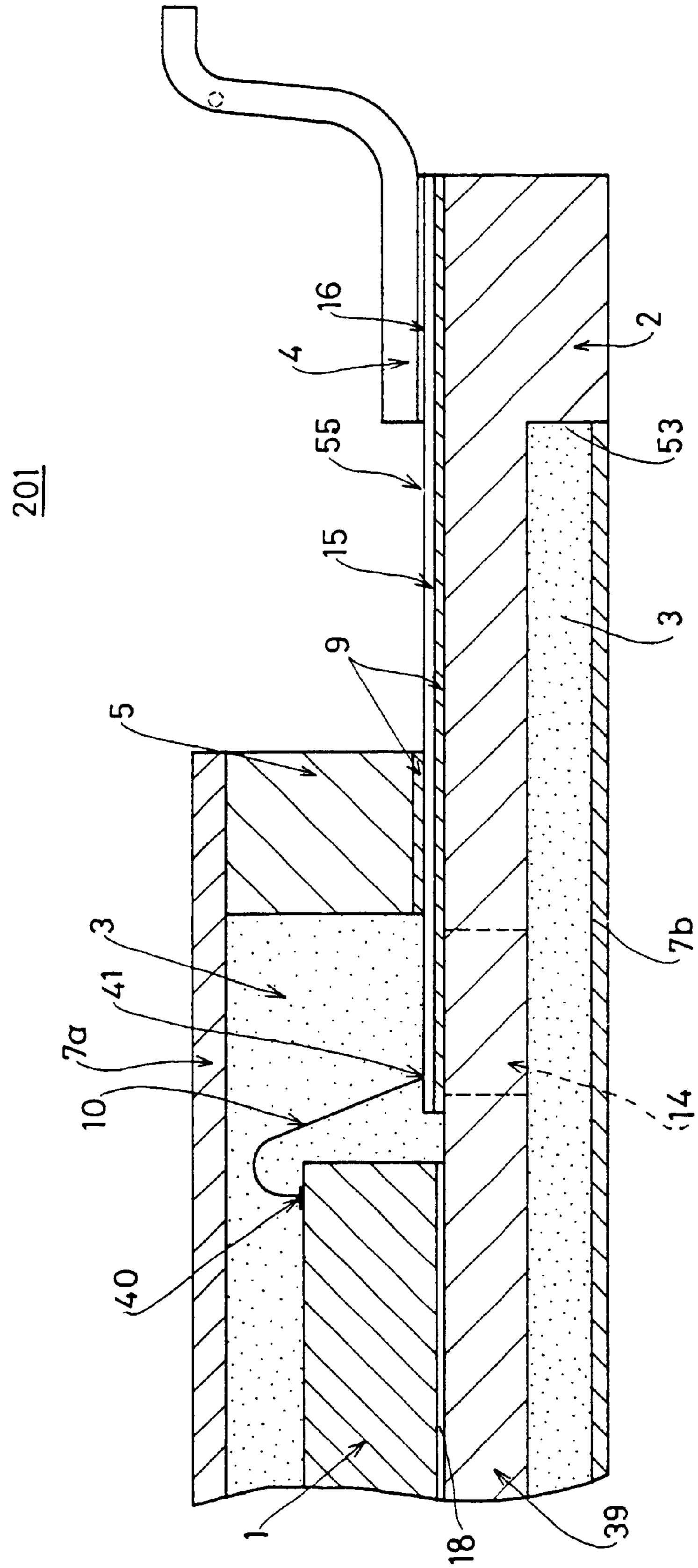
FIG. 5 is a cross sectional view showing an important part of a second embodiment of the semiconductor device according to the present invention.

FIG. 5 shows a cross section of a second embodiment of the semiconductor device according to the present invention employing the first aspect of the present invention. In FIG. 5, those parts which are the same as those corresponding parts in FIGS. 2 through 4 are designated by the same reference numerals, and a description thereof will be omitted.

The basic construction of a semiconductor device 201 shown in FIG. 5 is the same as that of the semiconductor device 200 described above. However, the semiconductor device 201 is characterized in that the outer leads 4 arranged on the outer end portion of the multi-level circuit 55 are bend upwards into the gull-wing shape.

According to this second embodiment, the semiconductor device 201 is mounted on the mounting substrate in a state where the semiconductor device 201 shown in FIG. 5 is arranged upside-down, that is, in a state where the substrate 2 is arranged on the top and the frame body 5 and the upper lid member 7a are arranged on the bottom. By employing this mounting arrangement, it is possible to protect the frame body 5 and the upper lid member 7a which are relatively weak strengthwise as compared to the substrate 2, by the substrate 2. As a result, it is possible to improve the reliability of the semiconductor device 201 after it is mounted on the mounting substrate. Furthermore, it is possible to select the mounting arrangement from two kinds depending on whether the outer leads 4 are bent upwards or downwards, and the degree of freedom with which the semiconductor device can be mounted is improved.

Figure 6:
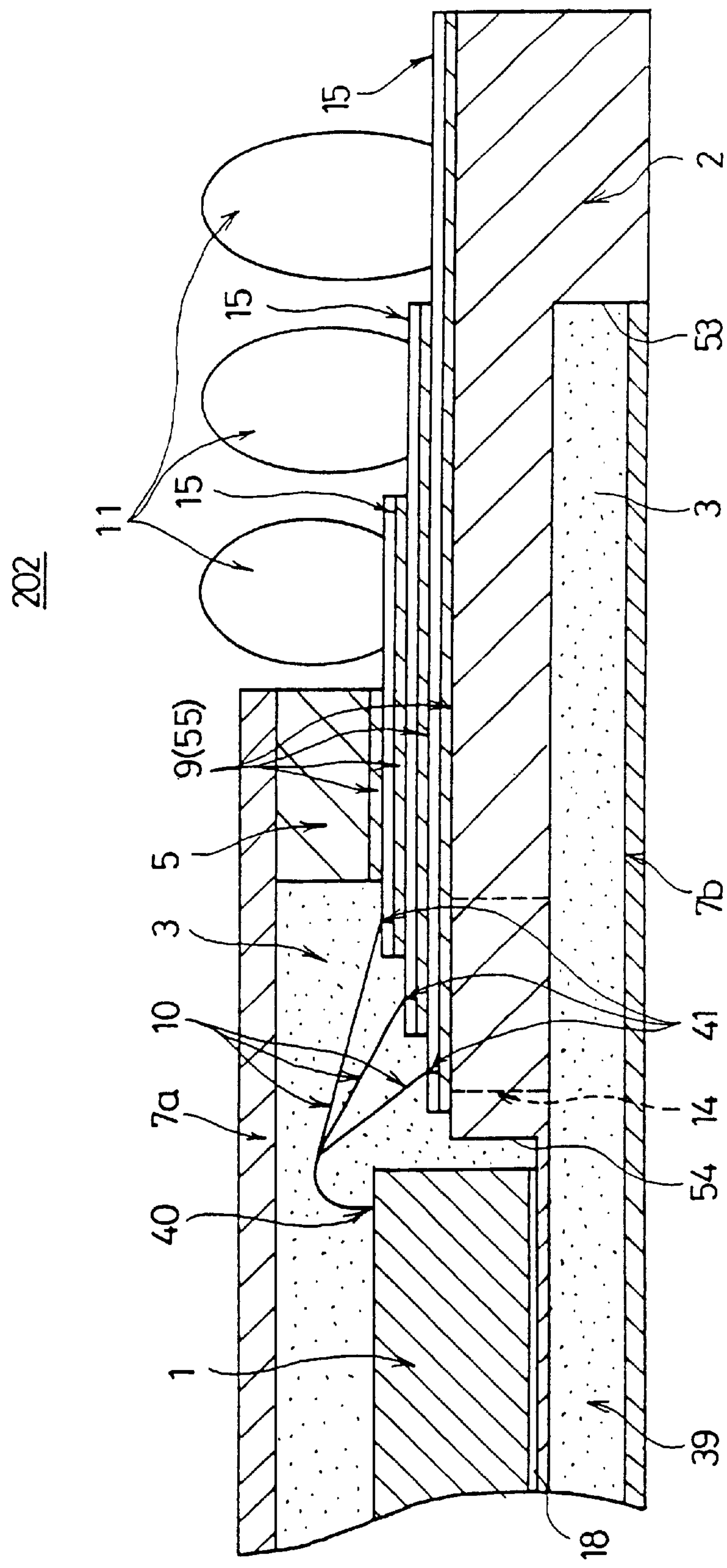
FIG. 6 is a cross sectional view showing an important part of a third embodiment of the semiconductor device according to the present invention.

FIG. 6 shows a cross section of a third embodiment of the semiconductor device according to the present invention employing the first aspect of the present invention. In FIG. 6, those parts which are the same as those corresponding parts in FIGS. 2 through 4 are designated by the same reference numerals, and a description thereof will be omitted.

A semiconductor device 202 shown in FIG. 6 is characterized in that the multi-level circuit 55 has a structure made up of 3 stacked wiring layers 15, bumps 11 are used as external connecting terminals to connect the semiconductor device 202 to the mounting substrate, and a counter sunk (or counterbore) part 54 is formed in the die-pad portion 39 of the substrate 2.

The multi-level circuit 55 includes the insulator layers 9 respectively interposed between each 2 adjacent ones of the 3 wiring layers 15. The right and left ends of the multi-level circuit 55 have a stepped shape as shown in FIG. 6 so that each wiring layer 15 is exposed. The wiring layers 15 which are exposed at the left stepped portion of the multi-level circuit 55 are electrically connected to the electrode pads 40 of the semiconductor element 1 via the wires 10. On the other hand, the bumps 11 are formed on the wiring layers 15 which are exposed at the right stepped portion of the multi-level circuit 55.

As described above, the counter sunk part 54 is formed in the die-pad portion 39 of the substrate 2, and the semiconductor element 1 is arranged within-the counter sunk part 54. By forming the counter sunk part 54 in the substrate 2 and arranging the semiconductor element 1 within this counter sunk part 54, it is possible to make the height position of the top surface of the semiconductor element 1 approximately the same as the height position of the multi-level circuit 55. The wire bonding process for connecting the wires 10 is facilitated when the height positions of the top surface of the semiconductor element 1 and the height position of the multi-level circuit 55 are approximately the same.

As described above, the bumps 11 are formed on the wiring layers 15 which are exposed at the right stepped portion of the multi-level circuit 55. When mounting the semiconductor device 202 on the mounting substrate, each bump 11 (only 3 shown in FIG. 6) must have the same height from the top surface of the substrate 2. Otherwise, if the heights of the bumps 11 are not uniform, only the bumps 11 which have the high height position will make contact with the mounting substrate, and the bumps 11 having the low height position will float from the mounting substrate and make no electrical contact.

But in this embodiment, the bumps 11 are formed on the wiring layers 15 at the right stepped portion of the multi-level circuit 55. For this reason, if the sizes of the bumps 11 were the same, the height positions of the bumps 11 would become different depending on the stepped shape of the multi-level circuit 55. In this case, the differences in the height positions of the bumps 11 would correspond to the thicknesses of the insulator layers 9 and the wiring layers 15. Accordingly, when forming the bumps 11 on the multi-level circuit 55, it is necessary to carry out a process of matching the height positions of each of the bumps 11 relative to the top surface of the substrate 2.

Next, a description will be given of a method of matching the height positions of the bumps 11 relative to the top surface of the substrate 2, by referring to FIGS. 23 through 32. FIGS. 23 through 26 are diagrams for explaining a first method of matching the height positions of the bumps 11 relative to the top surface of the substrate 2, and FIGS. 27 through 32 are diagrams for explaining a second method of matching the height positions of the bumps 11 relative to the top surface of the substrate 2.

FIGS. 23A, 24A, 25A, 26, 27A, 28A, 29A, 30A, 31A and 32 are side views. On the other hand, FIGS. 23B, 24B, 25B, 27B, 28B, 29B, 30B and 31B are plan views. In FIGS. 23 through 32, those parts which are the same as those corresponding parts in FIG. 6 are designated by the same reference numerals, and a description thereof will be omitted.

Figure 23B:
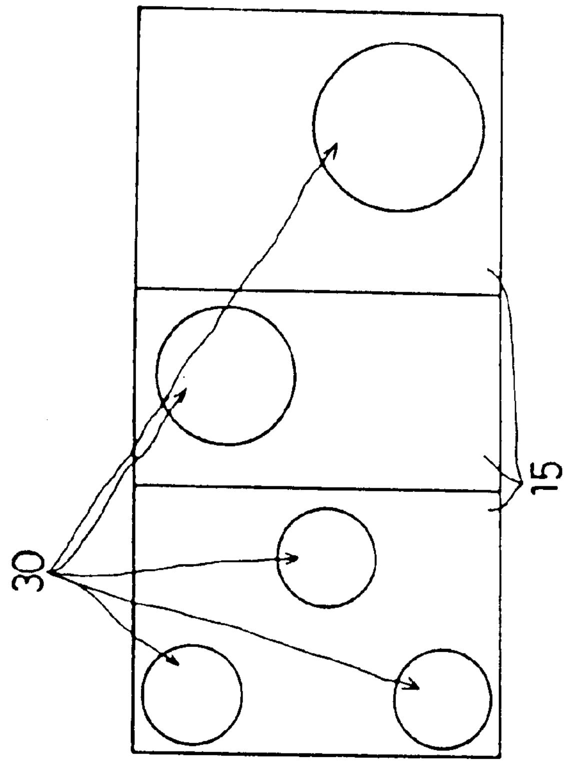
FIGS. 23A and 23B respectively are a cross sectional view and a plan view for explaining a first method of making the height position of solder bumps uniform.
Figure 23A:
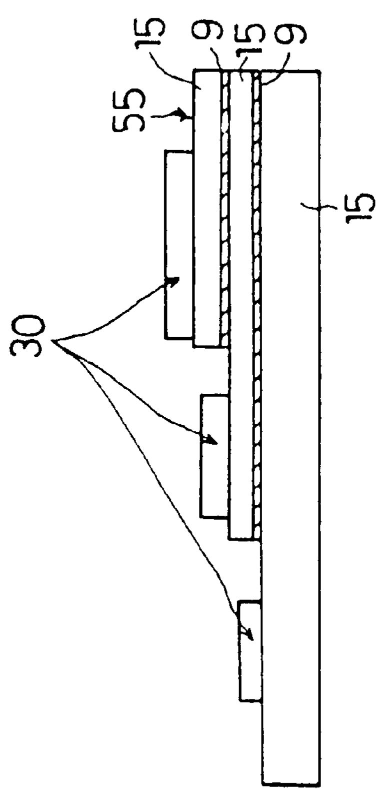

According to the first method, lands 30 are formed on the multi-level circuit 55 having the 3 wiring layers 15 which are insulated by the insulator layers 9 as shown in FIGS. 23A and 23B. The multi-level circuit 55 is formed in advance to have the stepped shape, and the insulator layers 9 are partially removed so as to expose each of the wiring layers 15 as shown in FIG. 23A. The lands 30 are formed on such exposed wiring layers 15.

The lands 30 are made of a material having a satisfactory wetting characteristic, and are formed at predetermined positions using a method such as thick film formation, deposition and plating. The areas of the lands 30 are different depending on the height position of the wiring layer 15 on which each land 30 is formed. More particularly, the land 30 formed on the lowermost wiring layer 15 has the smallest area, and the areas of the lands 30 formed on the intermediate wiring layer 15 and the uppermost wiring layer 15 successively increase compared to the smallest area.

Figure 24B:
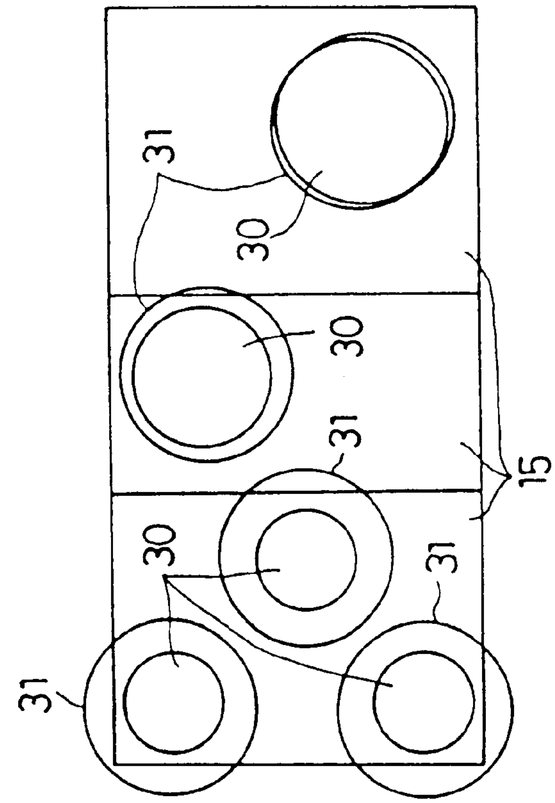
FIGS. 24A and 24B respectively are a cross sectional view and a plan view for explaining the first method of making the height position of the solder bumps uniform.
Figure 24A:
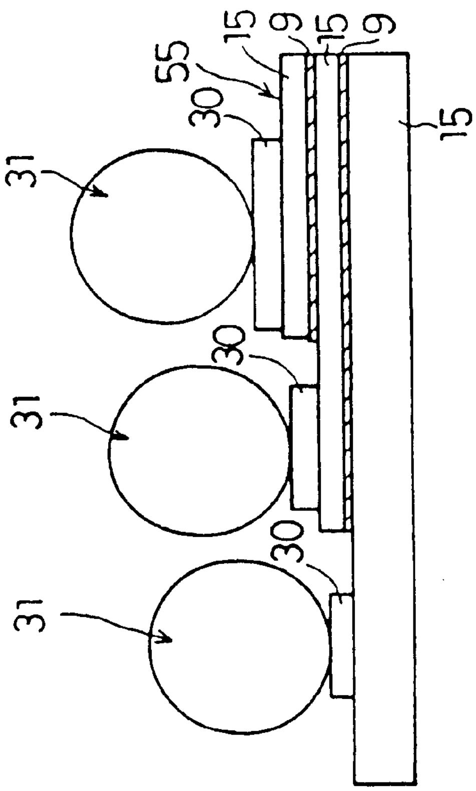

After forming the land 30 having a predetermined area on each wiring layer 15, a solder ball 31 is provided on each land 30 as shown in FIGS. 24A and 24B. The size (volume) of each of the solder balls 31 provided on the lands 30 is the same. The solder balls 31 have a uniform size at the stage shown in FIGS. 24A and 24B, and thus, the height of the top portion of the solder balls 31 from the top surface of the substrate (corresponding to the bottom surface of the lowermost wiring layer 15 in FIG. 24A) differs depending on the differences of the height positions of the lowermost, intermediate and uppermost wiring layers 15.

Figure 25A:
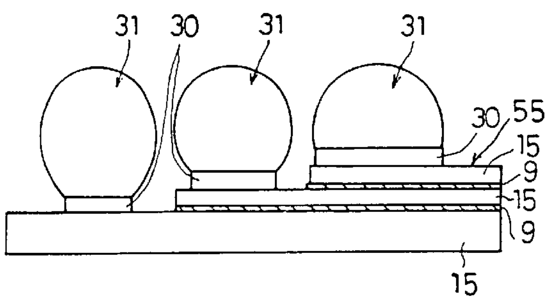
FIGS. 25A and 25B respectively are a cross sectional view and a plan view for explaining the first method of making the height position of the solder bumps uniform.
Figure 25B:
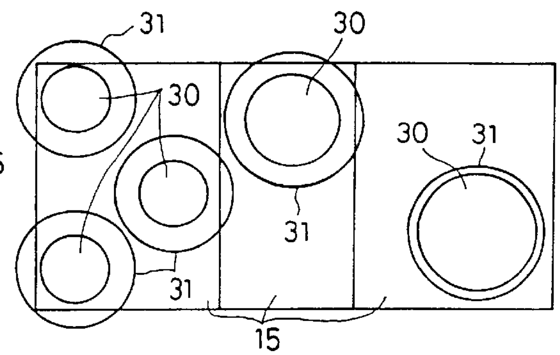

After the solder balls 31 are provided on the lands 30, a heating process is carried out to heat the multi-level circuit 55 in a reflow chamber or the like. As a result, the solder balls 31 melt and lower portions of the solder balls 31 make contact with the entire surface of the corresponding lands 30 as shown in FIGS. 25A and 25B. In addition, the upper portions of the solder balls 31 have a spherical shape due to the surface tension that is generated when the solder balls 31 melt.

As described above, the areas of the lands 30 are set different depending on the whether the land 30 is formed on the lowermost, intermediate or uppermost wiring layer 15.

In other words, the so-called wetting areas are set differently depending on the height positions of the wiring layers 15. Accordingly, the solder ball 31 (solder bump) that is provided on the lowermost wiring layer 15 having the land 30 with the small area, that is, having the small wetting area, becomes tall and the cross section becomes an oval which is vertically long as shown in FIG. 25A. On the other hand, the solder ball 31 (solder bump) that is provided on the uppermost wiring layer 15 having the land 30 with the large area, that is, having the large wetting area, becomes short and the cross section becomes an oval which is horizontally long as shown in FIG. 25A. Furthermore, the area of the land 30 formed on the intermediate wiring layer 15 is an intermediate area between the areas of the lands 30 formed on the uppermost and lowermost wiring layers 15. Hence, the height and cross section of the solder ball 31 (solder bump) that is provided on the intermediate wiring layer 15 having the land 30 with the medium area respectively are between the above short and tall and between the above vertically long and the horizontally long.

Figure 26:
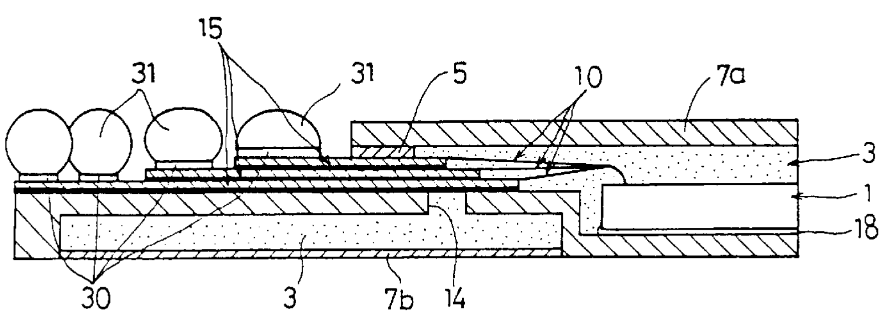
FIG. 26 is a cross sectional view for explaining the first method of making the height position of the solder bumps uniform.

As is clear from the description above, the height of the solder ball 31 (solder bump) that is formed can be controlled by controlling the area of the land 30. Thus, it is possible to make the heights of the solder balls 31 from top surface of the substrate 2 uniform by appropriately selecting the areas of the lands 30 that are formed on the wiring layers 15. FIG. 26 shows the semiconductor device having the bumps 31 having the uniform height.

Next, a description will be given of the second method of matching the height positions of the bumps 11 relative to the top surface of the substrate 2, by referring to FIGS. 27 through 32.

Figure 27A:
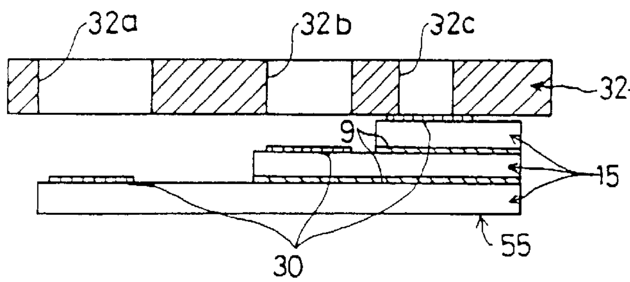
FIGS. 27A and 27B respectively are a cross sectional view and a plan view for explaining a second method of making the height position of solder bumps uniform.

According to this second method, the lands 30 are formed on the multi-level circuit 55 having the 3 wiring layers 15 and the insulator layers 9, as shown in FIG. 27A. The lands 30 have the same area regardless of the locations thereof. Similarly as in the case of the first method described above, the multi-level circuit 55 is formed in advance to have the stepped shape, and the wiring layers 15 are exposed by partially removing the insulator layers 9. The lands 30 are formed on such exposed wiring layers 15.

Figure 27B:
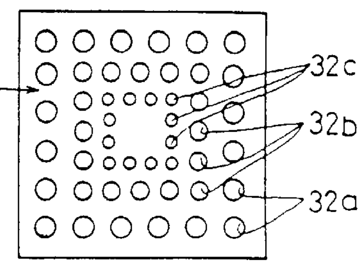

A mask 32 is arranged above the multi-level circuit 55 which is formed with the lands 30. A plurality of holes 32*a* through 32*c* having different sizes are provided in this mask 32 as shown in FIGS. 27A and 27B. Each hole 32*a* having the large diameter is provided at a position confronting the land 30 that is formed on the lowermost wiring layer 15. Each hole 32*b* having the medium diameter is provided at a position confronting the land 30 that is formed on the intermediate wiring layer 15. In addition, each hole 32*c* having the small diameter is provided at a position confronting the land 30 that is formed on the uppermost wiring layer 15. The mask 32 and the multi-level circuit 55 are held by a jig (not shown), for example, so that the relative positions thereof do not change.

Figure 28A:
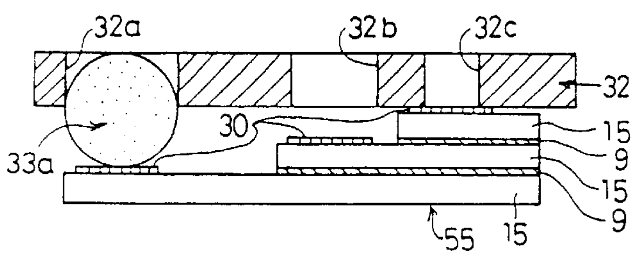
FIGS. 28A and 28B respectively are a cross sectional view and a plan view for explaining the second method of making the height position of the solder bumps uniform.
Figure 28B:
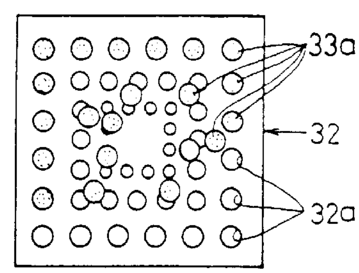

Then, as shown in FIGS. 28A and 28B, a plurality of solder balls 33*a* having a large diameter such that they pass through the large holes 32*a* but will not pass through the small and medium holes 32*c* and 32*b* are supplied from the top of the mask 32. As a result, the large solder balls 33*a* enter within the large holes 32*a* in the mask 32, and lower ends of the large solder balls 33*a* make contact with the lands 30. Excess large solder balls 33*a* are removed.

Figure 29A:
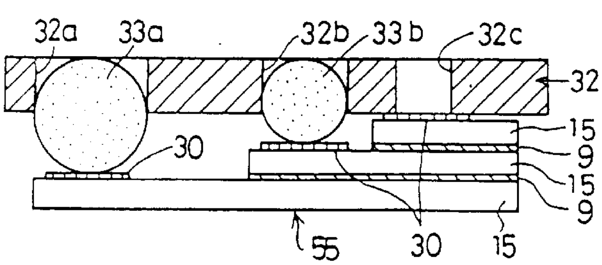
FIGS. 29A and 29B respectively are a cross sectional view and a plan view for explaining the second method of making the height position of the solder bumps uniform.
Figure 29B:
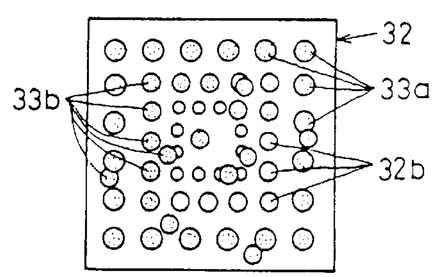

After all of the large holes 32*a* in the mask 32 are filled by the large solder balls 33*a*, a plurality of solder balls 33*b* having a medium diameter such that they pass through the medium holes 32*b* but will not pass through the small holes 32*c* are supplied from the top of the mask 32 as shown in FIGS. 29A and 29B. As a result, the medium solder balls 33*b* enter within the medium holes 32*b* in the mask 32, and lower ends of the medium solder balls 32*b* make contact with the lands 30. Excess medium solder balls 33*b* are removed.

Figure 30A:
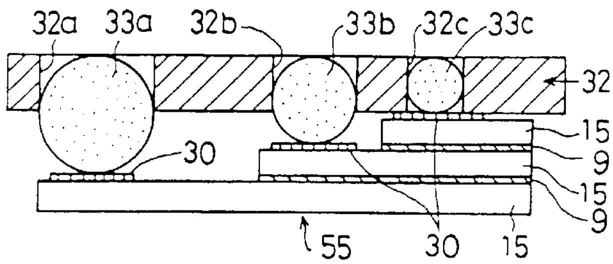
FIGS. 30A and 30B respectively are a cross sectional view and a plan view for explaining the second method of making the height position of the solder bumps uniform.
Figure 30B:
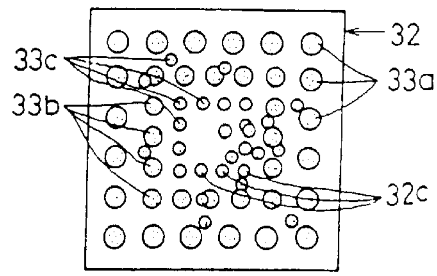

After all of the medium holes 32*b* in the mask 32 are filled by the medium solder balls 33*b*, a plurality of solder balls 33*c* having a small diameter such that they pass through the small holes 32*c* in the mask 32 are supplied from the top of the mask 32 as shown in FIGS. 30A and 30B. As a result, the small solder balls 33*c* enter within the small holes 32*c* in the mask 32, and lower ends of the small solder balls 32*c* make contact with the lands 30. Since the all of the large holes 32*a* in the mask 32 are already filled by the large solder balls 33*a* and all of the medium holes 32*b* in the mask 32 are already filled by the medium solder balls 33*b*, the small solder balls 33*c* will not enter within the large and medium holes 32*a* and 32*b* in the mask 32. Further, excess small solder balls 33*c* are removed if they exist.

Figure 31A:
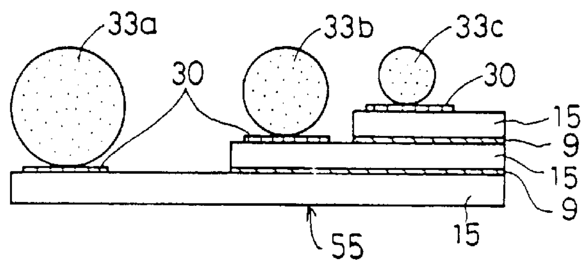
FIGS. 31A and 31B respectively are a cross sectional view and a plan view for explaining the second method of making the height position of the solder bumps uniform.
Figure 31B:
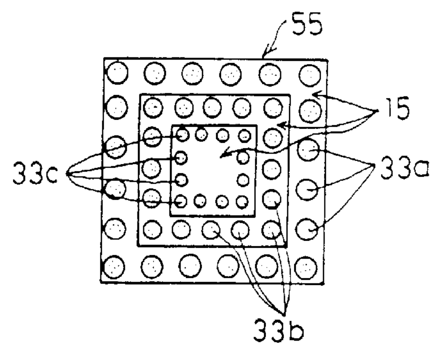

The mask 32 is removed from the multi-level circuit 55 as shown in FIGS. 31A and 31B after the solder balls 33*a* through 33*c* having the diameters corresponding to those of the holes 32*a* through 32*c* in the mask 32 are provided on the lands 30. The solder balls 33*a* through 33*c* remain on the corresponding lands 30 even after the mask 32 is removed.

After the mask 32 is removed, the multi-level circuit 55 is subjected to a heating process in a reflow chamber or the like. By this heating process, the solder balls 33*a* through 33*c* melt and form solder bumps connected to the corresponding lands 30. According to this second method, the areas of the lands 30 are the same, unlike in the first method. For this reason, the height positions of the solder bumps from the wiring layers 15 are determined by the sizes (volume) of the solder balls 33*a* through 33*c*.

Figure 32:
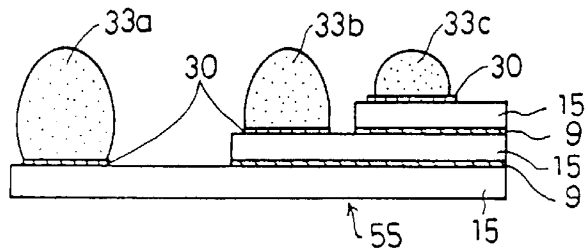
FIG. 32 is a cross sectional view for explaining the second method of making the height position of the solder bumps uniform.

The large solder ball 33*a* having the large volume is provided on the land 30 that is formed on the lowermost wiring layer 15 arranged at the lowermost part of the multi-level circuit 55. Since the volume of this large solder ball 33*a* is large, the bump formed when this large solder ball 33*a* melts becomes the highest. Similarly, the bump formed when the medium solder ball 33*b* melts becomes medium, that is, lower than the bump formed by the large solder ball 33*a* but higher than the bump formed by the small solder ball 33*c*. In addition, the bump formed when the small solder ball 33*c* melts becomes low, that is, lower than the bump formed by the medium solder ball 33*b*. Therefore, by appropriately setting the volumes of the solder balls 33*a* through 33*c* in advance, it is possible to make the heights of the bumps which are formed uniform as shown in FIG. 32.

By employing the first or second method described above, it is possible to easily make the heights of the bumps from the top surface of the substrate 2 uniform by appropriately setting the areas of the lands 30 or the volumes of the solder balls 33*a* through 33*c*, even when the bumps are formed on the stepped portions of the multi-level circuit 55.

Figure 7:
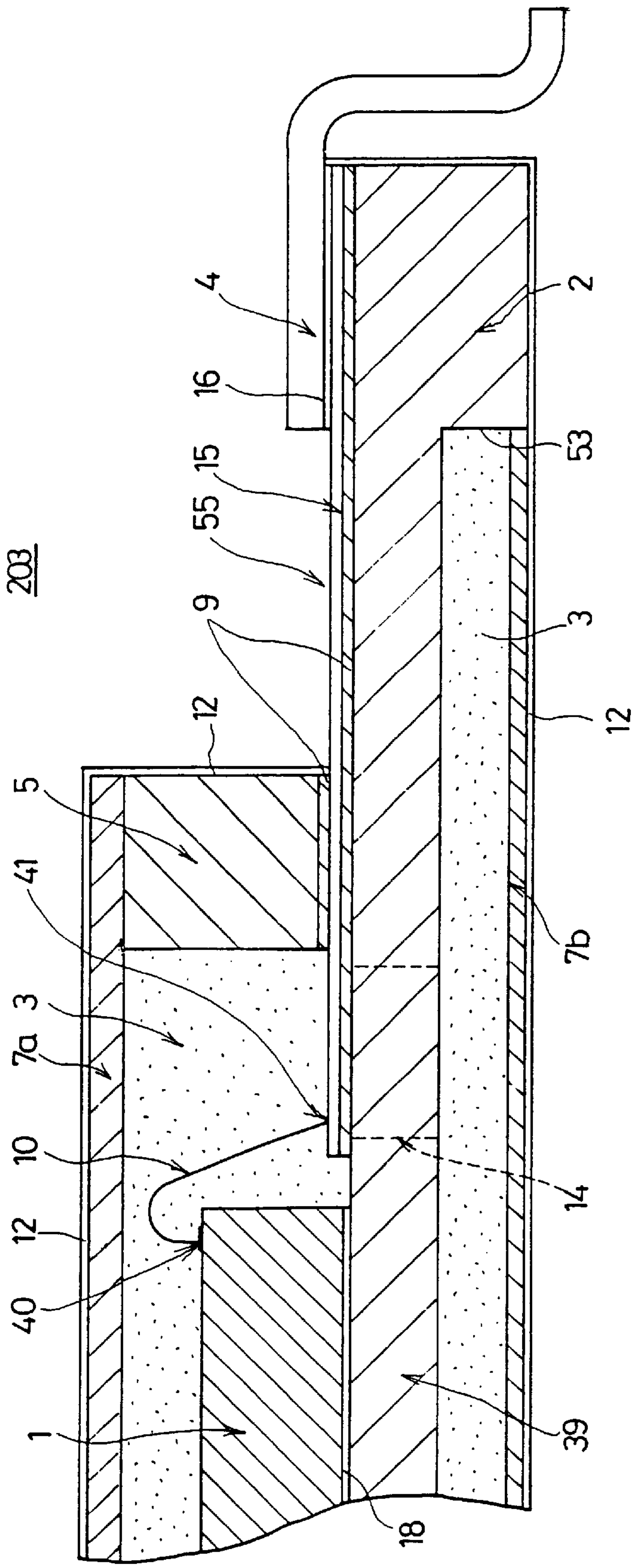
FIG. 7 is a cross sectional view showing an important part of a fourth embodiment of the semiconductor device according to the present invention.

Next, a description will be given of a fourth embodiment of the semiconductor device according to the present invention, by referring to FIG. 7. This fourth embodiment of the semiconductor device employs the first aspect of the present invention. FIG. 7 shows a cross section of the fourth embodiment of the semiconductor device. In FIG. 7, those parts which are the same as those corresponding parts in FIGS. 2 through 4 are designated by the same reference numerals, and a description thereof will be omitted.

A semiconductor device 203 shown in FIG. 7 is characterized in that a material 12 having a high thermal conductivity is formed to a predetermined thickness on the frame body 5, the upper lid member 7*a*, the lower lid member 7*b*, and the bottom surface of the substrate 2 excluding the part provided with the lower lid member 7*b*. The material 12 is formed on parts of the semiconductor device 203 exposed to the outside, so that the heat generated from the semiconductor element 1 is efficiently released outside the semiconductor device 203.

Figure 8:
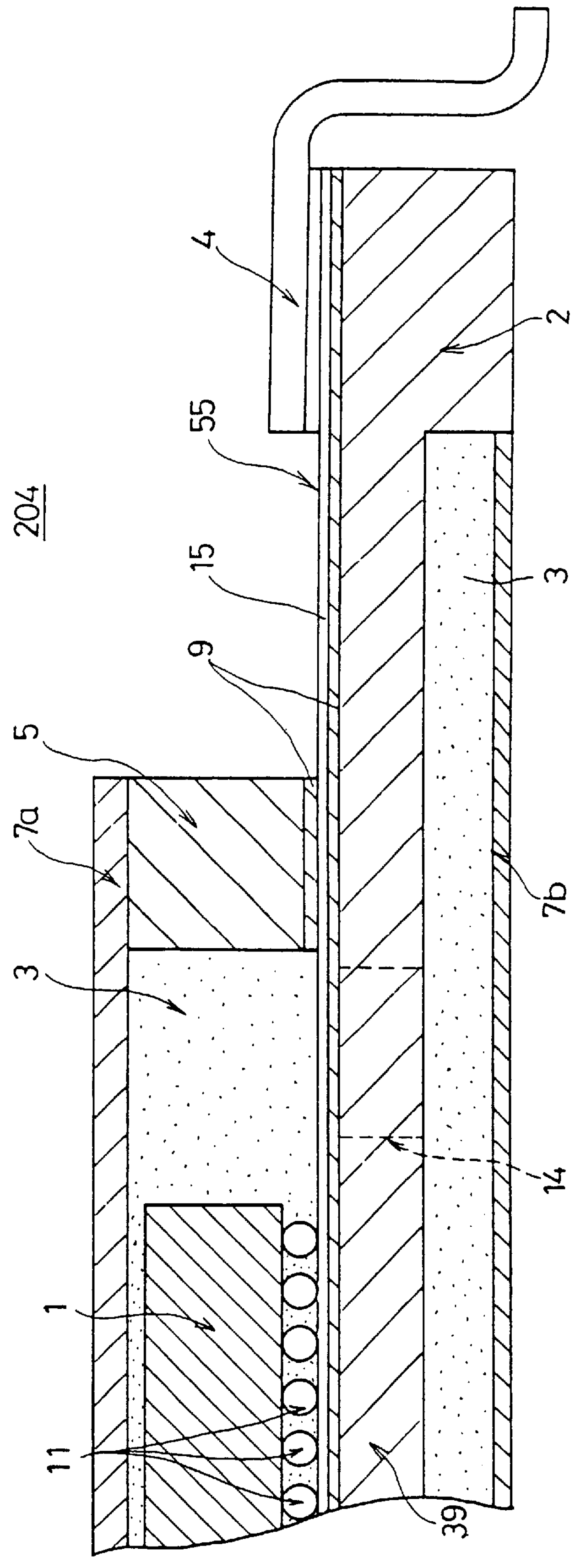
FIG. 8 is a cross sectional view showing an important part of a fifth embodiment of the semiconductor device according to the present invention.

FIG. 8 shows a cross section of a fifth embodiment of the semiconductor device according to the present invention. This fifth embodiment employs the first aspect of the present invention. In FIG. 8, those parts which are the same as those corresponding parts in FIGS. 2 through 4 are designated by the same reference numerals, and a description thereof will be omitted.

A semiconductor device 204 is characterized in that the electrical connections between the semiconductor element 1 and the multi-level circuit 55 are made by flip-chip bonding. For this reason, the multi-level circuit 55 extends on the top surface of the substrate 2 up to the position where the semiconductor element 1 is provided. In addition, the semiconductor element 1 is electrically connected to the multi-level circuit 55 using the bumps 11. According to this construction, it is possible to easily make the electrical connections between the semiconductor element 1 and the multi-level circuit 55 at a high density, even if the semiconductor element 1 has a large number of electrodes.

Figure 9:
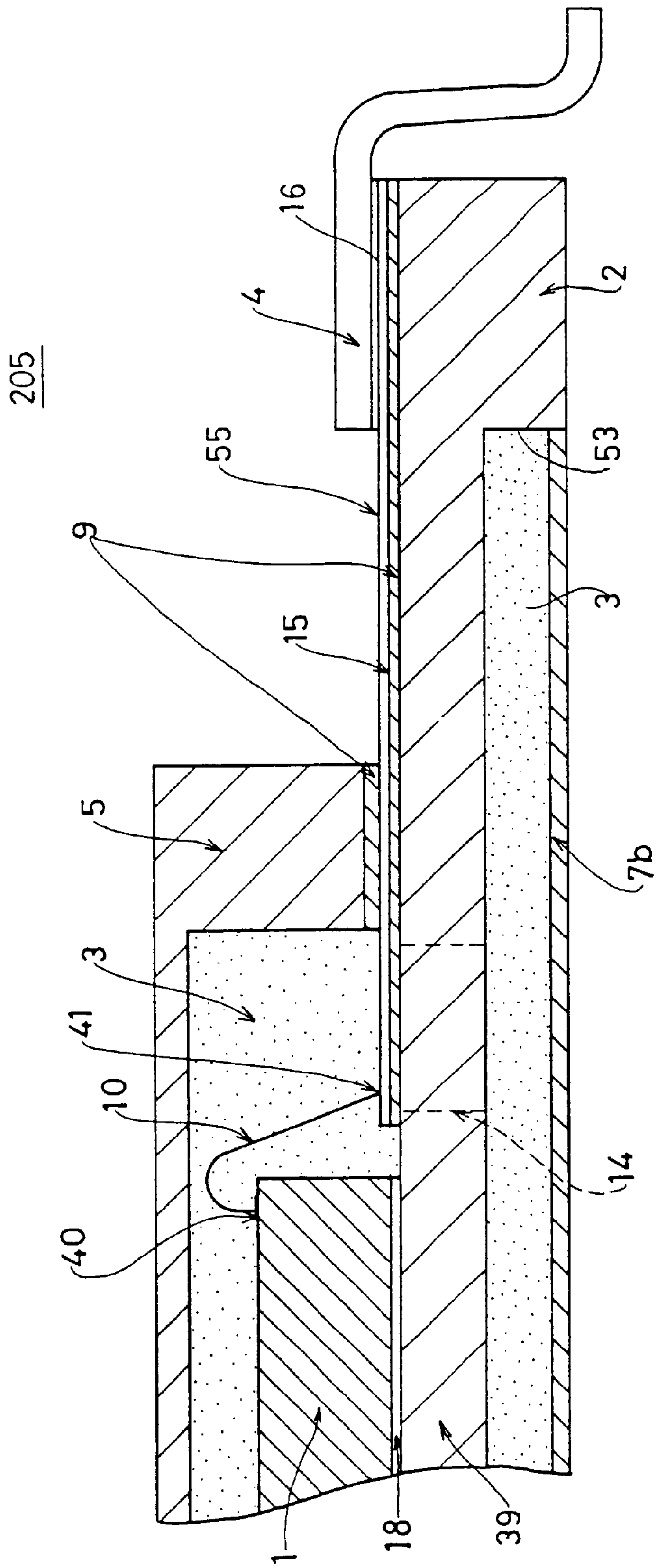
FIG. 9 is a cross sectional view showing an important part of a sixth embodiment of the semiconductor device according to the present invention.

FIG. 9 shows a cross section of a sixth embodiment of the semiconductor device according to the present invention. This sixth embodiment of the semiconductor device employs the first aspect of the present invention. In FIG. 9, those parts which are the same as those corresponding parts in FIGS. 2 through 4 are designated by the same reference numerals, and a description thereof will be omitted.

A semiconductor device 205 shown in FIG. 9 is characterized in that the frame body 5 integrally comprises the upper lid member, as compared to the first embodiment wherein the frame body 5 and the upper lid member 7*a* are independent parts. Although the frame body 5 shown in FIG. 9 integrally comprises the upper lid member and has an upside-down box shape, it is possible to easily form this frame body 5 by deformation processing or machining process because this frame body 5 is made of a metal material. In addition, unlike the first embodiment, this embodiment can simplify the production process of the semiconductor device 205 because it is unnecessary to carry out the process of bonding the frame body and the upper lid member. As described above with reference to the first embodiment, the first aspect of the present invention can use as the resin 3 a resin which does not include a mold release agent and has a high adhesive strength, and for this reason, the resin 3 also functions as an bonding material for bonding the frame body 5 to the substrate 2.

Figure 10:
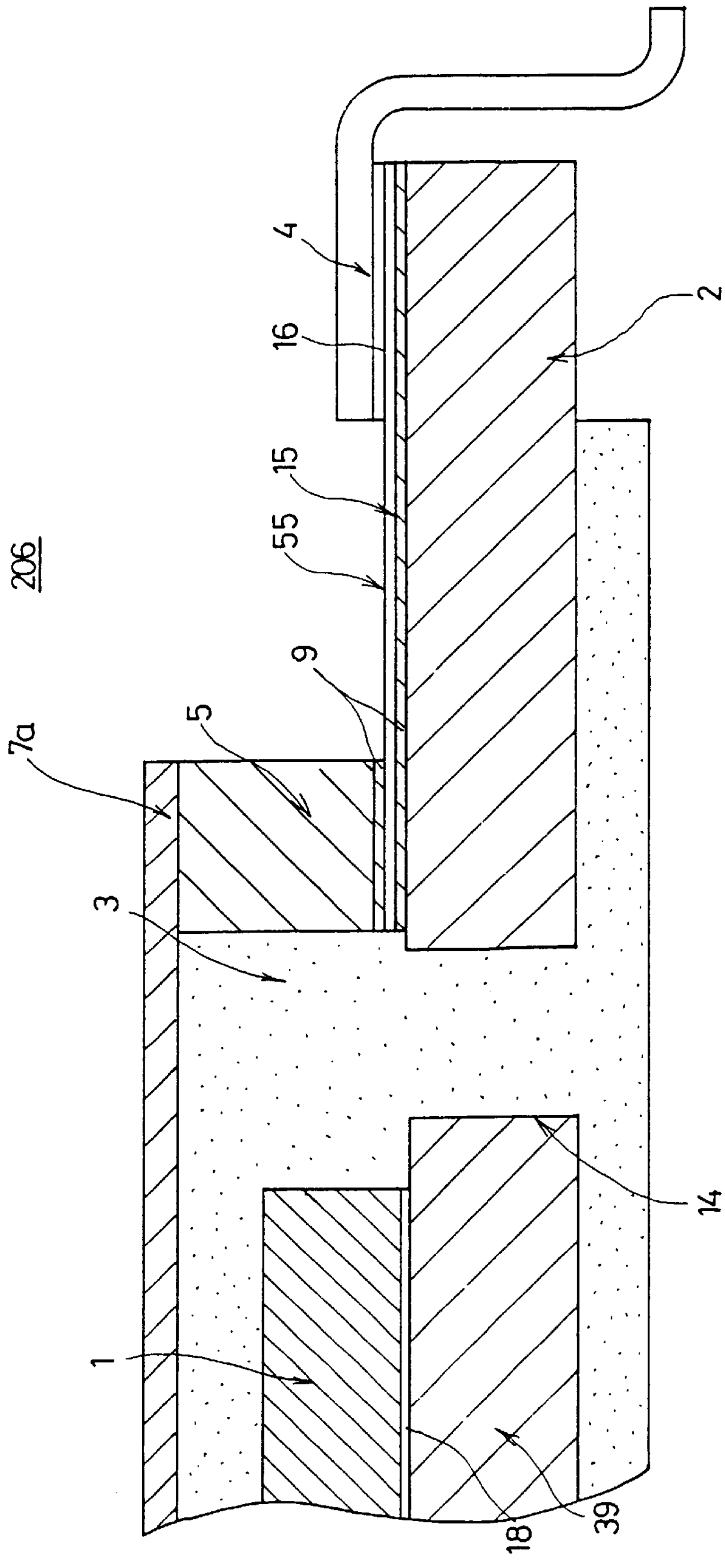
FIG. 10 is a cross sectional view showing an important part of a seventh embodiment of the semiconductor device according to the present invention.

FIG. 10 shows a cross section of a seventh embodiment of the semiconductor device according to the present invention. This seventh embodiment of the semiconductor device employs the first aspect of the present invention. In FIG. 10, those parts which are the same as those corresponding parts in FIGS. 2 through 4 are designated by the same reference numerals, and a description thereof will be omitted.

A semiconductor device 206 shown in FIG. 10 is characterized in that the resin filling recess 53 of the first embodiment is not provided. In other words, this embodiment shows that it is not essential to provide the resin filling recess 53. By not providing the resin filling recess 53, it is possible to improve the mechanical strength of the substrate 2. In addition, since it is unnecessary to form the resin filling recess 53, it is possible to facilitate the process of forming the substrate and accordingly reduce the production cost of the semiconductor device 206. In this embodiment, the resin gate holes 14 connect directly to a plunger pot of the mold that is used when filling the resin 3, and a projecting part of the resin 3 may be formed on the lower part of the substrate 2 as shown in FIG. 10. However, even if such a projecting part of the resin 3 is formed, this will not deteriorate the mounting characteristic of the semiconductor device 206.

Figure 11:
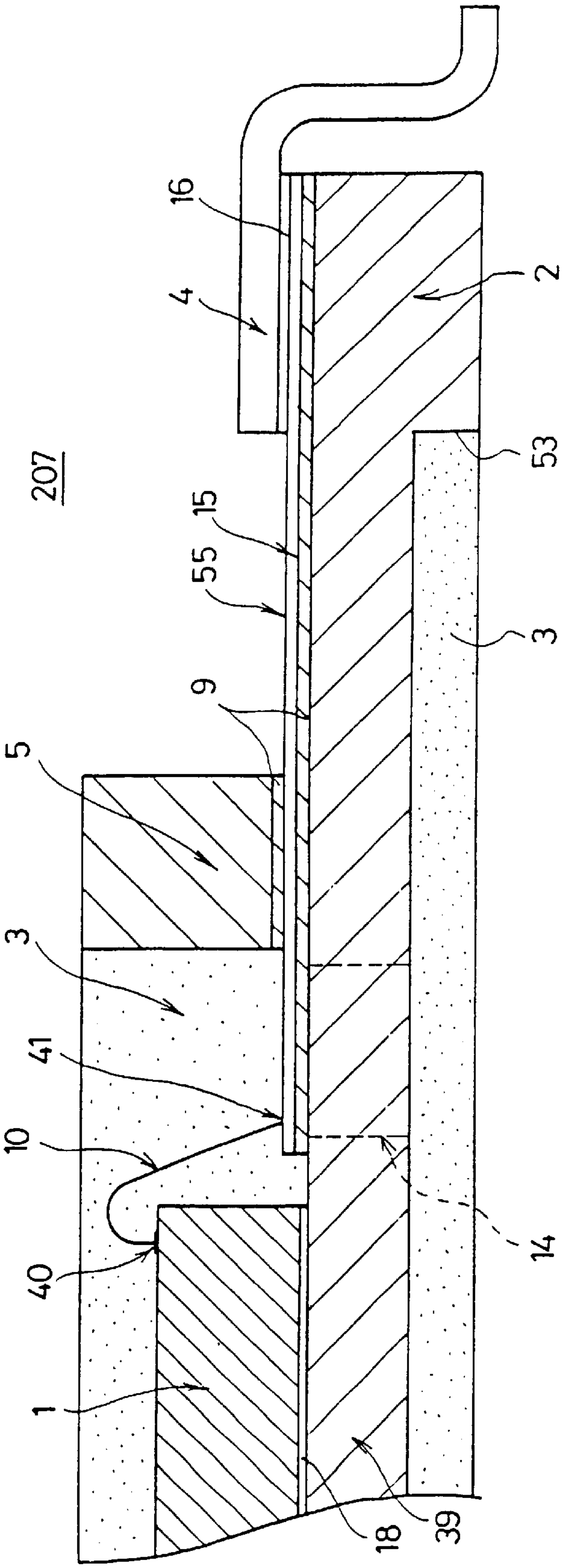
FIG. 11 is a cross sectional view showing an important part of an eighth embodiment of the semiconductor device according to the present invention.

FIG. 11 shows a cross section of an eighth embodiment of the semiconductor device according to the present invention. This eighth embodiment of the semiconductor device employs the first aspect of the present invention. In FIG. 11, those parts which are the same as those corresponding parts in FIGS. 2 through 4 are designated by the same reference numerals, and a description thereof will be omitted.

A semiconductor device 207 shown in FIG. 11 is characterized in that the upper lid member 7*a* and the lower lid member 7*b* of the first embodiment are not provided. As a result, it is possible to reduce the number of parts, and to eliminate the processes of bonding the upper lid member 7*a* to the frame body 5 and bonding the lower lid member 7*b* to the substrate 2. Therefore, the production cost of the semiconductor device 207 can be reduced, and the production process of the semiconductor device 207 can be simplified. Furthermore, it is possible to reduce the thickness of the semiconductor device 207 by an amount corresponding to the thicknesses of the upper and lower lid members 7*a* and 7*b*.

According to the semiconductor device 207, it is also possible to encapsulate the semiconductor element 1 by directly filling the resin 3 onto the substrate 2 via the resin gate holes 14 formed in the substrate 2. Hence, it is unnecessary to provide the cull part, the runner part, the gate part and the like in the molds as was required in the conventional case, and the kind and amount of the mold release agent may be selected without having to consider the mold release characteristic. As a result, it is possible to use as the resin 3 a resin having a high adhesive strength, and it is possible to improve the reliability of the semiconductor device 207 even when the size of the semiconductor device 207 is reduced. On the other hand, the exposed area of the resin 3 of the semiconductor device 207 increases compared to the other embodiments described above, and the mold release characteristic of the semiconductor device 207 becomes poorer compared to those of the embodiments described above. However, since it is unnecessary to provide the cull part, the runner part, the gate part and the like in the molds as was required in the conventional case, there is no need to take into consideration the mold release characteristic, and this eighth embodiment does not require an increased amount of mold release agent to be added to the resin 3.

Figure 12:
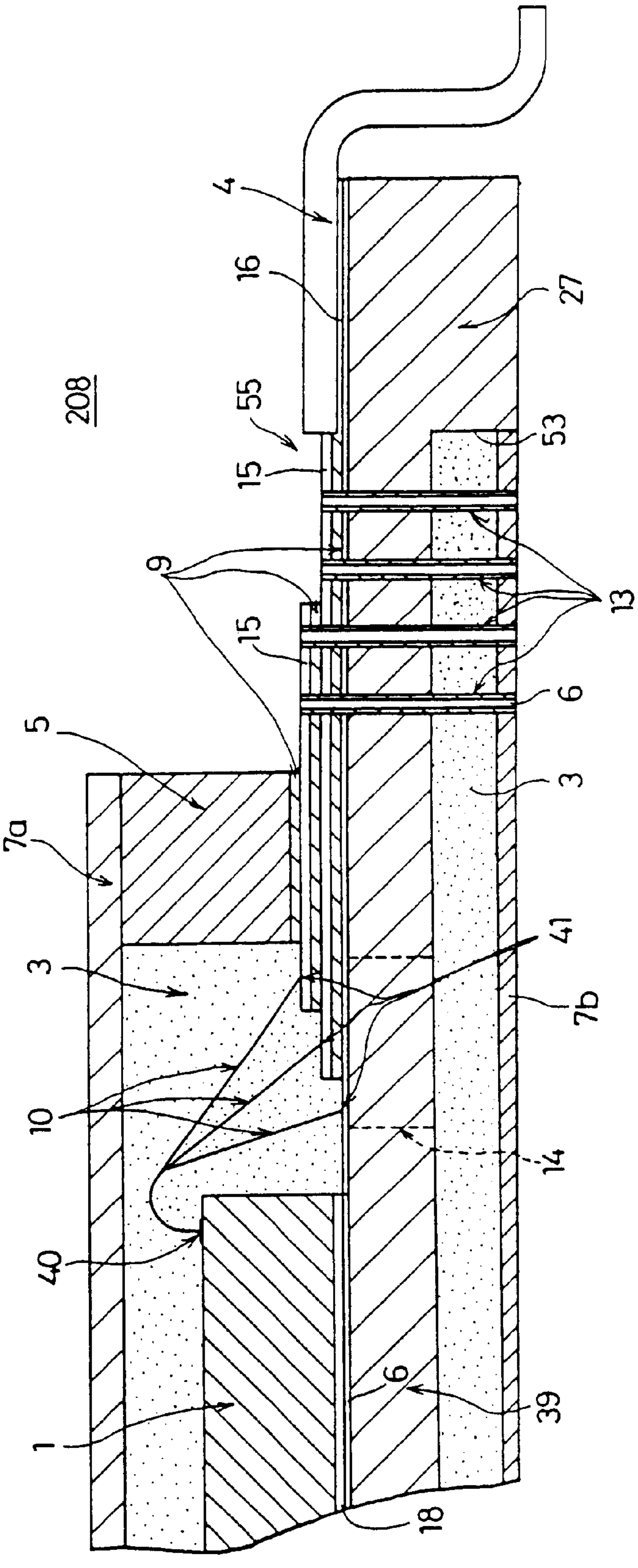
FIG. 12 is a cross sectional view showing an important part of a ninth embodiment of the semiconductor device according to the present invention.

FIG. 12 shows a cross section of a ninth embodiment of the semiconductor device according to the present invention. This ninth embodiment of the semiconductor device employs the first aspect of the present invention. In FIG. 12, those parts which are the same as those corresponding parts in FIGS. 2 through 4 are designated by the same reference numerals, and a description thereof will be omitted.

A semiconductor device 208 includes the multi-level circuit 55 that is made up of a glass epoxy substrate having 3 stacked wiring layers 15. The connections to the wiring layers 15 are made by vias 13. The via 13 is made up of a via hole which penetrates the layers of the multi-level circuit 55 and a conductor member provided inside the via hole so as to make electrical contact with one or more wiring layers 15. Hence, a connection can be made to each wiring layer 15 by the via 13. By making the electrical connections to the wiring layers 15 by the vias 13, it is possible to positively and easily make the necessary connections to the wiring layers 15, thereby improving the degree of freedom of wiring.

Figure 13:
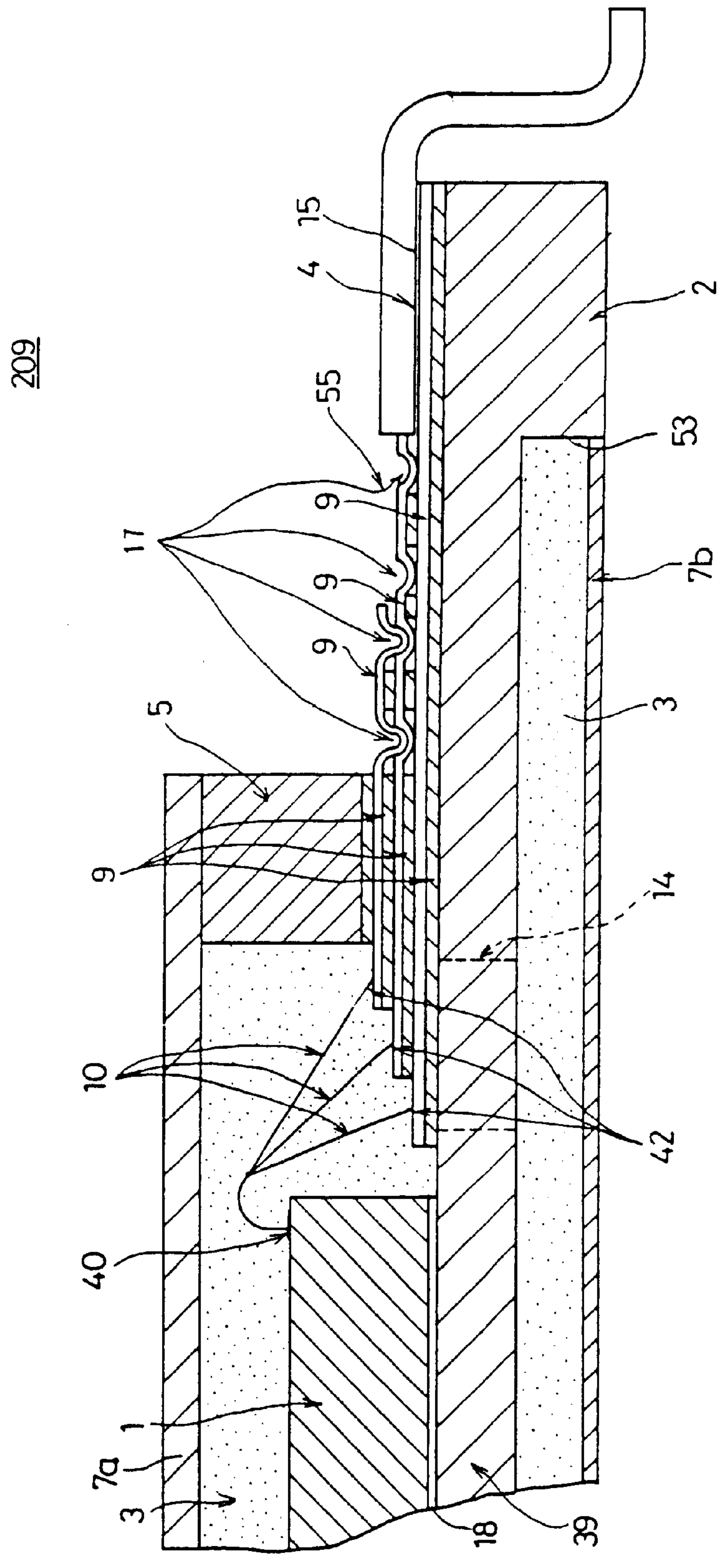
FIG. 13 is a cross sectional view showing an important part of a tenth embodiment of the semiconductor device according to the present invention.

FIG. 13 shows a cross section of a tenth embodiment of the semiconductor device according to the present invention. This tenth embodiment of the semiconductor device employs the first aspect of the present invention. In FIG. 13, those parts which are the same as those corresponding parts in FIGS. 2 through 4 are designated by the same reference numerals, and a description thereof will be omitted.

A semiconductor device 209 shown in FIG. 13 is characterized in that the connections to the wiring layers 15 of the multi-level circuit 55 are made by so-called mechanical vias 17. A description will be given of a method of forming the mechanical vias 17, by referring to FIGS. 21A and 21B.

Figure 21A:
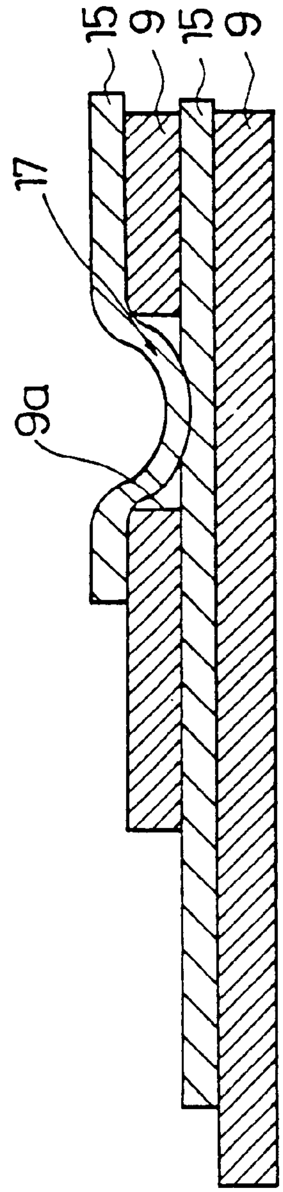
FIGS. 21A and 21B respectively are cross sectional views for explaining a method of producing a mechanical via.

FIG. 21A shows a case where 2 wiring layers 15 are connected by the mechanical via 17. The mechanical via 17 is obtained by subjecting the wiring layer 15 to a deformation processing to mechanically deform the wiring layer 15, so that the stacked wiring layers 15 are electrically connected. More particularly, the wiring layers 15 are made of a deformable metal material, and a hole 9*a* is formed in the insulator layer 9 at a position where the mechanical via 17 is to be formed. By pressing the wiring layer 15 by a jig such as a punch from above the hole 9*a*, the wiring layer 15 is deformed to make pressing contact (or joint) with the wiring layer 15 arranged below.

As described above, the mechanical via 17 is formed by the simple process of forming the hole 9*a* at a predetermined position of the insulator layer 9 and subjecting the wiring layer 15 to the deformation processing by use of the jig from above the hole 9*a*. Accordingly, it is possible to easily and positively connect the wiring layers 15.

Figure 21B:
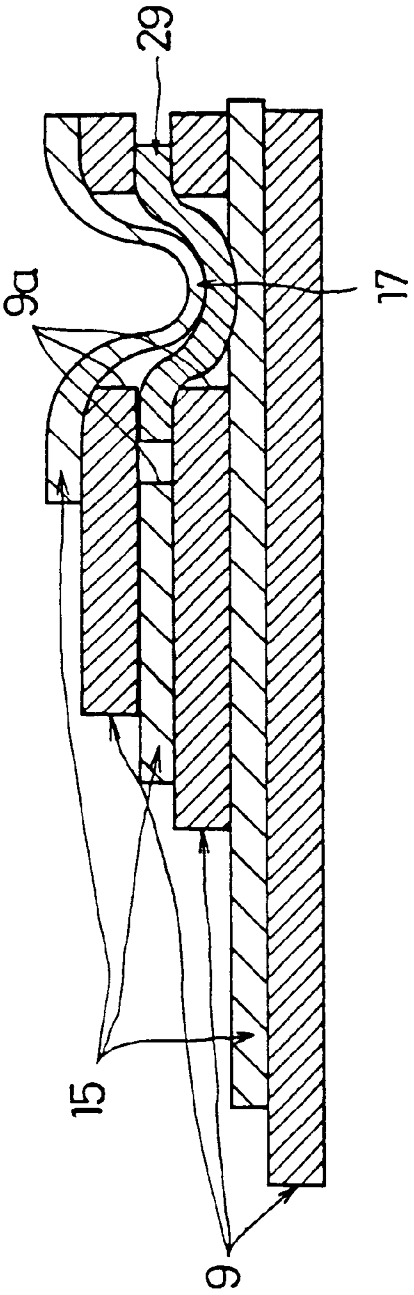

On the other hand, FIG. 21B shows a case where 3 wiring layers 15 are connected by the mechanical via 17. When the uppermost wiring layer 15 is to be connected to the lowermost wiring layer 15, the load applied on the uppermost wiring layer 15 will be too large when the uppermost wiring layer 15 is simply deformed, and in this case, cracks may be generated and there is a possibility that the electrical contact among the wiring layers 15 will not be made positively.

For this reason, a metal layer 29 may interposed between the uppermost wiring layer 15 and the lowermost wiring layer 15 as shown in FIG. 21B, so that the uppermost wiring layer 15 connects to the lowermost wiring layer 15 via the metal layer 29. According to the structure shown in FIG. 21B, it is possible to reduce the load applied on the uppermost wiring layer 15, and positively realize the electrical connection of the wiring layers 15.

Figure 22A:
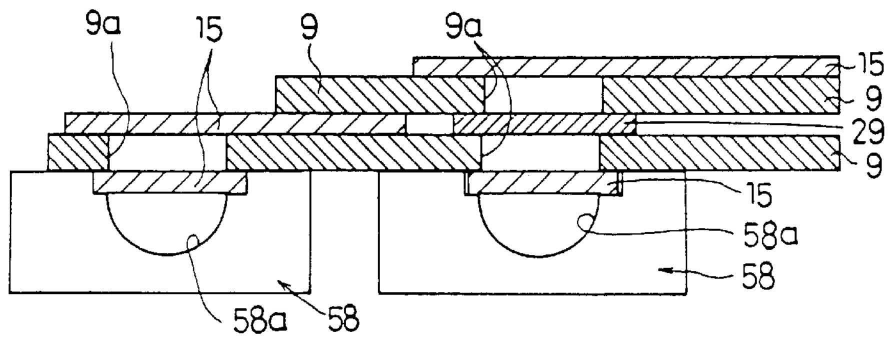
FIGS. 22A, 22B and 22C respectively are cross sectional views for explaining a method of producing a mechanical bump.
Figure 22B:
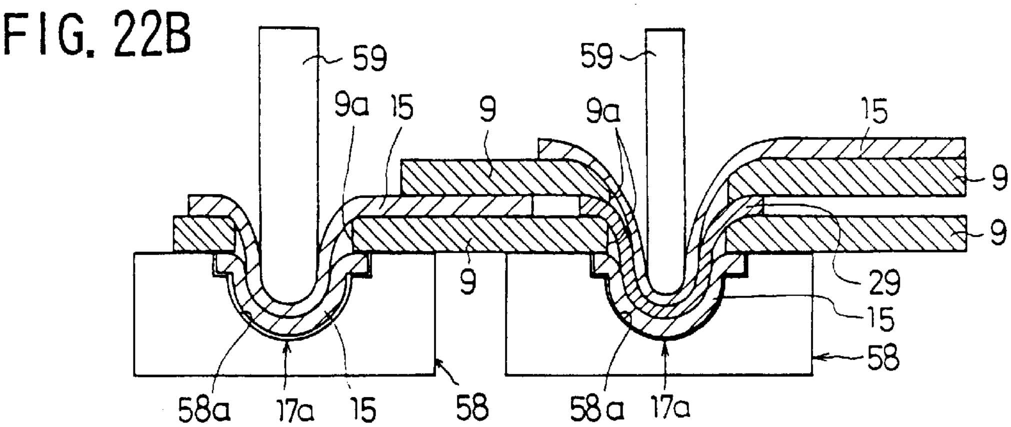
Figure 22C:
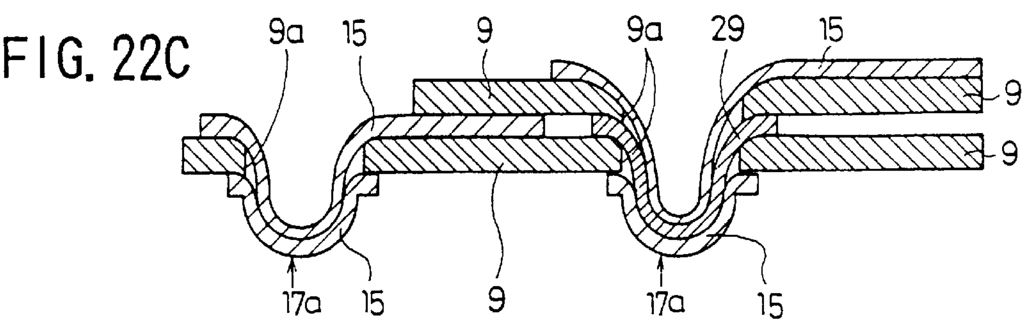

FIGS. 22A through 22C are diagrams for explaining a method of forming mechanical bumps 17*a* by applying the method of forming the mechanical via 17 described above with reference to FIGS. 21A and 21B. In the case of the mechanical via 17, it is sufficient to connect the wiring layers 15 of the multi-level circuit 55, and for this reason, the deformation of the wiring layers 15 is set small. However, by setting the deformation of the wiring layers 15 large so that the deformed wiring layers 15 greatly project from the multi-level circuit 55, it is possible to use this projecting part as an external connecting terminal. In other words, it is possible to use this projecting part similarly to the solder bump or the like. In this embodiment, the wiring layers 15 are greatly deformed so as to project from the multi-level circuit 55, and the projecting part is referred to as the mechanical bump 17*a* which is used as the external connecting terminal.

In order to form the mechanical bump 17*a*, the multi-level circuit 55 is formed by alternately stacking the insulator layers 9 having holes 9*a* and the wiring layers 15 made of a deformable metal material. This multi-level circuit 55 is placed on a mold 58 which is used for forming a bump, as shown in FIG. 22A. The mold 58 has a cavity 58*a* corresponding to the shape of the bump which is to be formed. The multi-level circuit 55 is placed on the mold 58 at a position such that each cavity 58*a* confronts the corresponding hole 9*a* in each insulator layer 9.

When the multi-level circuit 55 is placed on the mold 58 as described above, punches 59 are lowered towards the mold 58 as shown in FIG. 22B, so as to deform the wiring layers 15. As a result, one or more wiring layers 15 project within the cavity 58*a* of the mold 58 via the hole 9*a* in each insulator layer 9. The one or more wiring layers 15 projecting within the cavity 58*a* are formed into a semi-spherical shape, similarly to the shape of the cavity 58*a*. In addition, the projecting wiring layers 15 become electrically connected.

FIG. 22C shows the multi-level circuit 55 having the mechanical bumps 17*a* formed in the above described manner. By deforming the wiring layers 15 to form the mechanical bump 17*a* which is used as the external connecting terminal, it is possible to form a bump by a simple process similarly as in the case of the mechanical via 17. In addition, the mechanical via 17 and the mechanical bump 17*a* can respectively be formed in one process, and the processing efficiency is satisfactory.

Figure 14:
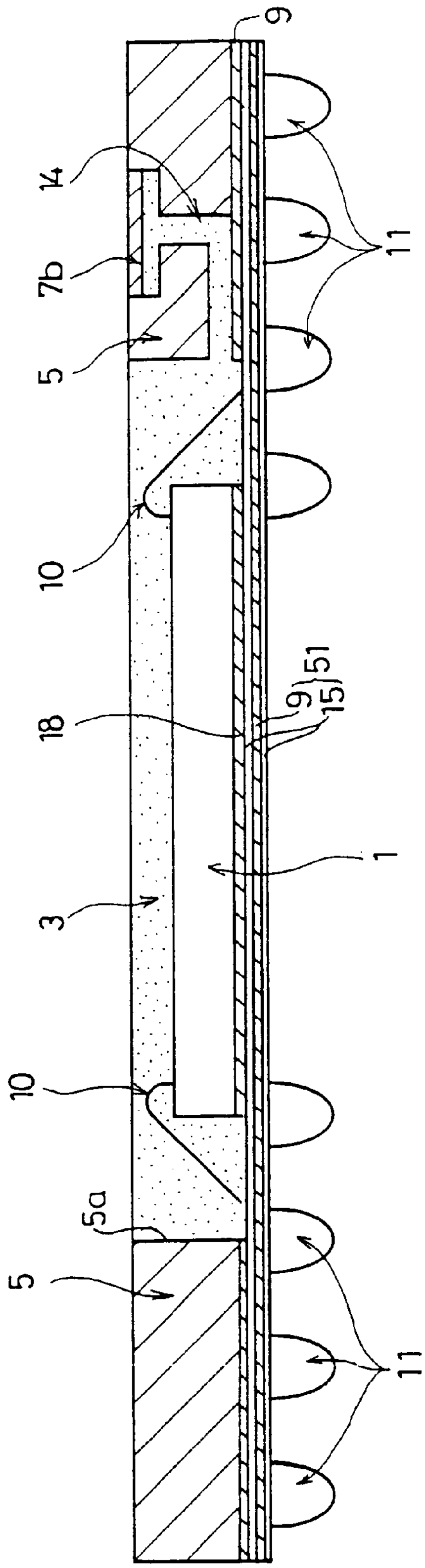
FIG. 14 is a cross sectional view showing an important part of an eleventh embodiment of the semiconductor device according to the present invention.

FIG. 14 shows a cross section of an eleventh embodiment of the semiconductor device according to the present invention. This eleventh embodiment of the semiconductor device employs the first aspect of the present invention. In FIG. 14, those parts which are the same as those corresponding parts in FIGS. 2 through 4 are designated by the same reference numerals, and a description thereof will be omitted.

A semiconductor device 210 shown in FIG. 14 is characterized in that no substrate 2 is provided and the frame body 5 is used as the package. More particularly, the insulator layers 9 are made of a flexible resin, and the wiring layers 15 and the insulator layers 9 are alternately bonded to form a flexible printed circuit (FPC) 51. The semiconductor element 1 is die-bonded on this FPC 51. The wires 10 are provided between the semiconductor element 1 and predetermined positions of the FPC 51, and the semiconductor element 1 and the FPC 51 are electrically connect via the wires 10. In addition, the bumps 11 which are made up of solder or the like and used as external connecting terminals are formed at predetermined positions on the lower part of the FPC 51.

The frame body 5 shown in FIG. 14 is slightly larger than that of the first embodiment. In addition, the frame body 5 is arranged on top of the FPC 51, and is fixed to the FPC 51 by the insulator layer 9 which also functions as an adhesive. In addition, the resin gate holes 14 are formed in the side wall of the frame body 5. The resin gate hole 14 has an approximately L-shaped cross section as shown in FIG. 14. One end of the resin gate hole 14 opens to a resin filling part 5*a* which is an internal space of the frame body 5, and the other end of the resin gate hole 14 opens at the top surface of the frame body 5.

The resin 3 is filled into the resin filling part 5*a*, that is, into the internal space of the frame body 5, via the resin gate holes 14. Accordingly, it is also possible in this embodiment to fill the resin 3 directly via the resin gate holes 14, and there is no need to provide the cull part, the runner part, the gate part and the like in the mold. As a result, it is possible to select the kind and amount of mold release agent to be added to the resin 3 without taking the mold release characteristic into much consideration. Consequently, it is possible to use as the resin 3 a resin having a high adhesive strength and improve the reliability of the semiconductor device 210.

In addition, according to this embodiment, the semiconductor device 210 is made up of the semiconductor element 1, the frame body 5 and the FPC 51, and has an extremely simple construction. Hence, the number of parts is small and the production cost of the semiconductor device 210 can be reduced. The lid member 7*b* prevents the resin 3 from leaking outside.

Figure 15:
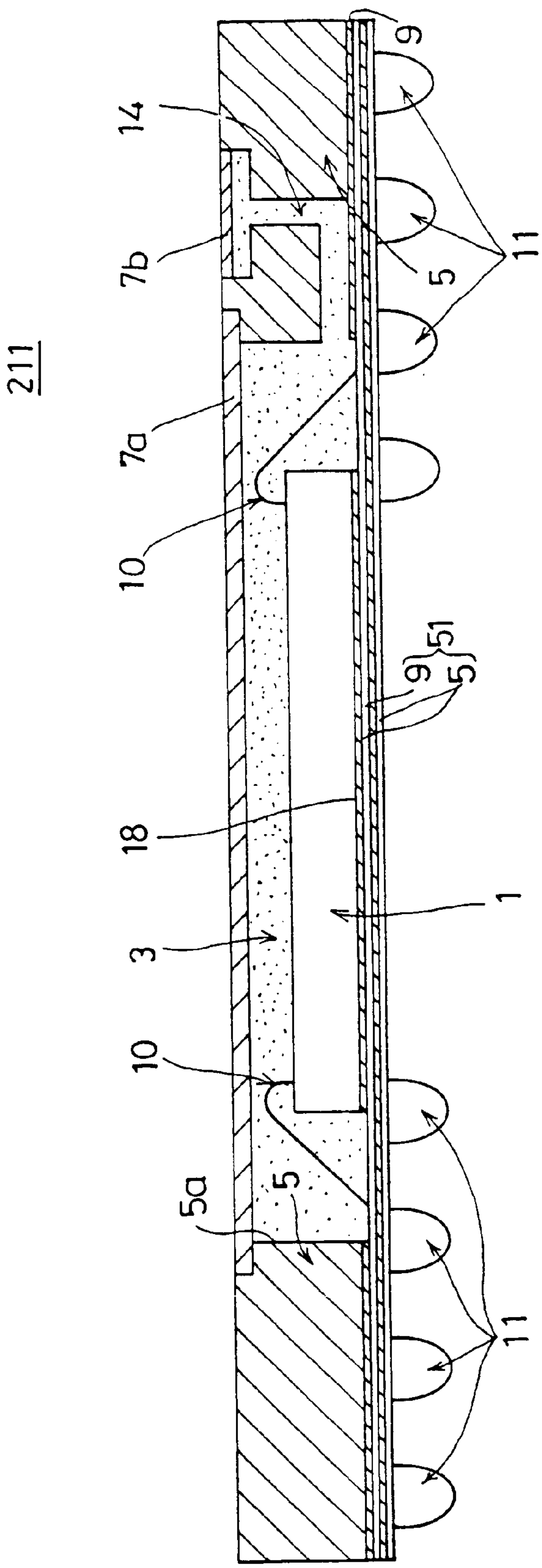
FIG. 15 is a cross sectional view showing an important part of a twelfth embodiment of the semiconductor device according to the present invention.

FIG. 15 shows a cross section of a twelfth embodiment of the semiconductor device according to the present invention. This twelfth embodiment of the semiconductor device employs the first aspect of the present invention. In FIG. 15, those parts which are the same as those corresponding parts in FIGS. 2 through 4 and 14 are designated by the same reference numerals, and a description thereof will be omitted.

A semiconductor device 211 shown in FIG. 15 has a basic construction similar to that of the eleventh embodiment, but is characterized in that the upper lid member 7*a* is provided above the resin filling part 5*a*. By providing the upper lid member 7*a* above the resin filling part 5*a*, it is possible to improve the mold release characteristic because the contact area between the rein 3 and the mold becomes small when using the mold and filling the resin 3. In addition, compared to the eleventh embodiment, it is possible to reduce the amount or eliminate the need for the mold release agent that is added to the resin 3, thereby improving the adhesive strength of the resin 3 and improving the reliability of the semiconductor device 211.

Next, a description will be given of embodiments of a method of producing the semiconductor device according to the present invention, by referring to FIGS. 16 through 20. These embodiments of the method employ the first aspect of the present invention.

Figure 16A:
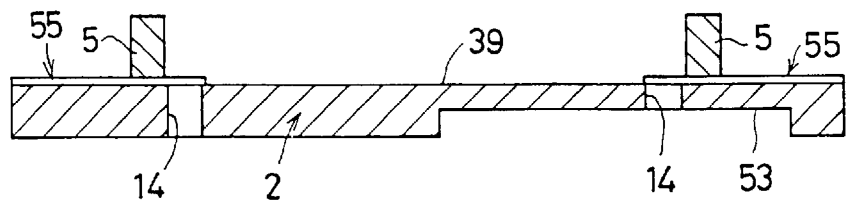
FIGS. 16A, 16B, 16C, 16D, 16E and 16F respectively are cross sectional views for explaining a first embodiment of a method of producing the semiconductor device according to the present invention.
Figure 16B:
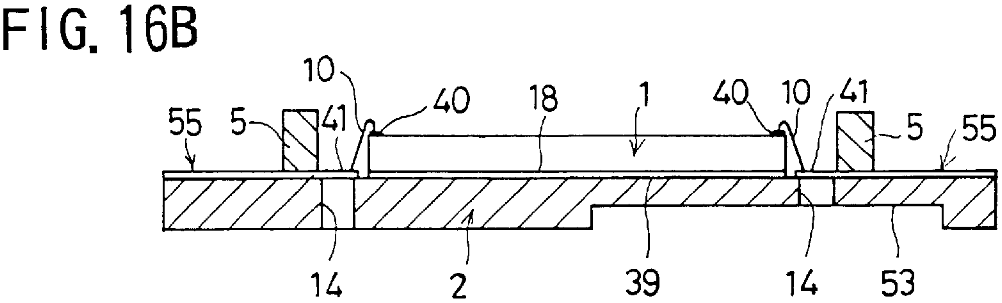
Figure 16C:
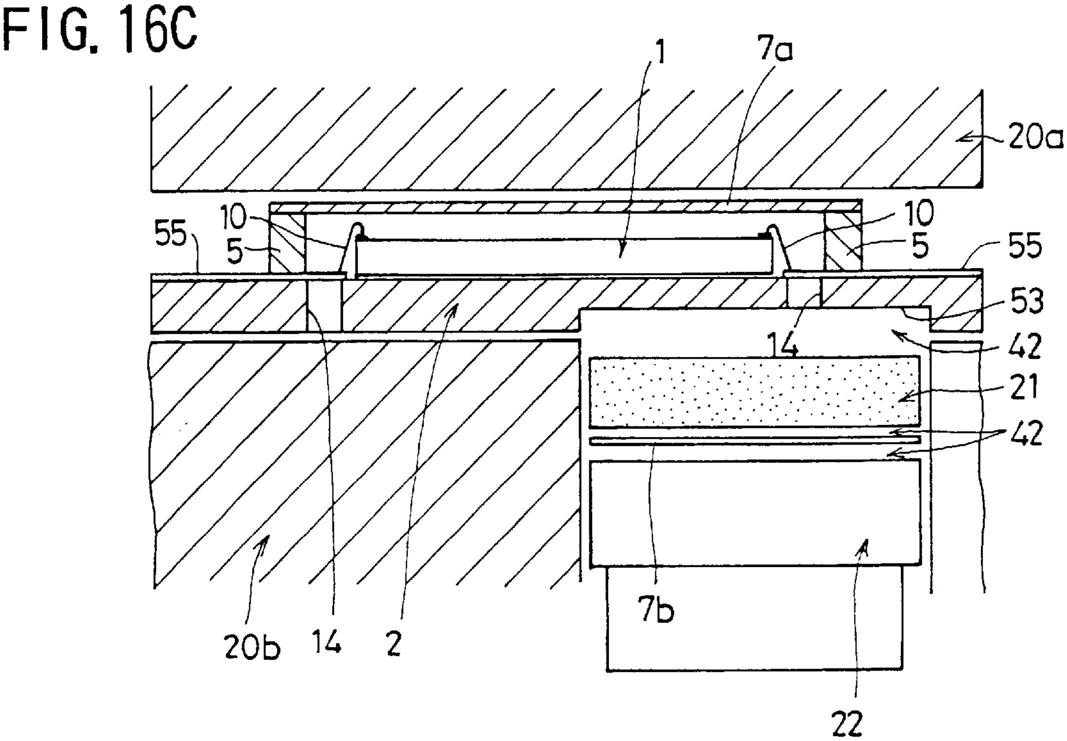
Figure 16D:
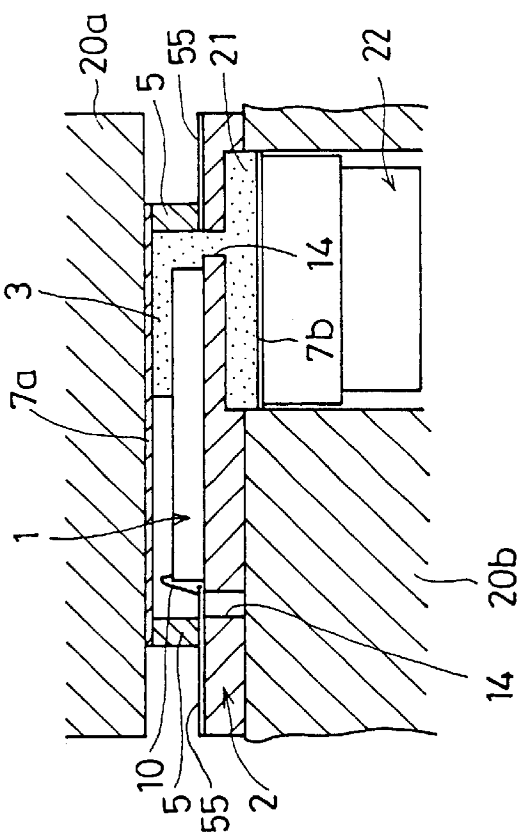
Figure 16F:
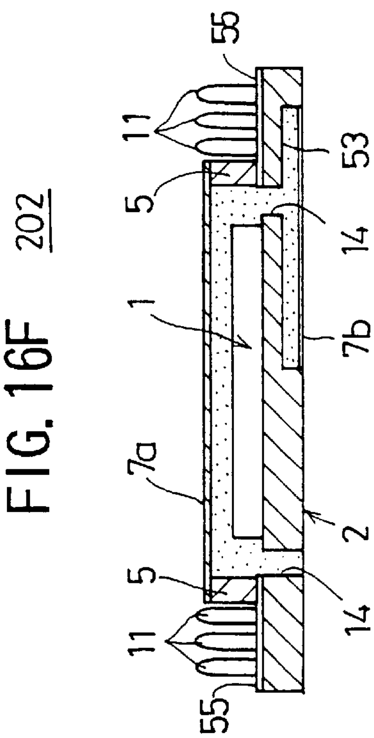
Figure 16E:
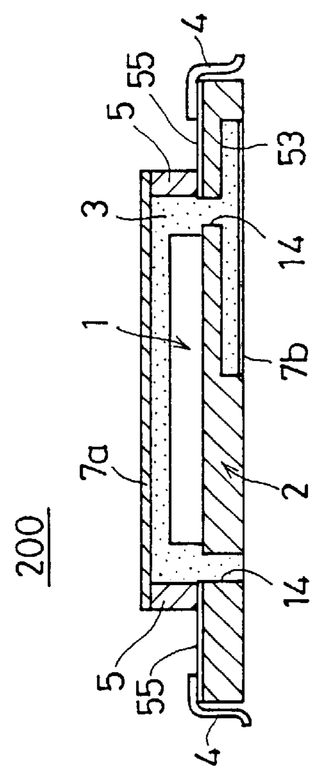
Figure 17:
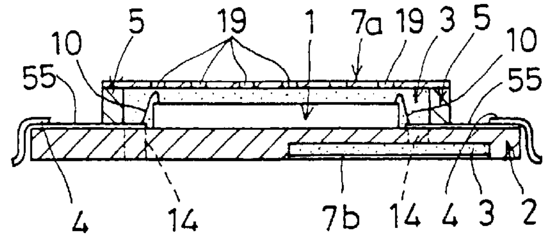
FIG. 17 is a cross sectional view showing a semiconductor device produced by a second embodiment of the method of producing the semiconductor device according to the present invention.

FIGS. 16 and 17 are cross sectional views for explaining a first embodiment of the method according to the present invention. This first embodiment of the method produces the semiconductor device 200 described above. In this embodiment of the method and the other embodiments of the method described later, the process of supplying the resin 3 into the resin gate holes 14 so as to encapsulate the semiconductor element 1 by the resin 3 is basically the same, and the description of this process will be omitted in the latter embodiments of the method.

In order to produce the semiconductor device 200, the substrate 2 is first formed as shown in FIG. 16A. More particularly, the resin filling recess 53 is formed in a metal member which becomes the substrate 2, and the resin gate holes 14 are formed at positions within the resin filling recess 53 and outside the resin filling recess 53. A plurality of resin gate holes 14 are formed in FIG. 16A, but it is possible to form only one resin gate hole 14. When a plurality of resin gate holes 14 are provided, it is possible to improve the efficiency with which the resin 3 is filled in a resin filling process which will be described later. More particularly, if 4 resin gate holes 14 are provided and the resin 3 is filled via 1 resin gate hole 14, it is possible to smoothly fill the resin 3 by using the remaining 3 resin gate holes 14 as air vents, so that the efficiency with which the resin 3 is filled is improved.

When the process of forming the resin filling recess 53 and the resin gate holes 14 ends, the multi-level circuit 55 and the frame body 5 are provided on top of the substrate 2. The multi-level circuit 2 is produced in advance by an independent process, and the wiring layers 15 are already exposed at positions where the wires 10 connect and at positions where the outer leads 4 are arranged.

When the process of forming the substrate 2 ends, the semiconductor element 1 is mounted on the die-pad portion 39 of the substrate 2 via the die-bond layer 18, as shown in FIG. 16B. In addition, the wires 10 are provided between the electrode pads 40 on the top surface of the semiconductor element 1 and the multi-level circuit 55. The wires 10 are bonded using a known wire-bonding machine. As a result, the semiconductor element 1 and the multi-level circuit 55 are electrically connected.

When the process of mounting the semiconductor element 1 ends, the substrate 2 mounted with the semiconductor element 1 is loaded into molds so as to carry out a resin filling process. FIG. 16C is a cross sectional view for explaining the resin filling process.

When the process of mounting the semiconductor element 1 ends, the upper lid member 7*a* is provided on top of the frame body 5 and the substrate 2 in this state is placed between the upper and lower molds 20*a* and 20*b*. In this loaded position of the substrate 2 between the upper and lower molds 20*a* and 20*b*, the upper mold 20*a* confronts the upper lid member 7*a* and the lower mold 20*b* confronts the bottom surface of the substrate 2. A plunger 22 and a plunger pot 42 which form a resin filling mechanism are provided in the lower mold 20*b* for the purpose of filling the resin 3.

The plunger 22 and the plunger pot 42 are positioned so as to confront the resin filling recess 53 formed in the substrate 2. In addition, the resin filling recess 53 and the plunger pot 42 have the same area and shape in the plan view. Hence, in the state where the substrate 2 is loaded between the upper and lower molds 20*a* and 20*b*, the resin filling recess 53 and the plunger pot 42 communicate to form a single space. In other words, the resin filling recess 53 also forms a part of the plunger pot 42. Furthermore, a resin tablet 21 which becomes the resin 3 is loaded above the plunger 22, and the lower lid member 7*b* is interposed between the resin tablet 21 and the plunger 22.

When the substrate 2 is loaded between the upper and lower molds 20*a* and 20*b*, the plunger 22 is then raised as shown in FIG. 16D while heating the resin tablet 21. As a result, the melted resin tablet 21, that is, the melted resin 3, passes through the resin filling recess 53 and the resin gate holes 14 and reaches the side of the substrate 2 provided with the semiconductor element 1. Hence, the resin 3 fills the space defined by the frame body 5 and the upper lid member 7*a* and surrounding the semiconductor element 1.

According to this embodiment of the method, it is possible to encapsulate the semiconductor element 1 by the resin 3 by directly filling the resin to the encapsulating position of the substrate 2 via the resin gate holes 14 formed in the substrate 2. In addition, it is possible to reduce the contact area between the resin 3 and the upper and lower molds 20*a* and 20*b*, because passages within the molds such as the cull part, the runner part and the gate part which were conventionally provided for passing the resin 3 are unnecessary in this embodiment. Furthermore, the plunger pot 42 within the upper and lower molds 20*a* and 20*b* through which the resin 3 passes has a large planar area, thereby making it easy for the resin 3 to flow. For this reason, it is possible to select the kind and amount of mold release agent to be added to the resin 3, without taking the mold release characteristic into consideration. Therefore, it is possible to use as the resin 3 a resin having a high adhesive strength, and the reliability of the semiconductor device 200 can be improved even when the size of the semiconductor device 200 is reduced.

On the other hand, since the resin filling recess 53 and the plunger pot 42 formed in the lower mold 20*b* communicate to form a single space, it is possible to prevent the resin 3 from leaking and smoothly introduce the resin 3 into the resin gate holes 14. Moreover, by providing the lower lid member 7*b* between the resin tablet 21 and the plunger 22 in advance, it is possible to close the resin filling recess 53 by the lower lid member 7*b* at the same time when the filling of the resin 3 ends. Hence, this method is simpler and easier compared to the method of carrying out an independent process to mount the lower lid member 7*b*.

When the above resin filling process ends, an external terminal forming process is carried out to provide external connecting terminals on the outer side of the multi-level circuit 55. FIG. 16E shows a case where the outer leads 4 are provided as the external connecting terminals, and FIG. 16F shows a case where the bumps 11 are provided as the external connecting terminals.

Next, a description will be given of a second embodiment of the method for producing a semiconductor device shown in FIGS. 17 and 18 having a construction such that the moisture included in the resin 3 can be eliminated.

The basic construction of the semiconductor device shown in FIG. 17 is the same as that of the semiconductor device 200 described above with reference to FIGS. 2 through 4. However, in the case of the semiconductor device shown in FIG. 17, a plurality of through holes 19 are formed in the upper lid member 7*a*.

Figure 18A:
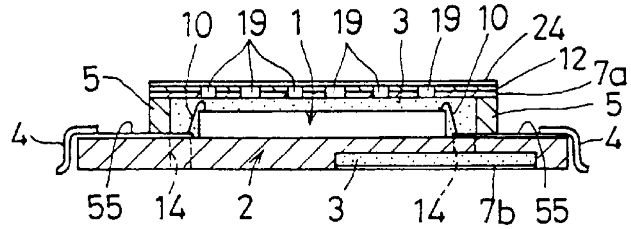
FIG. 18A is a cross sectional view for explaining the second embodiment of the method.

When producing the semiconductor device shown in FIG. 17, the plurality of through holes 19 are formed in the upper lid member 7*a*, and a mold separation film 24 is formed on the upper lid member 7*a*. Such an upper lid member 7*a* having the through holes 19 and the mold separation film 24 is used to produce the semiconductor device shown in FIG. 17 by carrying out the processes described above in conjunction with FIGS. 15 and 16. FIG. 18A shows the semiconductor device which is produced in this manner. In the case of the semiconductor device shown in FIG. 18A, a material 12 having a high thermal conductivity is arranged between the upper lid member 7*a* and the mold separation film 24.

During the production stage of the semiconductor device, the through holes 19 in the upper lid member 7*a* are closed by the mold separation film 24 which is arranged on the upper lid member 7*a*, and the resin 3 is prevented from leaking to the outside via the through holes 19 when the resin filling process is carried out. In addition, a satisfactory mold release characteristic is obtained after the resin filling process because the mold separation film 24 makes contact with the upper mold 20*a*.

Figure 18B:
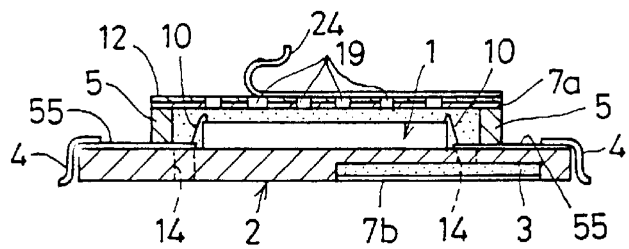
FIGS. 18B and 18C respectively are cross sectional views for explaining the mounting of the semiconductor device shown in FIG. 18A onto a mounting substrate.
Figure 18C:
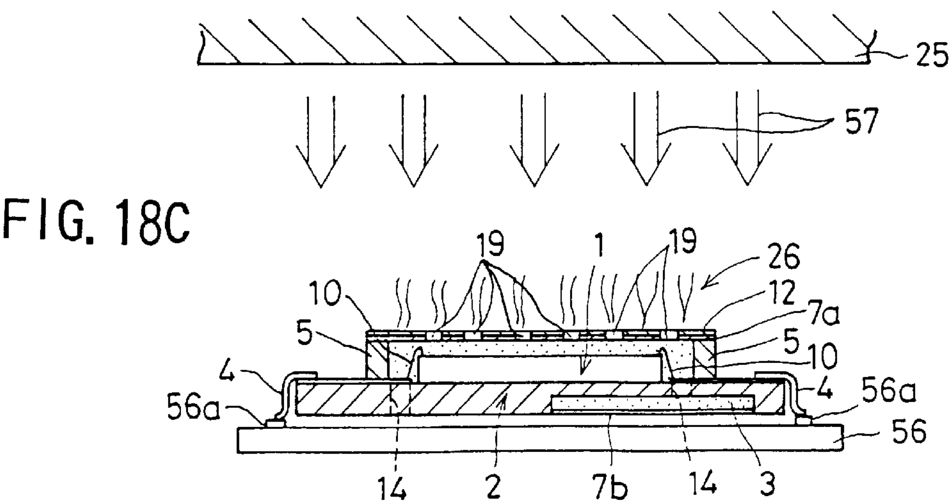

When mounting the semiconductor device shown in FIG. 18A on a mounting substrate 56, the mold separation film 24 on the upper lid member 7*a* is removed as shown in FIG. 18B. Thereafter, in order to solder the outer leads 4 onto terminals 56*a* formed on the mounting substrate 56 as shown in FIG. 18C, the semiconductor device is loaded into a reflow chamber 25 to subject the semiconductor device to heat or infrared ray 57, so as to melt the solder (not shown) provided at the connecting positions of the outer leads 4 and the terminals 56*a*.

Due to the heating process carried out within the reflow chamber 25, the moisture included within the resin 3 becomes water vapor 26 and escapes outside the semiconductor device via the through holes 19 in the upper lid member 7*a*. Because the moisture included within the resin 3 is eliminated, it is possible to prevent corrosion from being generated at the electrode pads 40, the wires 10 and the wiring layers 15. In addition, since the through holes 19 are provided, it is possible to prevent cracks from being formed in the resin due to the water vapor 26 that is generated during the heating process, thereby making it possible to improve the reliability of the semiconductor device.

FIGS. 19A through 19D respectively are cross sectional views for explaining a third embodiment of the method of producing the semiconductor device according to the present invention. This third embodiment of the method employs the plate mold technique using a plate 23 during the resin filling process.

Figure 19A:
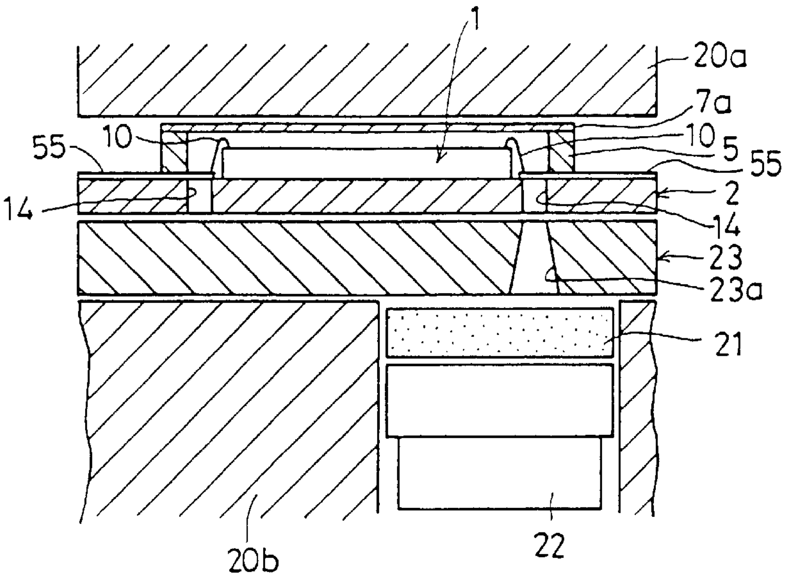
FIGS. 19A, 19B, 19C and 19D respectively are cross sectional views for explaining a third embodiment of the method of producing the semiconductor device according to the present invention.

When producing the semiconductor device employing the plate mold technique, the substrate 2 is loaded between the upper and lower molds 20*a* and 20*b* in a state where a plate 23 is interposed between the substrate 2 and the lower mold 20*b* as shown in FIG. 19A. This plate 23 includes a resin supplying hole 23*a* having a truncated cone shape. The lower end of the resin supplying hole 23*a* confronts the resin filling mechanism formed in the lower mold 20*b*, and the upper end of the resin supplying hole 23*a* confronts the resin gate hole 14 formed in the substrate 2. In this state, when the plunger 22 is raised while heating the resin tablet 21, the melted resin 3 passes through the resin supplying hole 23*a* in the plate 23 and reaches the resin gate hole 14 in the substrate 2. Then, the melted resin 3 passes through the resin gate hole 14 and reaches the side of the substrate 2 provided with the semiconductor element 1, so as to encapsulate the semiconductor element 1.

Figure 19B:
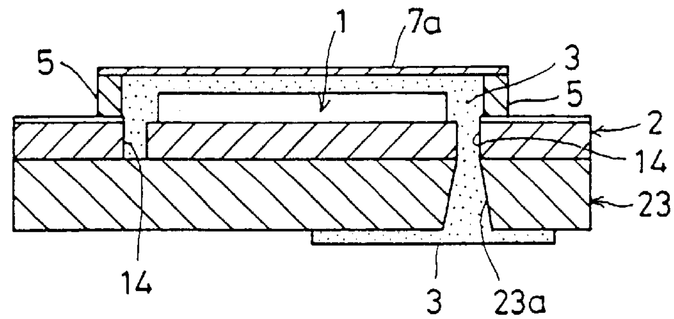

FIG. 19B shows a state where the resin filling process has ended and the substrate 2 is removed from the upper and lower molds 20*a* and 20*b*. In this state, the resin 3 continuously fills the resin supplying hole 23*a* and the resin gate hole 14, and the plate 23 is maintained in the state making contact with the bottom part of the substrate 2.

Figure 19C:
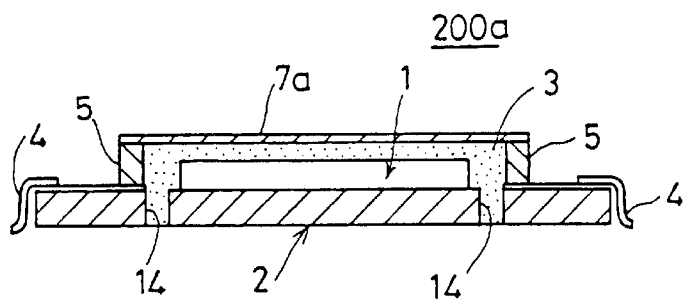
Figure 19D:
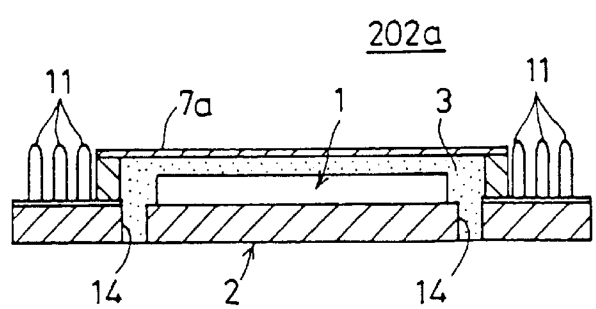

Next, the plate 23 is removed from the substrate 2, and a process of forming the external connecting terminals is carried out thereafter so as to obtain a semiconductor device 200*a* shown in FIG. 19C or a semiconductor device 202*a* shown in FIG. 19D. When the semiconductor device is produced using the plate mold technique as described above, it is unnecessary to provide a resin filling recess in the substrate 2 as in the case of the semiconductor device 206 described above in conjunction with FIG. 10. For this reason, it is possible to simplify the process of forming the substrate 2, and the mechanical strength of the substrate 2 can be improved. In addition, unlike the semiconductor device 206 shown in FIG. 10, the resin 3 will not remain at the bottom part of the substrate 2, and the excess resin 3 remains on the side of the plate 23 as a residual resin part. As a result, it is possible to absorb the inconsistency in the volume of the resin tablet 21 by the residual resin part.

FIGS. 20A through 20E are cross sectional views for explaining a fourth embodiment of the method of producing the semiconductor device according to the present invention. This embodiment of the method is characterized in that the resin table 21 is formed in advance, and the substrate 2 is interposed between the upper and lower molds 20*a* and 20*b* after loading this resin tablet 21 into a resin filling recess 53 formed in the substrate 2.

Figure 20A:
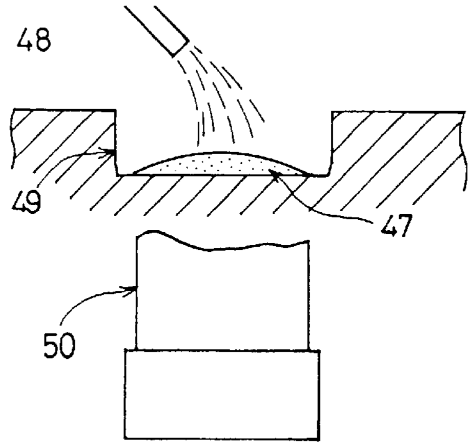
FIGS. 20A, 20B, 20C, 20D and 20E respectively are cross sectional views for explaining a fourth embodiment of the method of producing the semiconductor device according to the present invention.
Figure 20B:
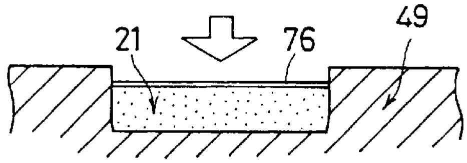

FIGS. 20A and 20B are cross sectional views for explaining a method of forming the resin tablet 21. When forming the resin tablet 21, a predetermined amount of resin powder 49 is first supplied from a nozzle 48 into a mold having a cavity 49 for forming the resin tablet 21 as shown in FIG. 19A. This cavity 49 corresponds to the shape of the resin filling recess 53 formed in the substrate 2. The amount of the resin powder 49 supplied is selected so as to correspond to the amount of the resin to be filled into the semiconductor device. Then, the lower lid member 7*b* is arranged on top of the resin powder 49, a press process is carried out by a press member 50 as shown in FIG. 20B, so as to solidify the resin powder 49 into the resin tablet 21.

Figure 20C:
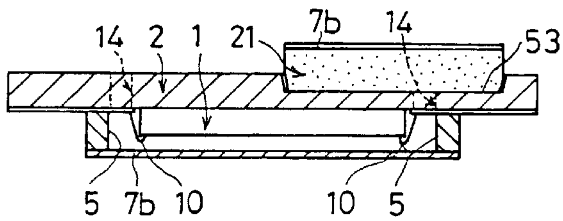
Figure 20D:
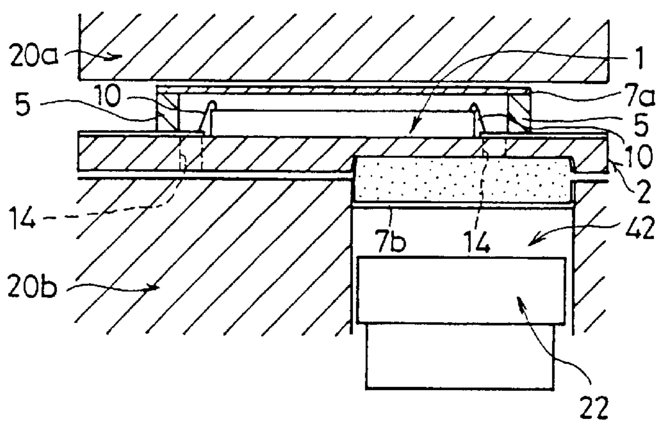
Figure 20E:
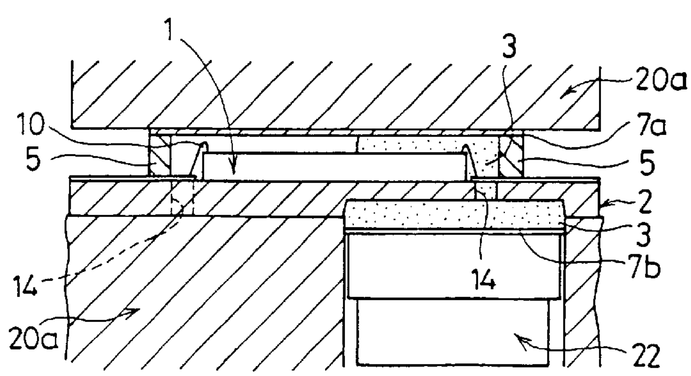

When the resin tablet 21 is formed, this resin tablet 21 is loaded into the resin filling recess 53 of the substrate 2 as shown in FIG. 20C, not into the plunger pot. Thereafter, the resin filling process is carried out to fill the resin 3 as shown in FIGS. 20D and 20E, similarly to the method described above.

According to this embodiment of the method, the resin tablet 21 is arranged on the side of the substrate 2. For this reason, it is unnecessary to carry out the process of placing the resin tablet 21 in the plunger pot of the lower mold 20*b*, thereby making it easier to carry out the resin filling process automatically.

Next, a description will be given of the second aspect of the present invention, by referring to FIGS. 34 through 72.

Figure 34:
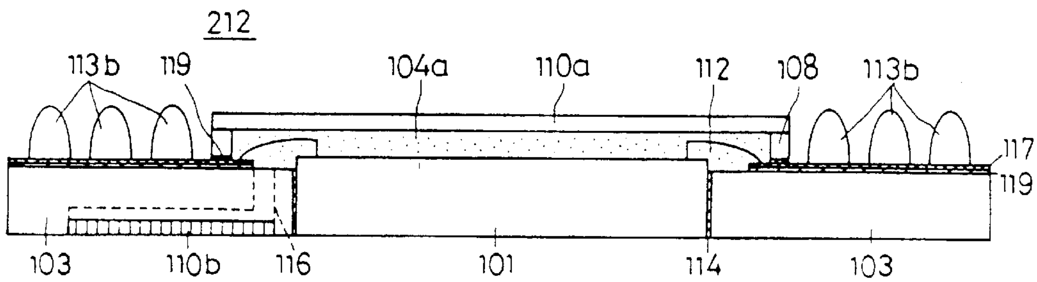
FIG. 34 is a cross sectional view showing an important part of a thirteenth embodiment of the semiconductor device according to the present invention.

FIG. 34 shows a cross section of a thirteenth embodiment of the semiconductor device according to the present invention employing the second aspect of the present invention.

A semiconductor device 212 shown in FIG. 34 is characterized in that an outer periphery of a semiconductor element 101 is surrounded on 4 sides by a base substrate (hereinafter simply referred to as a substrate) 103. The substrate 103 is made up of a plurality of divided substrates as will be described later, and is bonded to the side surface of the semiconductor element 101 using a bond material 114. Since FIG. 34 shows the vertical cross section of the semiconductor device 212, the substrate 103 is arranged only on the right and left sides of the semiconductor element 101. However, the substrate 103 actually surrounds the outer periphery on all 4 sides of the semiconductor element 101.

The substrate 103 is made of a material having a satisfactory heat radiation characteristic. For example, metals including copper alloys, aluminum alloys, copper-tungsten alloys having low coefficients of-linear expansion, molybdenum alloys, cladding materials including copper and molybdenum and the like, and insulative ceramics such as aluminum nitride, silicon nitride and alumina may be used for the substrate 103. In addition, the bond material 114 may be a thermo-compression hardening type bond having a Young's modulus in the range of 0.1 to 500 $Kgf/mm^2$ at room temperature and having metal powder or insulator powder as the filling. The metal powder may be selected from silver having a satisfactory thermal conductivity, silver palladium alloy, copper and the like. On the other hand, the insulator powder may be selected from silica, alumina, aluminum nitride, silicon nitride, boron nitride, diamond and the like.

In addition, a resin gate hole 116 is formed in the substrate 103 and penetrates the substrate 103. The upper end of this resin gate hole 116 opens to the side of the substrate 103 provided with the semiconductor element 101, and the lower end of this resin gate hole 116 opens to the back (or bottom) side of the substrate 103. A lower lid member 110*b* is arranged at the back side of the substrate 103 where the lower end of the resin gate hole 116 opens.

In addition, a wiring layer 117 and an insulator layer 119 forming a stacked structure are arranged on the side (top surface) of the substrate 103 provided with the semiconductor element 101. The inner end part of the wiring layer 117 is electrically connected to electrode pads (not shown) formed on the top surface of the semiconductor element 101 by wires 112. Further, bumps 113*b* which become external connecting terminals for connecting the semiconductor device 212 and connecting terminals formed on a mounting substrate (not shown) are provided on the outer end part of the wiring layer 117.

A frame body 108 is provided at a predetermined position on the substrate 103 so as to surround the semiconductor element 101. An upper lid member 110*a* is arranged on top of this frame body 108. The frame body 108 and the upper lid member 110*a* are both made of a metal material having a satisfactory thermal conductivity, and are bonded by soldering, bonding, welding or the like. The frame body 108 and the upper lid member 110*a* may be connected similarly as described above with reference to FIGS. 33A through 33E.

According to the semiconductor device 212 having the above described construction, the substrate 103 makes contact with the side surface of the semiconductor element 101 and surrounds the semiconductor element 101. Hence, the contact area between the semiconductor element 101 and the substrate 103 is large, and the heat generated from the semiconductor element 101 can be released via this substrate 103. As a result, it is possible to improve the heat radiation characteristic of the semiconductor element 101. In addition, since the heat is released via the substrate 103 which holds the semiconductor element 101, the size of the semiconductor device 212 will not increase. In addition, because the substrate 103 and the bond material 114 are both made of the material having the satisfactory thermal conductivity, it is possible to improve the heat radiation characteristic of the semiconductor element 101 also from this point of view.

Figure 35:
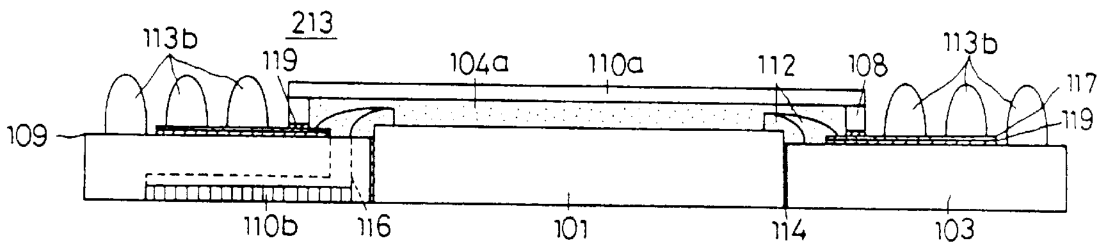
FIG. 35 is a cross sectional view showing an important part of a fourteenth embodiment of the semiconductor device according to the present invention.

FIG. 35 shows a cross section of a fourteenth embodiment of the semiconductor device according to the present invention employing the second aspect of the present invention. In FIG. 35, those parts which are the same as those corresponding parts in FIG. 34 are designated by the same reference numerals, and a description thereof will be omitted.

A semiconductor device 213 shown in FIG. 35 is characterized in that the substrate 103 is made of a conductive metal so that the substrate 103 has a function similar to that of the wiring layer 117. Hence, in this embodiment, the wires 112 are also bonded on the substrate 103, and the bumps 113*b* arranged on the outermost periphery are formed directly on top of the substrate 103 as shown in FIG. 35. By also using the substrate 103 as a wiring layer, it is possible to reduce the number of wiring layers 117 and insulator layers 119 formed on the substrate 103. In addition, since the volume of the substrate 103 is large compared to the wiring layer 117 and the impedance of the substrate 103 is small, the substrate 103 is suited for use as a wiring layer for supplying a power supply voltage or for grounding.

In this embodiment, some bumps 113*b* are formed on top of the stacked structure which is made up of the wiring layer 117 and the insulator layer 119, and some bumps 113*b* are formed directly on the substrate 103. For this reason, in order to make the heights of the bumps 113*b* uniform, it is necessary to make the height of the bumps 113*b* themselves formed on the stacked structure of the wiring layer 117 and the insulator layer 119 different from the height of the bumps 113*b* themselves formed on the substrate 103. In other words, the bumps 113*b* formed on the substrate 103 must by themselves be higher than the bumps 113*b* themselves formed on the stacked structure. In order to realize the different heights, it is possible to employ the method of forming the bumps described above with reference to FIGS. 23 through 26 or, the method of forming the bumps described above with reference to FIGS. 27 through 32. In this embodiment, however, the bond material 114 used must be an insulative material so that the semiconductor element 101 and the substrate 103 will not be electrically connected.

Figure 36:
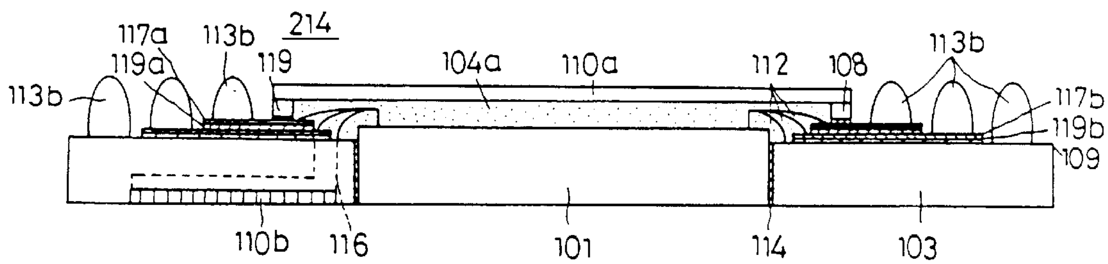
FIG. 36 is a cross sectional view showing an important part of a fifteenth embodiment of the semiconductor device according to the present invention.

FIG. 36 shows a cross section of a fifteenth embodiment of the semiconductor device according to the present invention employing the second aspect of the present invention. In FIG. 36, those parts which are the same as those corresponding parts in FIG. 35 are designated by the same reference numerals, and a description thereof will be omitted.

The basic construction of a semiconductor device 214 shown in FIG. 36 is the same as that of the semiconductor device 213 described above, except that the semiconductor device 214 is characterized in that 2 wiring layers 117*a* and 117*b* are provided. By using the multi-level circuit having the stacked wiring layers 117*a* and 117*b*, it is possible to draw out the wiring layers 117*a* and 117*b* with a large degree of freedom. In addition, since it is possible to independently provide the signal wiring, the power supply wiring and the ground wiring, interference among the wiring layers can be prevented.

In this embodiment, it is also necessary to make the heights of the bumps 113*b* themselves different depending on the layer on which the bumps 113*b* are provided, that is, depending on whether the bumps 113*b* are formed on the wiring layer 117*a*, the wiring layer 117*b* or the substrate 103. In order to realize the different heights, it is possible to employ the method of forming the bumps described above with reference to FIGS. 23 through 26 or, the method of forming the bumps described above with reference to FIGS. 27 through 32.

Figure 37:
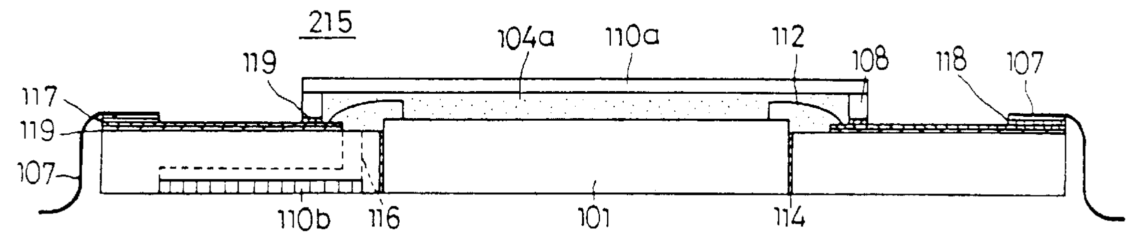
FIG. 37 is a cross sectional view showing an important part of a sixteenth embodiment of the semiconductor device according to the present invention.

FIG. 37 shows a cross section of a sixteenth embodiment of the semiconductor device according to the present invention employing the second aspect of the present invention. In FIG. 37, those parts which are the same as those corresponding parts in FIG. 35 are designated by the same reference numerals, and a description thereof will be omitted.

The basic construction of a semiconductor device 215 shown in FIG. 37 is the same as that of the semiconductor device 213 described above, except that the semiconductor device 215 is characterized in that outer leads 107 are used as the external connecting terminals. For example, a conductive bond material (not shown) is used to connect the outer leads 107 and the wiring layer 117. It may thus be seen that the second aspect of the present invention may be applied regardless of the structure of the external connecting terminals.

Figure 38:
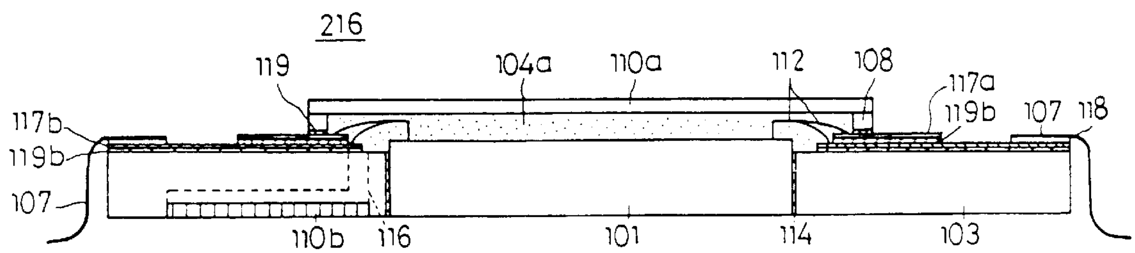
FIG. 38 is a cross sectional view showing an important part of a seventeenth embodiment of the semiconductor device according to the present invention.

FIG. 38 shows a cross section of a seventeenth embodiment of the semiconductor device according to the present invention employing the second aspect of the present invention. In FIG. 38, those parts which are the same as those corresponding parts in FIG. 37 are designated by the same reference numerals, and a description thereof will be omitted.

The basic construction of a semiconductor device 216 shown in FIG. 38 is the same as that of the semiconductor device 215 described above, except that the semiconductor device 216 is characterized in that a wiring layer 117*b* and an insulator layer 119*b* are further formed above the wiring layer 117 and the insulator layer 119 which are provided on the substrate 103. Therefore, it may be seen that the wiring layers and the insulator layers may be arranged with a relatively large degree of freedom even in the case of the semiconductor device employing the second aspect of the present invention.

In addition, by providing a plurality of wiring layers 117 in a stacked arrangement, it becomes necessary to connect the wiring layers. But the wiring layers may easily be connected using the concept of the mechanical via 17 described above with reference to FIGS. 21A and 21B.

Figure 39:
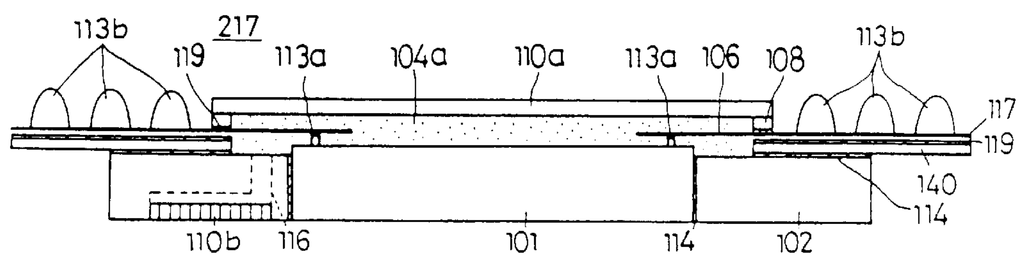
FIG. 39 is a cross sectional view showing an important part of an eighteenth embodiment of the semiconductor device according to the present invention.

FIG. 39 shows a cross section of an eighteenth embodiment of the semiconductor device according to the present invention employing the second aspect of the present invention. In FIG. 39, those parts which are the-same as those corresponding parts in FIG. 34 are designated by the same reference numerals, and a description thereof will be omitted.

A semiconductor device 217 shown in FIG. 39 is characterized in that the tape automated bonding (TAB) technique is used to connect the semiconductor element 101 and the external electrode which are the bumps 113*b* in this embodiment.

In FIG. 39, an insulating substrate 140 is made of polyimide or the like and forms a TAB tape. The wiring layer 117 is formed on the insulating substrate 140 via the insulating layer 119. This insulating substrate 140 is bonded on a plate-shaped substrate 102 by a bonding member 114. The wiring layer 117 extends deeply within the frame body 108. More particularly, the wiring layer 117 extends to a position confronting inner bumps 113*a* which are formed on the semiconductor element 101. The inner bumps 113*a* and the wiring layer 117 are bonded based on a method which will be described later. In addition, outer bumps 113*b* which become the external connecting terminals are formed on the wiring layer 117 at a position on the outer side of the frame body 108. Hence, the semiconductor element 101 and the outer bumps 113*b* are electrically connected via the wiring layer 117.

By connecting the inner bumps 113*a* formed on the semiconductor element 101 and the wiring layer 117 by use of the TAB technique as described above, it is also possible to satisfactorily cope with the case where a large number of inner bumps 113*a* are formed on the semiconductor element 101 and the connection must be made at a high density. As a result, it is possible to realize the semiconductor device 217 which includes the connections which are made at the high density.

Figure 40:
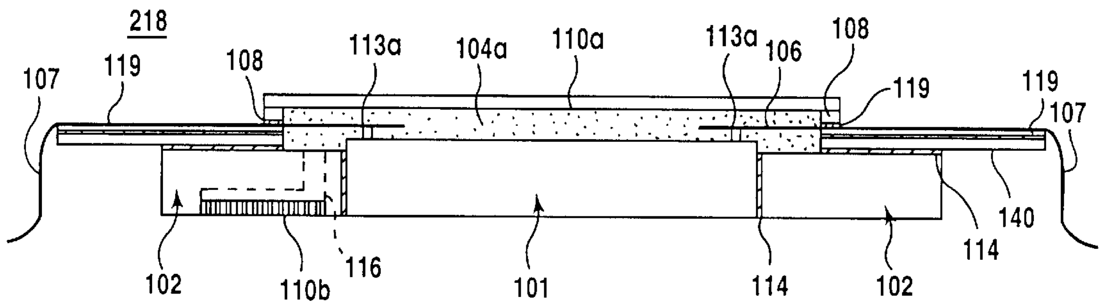
FIG. 40 is a cross sectional view showing an important part of a nineteenth embodiment of the semiconductor device according to the present invention.

FIG. 40 shows a cross section of a nineteenth embodiment of the semiconductor device according to the present invention employing the second aspect of the present invention. In FIG. 40, those parts which are the same as those corresponding parts in FIG. 39 are designated by the same reference numerals, and a description thereof will be omitted.

The basic construction of a semiconductor device 218 shown in FIG. 40 is the same as that of the semiconductor device 217, however, the semiconductor device 218 is characterized in that the part of the wiring layer 117 on the outer side of the frame body 108 is extended further on the outer side and bent in a gull-wing shape to form the outer leads 107.

By forming the outer leads 107 by use of the wiring layer 117, it becomes unnecessary to form the outer leads independently of the TAB tape and there is no need to arranged such independently formed outer leads on the plate-shaped substrate 102. Therefore, it is possible to reduce the number of parts, and also simplify the process of forming the external connecting terminals.

Figure 41:
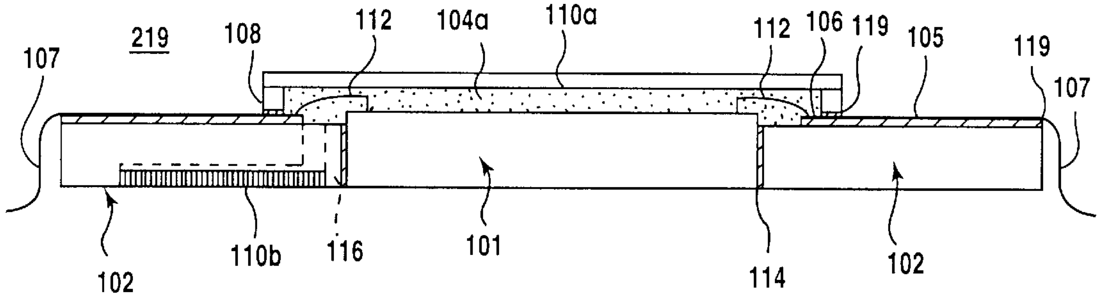
FIG. 41 is a cross sectional view showing an important part of a twentieth embodiment of the semiconductor device according to the present invention.

FIG. 41 shows a cross section of a twentieth embodiment of the semiconductor device according to the present invention employing the second aspect of the present invention. In FIG. 41, those parts which are the same as those corresponding parts in FIG. 40 are designated by the same reference numerals, and a description thereof will be omitted.

A semiconductor device 219 shown in FIG. 41 is characterized in that a lead frame 105 is used in place of the wiring layer 117 arranged on the TAB tape of the semiconductor device 218. For example, iron-nickel alloys, copper alloys or the like may be used for the lead frame 105.

Since this embodiment uses the lead frame 105 in place of the wiring layer 117, it is possible to improve the mechanical strength of the outer leads 107, and also eliminate the need for the insulating substrate 140 that is made of polyimide or the like.

Figure 42:
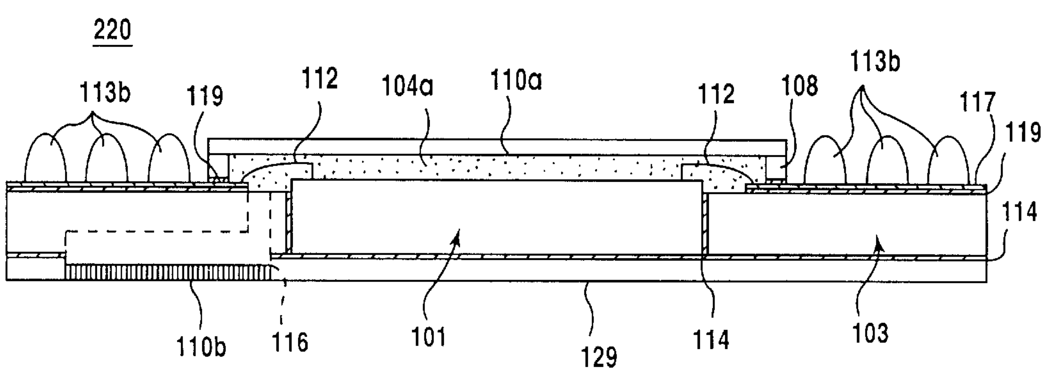
FIG. 42 is a cross sectional view showing an important part of a twenty-first embodiment of the semiconductor device according to the present invention.

FIG. 42 shows a cross section of a twenty-first embodiment of the semiconductor device according to the present invention employing the second aspect of the present invention. In FIG. 42, those parts which are the same as those corresponding parts in FIG. 39 are designated by the same reference numerals, and a description thereof will be omitted.

A semiconductor device 220 shown in FIG. 42 is characterized in that a heat radiation plate 129 is arranged below the semiconductor element 101 and the substrate 103. For example, this heat radiation plate 129 is made of a metal material having a satisfactory thermal conductivity.

By providing the metal heat radiation plate 129 below the substrate 103, it is possible to improve the mechanical strength of the substrate 103. In addition, since the heat radiation plate 129 having the satisfactory thermal conductivity also makes contact with the bottom part of the semiconductor element 101, it is possible to efficiently radiate (or release) the heat generated from the semiconductor element 101.

Figure 43:
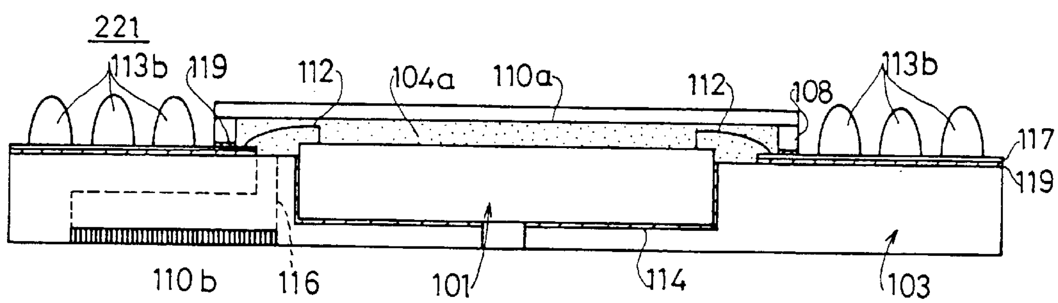
FIG. 43 is a cross sectional view showing an important part of a twenty-second embodiment of the semiconductor device according to the present invention.

FIG. 43 shows a cross section of a twenty-second embodiment of the semiconductor device according to the present invention employing the second aspect of the present invention. In FIG. 43, those parts which are the same as those corresponding parts in FIG. 39 are designated by the same reference numerals, and a description thereof will be omitted.

A semiconductor device 221 shown in FIG. 43 is characterized in that the bottom part of the substrate 103 extends to the bottom surface of the semiconductor element 101.

According to the semiconductor device 221, a part of the substrate 103 extend to the bottom part of the semiconductor element 101. For this reason, the exposed part of the semiconductor device 101 is small, and it is possible to reduce the damage that is applied directly on the semiconductor element 101 from the outside. In addition, because the substrate 103 is made of a material having a satisfactory thermal conductivity, it is possible to improve the heat radiation characteristic of the semiconductor element 101 without having to provide the independent heat radiation plate 129 as in the case of the semiconductor device 220 described above.

Figure 44:
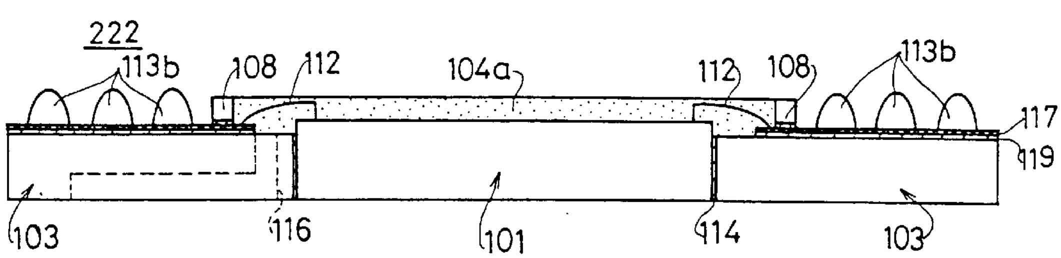
FIG. 44 is a cross sectional view showing an important part of a twenty-third embodiment of the semiconductor device according to the present invention.

FIG. 44 shows a cross section of a twenty-third embodiment of the semiconductor device according to the present invention employing the second aspect of the present invention. In FIG. 44, those parts which are the same as those corresponding parts in FIG. 34 are designated by the same reference numerals, and a description thereof will be omitted.

A semiconductor device 222 shown in FIG. 44 is characterized in that the upper lid member **110*a* and the lower lid member 110*b* are removed from the semiconductor device 212 described above. In other words, the semiconductor device 222 has a construction similar to that of the semiconductor device 207 shown in FIG. 11** described above, and it is possible to reduce both the number of parts and the thickness of the semiconductor device.

Figure 45:
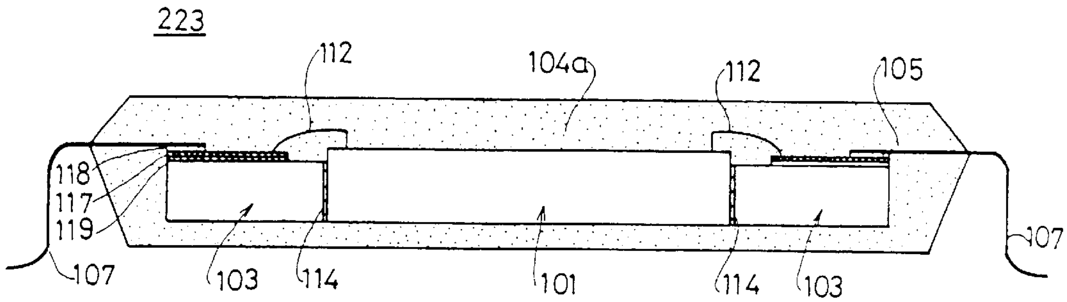
FIG. 45 is a cross sectional view showing an important part of a twenty-fourth embodiment of the semiconductor device according to the present invention.

FIG. 45 shows a cross section of a twenty-fourth embodiment of the semiconductor device according to the present invention employing the second aspect of the present invention. In FIG. 45, those parts which are the same as those corresponding parts in FIG. 34 are designated by the same reference numerals, and a description thereof will be omitted.

A semiconductor device 223 shown in FIG. 45 is characterized in that the substrate 103 is used as a so-called extension substrate, and a package is formed by molding a resin **104*a* over the substrate 103 which holds the semiconductor element 101 by a transfer mold, similarly as in the case of the general resin encapsulated type semiconductor device. In this embodiment, the semiconductor element 101 and the substrate 103 are completely embedded within the resin 104*a*, and the handling of the semiconductor device 223 at the time of mounting is facilitated. In this embodiment, it is unnecessary to provide the frame body 108 and the upper lid member 110*a***.

Figure 46:
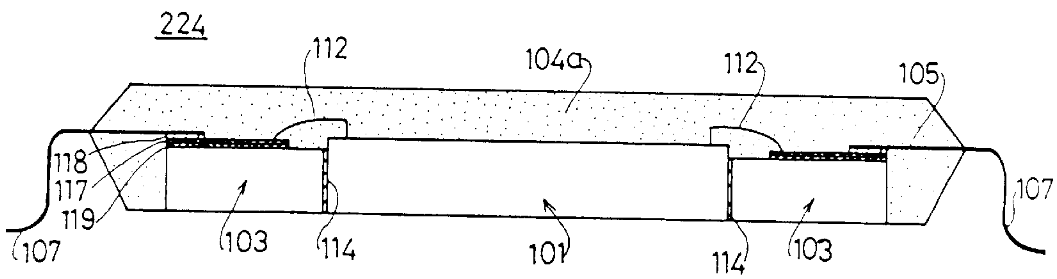
FIG. 46 is a cross sectional view showing an important part of a twenty-fifth embodiment of the semiconductor device according to the present invention.

FIG. 46 shows a cross section of a twenty-fifth embodiment of the semiconductor device according to the present invention employing the second aspect of the present invention. In FIG. 46, those parts which are the same as those corresponding parts in FIG. 45 are designated by the same reference numerals, and a description thereof will be omitted.

The basic construction of a semiconductor device 224 shown in FIG. 46 is the same as that of the semiconductor device 223 described above, however, the semiconductor device 224 is characterized in that the bottom part of the semiconductor element 101 is exposed outside the resin **104*a*. According to this embodiment, it is possible to directly release the heat generated from the semiconductor element 101 to the outside from the bottom surface of the semiconductor element 101, and the heat radiation characteristic is improved. In addition, since the resin 104*a* is unnecessary at the bottom of the substrate 103, it is possible to reduce the thickness of the semiconductor device 224 and also reduce the amount of resin 104*a*** that is required.

Figure 47:
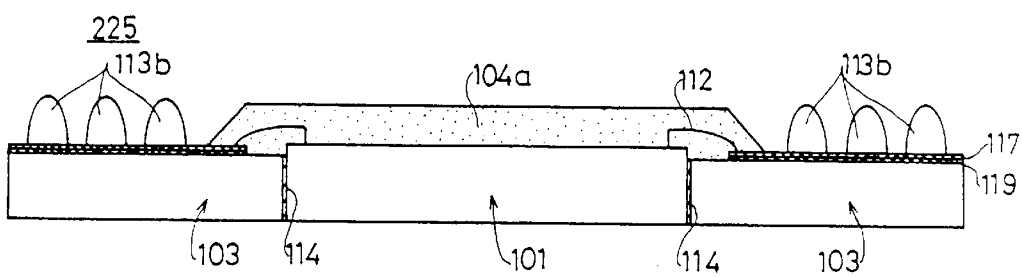
FIG. 47 is a cross sectional view showing an important part of a twenty-sixth embodiment of the semiconductor device according to the present invention.

FIG. 47 shows a cross section of a twenty-sixth embodiment of the semiconductor device according to the present invention employing the second aspect of the present invention. In FIG. 47, those parts which are the same as those corresponding parts in FIG. 34 are designated by the same reference numerals, and a description thereof will be omitted.

A semiconductor device 225 shown in FIG. 47 is characterized in that a so-called over-mold is used to encapsulate the electrode pads of the semiconductor element 101 and the wires 112 by the resin **104*a***.

Figure 48:
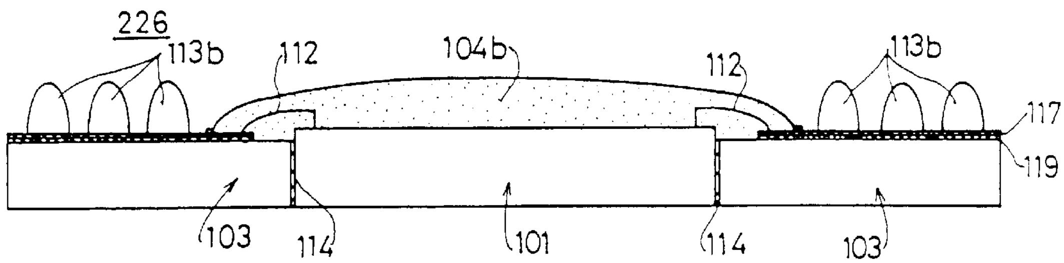
FIG. 48 is a cross sectional view showing an important part of a twenty-seventh embodiment of the semiconductor device according to the present invention.

FIG. 48 shows a cross section of a twenty-seventh embodiment of the semiconductor device according to the present invention employing the second aspect of the present invention. In FIG. 48, those parts which are the same as those corresponding parts in FIG. 34 are designated by the same reference numerals, and a description thereof will be omitted.

A semiconductor device 226 shown in FIG. 48 is characterized in that a so-called potting is used to encapsulate the electrode pads of the semiconductor element 101 and the wires 112 by the resin 104*a*.

Figure 49:
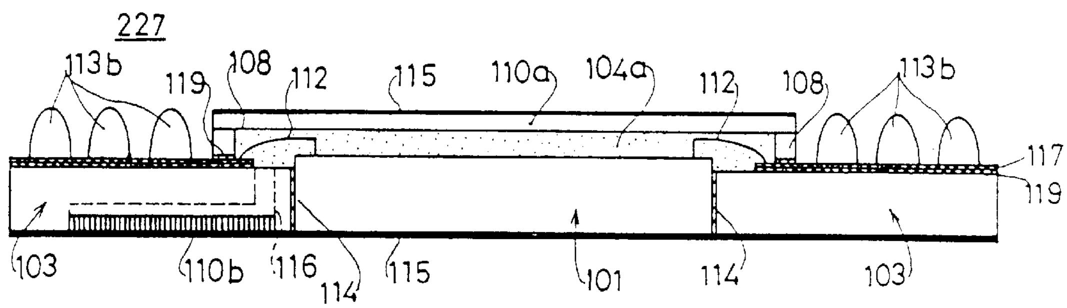
FIG. 49 is a cross sectional view showing an important part of a twenty-eighth embodiment of the semiconductor device according to the present invention.

FIG. 49 shows a cross section of a twenty-eighth embodiment of the semiconductor device according to the present invention employing the second aspect of the present invention. In FIG. 49, those parts which are the same as those corresponding parts in FIG. 34 are designated by the same reference numerals, and a description thereof will be omitted.

A semiconductor device 227 shown in FIG. 49 is characterized in that a material 115 having a high thermal conductivity is formed to a predetermined thickness on the surfaces of the frame body 108, the upper lid member 110*a*, the lower lid member 110*b*, the semiconductor element 101 and the substrate 103. In other words, the material 115 having the high thermal conductivity is formed on parts of the semiconductor device 227 exposed to the outside, so that the heat generated from the semiconductor element 101 is efficiently released outside the semiconductor device 227. For example, the material 115 having the high thermal conductivity may have a metal powder or an insulator powder as the filling. The metal powder may be selected from silver having a satisfactory thermal conductivity, silver palladium alloy, copper and the like. On the other hand, the insulator powder may be selected from silica, alumina, aluminum nitride, silicon nitride, boron nitride, diamond and the like.

Figure 50:
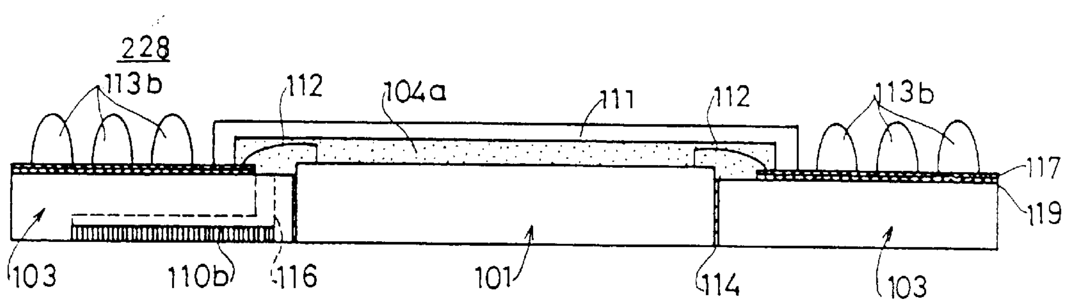
FIG. 50 is a cross sectional view showing an important part of a twenty-ninth embodiment of the semiconductor device according to the present invention.

FIG. 50 shows a cross section of a twenty-ninth embodiment of the semiconductor device according to the present invention employing the second aspect of the present invention. In FIG. 50, those parts which are the same as those corresponding parts in FIG. 34 are designated by the same reference numerals, and a description thereof will be omitted.

A semiconductor device 228 shown in FIG. 50 is characterized in that a metal cap 111 is used in place of the frame body 108 and the upper lid member 110*a* of the semiconductor device 212 described above, so as to close the upper part of the semiconductor element 101. According to this embodiment, it is unnecessary to carry out the process of bonding the frame body 108 and the upper lid member 110*a* as was required in the case of the semiconductor device 212, and it is also possible to reduce the number of parts. Furthermore, since it is possible to prevent defective or incomplete bonding between the frame body 108 and the upper lid member 110*a*, the leaking of the resin 104*a* can be prevented and the reliability of the semiconductor device 228 can be improved.

Figure 51:
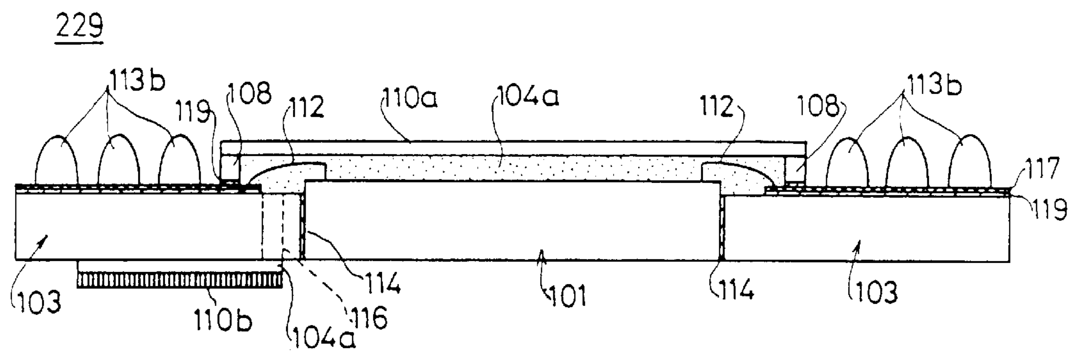
FIG. 51 is a cross sectional view showing an important part of a thirtieth embodiment of the semiconductor device according to the present invention.

FIG. 51 shows a cross section of a thirtieth embodiment of the semiconductor device according to the present invention employing the second aspect of the present invention. In FIG. 51, those parts which are the same as those corresponding parts in FIG. 49 are designated by the same reference numerals, and a description thereof will be omitted.

A semiconductor device 229 shown in FIG. 51 is characterized in that a part of the resin 104*a* and the lower lid member 10*b* are exposed at the bottom part of the substrate 103. According to this embodiment, it is only necessary to form a resin gate hole 116 in the substrate 103, and it is unnecessary to provide a resin filling recess as in the case of the first aspect of the present invention described above, thereby making it easy to produce the semiconductor device 229. In addition, it is possible to simplify the construction of the substrate 103 because it is unnecessary to provide the resin filling recess, and thus, it is possible to improve the mechanical strength of the substrate 103.

Figure 52:
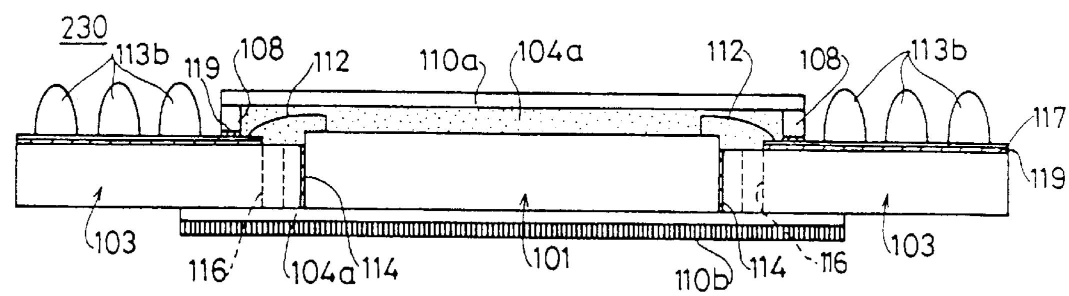
FIG. 52 is a cross sectional view showing an important part of a thirty-first embodiment of the semiconductor device according to the present invention.

FIG. 52 shows a cross section of a thirty-first embodiment of the semiconductor device according to the present invention employing the second aspect of the present invention. In FIG. 52, those parts which are the same as those corresponding parts in FIG. 51 are designated by the same reference numerals, and a description thereof will be omitted.

A semiconductor device 230 shown in FIG. 52 is characterized in that a plurality of resin gate holes 116 are formed in the substrate 103. By providing the plurality of resin gate holes 116, it is possible to efficiently and uniformly fill the resin 104*a* at the top surface of the substrate 103, and the resin filling process can positively be carried out within a short time.

Figure 53:
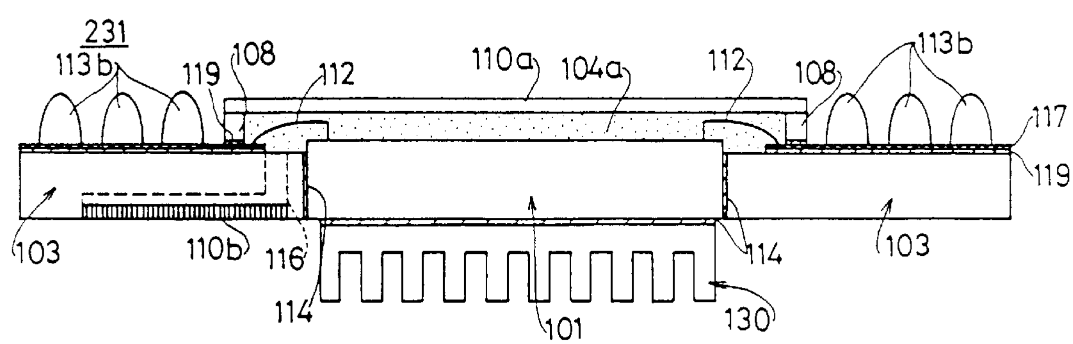
FIG. 53 is a cross sectional view showing an important part of a thirty-second embodiment of the semiconductor device according to the present invention.

FIG. 53 shows a cross section of a thirty-second embodiment of the semiconductor device according to the present invention employing the second aspect of the present invention. In FIG. 53, those parts which are the same as those corresponding parts in FIG. 34 are designated by the same reference numerals, and a description thereof will be omitted.

A semiconductor device 231 shown in FIG. 53 is characterized in that a heat radiating member 130 is provided on the entire bottom part of the semiconductor device 231 or on the bottom surface of the semiconductor element 101 that is exposed to the outside when compared to the semiconductor device 212 described above. The heat radiating member 130 is made of a metal such as aluminum having a satisfactory heat radiation characteristic, and is bonded on the bottom surface of the semiconductor element 101 by the bond material 114. In addition, the heat radiating member 130 has a shape with a large heat radiation area such as fins, so as to improve the heat radiation characteristic.

Figure 54:
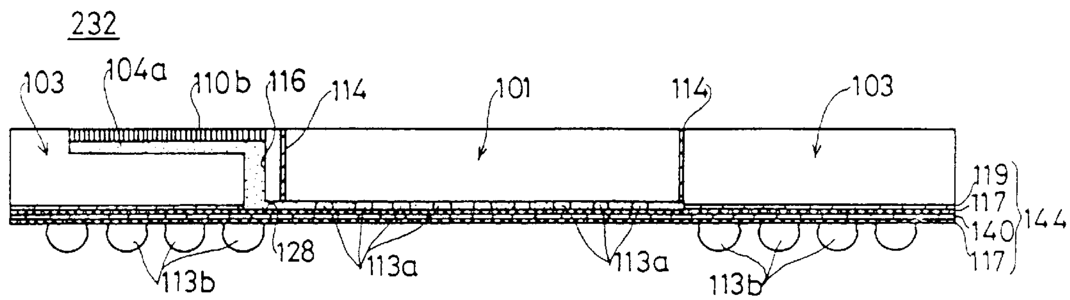
FIG. 54 is a cross sectional view showing an important part of a thirty-third embodiment of the semiconductor device according to the present invention.

FIG. 54 shows a cross section of a thirty-third embodiment of the semiconductor device according to the present invention employing the second aspect of the present invention. In FIG. 54, those parts which are the same as those corresponding parts in FIG. 34 are designated by the same reference numerals, and a description thereof will be omitted.

A semiconductor device 232 shown in FIG. 54 is characterized in that a flexible printed circuit (FPC) 144 is used as the circuit, and the electrical connection between the FPC 144 and the semiconductor element 101 is realized by use of flip-chip bonding.

In other words, inner bumps 113*a* are formed on the semiconductor element 101, and the electrical connection between the semiconductor element 101 and the FPC 144 is made by connecting the inner bumps 113*a* to the FPC 144. In addition, outer bumps 113*b* which become the external connecting terminals are formed on the FPC 144. The outer bumps 113*b* may employ the construction of the mechanical bumps 17*a* described above with reference to FIGS. 22A through 22C. According to this embodiment, it is possible to improve the density of the semiconductor device 232 and reduce the size of the semiconductor device 232.

Figure 55:
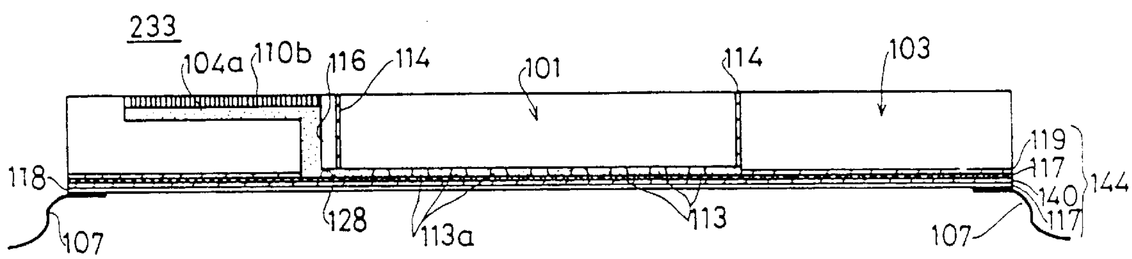
FIG. 55 is a cross sectional view showing an important part of a thirty-fourth embodiment of the semiconductor device according to the present invention.

FIG. 55 shows a cross section of a thirty-fourth embodiment of the semiconductor device according to the present invention employing the second aspect of the present invention. In FIG. 55, those parts which are the same as those corresponding parts in FIG. 54 are designated by the same reference numerals, and a description thereof will be omitted.

The basic construction of a semiconductor device 233 shown in FIG. 55 is the same as that of the semiconductor device 232 described above, but the semiconductor device 233 is characterized in that the outer leads 107 having the gull-wing shape are provided as the external connecting terminals in place of the outer bumps 133*b*.

Next, a description will be given of embodiments of the method of producing the semiconductor device according to the present invention, by referring to FIGS. 56 through 72. These embodiments of the method employ the second aspect of the present invention.

FIGS. 56A through 56H and 57 are cross sectional views for explaining a fifth embodiment of the method of producing the semiconductor device according to the present invention. In this embodiment, it is assumed for the sake of convenience that the semiconductor device 212 described above is produced.

Figure 56A:
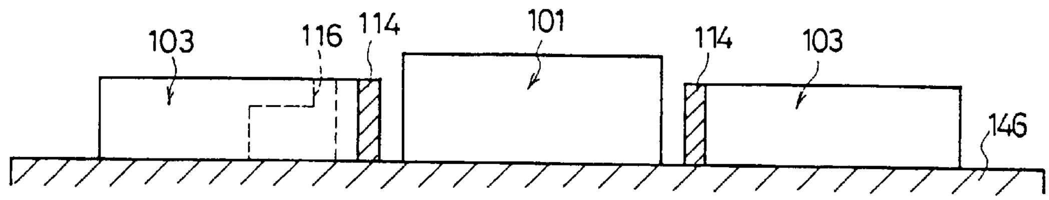
FIGS. 56A, 56B, 56C, 56D, 56E, 56F, 56G and 56H respectively are cross sectional views for explaining a fifth embodiment of the method of producing the semiconductor device according to the present invention.

When producing the semiconductor device 212, the substrates 103 which are divided as shown in FIG. 56A are formed in advance, and the bond material 114 is provided on the divided substrates 103 at parts where the semiconductor element 101 is bonded. When forming the divided substrates 103, the resin gate hole 116 is formed in at least one of the divided substrates 103.

Figure 56B:
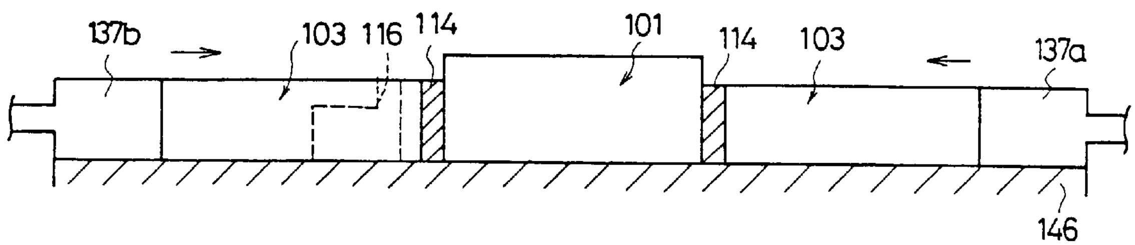

Then, the divided substrates 103 are positioned so that the parts where the bond material 114 is provided confront the 4 outer peripheral sides of the semiconductor element 101. The divided substrates 103 are then pressed towards the semiconductor element 101 by use of pressing tools 137*a* and 137*b* as shown in FIG. 56B. In this state, the divided substrates 103 and the semiconductor element 101 are placed on top of a base 146, and the divided substrates 103 are pressed against the semiconductor element 101 while maintaining this state. Hence, the bottom surfaces of the divided substrates 103 and the bottom surface of the semiconductor element 101 approximately match. The processing of pressing the divided substrates 103 against the semiconductor element 101 by use of the pressing tools 137*a* and 137*b* is carried out until the divided substrates 103 and the semiconductor element 101 are positively bonded by the bond materials 114.

Figure 59A:
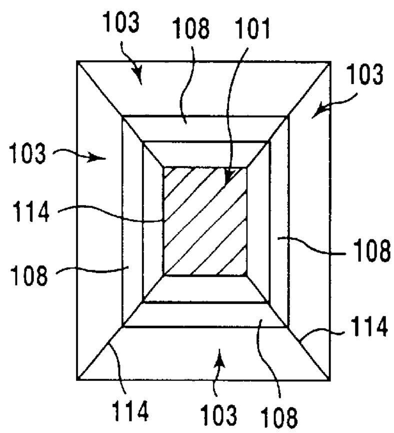
FIGS. 59A, 59B, 59C, 59D, 59E, 59F and 59G respectively are plan views for explaining various methods of dividing a substrate.
Figure 59B:
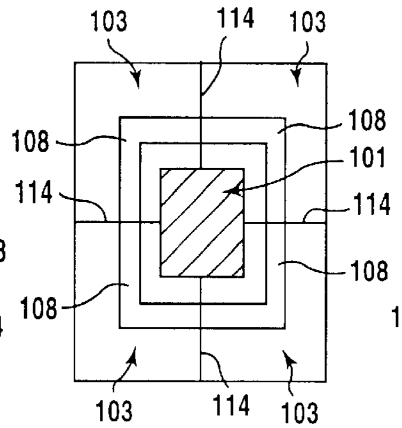
Figure 59C:
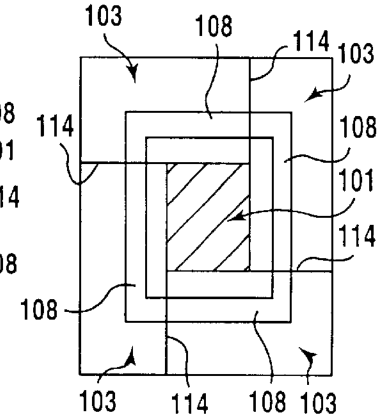
Figure 59D:
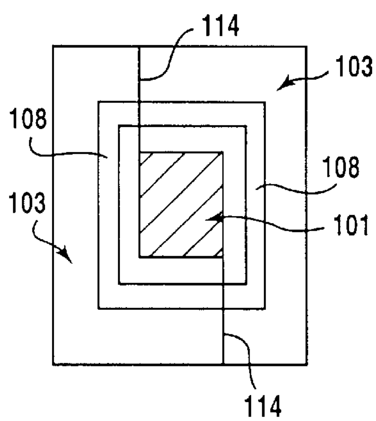
Figure 59E:
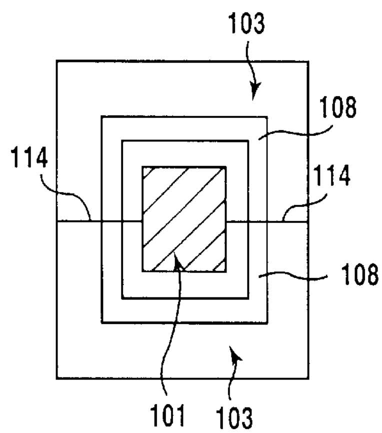
Figure 59F:
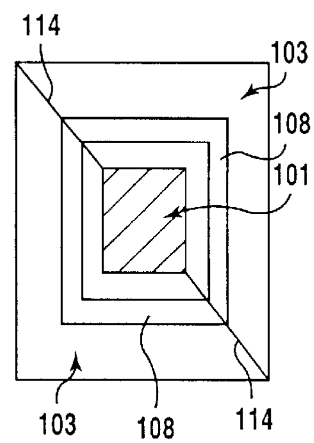
Figure 59G:
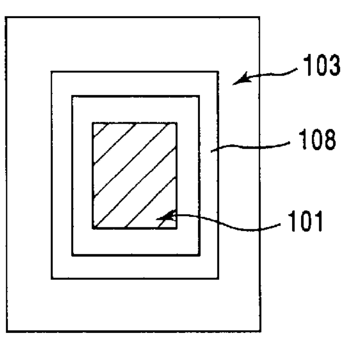

FIGS. 59A through 59G are plan views for explaining various methods of dividing the substrate 103. FIGS. 59A, 59B and 59C show cases where the substrate 103 is divided into 4 pieces. FIGS. 59D, 59E and 59F show cases where the substrate 103 is divided into 2 pieces. On the other hand, FIG. 59G shows a case where the substrate 103 is not divided as is 1 piece. As may be seen from FIGS. 59A through 59G, there are various methods of dividing the substrate 103, and the number of pieces into which the division is made, the dividing positions and the like may be appropriately selected depending on the size, the positional relationships of the wirings and the like of the semiconductor device.

If it is assumed for the sake of convenience that the substrate 103 is not divided but is constructed to surround the semiconductor element 101, it is necessary to provide a hole at the center of this substrate 103 to fit the semiconductor element 101.

On the other hand, when the divided substrates 103 are formed in advance and such divided substrates 103 are bonded on the side surfaces of the semiconductor element 101 as described above, it is much easier to bond the divided substrates 103 on the side surfaces of the semiconductor element 101.

Figure 62:
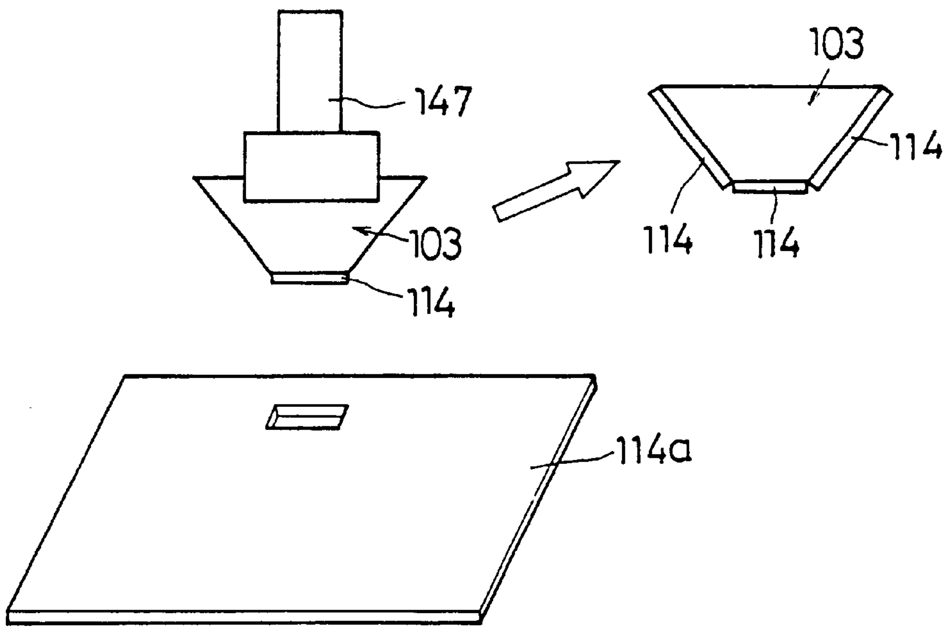
FIG. 62 is a perspective view for explaining a method of providing a bond material.
Figure 63:
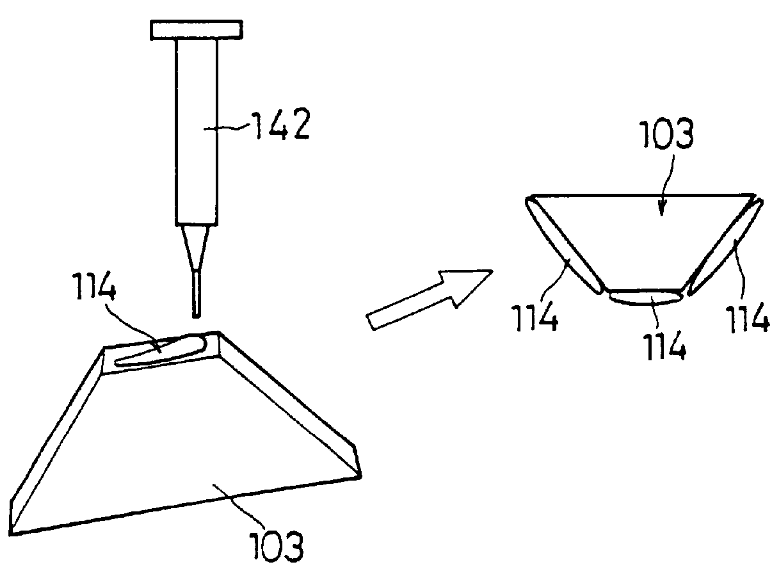
FIG. 63 is a perspective view for explaining another method of providing the bond material.
Figure 64:
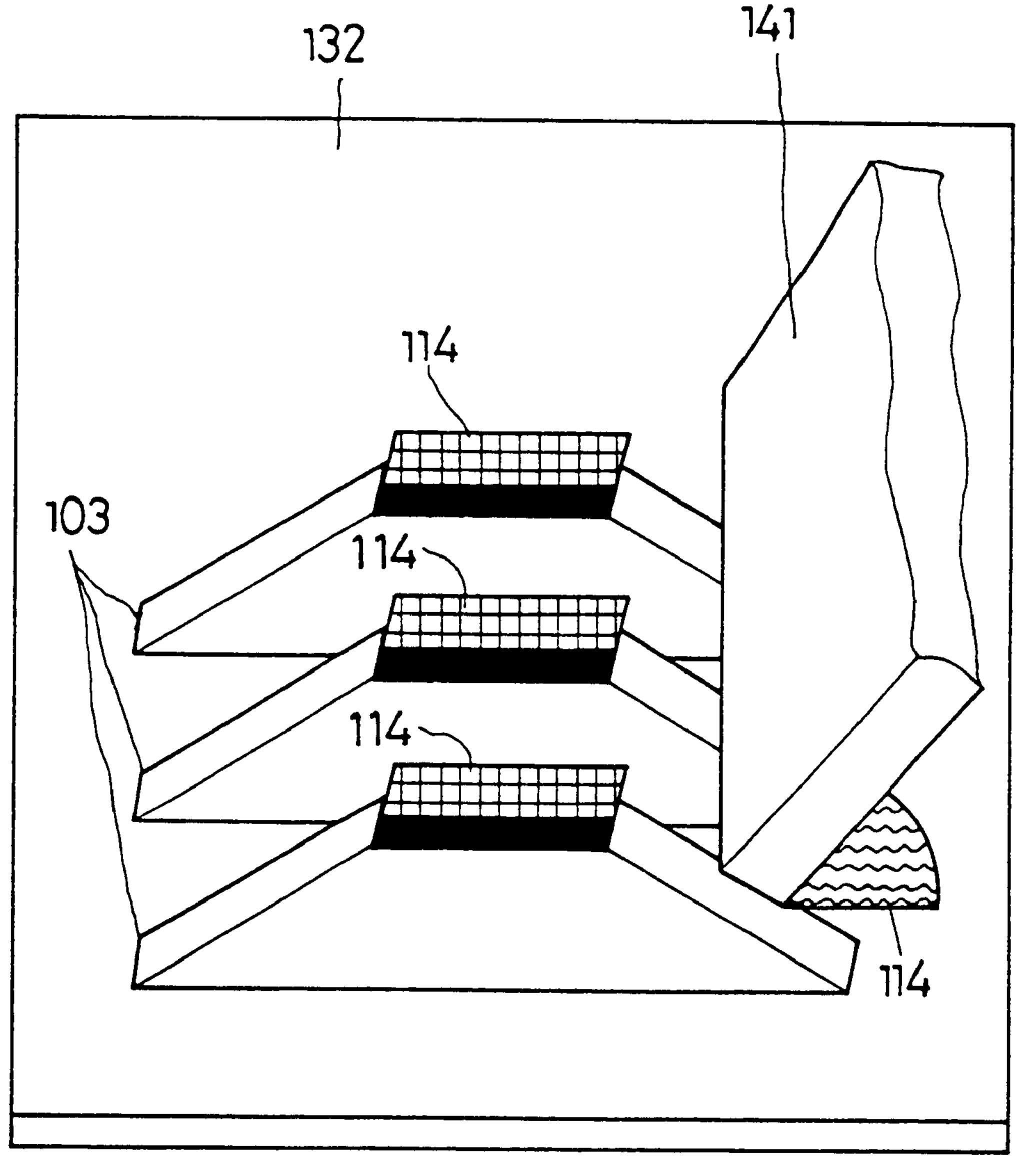
FIG. 64 is a perspective view for explaining still another method of providing the bond material.

FIGS. 62 through 64 are perspective views for explaining methods of providing the bond material 114 on the divided substrates 103.

FIG. 62 shows a case where the so-called transfer method is employed. In this case, the bond material 114 is formed into a plate shape, and the substrate 103 held by a holding tool 147 is pushed against this plate-shaped bond material 114, so as to provide the bond material 114 at predetermined positions on the substrate 103.

FIG. 63 shows a case where the dispense method is employed, In this case, the bond material 114 is loaded into a dispenser 142, and the bond material 114 is provided at predetermined positions on the substrate 103 by this dispenser 142.

Further, FIG. 64 shows a case where the screen printing method is employed. A print mask 132 having holes at positions corresponding to the positions of the substrate 103 where the bond material 114 is to be provided is arranged on top of the substrate 103. Then, the bond material 114 is printed on the substrate from the top of the print mask 132 using a squeegee 141.

The bond material 114 can thus be provided on the substrate 103 according to any of the methods described above.

Figure 56C:
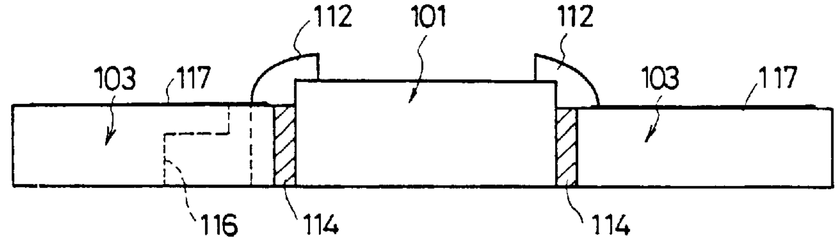
Figure 56D:
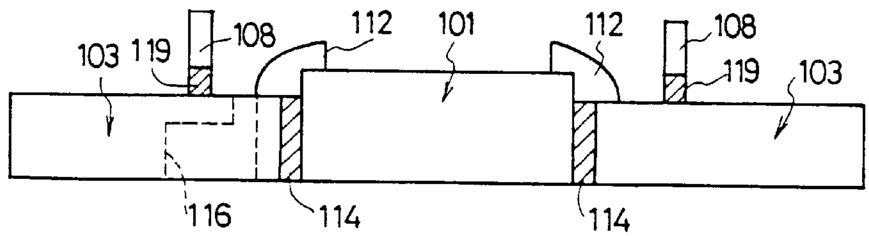

Returning now to the description of the fifth embodiment of the method, when the substrate 103 is made to surround the semiconductor element 101, the wiring layer 117 is provided on top of the substrate as shown in FIG. 56C, and the wires 112 are bonded between the wiring layer 117 and the semiconductor element 101. When the wires 112 are provided and the electrical connection between the wiring layer 117 and the semiconductor element 101 is finished, the frame body 108 is provided on top of the substrate 103 as shown in FIG. 56D. The substrate 103 and the frame body 108 are bonded via the insulator layer 119 which also has the function of a bond.

Figure 60:
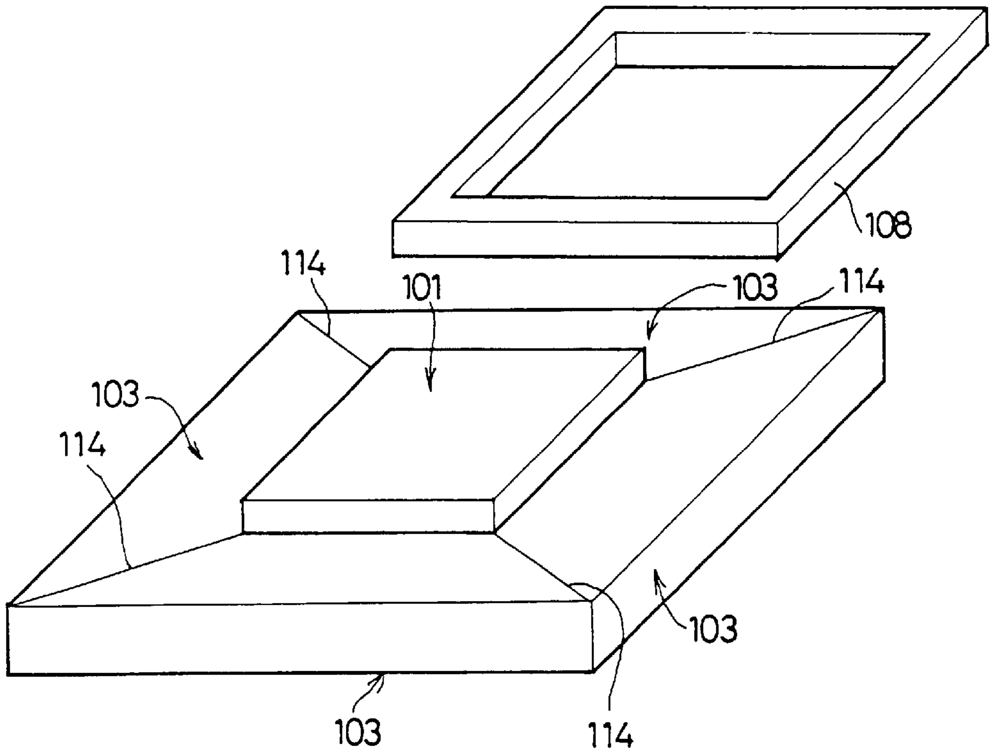
FIG. 60 is a perspective view for explaining a process of providing a frame body on the substrate.
Figure 61:
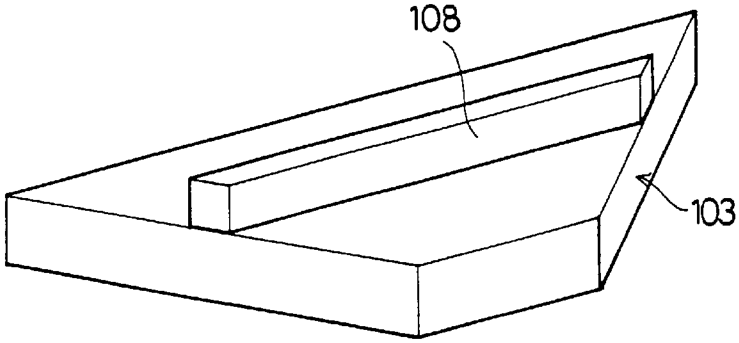
FIG. 61 is a perspective view for explaining another method of forming the frame body.

FIG. 60 is a perspective view showing the manner in which the frame body 108 is provided on the substrate 103. Of course, it is not essential to form the frame body 108 to have the shape shown from the beginning. For example, it is possible to provide parts of the frame body 108 on each divided substrate 103 as shown in FIG. 61, so that the frame body 108 is completed when all of the divided substrates 103 are bonded.

Figure 56E:
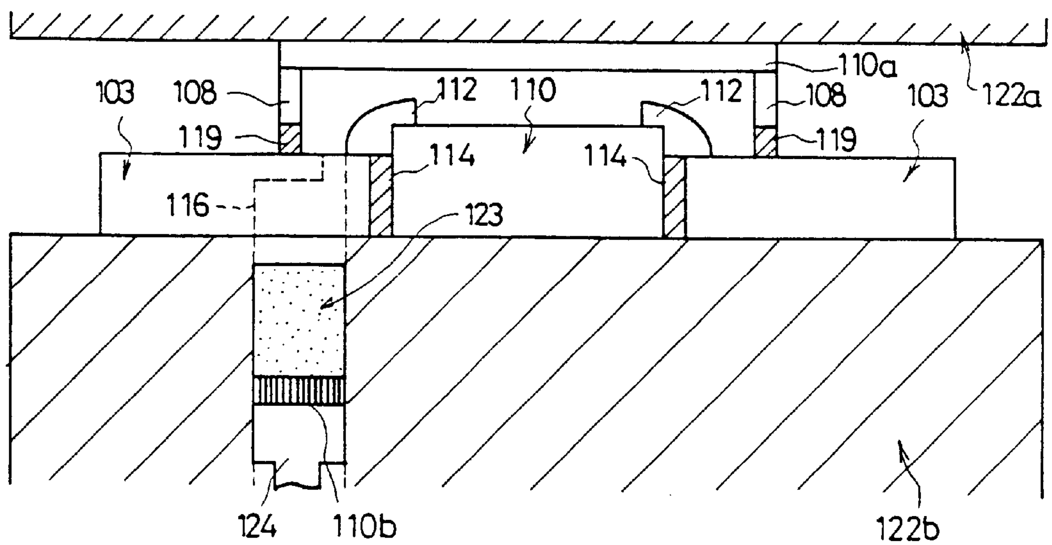

After providing the frame body 108 on the substrate 103, the upper lid member 110*a* is bonded on the frame body 108 as shown in FIG. 56E. In addition, after providing the upper lid member 110*a* on the frame body 108, the resin filling process is carried out using the resin 104*a*.

The substrate 103 having the upper lid member 110*a* provided on the frame body 108 as described above is loaded between an upper mold 122*a* and a lower mold 122*b* as shown in FIG. 56E. In this loaded state, the upper mold 122*a* confronts the upper lid member 110*a*, and the lower mold 122*b* confronts the bottom surface of the substrate 103. In addition, a plunger 124 which forms a resin filling mechanism for filling the resin 104*a* is provided in the lower mold 122*b*.

The plunger 124 is positioned so as to confront a resin filling recess of the resin gate hole 116 formed in the substrate 103. In addition, the resin filling recess and the plunger 124 have approximately the same area and shape in the plan view. A resin tablet 123 which becomes the resin 104*a* is loaded above the plunger 124, and a lower lid member 110*b* is interposed between the resin tablet 123 and the plunger 124.

Figure 56F:
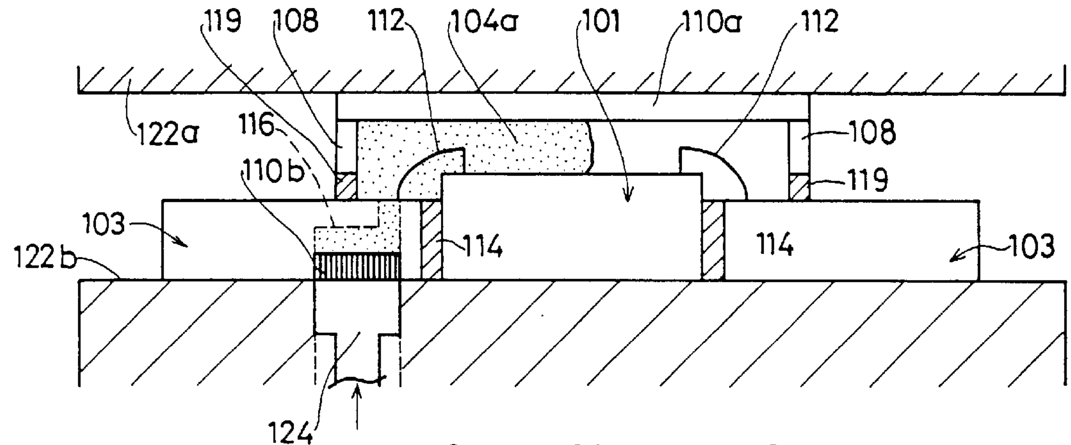

After the substrate 103 is loaded between the upper and lower molds 122*a* and 122*b*, the plunger 124 is raised while heating the resin tablet 123 as shown in FIG. 56F. As a result, the melted resin 104*a* passes through the resin gate hole 116 and reaches the top of the substrate 103, thereby filling the resin 104*a* into the space formed by the frame body 108 and the upper lid member 110*a*.

According to this embodiment of the method, it is also possible to directly fill the resin 104*a* to the semiconductor element encapsulating position on the substrate 103 via the resin gate hole 116, so that the predetermined part of the semiconductor element 101 is encapsulated. For this reason, it is possible to select the kind and amount of the mold release agent to be added to the resin 104*a*, without taking the mold separation characteristic into consideration. Hence, it is possible to use as the resin 104*a* a resin having a high adhesive strength, and the reliability of the semiconductor device can be improved even when the size of the semiconductor device is reduced.

Figure 56G:
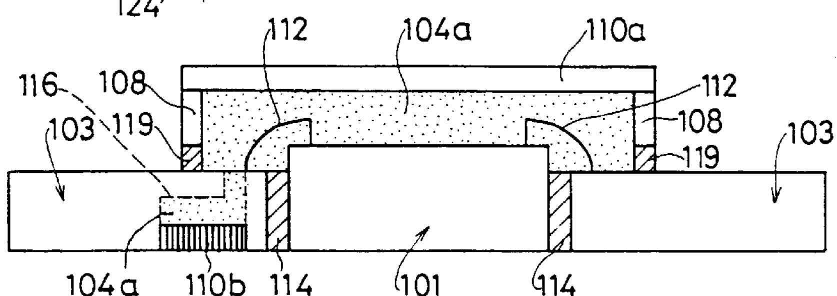
Figure 56H:
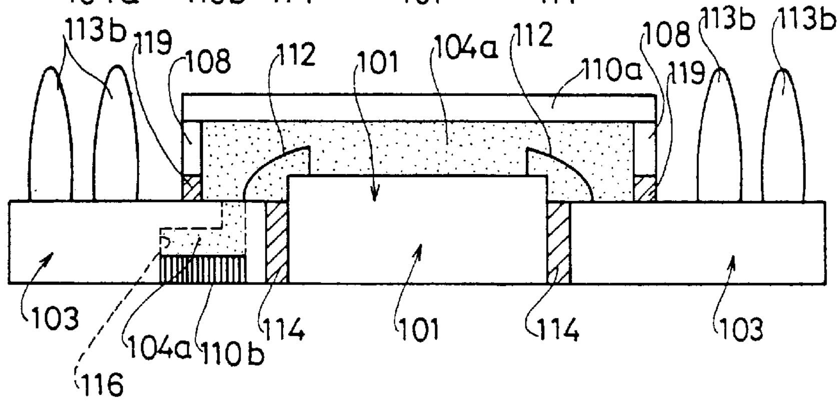

When the above described resin filling process ends, the substrate 103 is removed from the molds 122*a* and 122*b* as shown in FIG. 56G, and the bumps 113*b* which become the external connecting terminals are formed at predetermined positions on the substrate 103 as shown in FIG. 56H.

Figure 65:
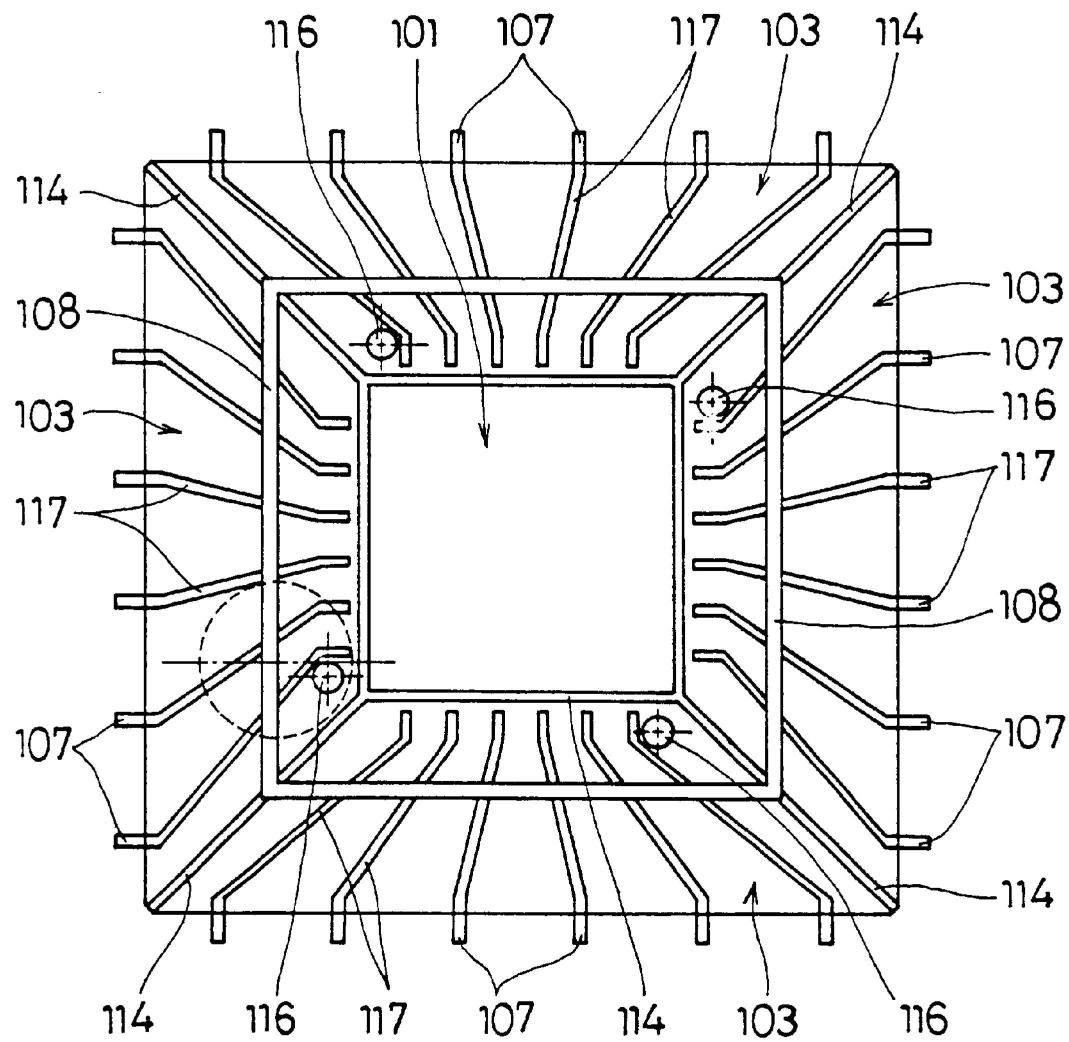
FIG. 65 is a plan view for explaining a method of forming resin gate holes.
Figure 66:
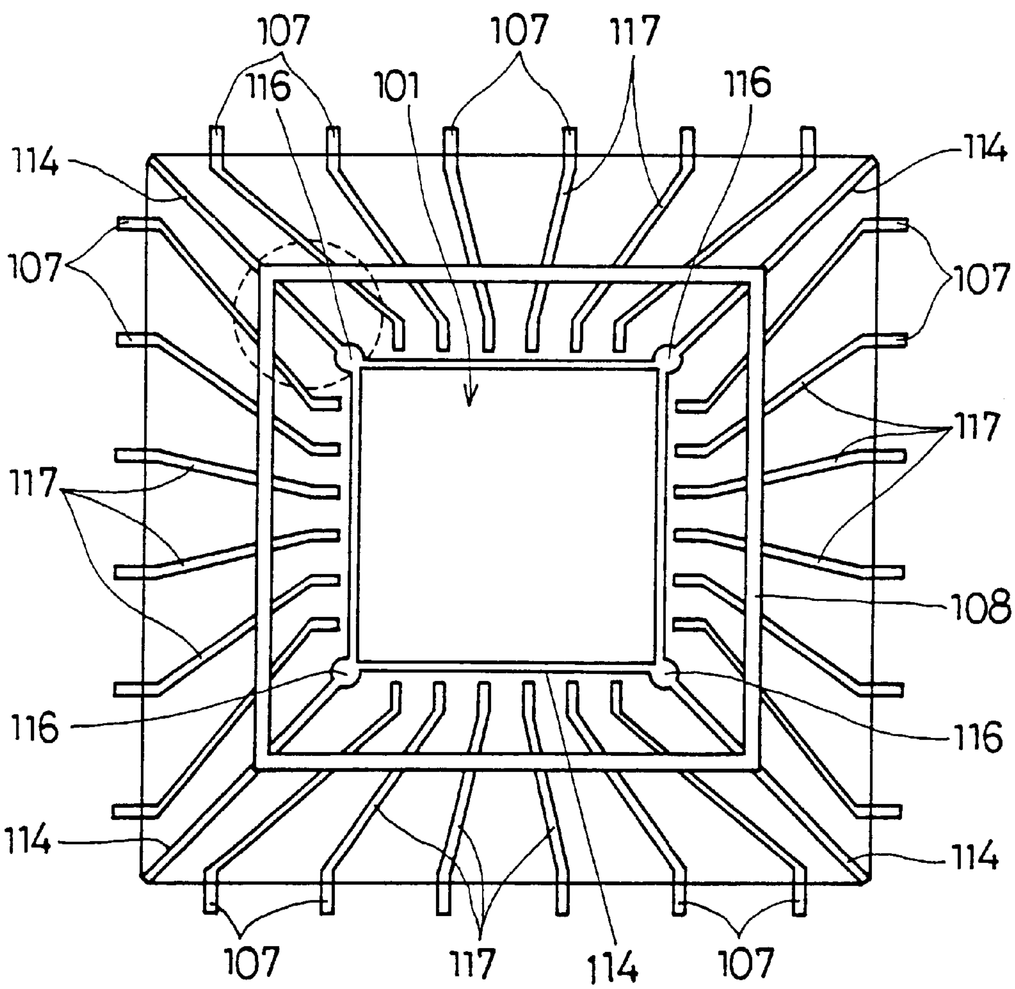
FIG. 66 is a plan view for explaining another method of forming the resin gate holes.

In this fifth embodiment of the method described above with reference to FIGS. 56A through 56H, only 1 resin gate hole 116 is provided. However, it is of course possible to provide a plurality of resin gate holes 116. When a plurality of resin gate holes 116 are provided, it is possible to improve the resin filling efficiency and also fill the resin 104*a* uniformly. FIG. 65 shows a case where 4 resin gate holes 116 are provided, and FIG. 66 shows a case where the resin gate holes 116 are provided by utilizing the bond positions of the divided substrates 103.

Figure 57:
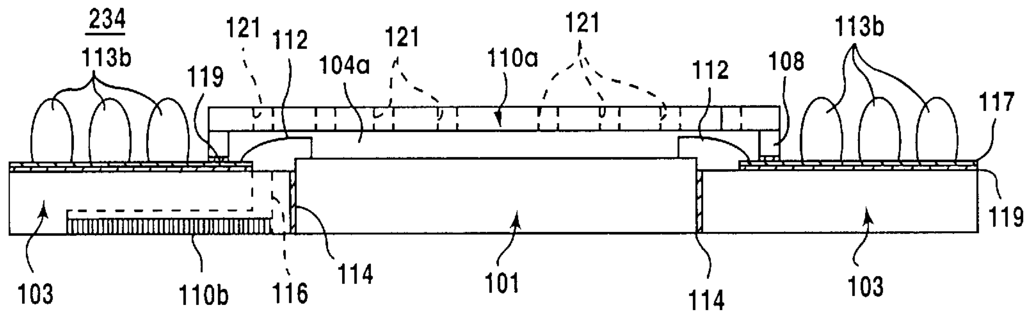
FIG. 57 is a cross sectional view showing an important part of a modification of the thirteenth embodiment of the semiconductor device produced by the fifth embodiment of the method.

FIG. 57 is shows a cross section of an important part of a modification of the thirteenth embodiment of the semiconductor device produced by the fifth embodiment of the method. The basic construction of a semiconductor device 234 shown in FIG. 57 is the same as that of the semiconductor device 212 shown in FIG. 34, except that a plurality of through holes 121 are formed in the upper lid member 110*a* in the case of the semiconductor device 234. Hence, this modification of the thirteenth embodiment of the semiconductor device corresponds to the semiconductor device shown in FIG. 17 described above.

Figure 58A:
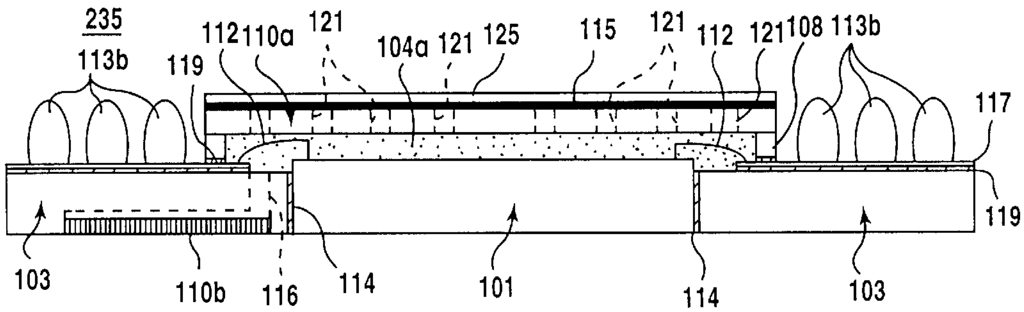
FIGS. 58A, 58B and 58C respectively are cross sectional views for explaining the method of producing the semiconductor device shown in FIG. 57.

When producing the semiconductor device 234 shown in FIG. 57, the plurality of through holes 121 are formed in the upper lid member 110*a*, and a mold separation film 125 is arranged above this upper lid member 110*a*. Then, the processes described above with reference to FIGS. 56A through 56H is carried out using this upper lid member 110*a*. FIG. 58A shows a semiconductor device 235 which is produced in this manner. In the semiconductor device 235 shown in FIG. 58A, the material 115 having the high thermal conductivity and ventilation characteristic is provided between the upper lid member 110*a* and the mold separation film 125.

During the production process of the semiconductor device, the through holes 121 formed in the upper lid member 110*a* are closed by the mold separation film 125 that is arranged above the upper lid member 110*a*. Hence, the resin 104*a* will not leak to the outside via the through holes 121 during the resin filling process. In addition, since the mold separation film 125 makes contact with the upper mold 122*a*, the mold release characteristic after the resin filling process is satisfactory.

Figure 58B:
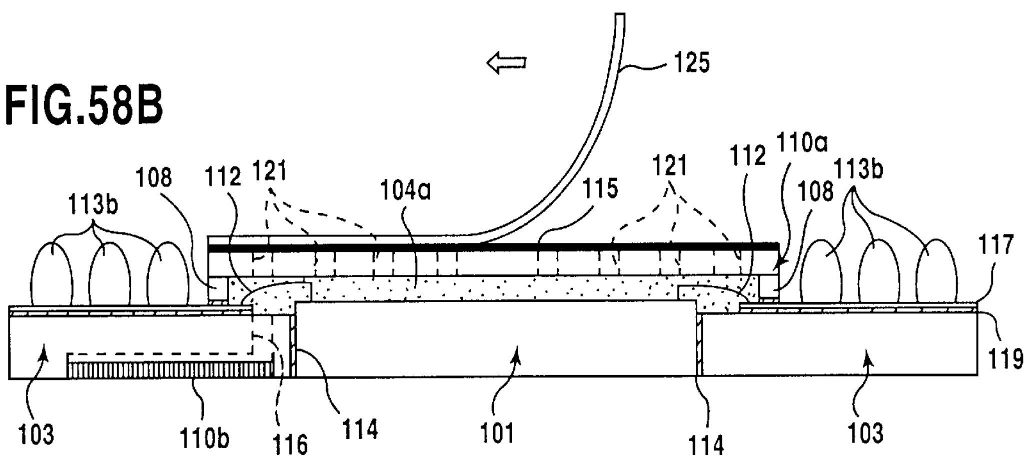
Figure 58C:
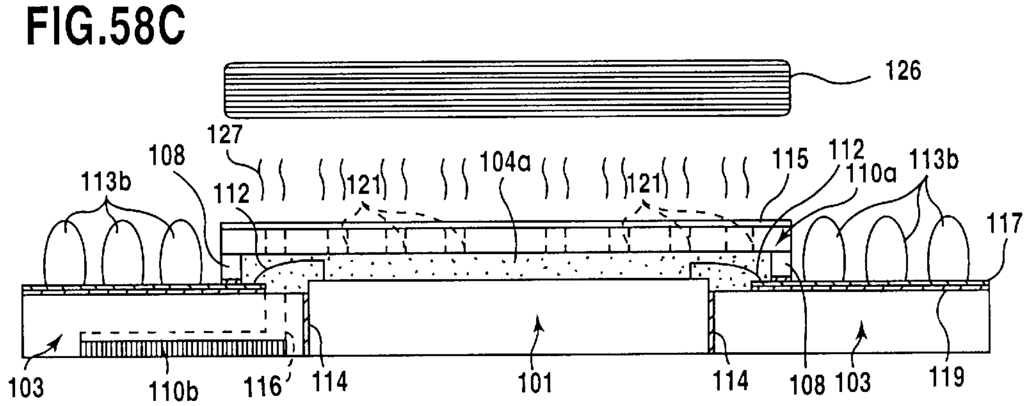

When mounting the semiconductor device 235 shown in FIG. 58A onto a mounting substrate (not shown), the mold separation film 125 arranged on top of the upper lid member 110*a* is removed as shown in FIG. 58B. Then, as shown in FIG. 58C, in order to solder the bumps 113*b* onto the terminals which are formed on the mounting substrate, the semiconductor device is loaded into a reflow chamber 126 and is subjected to a heating process. As a result, the bumps 113*b* melt and connect to the terminals of the mounting substrate.

When the heating process is carried out within the reflow chamber 126, the moisture included within the resin 104*a* becomes water vapor 127, and the water vapor 127 escapes outside the semiconductor device via the through holes 121 formed in the upper lid member 110*a*. Therefore, the moisture included within the resin 104*a* is eliminated, and it is possible to prevent the electrode pads, the wires 112, the wiring layer 117 and the like from corrosion and also prevent cracks from being generated in the resin 104*a*.

FIGS. 67A through 67F show cross sections for explaining a sixth embodiment of the method of producing the semiconductor device according to the present invention. In this embodiment, the semiconductor device uses the FPC 144 having the wiring layer 117.

Figures 67A, 67B, 67C, 67D, 67E, 67F:
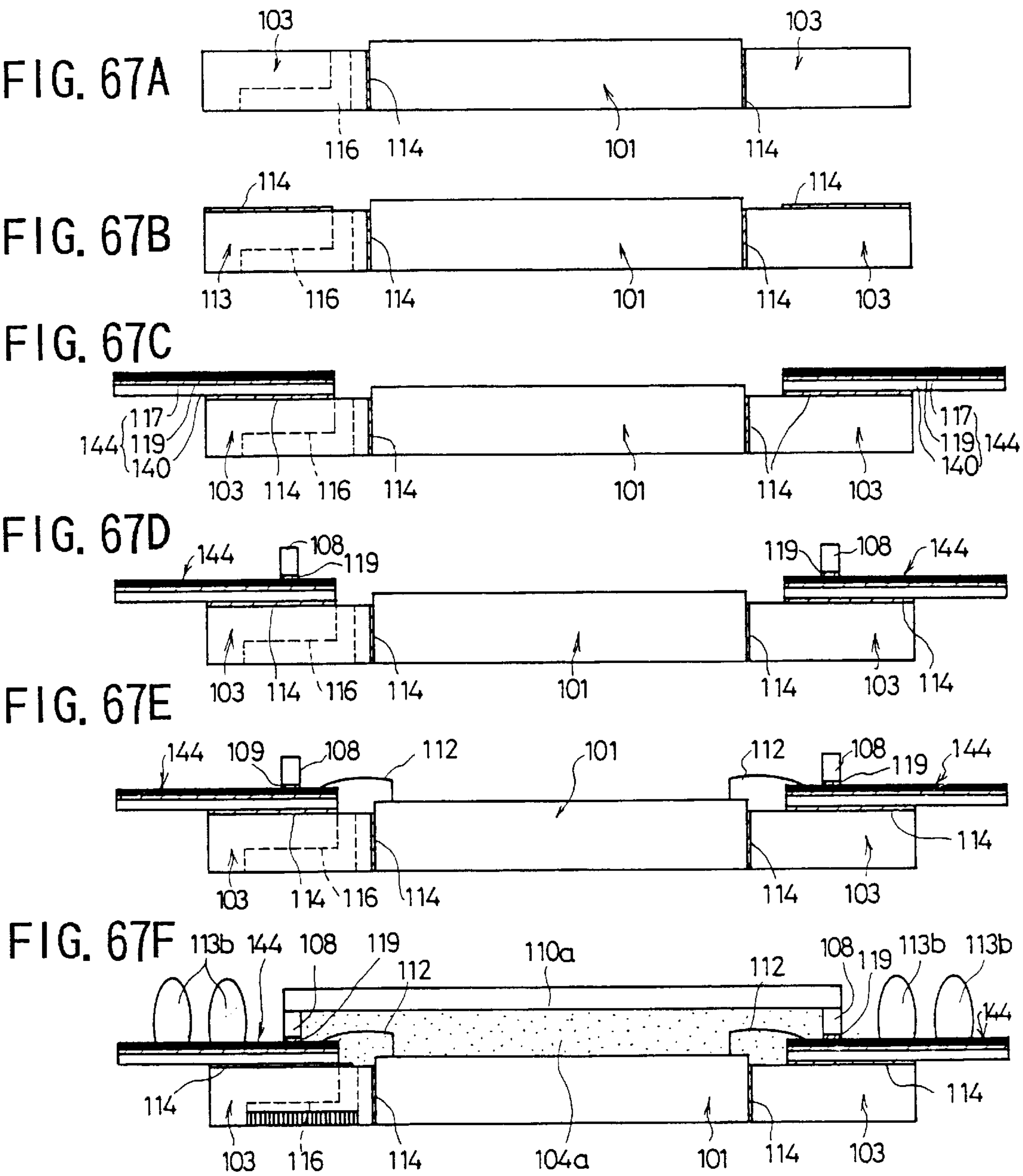
FIGS. 67A, 67B, 67C, 67D, 67E and 67F respectively are cross sectional views for explaining a sixth embodiment of the method of producing the semiconductor device according to the present invention.

First, processes similar to those described above with reference to FIGS. 56A and 56B are carried out to bond the divided substrates 103 on the outer peripheral side surfaces of the semiconductor element 101 using the bond material 114. As a result, a structure shown in FIG. 67A is obtained. Then, the bond material 114 is coated on the substrate 103 as shown in FIG. 67B, and the FPC 144 is arranged above the substrate 103 as shown in FIG. 67C. This FPC 144 is formed in advance by another process, and includes the insulating substrate 140, the insulator layer 119 and the wiring layer 117 which are stacked in this sequence from the bottom.

The processes shown in FIGS. 67D through 67F are identical to those shown in FIGS. 56D through 56G, and a description thereof will be omitted.

By using the FPC 144 as the wiring layer, it is possible to make the external shape of the semiconductor device constant by the shape of the FPC 144, regardless of the size and shape of the semiconductor element 101.

FIGS. 68A through 68F show cross sections for explaining a seventh embodiment of the method of producing the semiconductor device according to the present invention. This embodiment of the method produces the semiconductor device 217 shown in FIG. 39.

Figure 68A:
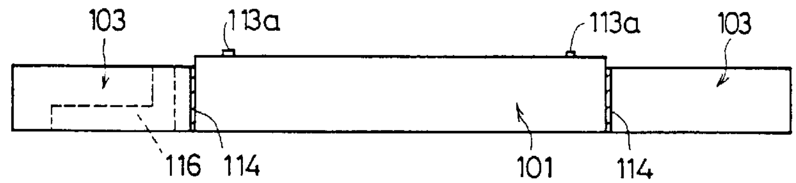
FIGS. 68A, 68B, 68C, 68D, 68E and 68F respectively are cross sectional views for explaining a seventh embodiment of the method of producing the semiconductor device according to the present invention.

When producing the semiconductor device 217, processes similar to those described above with reference to FIGS. 56A and 56B are carried out to bond the divided substrates 103 on the outer peripheral side surfaces of the semiconductor element 101 using the bond material 114. As a result, a structure shown in FIG. 68A is obtained.

Figure 68B:
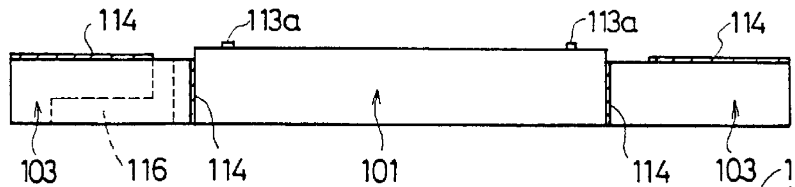
Figure 68C:
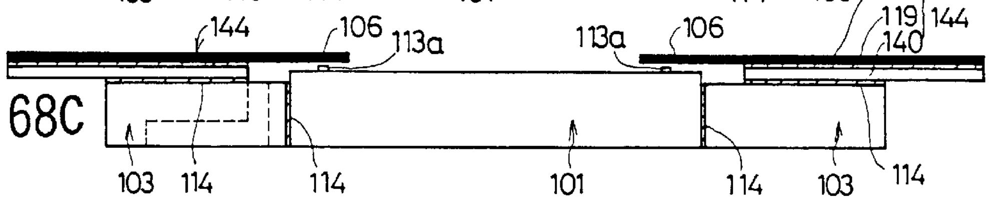

Next, the bond material 114 is formed above the substrate 103 as shown in FIG. 68B using the transfer method, the screen printing method, the dispense method or the like described above. Then, the TAB tape (FPC) 144 is bonded on the substrate 103. This TAB tape 144 is made up of the insulating substrate 140, the insulator layer 119 and the wiring layer 117 which are successively stacked in this sequence from the bottom. Generally, the wiring layer 117 and the inner leads 106 are integrally provided in the TAB tape 144 by electrolytic copper film or the like, and gold, tin, solder or the like is plated on the inner leads 106. The inner leads 106 are positioned above the inner bumps 103*a* of the semiconductor element 101 in the state where the TAB table 144 is arranged on the substrate 103. FIG. 68C shows a state where the TAB tape 144 is bonded on the substrate 103.

Figure 68D:
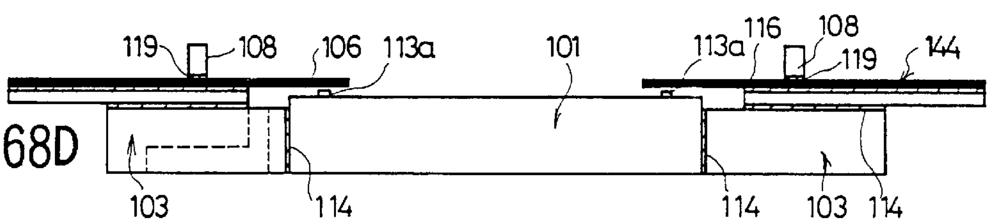

When the TAB tape 144 is bonded on the substrate 103, the frame body 108 is bonded on the TAB tape 144 by the insulator layer 119 which also functions as the bond material, as shown in FIG. 68D.

Figure 68E:
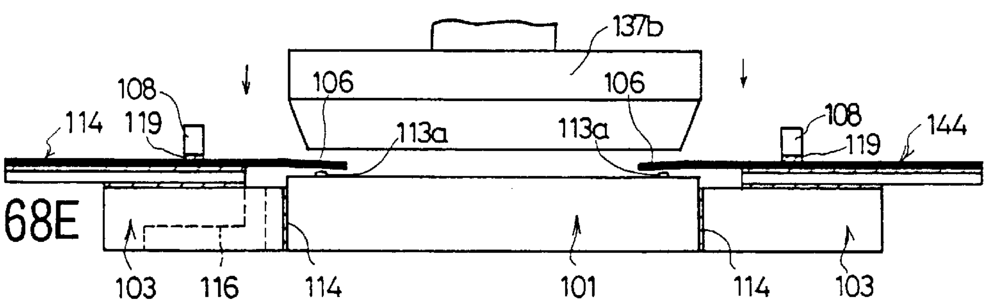
Figure 68F:
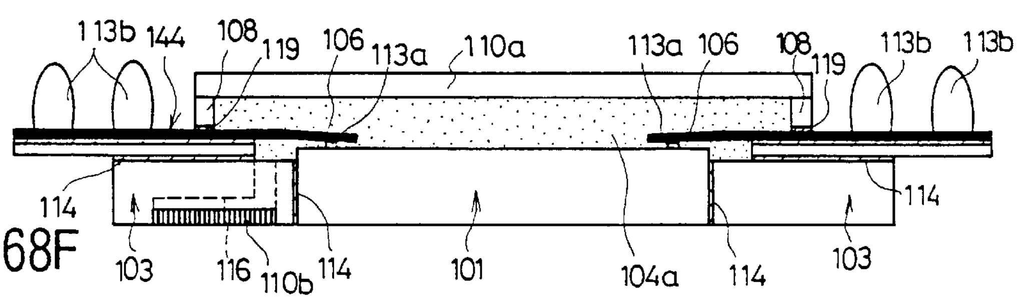

Thereafter, as shown in FIG. 68E, an inner lead bonding (ILB) is carried out using a tool 137*b* so as to bond the inner bumps 103*a* and the inner leads 106 by thermo-compression bonding or eutectic bonding. Next, processes similar to those described above with reference to FIGS. 56E through 56G are carried out, and the semiconductor device 217 shown in FIG. 68F is obtained.

Figures 69A, 69B, 69C, 69D:
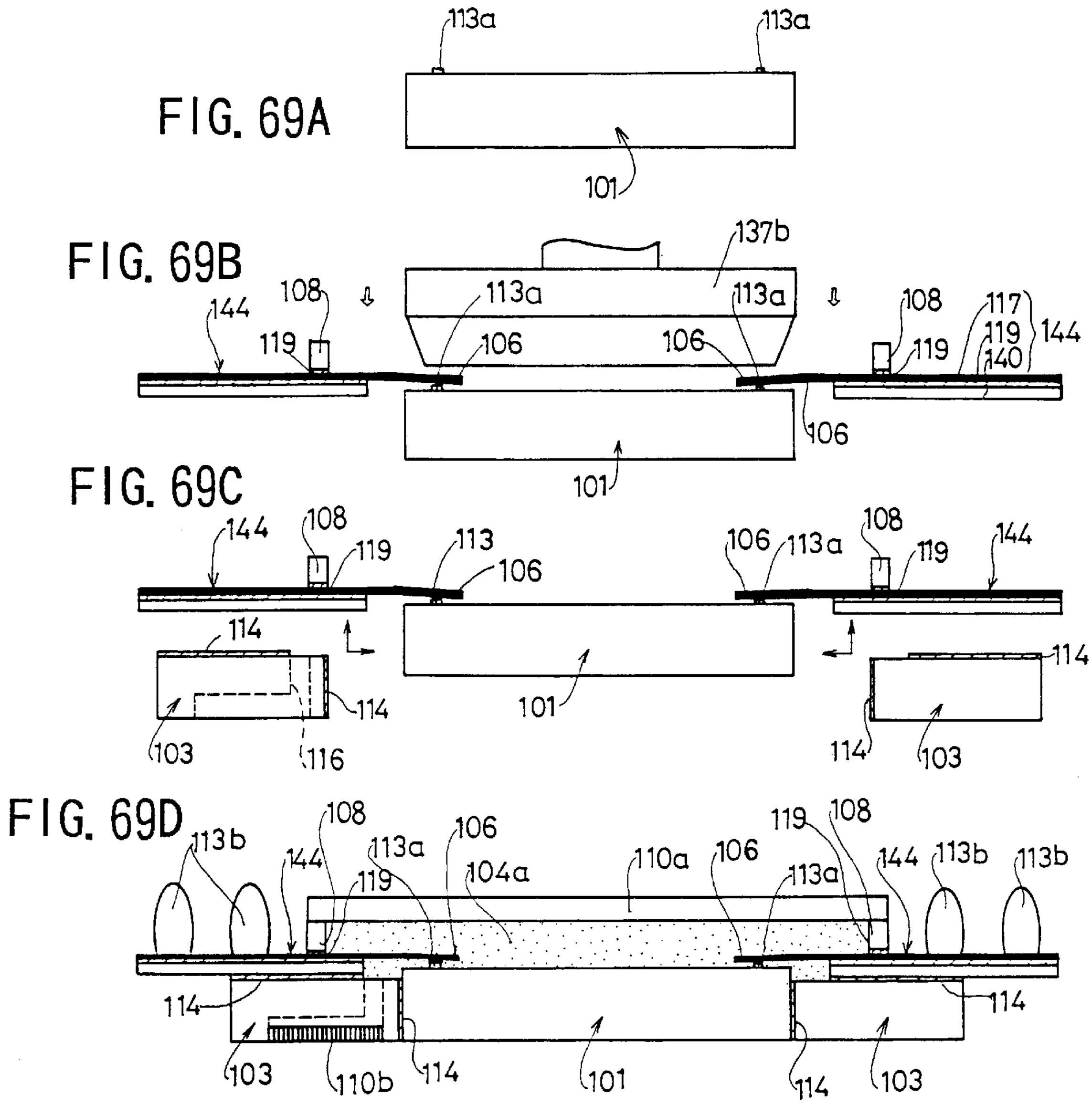
FIGS. 69A, 69B, 69C and 69D respectively are cross sectional views for explaining an eighth embodiment of the method of producing the semiconductor device according to the present invention.

FIGS. 69A through 68D show cross sections for explaining an eighth embodiment of the method of producing the semiconductor device according to the present invention. This embodiment of the method produces the semiconductor device 217 shown in FIG. 39.

This embodiment of the method is characterized in that, when producing the semiconductor device 217, the semiconductor element 101 is first connected to the TAB tape 144, and the substrate 103 is then bonded on the semiconductor element 101. For this reason, the inner bumps 103*a* are first formed on the semiconductor element 101 as shown in FIG. 69A, and the tool 137*b* is used to bond the inner bumps 103*a* and the inner leads 106 by the thermo-compression bonding or the eutectic bonding as shown in FIG. 69B. In this case, the frame body 108 is arranged above the TAB tape 144 when bonding the inner bumps 103*a* and the inner leads 106.

Next, as shown in FIG. 69C, the bond material 114 is provided on the surfaces of the divided substrates 103 confronting the semiconductor element 101 and the TAP tape 144, and the divided substrates 103 are bonded to the semiconductor element 101 and to the TAB tape 144 in one process. Thereafter, processes similar to those described above with reference to FIGS. 56E through 56G are carried out, and the semiconductor device 217 shown in FIG. 69D is obtained.

Figure 70A:
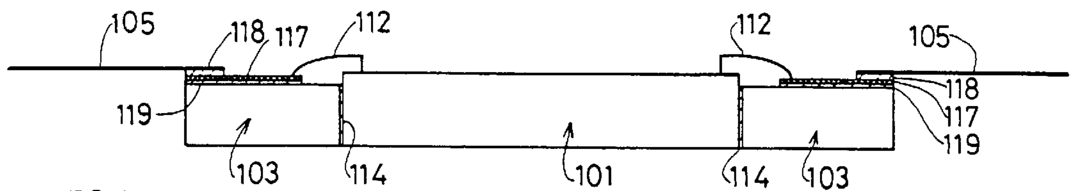
FIGS. 70A, 70B and 70C respectively are cross sectional views for explaining a ninth embodiment of the method of producing the semiconductor device according to the present invention.
Figure 70B:
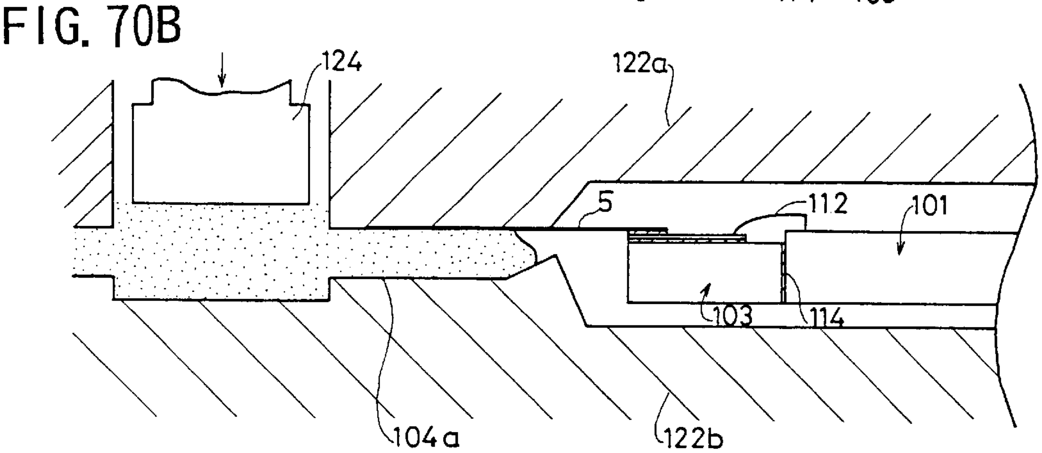
Figure 70C:
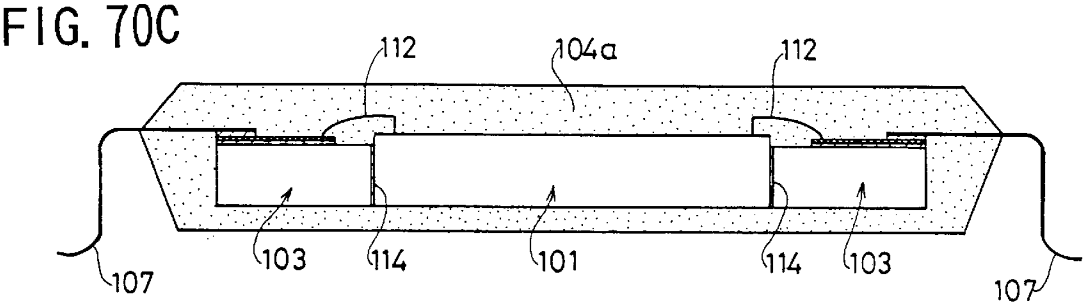

FIGS. 70A through 70C show cross sections for explaining a ninth embodiment of the method of producing the semiconductor device according to the present invention. This embodiment of the method produces the semiconductor device 223 shown in FIG. 45.

When producing the semiconductor device 223, the divided substrates 103 are bonded on the semiconductor element 101, and the wiring layer 117 and the insulator layer 119 are formed on the substrate 103. In addition, the wires 112 are provided between the wiring layer 117 and the semiconductor element 101, and the lead frame 105 is arranged as shown in FIG. 70A.

Then, the structure shown in FIG. 70A is loaded between the molds 122*a* and 122*b* as shown in FIG. 70B, so as to carry out a transfer mold process. The resin filling process shown in FIG. 70B is generally carried out when forming a resin package, and it is possible to encapsulate the structure shown in FIG. 70A by the resin 104*a* using the existing equipments. When the resin mold of the resin 104*a* with respect to the structure shown in FIG. 70A ends, this structure is removed from the molds 122*a* and 122*b*, and a shaping process is carried out with respect to the lead frame 105 so as to obtain the semiconductor device 217 shown in FIG. 70C.

Figure 71A:
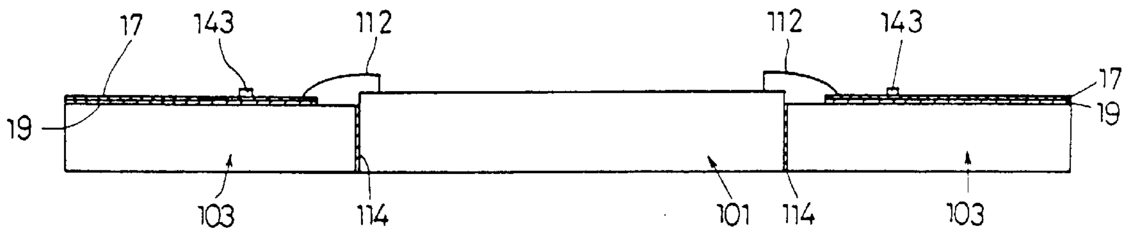
FIGS. 71A, 71B and 71C respectively are cross sectional views for explaining a tenth embodiment of the method of producing the semiconductor device according to the present invention.
Figure 71B:
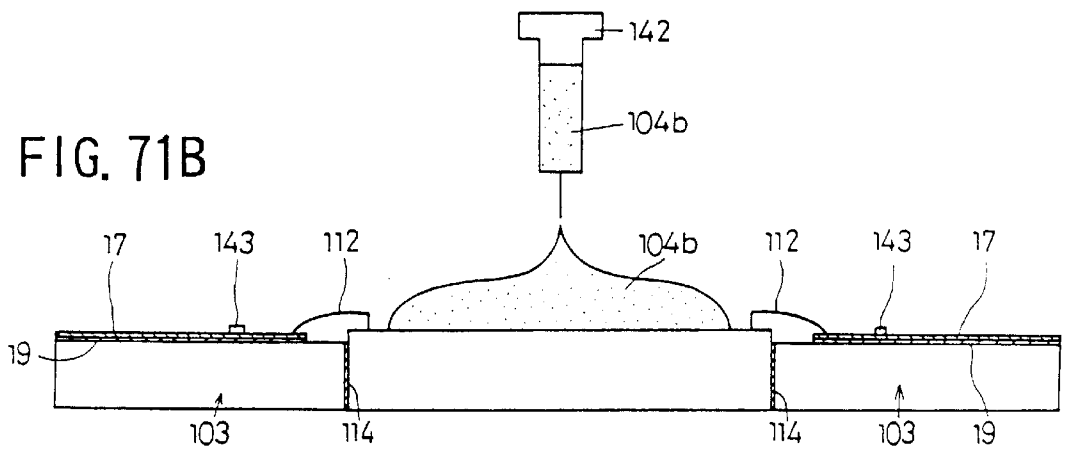
Figure 71C:
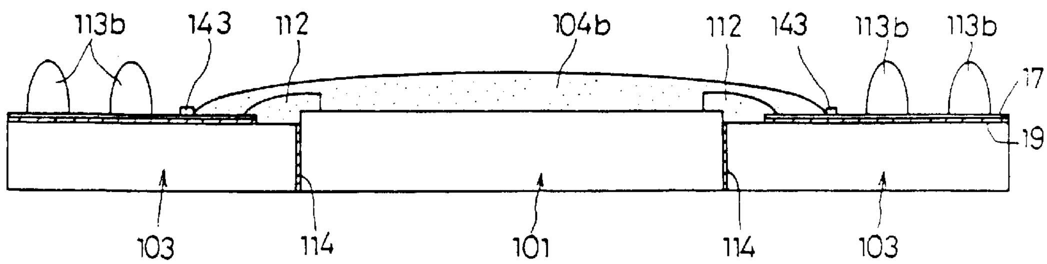

FIGS. 71A through 71C show cross sections for explaining a tenth embodiment of the method of producing the semiconductor device according to the present invention. This embodiment of the method produces the semiconductor device 226 shown in FIG. 48.

When producing the semiconductor device 226, the divided substrates 103 are bonded on the semiconductor element 101, and the wiring layer 117 and the insulator layer 119 are formed on the substrate 103. In addition, the wires 112 are provided between the wiring layer 117 and the semiconductor element 101, and a dam 143 for preventing the resin flow is formed on the wiring layer 117 as shown in FIG. 71A.

Then, as shown in FIG. 71B, the potting of the resin 104*a* on the semiconductor element 101 is made using the dispenser 142. As a result, the semiconductor device 226 shown in FIG. 71C is obtained.

FIGS. 72A through 72E show cross sections for explaining an eleventh embodiment of the method of producing the semiconductor device according to the present invention. This embodiment of the method produces the semiconductor device 232 shown in FIG. 54.

Figure 72A:
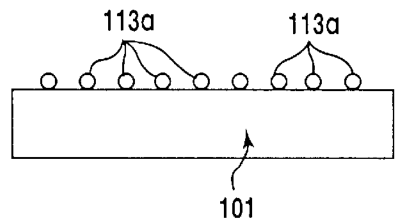
FIGS. 72A, 72B, 72C, 72D and 72E respectively are cross sectional views for explaining an eleventh embodiment of the method of producing the semiconductor device according to the present invention.
Figure 72B:
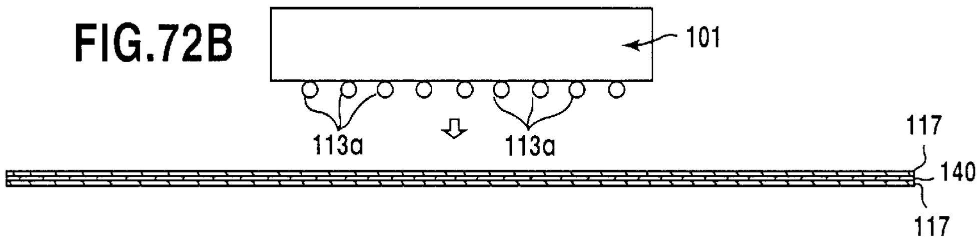

When producing the semiconductor device 232, the inner bumps 113*a* are formed on the semiconductor element 101 as shown in FIG. 72A. Then, as shown in FIG. 72B, the inner bumps 113*a* of the semiconductor element 101 are bonded on a FPC which is made up of the insulating substrate 140 and the wiring layers 117 which sandwich the insulating substrate 140.

Figure 72C:
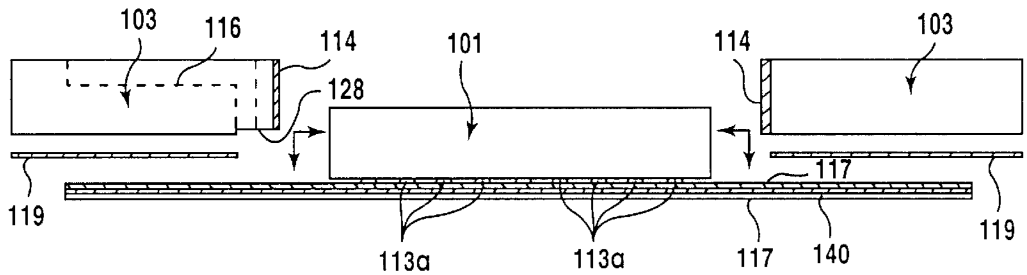

When the semiconductor element 101 is mounted on the FPC in the above described manner, the divided substrates 103 are bonded on the FPC so as to surround the semiconductor element 101 as shown in FIG. 72C. In this case, the outer peripheral side surfaces of the semiconductor element 101 and the divided substrates 103 are bonded by the bond material 114, and the FPC and the substrate 103 are bonded by the insulating layer 119 which also functions as a bond material.

Figure 72D:
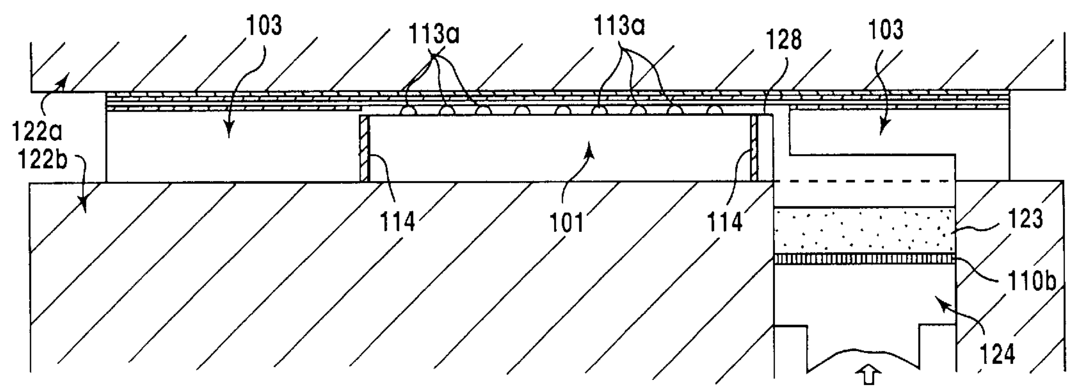
Figure 72E:
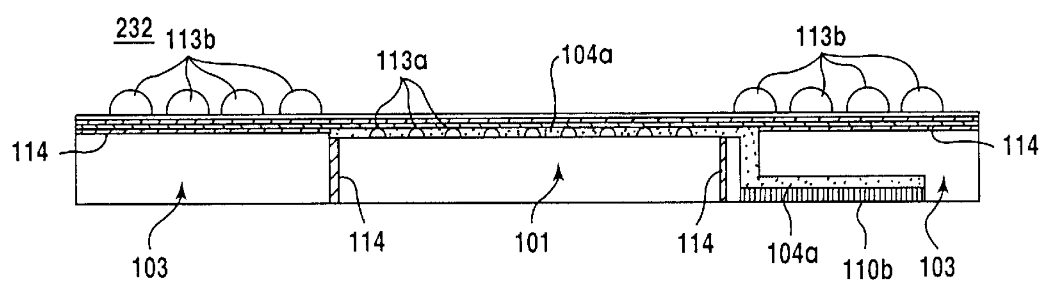

The FPC mounted with the substrate 103 is loaded between the molds 122*a* and 122*b* as shown in FIG. 72D, and the resin 104*a* is filled into the gap between the semiconductor element 101 and the FPC via the resin gate hole 116. Next, the outer bumps 113*b* are formed on the outer end parts of the FPC, and the semiconductor device 232 shown in FIG. 72E is obtained.

In each of the embodiments described above, the material having a satisfactory heat radiation characteristic and the material having a satisfactory or high thermal conductivity may be selected from a group consisting of (i) metals such as copper, aluminum, tungsten, molybdenum, clad materials of such metals, alloys of such metals and mixtures of such metals respectively having a thermal conductivity of 20 W/mk or greater, (ii) ceramics such as silicon nitride, aluminum nitride, alumina and composite materials of such ceramics, (iii) diamond, and (iv) composite materials of a plurality of materials such as metals, ceramics and diamond.

FIGS. 73 through 86 are diagrams for explaining a third aspect of the present invention.

Figure 73:
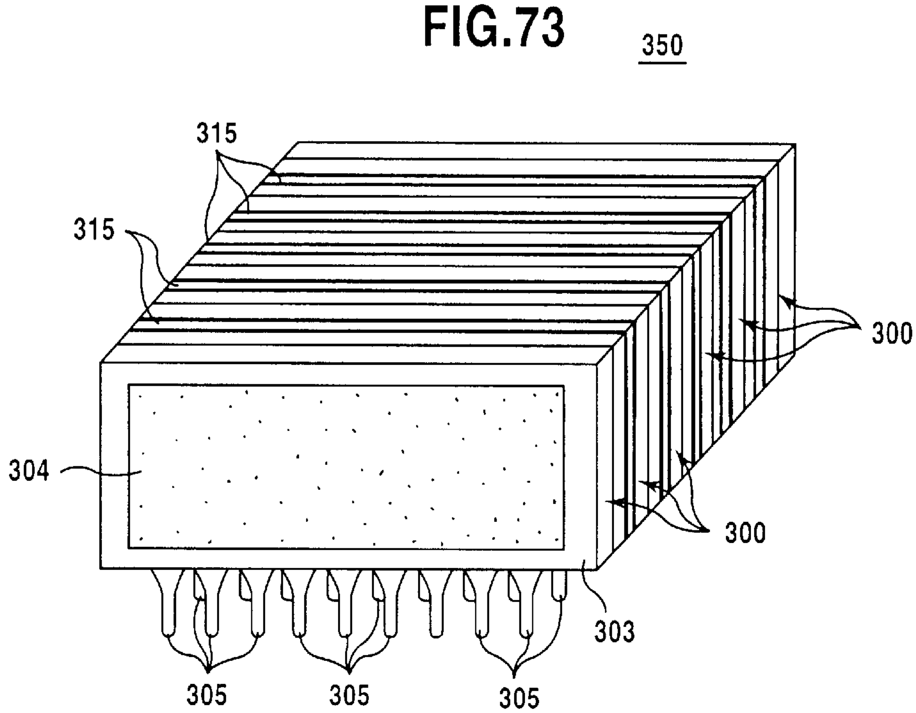
FIG. 73 is a perspective view showing a first embodiment of a semiconductor device unit according to the present invention.
Figure 74:
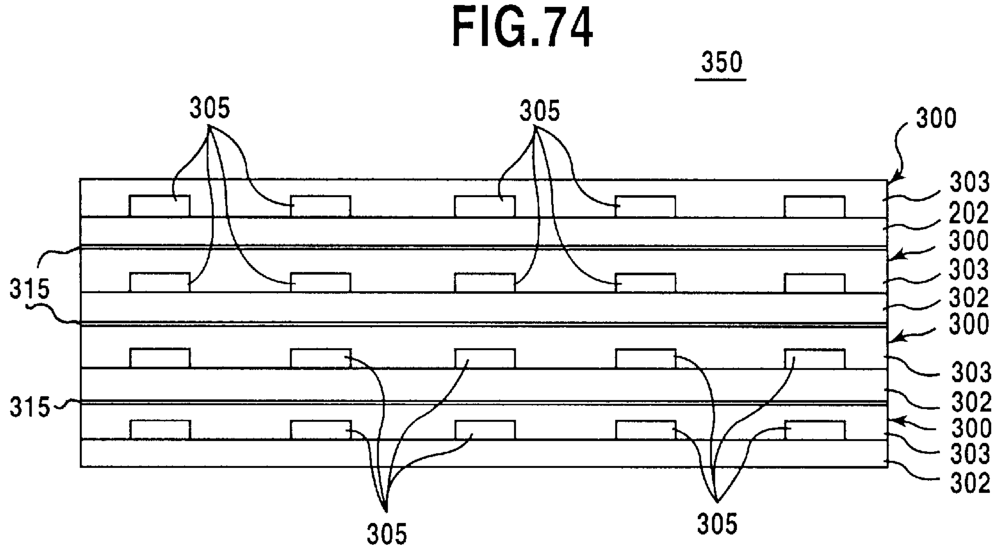
FIG. 74 is a bottom view showing the first embodiment of the semiconductor device unit.
Figure 75:
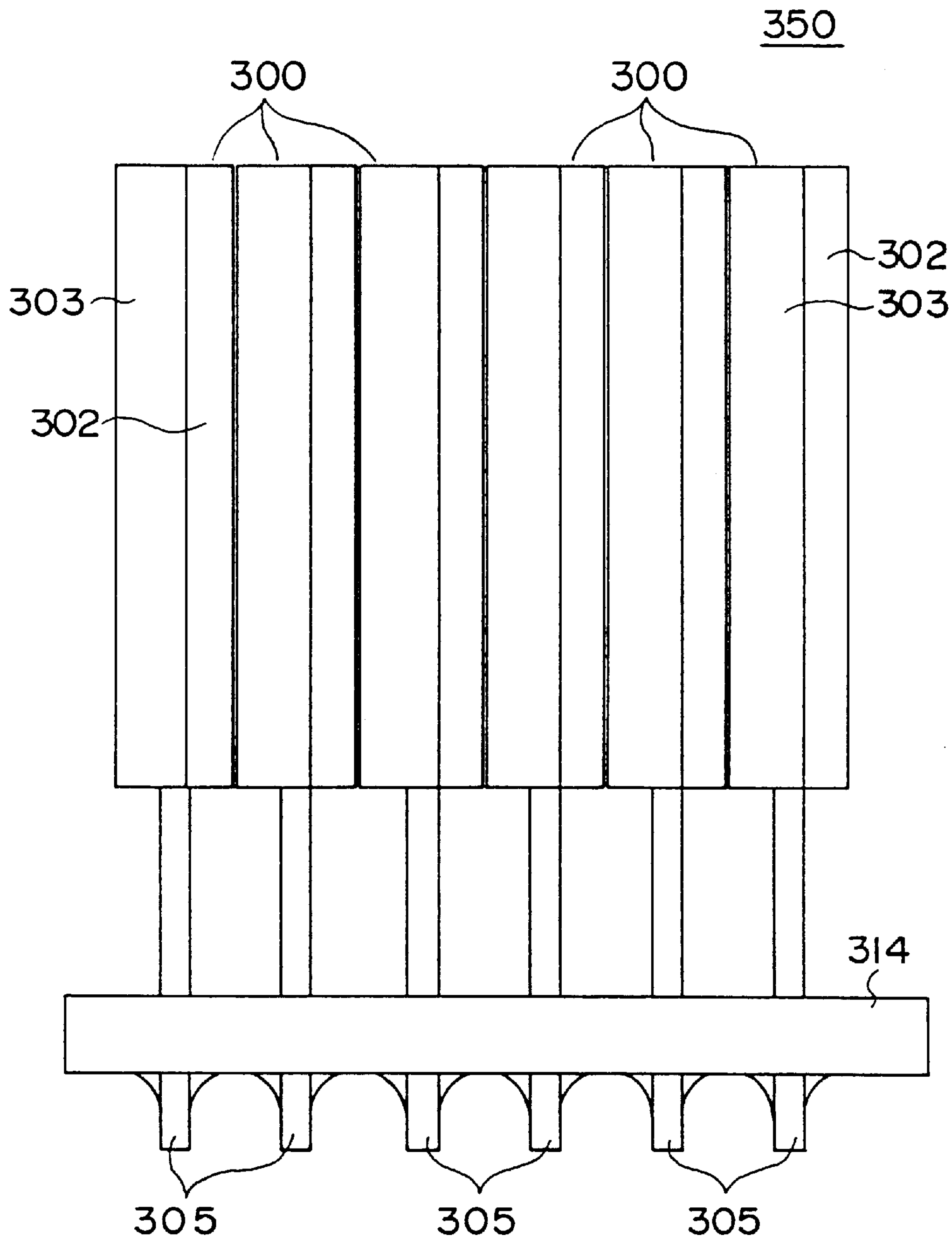
FIG. 75 is a side view showing a mounted state of the first embodiment of the semiconductor device unit.
Figure 76:
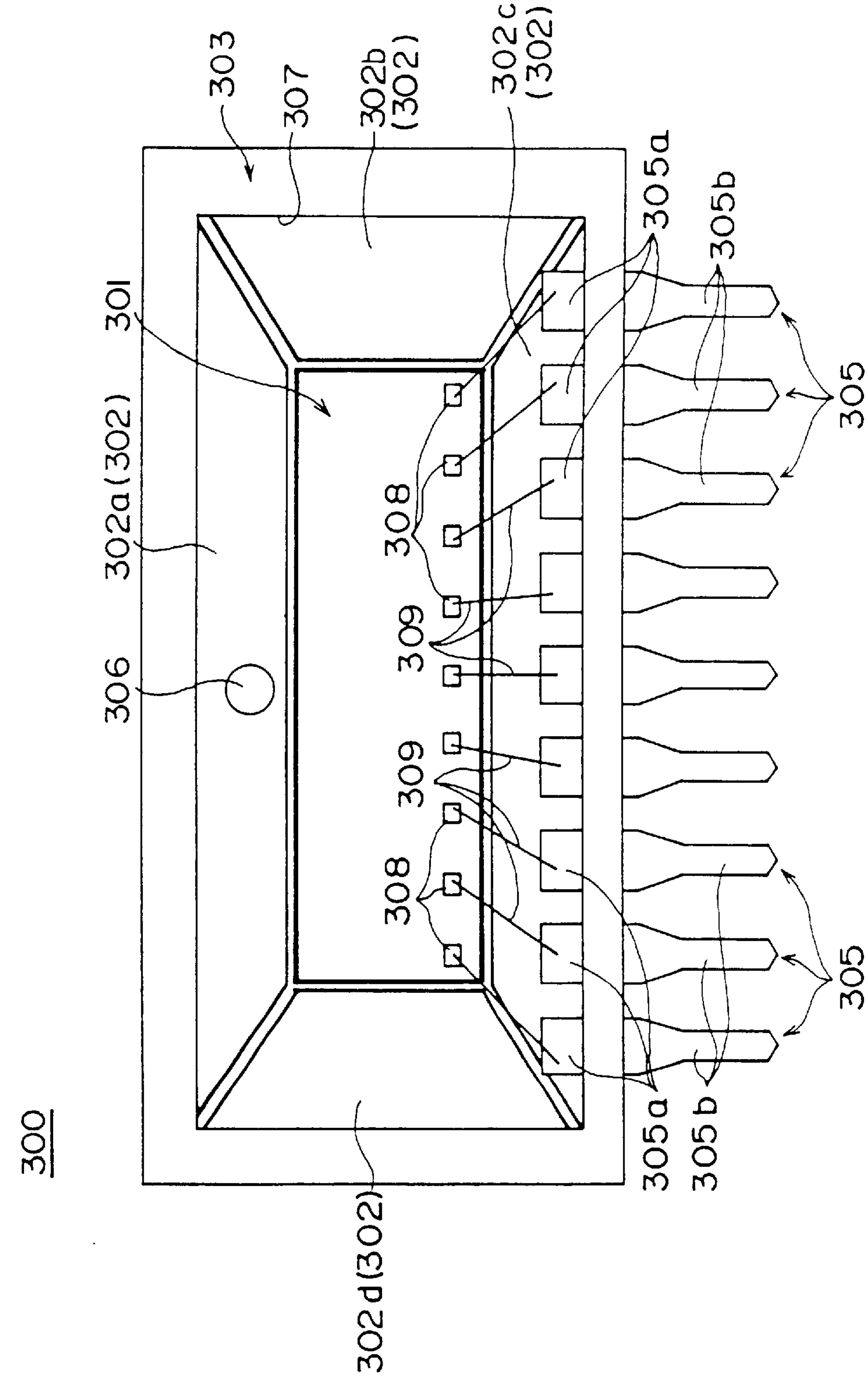
FIG. 76 is a front view showing a semiconductor device forming the first embodiment of the semiconductor device unit.
Figure 77:
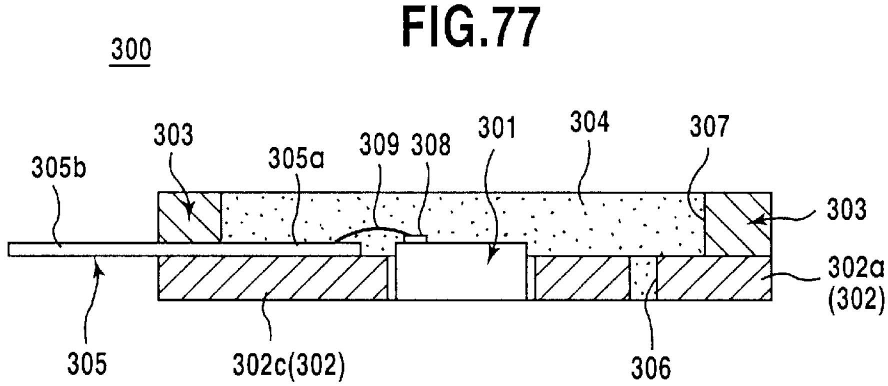
FIG. 77 is a cross sectional view showing the semiconductor device forming the first embodiment of the semiconductor device unit.

FIGS. 73 through 75 show a first embodiment of a semiconductor device unit according to the present invention employing the third aspect of the present invention. FIGS. 76 and 77 show a semiconductor device that forms the semiconductor device unit shown in FIGS. 73 through 75.

First, a description will be given of the construction of a semiconductor device 300, by referring to FIGS. 76 and 77. The semiconductor device 300 shown in FIGS. 76 and 77 generally includes a semiconductor element 301, a holding substrate 302, a frame body 303, an encapsulating resin 304 (not shown in FIG. 76 for the sake of convenience), and a plurality of leads 305.

The holding substrate 302 has a construction similar to the substrate 103 described above in conjunction with FIG. 60.

The holding substrate 302 is formed to have a rectangular shape as a whole, by bonding four divided substrates 302*a* through 302*b* to four outer peripheral sides of the semiconductor element 301 using an adhesive agent. As will be described later, a resin filling hole 306 for use in filling the resin is formed in the divided substrate 302*a* of the holding substrate 302. The holding substrate 302 is arranged so as to surround the semiconductor element 301, and has a function of holding the semiconductor element 301. The confronting connecting surfaces of the divided substrates 302*a* through 302*d* are also bonded to each other using an adhesive agent.

The frame body 303 is arranged on the top surface of the holding substrate 302 by bonding, for example. This frame body 303 is shaped so as to surround at least the semiconductor element 301. In this embodiment, the external shape of the frame body 303 and the external shape of the holding substrate 302 are approximately the same. By arranging the frame body 303 on the top surface of the holding substrate 302, the holding substrate 302 and the frame body 303 cooperate to form a space 307 having a closed bottom.

The encapsulating resin 304 is filled into the space 307 that is formed by the holding substrate 302 and the frame body 303. The encapsulating resin 304 is filled into the space 307 via the resin filling hole 306 in the holding substrate 302. A more detailed description on the filling of the encapsulating resin 304 will be given later.

The leads 305 are made of a lead material such as covar and 42 alloy (FeNi alloy). Each lead 305 is made up of an inner lead portion 305*a* and an outer lead portion 305*b*. The leads 305 are intensively arranged along one side of a housing which is formed by the holding substrate 302 and the frame body 303. In this embodiment, the leads 305 are arranged along the lower longer side of the housing as shown in FIG. 76. In addition, the leads 305 are bonded on the upper portion of the holding substrate 302, and are fixed by being sandwiched between the holding substrate 302 and the frame body 303.

Each inner lead portion 305*a* is connected to an electrode pad 308 formed on the top surface of the semiconductor element 301 by a wire 309, so that the leads 305 and the semiconductor element 301 are electrically connected. Each outer lead portion 305*b* extends outwards from an edge part of the frame body 303 or the holding substrate 302. When mounting the semiconductor device 300 on a mounting substrate, the outer lead portions 305*b* are connected to the mounting substrate. In this embodiment, the outer lead portions 305*b* are shaped to extend linearly from the frame body 303 or the holding substrate 302.

In the semiconductor device 300 having the construction described above, all of the leads 305 are intensively arranged along one side of the housing that is formed by the holding substrate 302 and the frame body 303. For this reason, it is possible to mount the semiconductor device 300 in a standing position. When the semiconductor device 300 is mounted on the mounting substrate in the standing position, the area on the mounting substrate occupied by the semiconductor device 300 becomes small, thereby making it possible to improve the mounting density.

Figure 78:
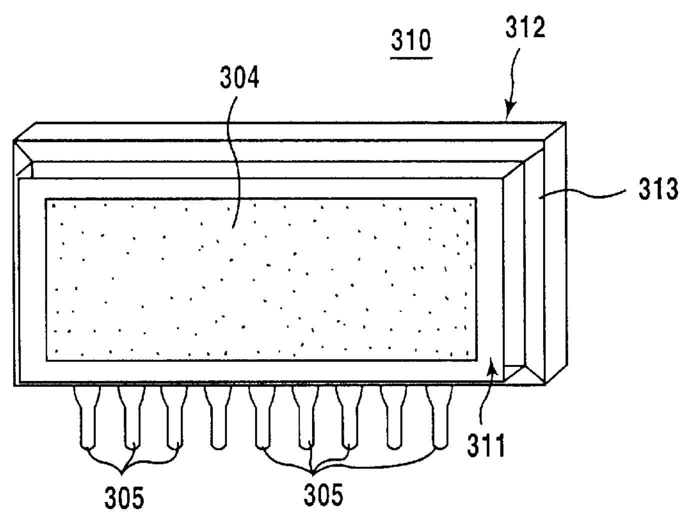
FIG. 78 is a perspective view showing a modification of the first embodiment of the semiconductor device unit.
Figure 79:
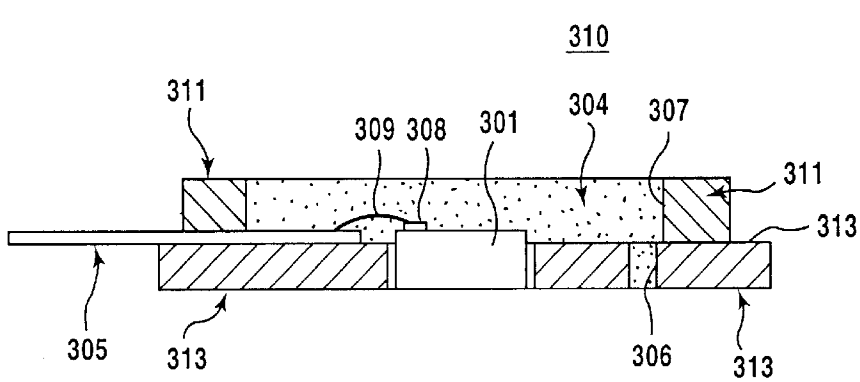
FIG. 79 is a cross sectional view showing the modification of the first embodiment of the semiconductor device unit.

FIGS. 78 and 79 show a modification of the semiconductor device 300.

A semiconductor device 310 shown in FIGS. 78 and 79 is characterized in that the external size of a holding substrate 312 is greater than the external size of a frame body 311. A stepped portion 313 is formed between the frame body 311 and the holding substrate 312 due to the different external sizes of the frame body 311 and the holding substrate 312, and the contact area of the frame body 311 and the holding substrate 312 with respect to the surrounding air is large. Hence, according to this modification, the heat radiating area of the semiconductor device 310 is large, and the heat radiating efficiency of the semiconductor element 301 can be improved.

Next, a description will be given of a semiconductor device unit 350 shown in FIGS. 73 through 75 which uses the semiconductor device 300 having the above described construction. The semiconductor device unit 350 includes a plurality of semiconductor devices 300 which are arranged in parallel and are bonded together by an adhesive agent so as to form a unit. The adhesive agent forms an adhesive layer 315 as shown in FIG. 73. The plurality of semiconductor devices 300 are fixed in parallel so that the leads 305 of each of the semiconductor devices 300 extend outwards from the same surface of the semiconductor device unit 350. FIG. 74 shows the bottom surface of the semiconductor device unit 350 from which each of the leads 305 extend outwards.

FIG. 75 shows a state where the semiconductor device unit 350 is mounted on a mounting substrate 314. As shown in FIG. 75, the semiconductor device unit 350 is mounted on the mounting substrate 314 in a state where each of the semiconductor devices 300 are in the standing position and the adjacent semiconductor devices 300 are in contiguous contact with each other. For this reason, compared to the case where the semiconductor devices 300 are mounted independently in the standing position, it is possible to further improve the mounting density of the semiconductor devices 300 on the mounting substrate 314. In addition, since the plurality of semiconductor devices 300 are connected to form the semiconductor device unit 350, it is possible to mount a large number of semiconductor devices 300 on the mounting substrate 314 in one operation, and the mounting efficiency of the semiconductor devices 300 with respect to the mounting substrate 314 can be improved.

Next, a description will be given of a first embodiment of a method of producing the semiconductor device unit 350, by referring to FIGS. 80A through 80G. The semiconductor device unit producing operation can generally be divided into a semiconductor element arranging process, a lead arranging process, a frame body arranging process, a wiring process, a resin encapsulating process and a semiconductor device stacking process. A description will hereunder be given with respect to each of these processes.

Figure 80A:
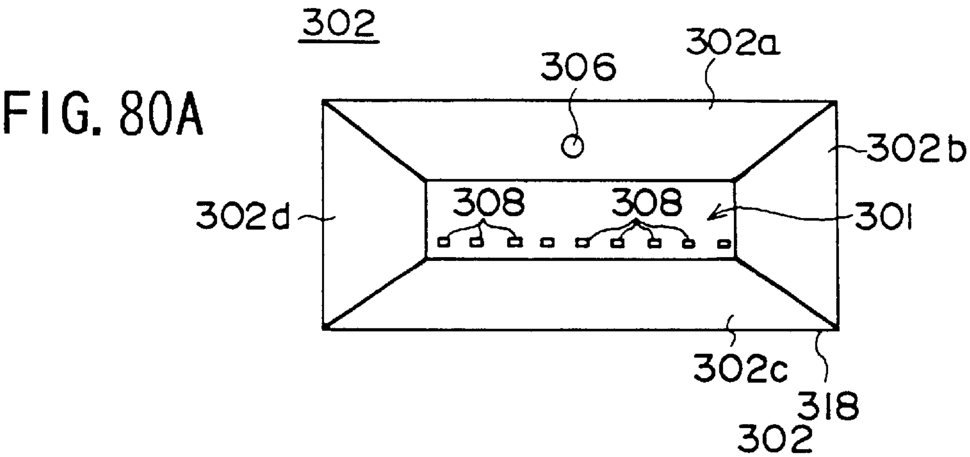
FIGS. 80A through 80G respectively are diagrams for explaining a first embodiment of a method of producing the semiconductor device unit according to the present invention.

When producing the semiconductor device unit 350, the semiconductor element arranging process is carried out first. FIG. 80A is a diagram for explaining the semiconductor element arranging process. As shown in FIG. 80A, the holding substrate 302 is formed in the semiconductor element arranging process by bonding the divided substrates 302*a* through 302*d* on the four outer peripheral side surfaces of the semiconductor element 301 using an adhesive agent. In this case, the resin filling hole 306 is formed in advance in the divided substrate 302*a*. By arranging the divided substrates 301 around the semiconductor element 301, the semiconductor element 301 becomes held by the holding substrate 302, thereby improving the mechanical strength.

Figure 80B:
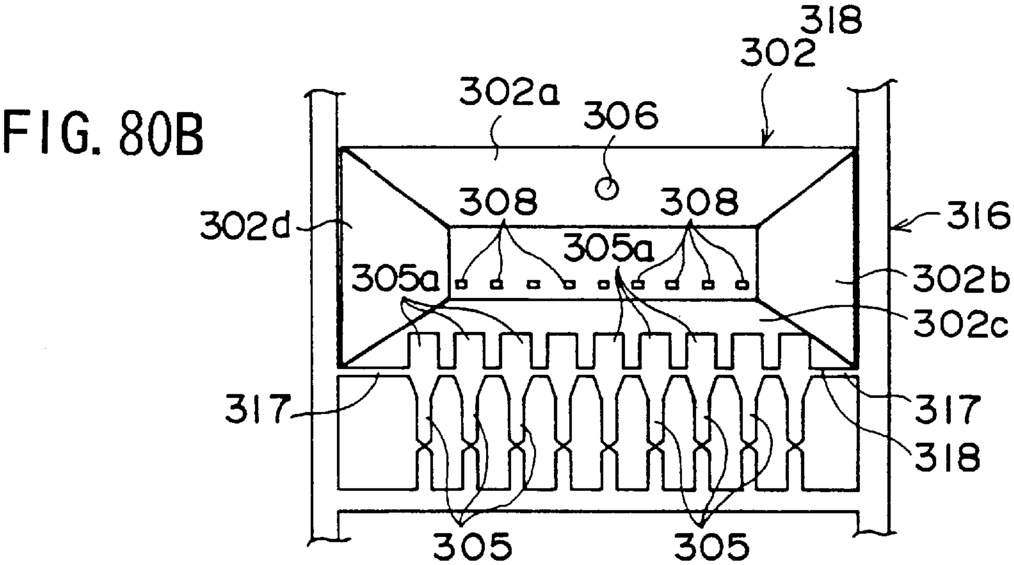

The lead arranging process is carried out after the semiconductor element arranging process ends. FIG. 80B is a diagram for explaining the lead arranging process. In FIG. 80B, the leads 305, tie bars 317 and the like are formed in advance on a lead frame 316 by press-molding or the like. This lead frame 316 is arranged on the upper portion of the holding substrate 302. The lead frame 316 has the leads 305 provided intensively at a position corresponding to one side of the holding substrate 302. In this particular case, the leads 305 are arranged at a position corresponding to a lower longer side 318 of the holding substrate 302.

Figure 80C:
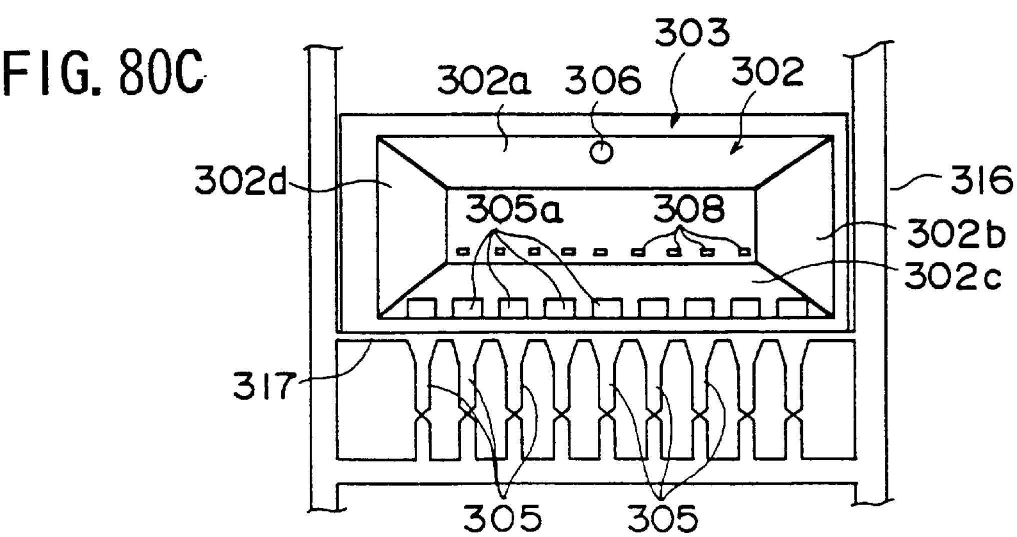

The frame body arranging process is carried out after the lead frame 316 is placed on the holding substrate 302. FIG. 80C is a diagram for explaining the frame body arranging process. In the frame body arranging process, the frame body 303 is bonded on the holding substrate 302 on which the lead frame 316 is placed, using an adhesive agent. This frame body 303 in the fixed state has a frame shape that surrounds the semiconductor element 301. In addition, because the frame body 303 is bonded on the holding substrate 302, the leads 305 become sandwiched and fixed between the frame body 303 and the holding substrate 302.

Figure 80D:
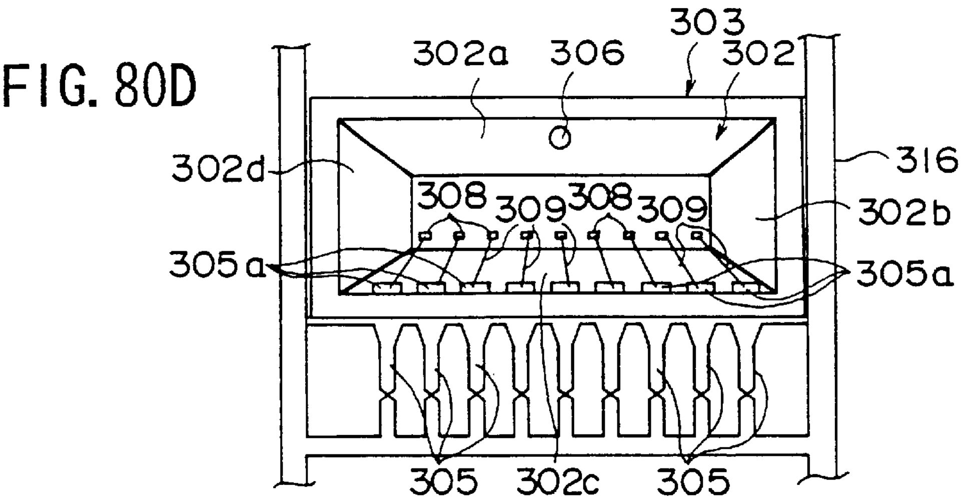

The wiring process is carried out after the frame body arranging process ends. FIG. 80D is a diagram for explaining the wiring process. The electrode pads 308 are provided at the upper portion of the semiconductor element 301, and the wiring process arranges the wire 309 between the inner lead portion 305*a* of each lead 305 and the corresponding electrode pad 308 by use of a wire-bonding equipment. The semiconductor element 301 and the leads 305 are electrically connected by this wiring process.

Figure 80E:
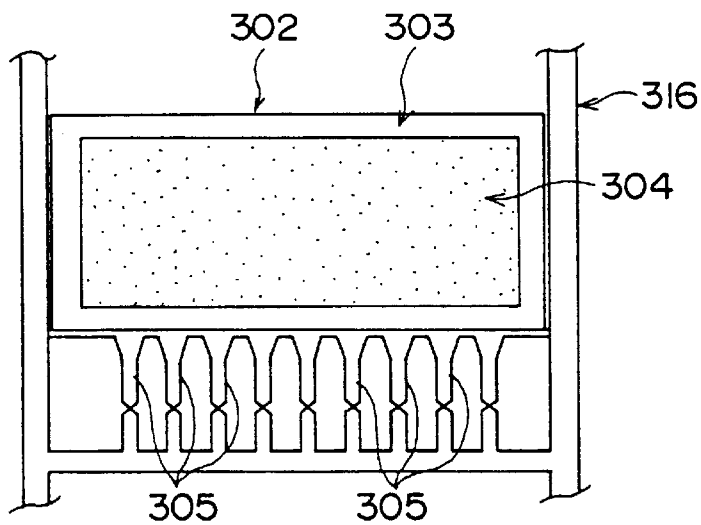

The resin encapsulating process is carried out after the wiring process ends. In the resin encapsulating process, the holding substrate 302 having the lead frame 316, the frame body 303 and the wires 309 arranged thereon is loaded into a resin molding equipment which uses the upper and lower molds 20*a* and 20*b* and the plate 23 which are similar to those described above in conjunction with FIGS. 19A through 19D. The resin is filled from the rear surface of the holding substrate 302 via the resin filling hole 306, that is, from the side of the holding substrate 302 not provided with the electrode pads 308, the wires 309 and the like. Accordingly, the encapsulating resin 304 is filled into the space 307 that is formed by the holding substrate 302 and the frame body 303. As a result, the semiconductor element 301, the wires 309 and the like are protected by the encapsulating resin 304. FIG. 80E shows a state where the resin encapsulating resin 304 fills the space 307.

Figure 80F:
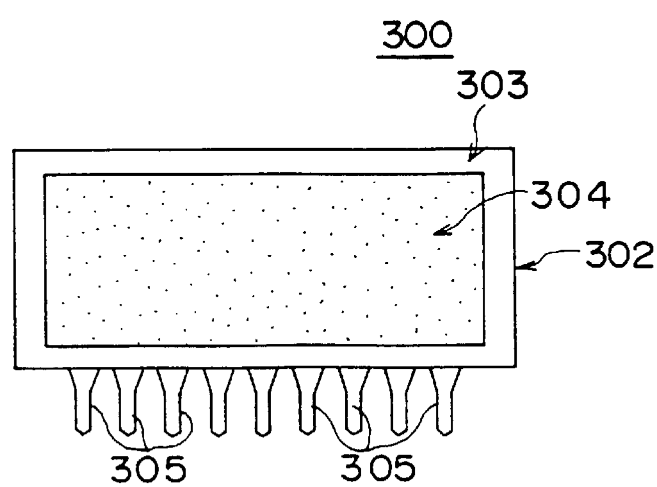

After the resin encapsulating process is carried out, unwanted portions of the lead frame 316, such as the tie bars 317, are removed so as to form the semiconductor device 300 shown in FIG. 80F.

Figure 80G:
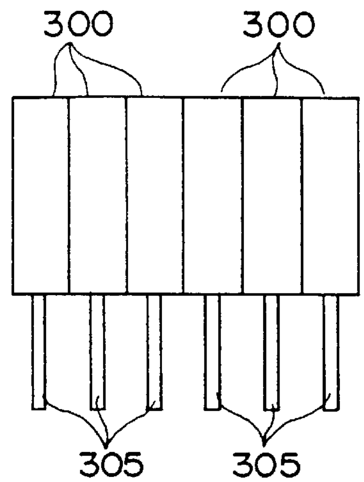

The semiconductor device stacking process is carried out after the semiconductor devices 300 are formed. FIG. 80G is a diagram for explaining the semiconductor device stacking process. In the semiconductor device stacking process, a plurality of the semiconductor devices 300 are arranged in parallel and positioned so that the leads 305 extend from the same surface, and the semiconductor devices 300 are fixed to each other using an adhesive agent. As a result, the semiconductor device unit 350 shown in FIGS. 73 through 75 and 80G.

When carrying out the semiconductor device stacking process, it is necessary to accurately align the positions of the leads 305 provided on each of the semiconductor devices 300. The leads 305 are to be connected to the mounting substrate 314, and the mounting substrate 314 is provided with electrode portions corresponding to the positions where the leads 305 are arranged on the semiconductor device unit 350. For this reason, if the positioning accuracy of the leads 305 is poor, there is a possibility that a satisfactory electrical contact may not be made between the leads 305 and the mounting substrate 314. Therefore, each of the semiconductor devices 300 must be arranged in parallel and positioned with a high accuracy during the semiconductor device stacking process.

FIGS. 81A and 81B, FIGS. 82A through 82C and FIGS. 83A through 83C respectively are diagrams for explaining methods of accurately positioning each of the semiconductor devices 300 when stacking the semiconductor devices 300.

Figure 81A:
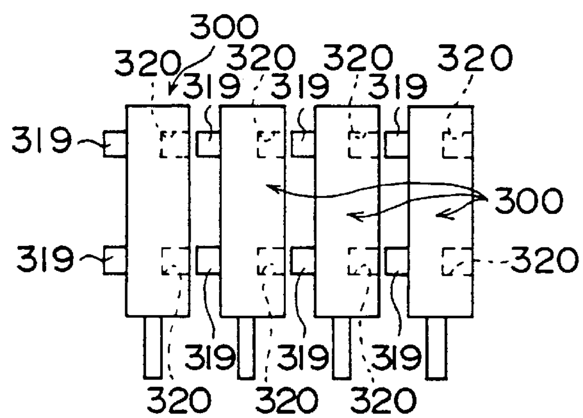
FIGS. 81A and 81B respectively are diagrams for explaining a method of positioning the semiconductor devices during a semiconductor device stacking process.
Figure 81B:
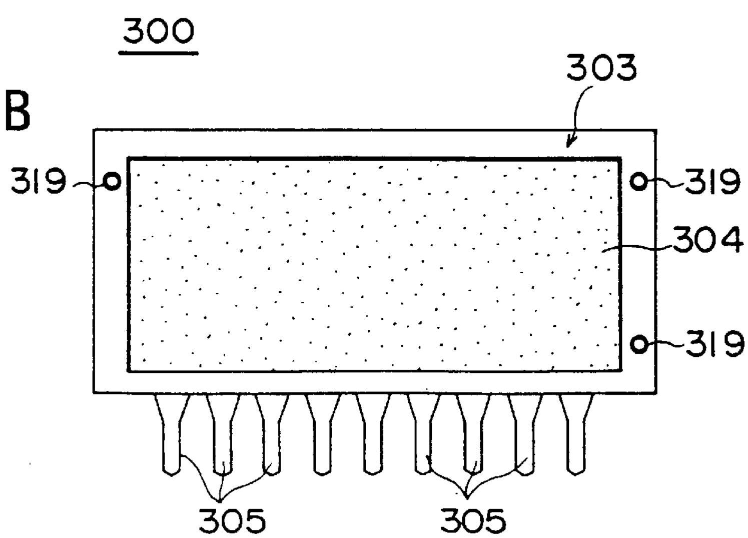

According to the positioning method shown in FIGS. 81A and 81B, positioning projections 319 are formed on the surface of the frame body 303, and positioning cavities 320 are formed on the rear surface of the holding substrate 302. FIG. 81A shows a side view of the semiconductor devices 300, and FIG. 81B shows a front view of the semiconductor devices 300. The positioning projections 319 and the positioning cavities 320 are formed with a high precision, and the positioning projections 319 fit into the corresponding positioning cavities 320.

Hence, when arranging the semiconductor devices 300 in parallel, each of the semiconductor devices 300 can be positioned with a high accuracy by fitting the positioning projections 319 into the corresponding positioning cavities 320.

Figure 82A:
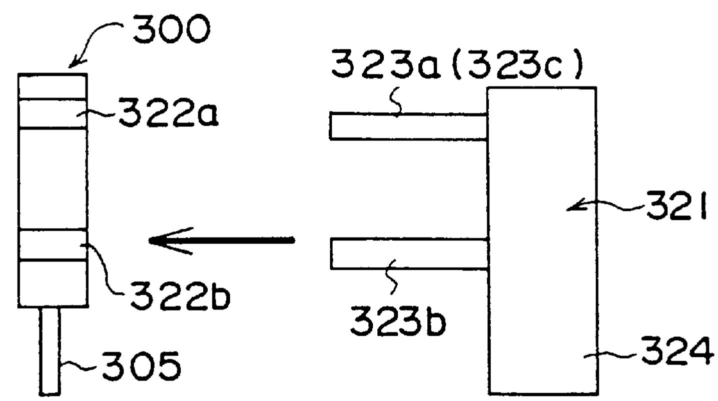
FIGS. 82A through 82C respectively are diagrams for explaining another method of positioning the semiconductor devices during the semiconductor device stacking process.
Figure 82B:
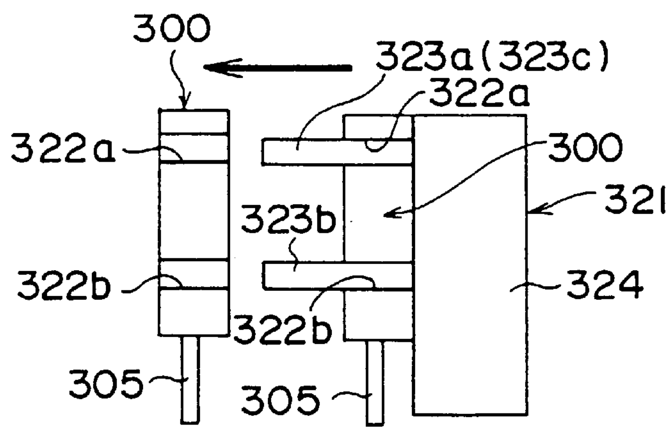
Figure 82C:
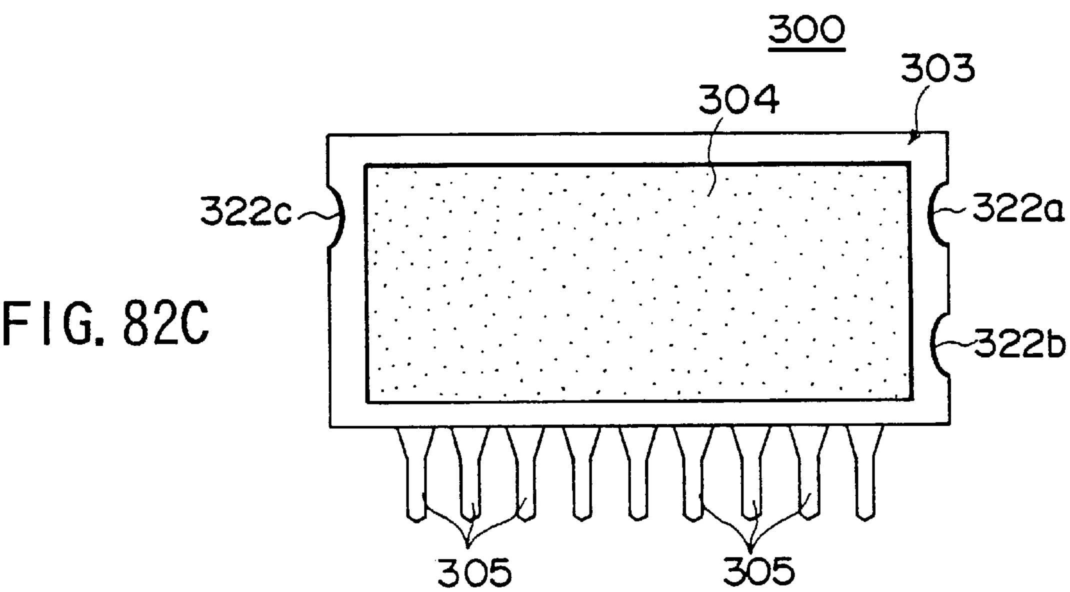

According to the positioning method shown in FIGS. 82A through 82C, each of the semiconductor devices 300 are positioned using a positioning jig 321. FIGS. 82A and 82B are side views showing the semiconductor devices 300 and the positioning jig 321, and FIG. 82C is a front view showing the semiconductor devices 300. As shown in FIG. 82C, positioning grooves 322*a* through 322*c* are formed on each semiconductor device 300 with a high precision. In addition, the positioning jig 321 has positioning pins 323*a* through 323*c* which are provided on a base member 324 and respectively correspond to the positioning grooves 322*a* through 322*c* of each semiconductor device 300.

Thus, by arranging the semiconductor devices 300 in parallel so that the positioning grooves 322*a* through 322*c* of each semiconductor device 300 engage the corresponding positioning pins 323*a* through 323*c* of the positioning jib 321 as shown in FIGS. 82A and 82B, it is possible to position each of the semiconductor devices 300 with a high accuracy.

Figure 83A:
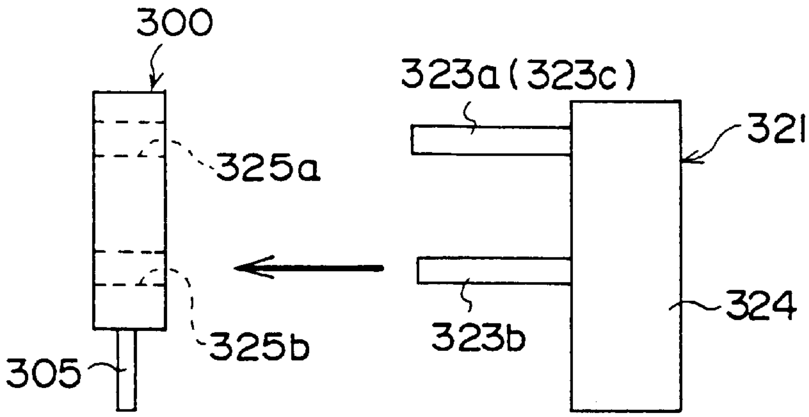
FIGS. 83A through 83C respectively are diagrams for explaining still another method of positioning the semiconductor devices during the semiconductor device stacking process.
Figure 83B:
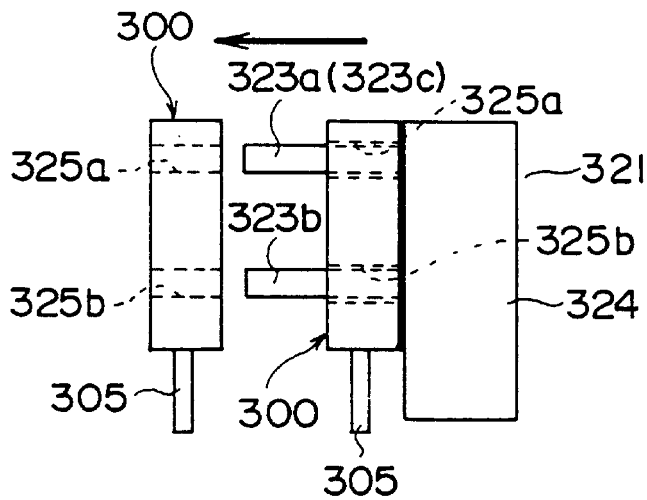
Figure 83C:
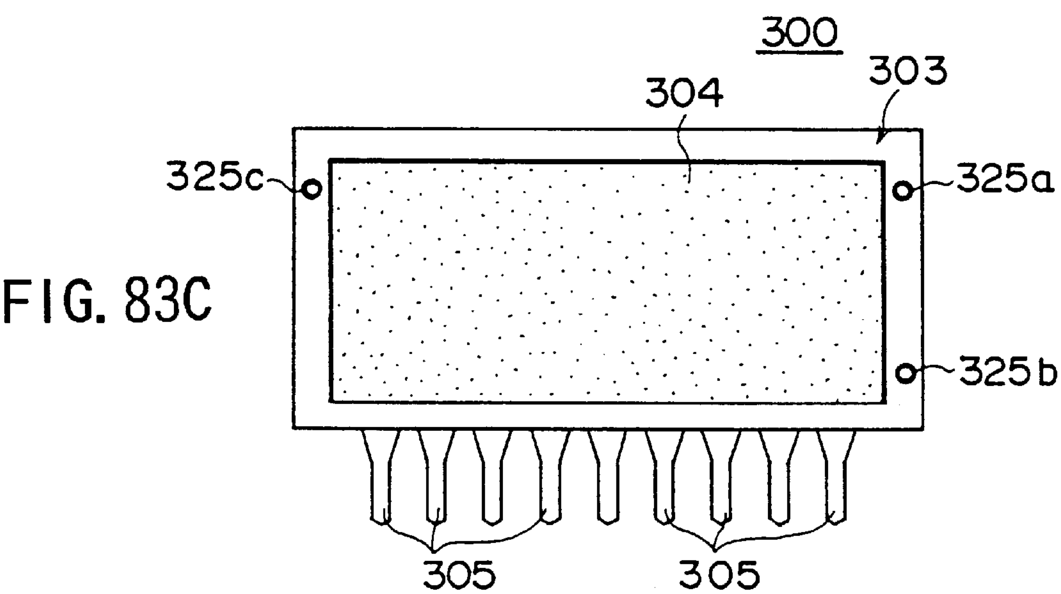

According to the positioning method shown in FIGS. 83A through 83C, the positioning jig 321 is used to position the semiconductor devices 300, similarly to the positioning method described above in conjunction with FIGS. 82A through 82C. FIGS. 83A and 83B are side views showing the semiconductor devices 300 and the positioning jig 321, and FIG. 83C is a front view showing the semiconductor devices 300. As shown in FIG. 83C, positioning holes 325*a* through 325*c* are formed on each semiconductor device 300 with a high precision. In addition, the positioning jig 321 has the positioning pins 323*a* through 323*c* which are provided on the base member 324 and respectively correspond to the positioning holes 325*a* through 325*c* of each semiconductor device 300.

Thus, by arranging the semiconductor devices 300 in parallel so that the positioning holes 325*a* through 325*c* of each semiconductor device 300 are penetrated by the corresponding positioning pins 323*a* through 323*c* of the positioning jib 321 as shown in FIGS. 83A and 83B, it is possible to position each of the semiconductor devices 300 with a high accuracy.

Figure 84:
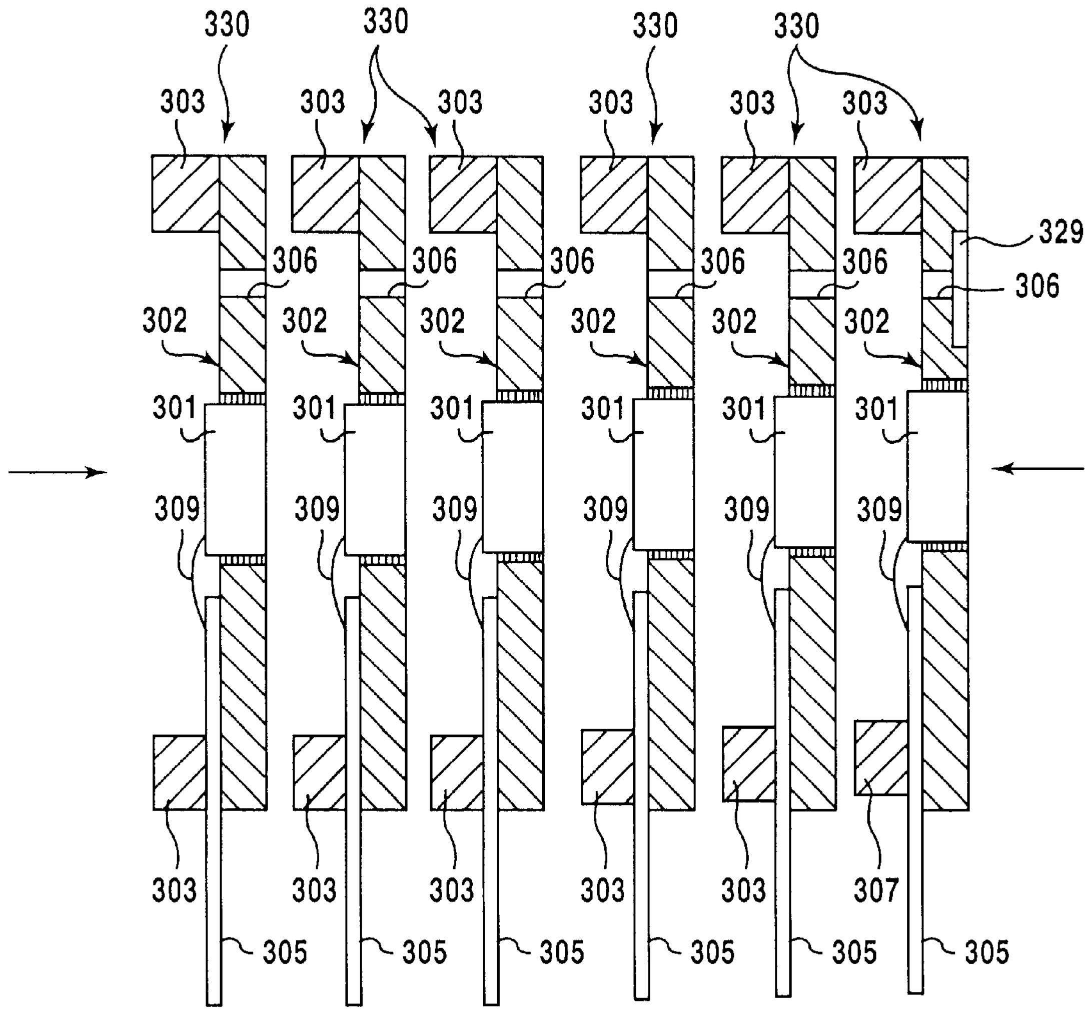
FIG. 84 is a cross sectional view for explaining a modification of the first embodiment of the method of producing the semiconductor device unit.
Figure 85:
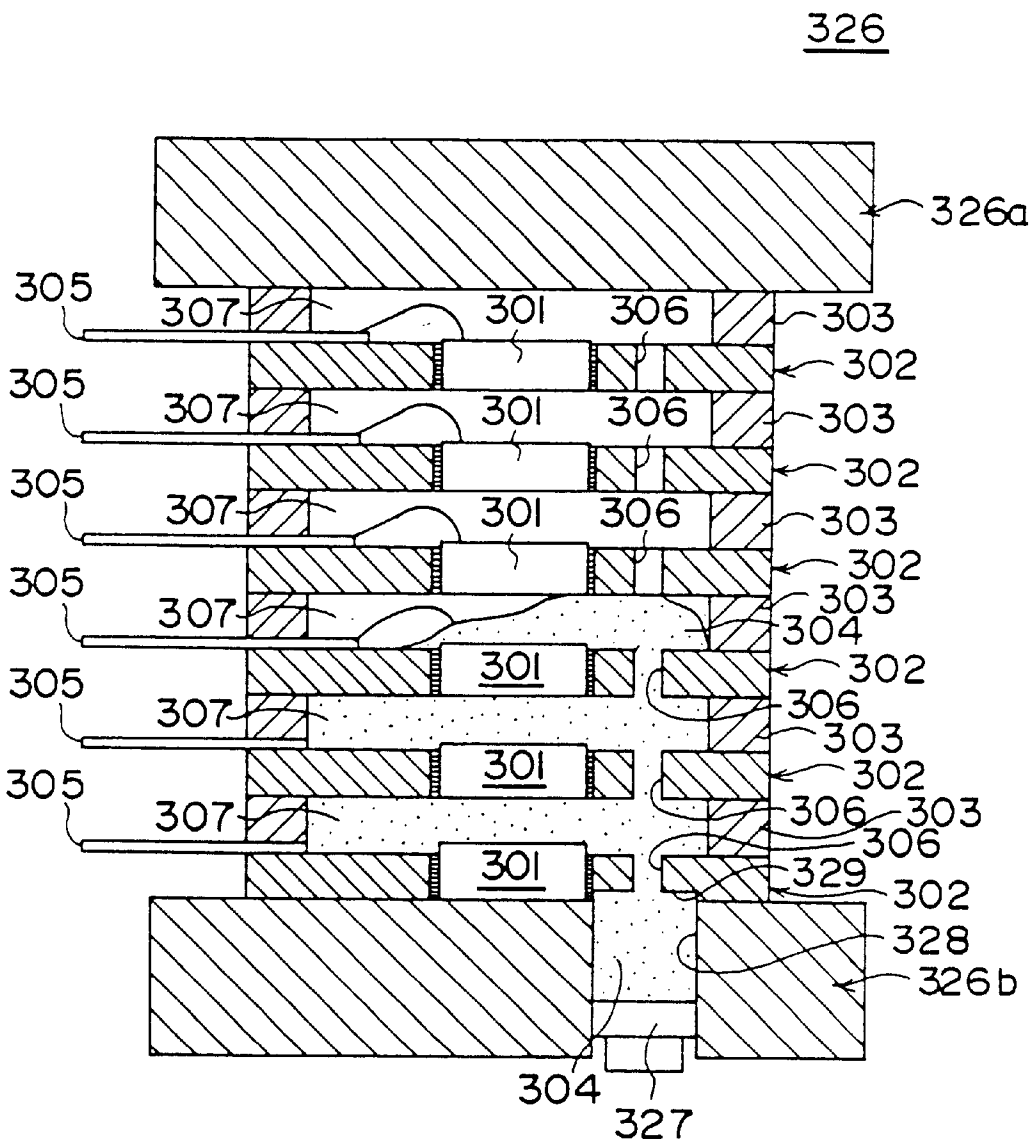
FIG. 85 is a cross sectional view for explaining the modification of the first embodiment of the method of producing the semiconductor device unit.

FIGS. 84 and 85 respectively are cross sectional views for explaining a modification of the first embodiment of the method of producing the semiconductor device unit.

According to the method of producing the semiconductor device unit described in conjunction with FIGS. 80A through 80G, the resin encapsulating process is carried out after the wiring process ends, and the semiconductor device stacking process is carried out thereafter. However, according to this modification of the method, the semiconductor device stacking process is carried out after the wiring process ends, and the resin encapsulating process is carried out thereafter.

FIG. 84 shows a state where the wiring process has ended and the semiconductor element 301, the frame body 303, the wires 309 and the like are arranged on each of the holding substrates 302, and such holding substrates are stacked. The holding substrate 302 having the semiconductor element 301, the frame body 303, the wires 309 and the like arranged thereon will hereinafter be referred to as a semiconductor device assembly 330. As shown in FIG. 84, a plurality of semiconductor device assemblies 330 are urged and pressed in the directions of the arrows, so as to stack the semiconductor device assemblies 330. In this state where the semiconductor device assemblies 330 are urged and pressed in the directions of the arrows, the semiconductor device assemblies 330 are simply stacked and the adjacent semiconductor device assemblies 330 are not bonded.

After the semiconductor device assemblies 330 are stacked, this stacked structure is loaded into a mold 326 in a state where the stacked state of the semiconductor device assemblies 330 are maintained. The mold 326 includes an upper mold 326*a* and a lower mold 326*b*, and a plunger pot 328 having a plunger 327 is formed on the lower mold 326*b*. In addition, a resin filling cavity 329 having approximately the same diameter as the plunger pot 328 is formed on the semiconductor device assembly 330 that is positioned at the outermost portion (lowermost portion in FIG. 85) confronting the lower mold 326*b*. The plunger pot 328 and the resin filling cavity 329 connect in the state where each of the semiconductor device assemblies 330 are loaded into the mold 326.

After each of the semiconductor device assemblies 330 are loaded into the mold 326, the plunger 327 moves up and the encapsulating resin (resin tablet) 304 filled within the plunger pot 328 is filled into the spaces 307 via the resin filling holes 306 in the holding substrates 302.

As shown in FIG. 85, the spaces 307 in each of the semiconductor device assemblies 330 are connected via the resin filling holes 306 in the state where each of the semiconductor device assemblies 330 are stacked. Accordingly, the encapsulating resin 304 within the plunger pot 328 passes through the resin filling holes 306 in each of the semiconductor device assemblies 330, and the encapsulating resin 304 successively reaches the spaces 307 in the semiconductor device assemblies 330 located at the upper portion starting from the semiconductor device assemblies 330 located at the lower portion.

Because the encapsulating resin 304 fills the spaces 307 in each of the semiconductor device assemblies 330, the encapsulating resin 304 also functions as an adhesive agent, and the adjacent semiconductor device assemblies 330 are bonded together by the encapsulating resin 304. Hence, according to this modification of the method, the semiconductor device stacking process and the resin encapsulating process can be carried out in one operation, thereby making it possible to efficiently produce the semiconductor device unit 350.

Figure 86:
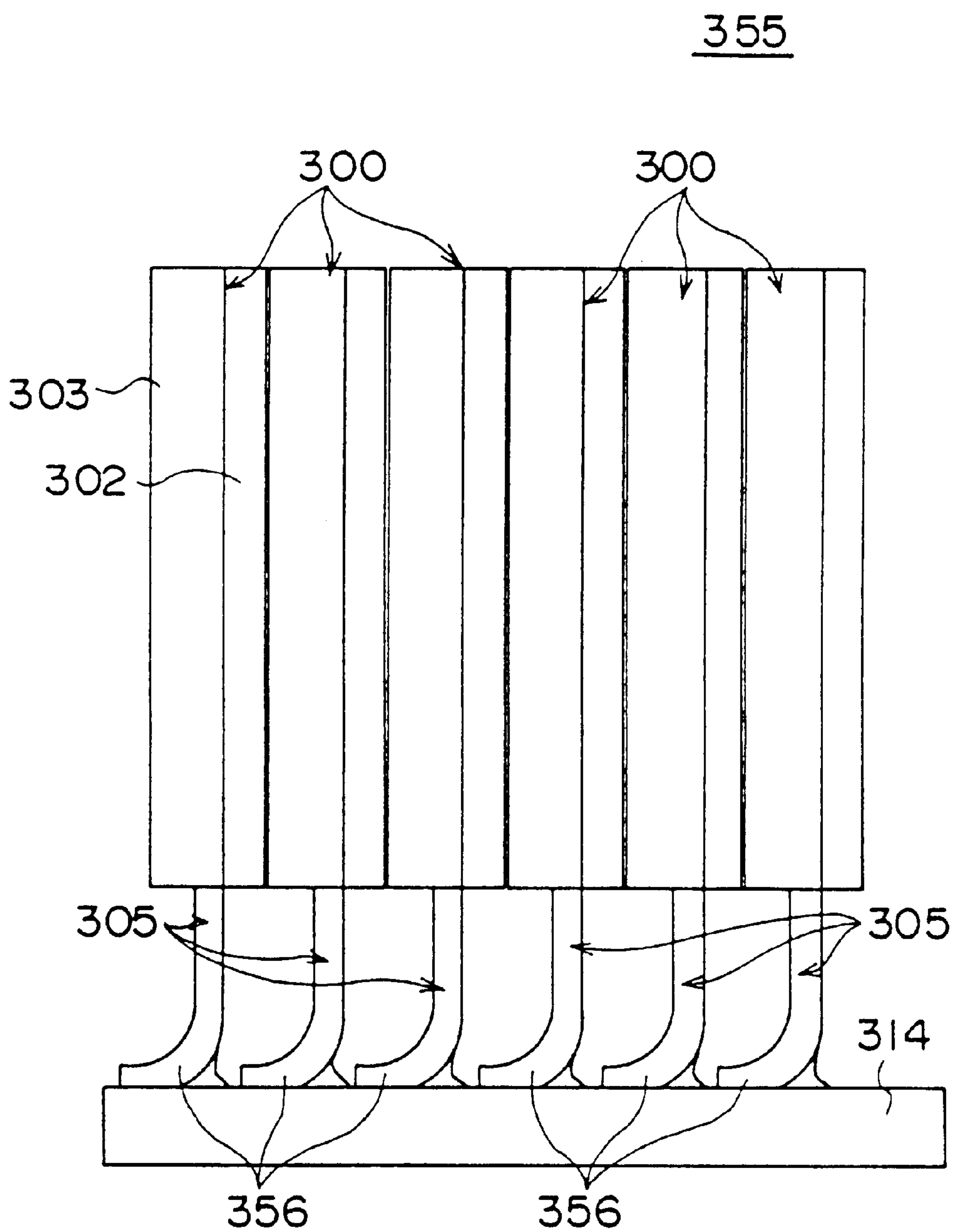
FIG. 86 is a side view showing another modification of the first embodiment of the semiconductor device unit according to the present invention.

FIG. 86 is a side view showing another modification of the semiconductor device unit 350 shown in FIGS. 73 through 75. A semiconductor device unit 355 shown in FIG. 86 has approximately L-shaped bent portion 356 formed at the tip end of each of the leads 305. By providing the bent portion 356 on the tip end of each lead 305, it becomes possible to mount the semiconductor device unit 355 using a surface mounting technique.

Next, a description will be given of a fourth aspect of the present invention, by referring to FIGS. 87 through 117.

Figure 87:
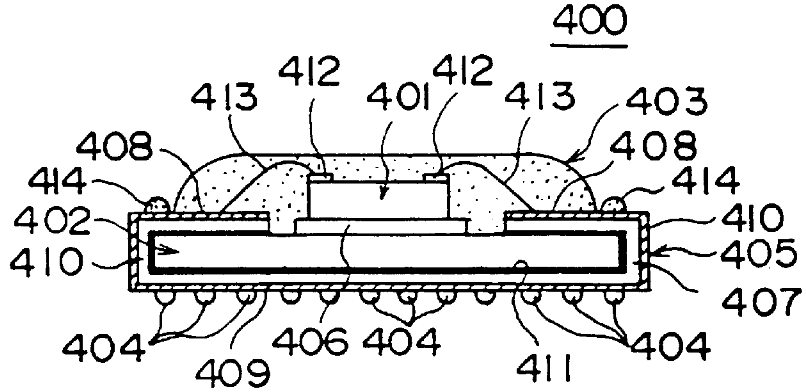
FIG. 87 is a cross sectional view showing a thirty-fifth embodiment of the semiconductor device according to the present invention.
Figure 88:
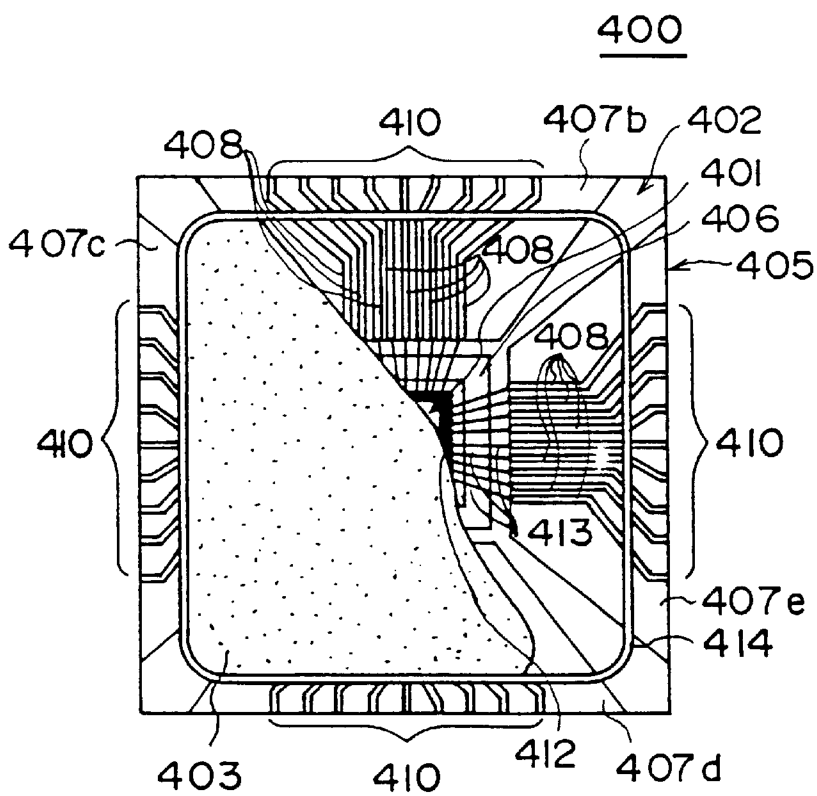
FIG. 88 is a plan view, with a part cut away, showing the thirty-fifth embodiment of the semiconductor device.
Figure 89:
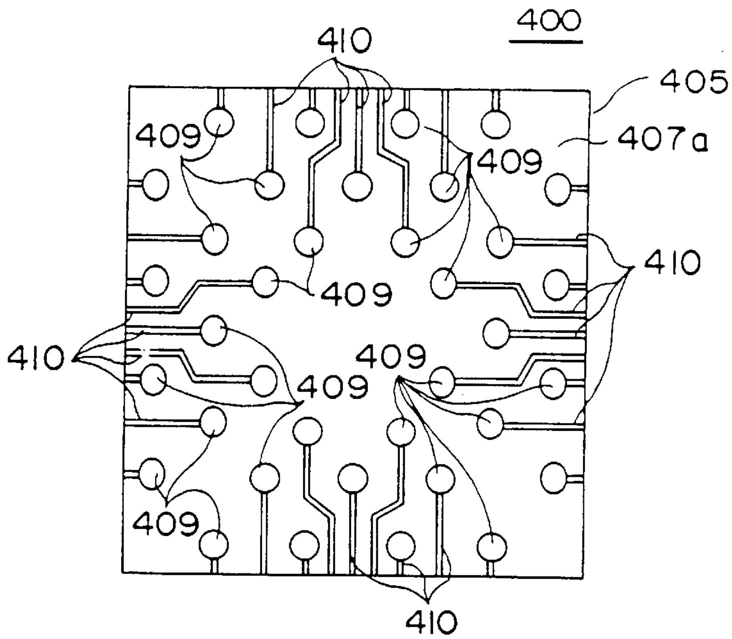
FIG. 89 is a bottom view showing the thirty-fifth embodiment of the semiconductor device.

FIGS. 87 through 89 respectively show a thirty-fifth embodiment of the semiconductor device according to the present invention. FIG. 87 shows a cross section of the thirty-fifth embodiment, FIG. 88 shows a plan view of the thirty-fifth embodiment with a part cut away, and FIG.89 is a bottom view of the thirty-fifth embodiment.

A semiconductor device 400 shown in FIGS. 87 through 89 generally includes a semiconductor element 401, a semiconductor element mounting substrate 402, an encapsulating resin 403, a plurality of bumps 404 which function as external connecting terminals, and a flexible printed wiring substrate 405.

The semiconductor element mounting substrate 402 is a rectangular substrate that is made of a metal having a good conductivity, such as aluminum alloys and copper alloys. The semiconductor element 401 is bonded on the top portion of the semiconductor element mounting substrate 402 by a die-bonding material 406.

The flexible printed wiring substrate 405 includes a flexible base member 407 made of polyimide or the like. In this embodiment, predetermined wiring patterns are formed on the rear surface of the base member 407 by plating gold or the like on copper film so that wire-bonding is possible on the predetermined wiring patterns.

Figure 90:
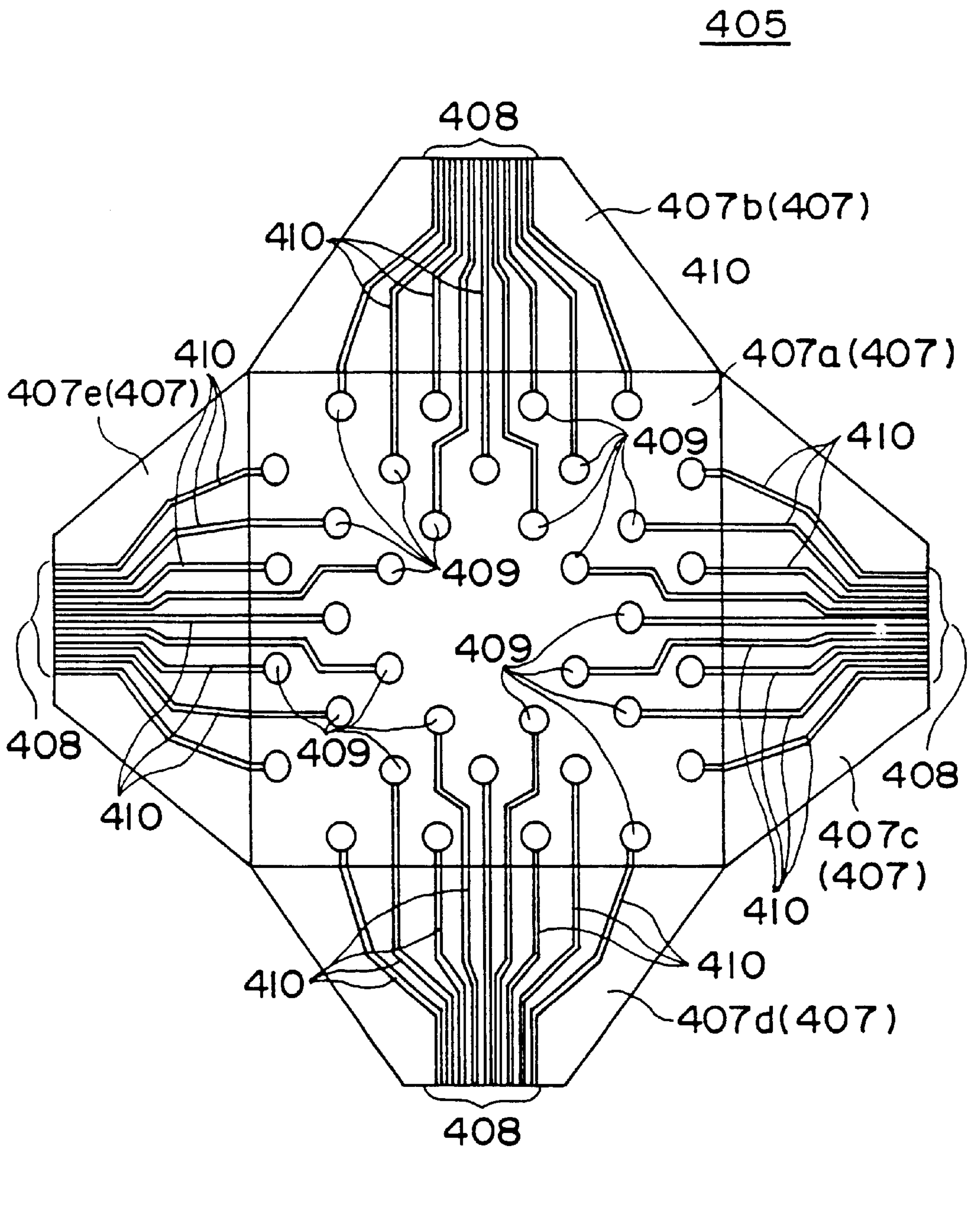
FIG. 90 is a bottom view showing a developed state of a flexible printed wiring substrate used in the thirty-fifth embodiment of the semiconductor device.
Figure 95A:
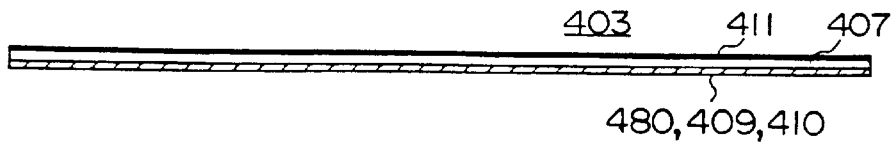
FIGS. 95A through 95F respectively are diagrams for explaining a twelfth embodiment of the method of producing the semiconductor device according to the present invention.

FIG. 90 is a bottom view showing the flexible printed wiring substrate 405 in a developed state. In addition, FIG. 95A is a cross sectional view of the flexible printed wiring substrate 405 in the developed state. As shown in FIGS. 90 and 95A, the wiring patterns formed on the rear surface of the base member 407 forming the flexible printed wiring substrate 405 include electrode portions 408 that are electrically connected to the semiconductor element 401, external connecting terminal portions 409 on which the bumps 404 are provided, and wiring portions 410 which connect the electrode portions 408 and the external connecting terminal portions 409.

In addition, the base member 407 forming the flexible printed wiring substrate 405 includes a base portion 407*a* at a central portion thereof, and extensions 407*b* through 407*e*. The base portion 407*a* has a rectangular shape which is approximately the same as the shape of the semiconductor element mounting substrate 402 in the plan view. The extensions 407*b* through 407*e* extend outwards from the four outer peripheral sides of the base portion 407*a* in an approximate trapezoidal shape.

The electrode portion 408 is located at each of the extensions 407*b* through 407*e*, and the external connecting terminal portions 409 are located at the base portion 407*a*. In addition, the wiring portions 410 are located at positions so as to extend from the base portion 407*a* to each of the extensions 407*b* through 407*e*. Furthermore, the bumps 404 made of solder are arranged on each of the external connecting terminal portions 409.

The flexible printed wiring substrate 405 having the above described construction is fixed on the semiconductor element mounting substrate 402 by use of an epoxy or silicone adhesive agent 411. More particularly, the flexible printed wiring substrate 405 is bonded and fixed to the semiconductor element mounting substrate 402 by placing the semiconductor element mounting substrate 402 on the base portion 407$a$ and bending each of the extensions 407$b$ through 407$e$ upwards and folding the same along the semiconductor element mounting substrate 402. As a result, the flexible printed wiring substrate 405 is arranged on the semiconductor element mounting substrate 402 so as to wrap the semiconductor element mounting substrate 402 inside.

In the state where the flexible printed wiring substrate 405 is arranged on the semiconductor element mounting substrate 402, the electrode portions 408 are located at the upper portion of the semiconductor element mounting substrate 402, that is, at positions close to or adjacent to the semiconductor element 401. On the other hand, the external connecting terminal portions 409 are located at the lower portion of the semiconductor element mounting substrate 402, that is, at positions which confront the mounting substrate when the semiconductor device 400 is mounted. In addition, the wiring portions 410 connect the electrode portions 408 and the external connecting terminal portions 409 via the side surfaces of the semiconductor element mounting substrate 402.

Wires 413 are arranged between the electrode portions 408 of the flexible printed wiring substrate 405 and electrode pads 412 which are provided on the semiconductor element 401. As a result, the semiconductor element 401 and the external connecting terminal portions 409 are electrically connected via the wires 413, the electrode portions 408 and the wiring portions 410.

For example, the encapsulating resin 403 is made of a thermosetting epoxy system resin. In this embodiment, the encapsulating resin 403 is arranged by potting, and the encapsulating resin 403 has the function of protecting the semiconductor element 401 and the wires 413. Dam members 414 prevent the flow of the encapsulating resin 403 when potting the encapsulating resin 403.

Because the semiconductor device 400 has the construction described above, the semiconductor element mounting substrate 402 simply needs to have the function of supporting the semiconductor element 401 mounted thereon. Since there is no need to provide a wiring layer on the semiconductor element mounting substrate 402, it is possible to produce the semiconductor element mounting substrate 402 at a low cost. In addition, it is possible to select a material having a satisfactory heat radiation (or heat release) characteristic for the semiconductor element mounting substrate 402, and the heat radiation efficiency of the semiconductor element 401 can be improved.

On the other hand, the flexible printed wiring substrate 405 itself is relatively inexpensive because flexible printed wiring substrates are popularly used as wiring members within electronic equipments. It is also possible to easily form the wiring patterns on the flexible printed wiring substrate 405. For this reason, it is also possible to reduce the cost of the semiconductor device 400 from this point of view.

Because the flexible printed wiring substrate 405 is arranged to wrap the semiconductor element mounting substrate 402, the arrangement automatically positions the electrode portions 408 in the vicinity of the semiconductor element 401 and positions the external connecting terminal portions 409 at the bottom surface (mounting portion) of the semiconductor element mounting substrate 402. As a result, the required wiring can be made with ease.

In addition, since the flexible printed wiring substrate 405 is arranged to wrap the semiconductor element mounting substrate 402, it is possible to make the semiconductor device 400 small even though the flexible printed wiring substrate 405 is provided. Further, in the state where the flexible printed wiring substrate 405 wraps the semiconductor element mounting substrate 402, a predetermined region of each of the extensions 407$b$ through 407$e$ is covered by the encapsulating resin 403. For this reason, it is possible to positively prevent the extensions 407$b$ through 407$e$ from separating from the semiconductor element mounting substrate 402.

In addition, it is possible to improve the mounting characteristic of the semiconductor device 400 because this semiconductor device 400 has the BGA (Ball Grid Array) structure.

Figure 93:
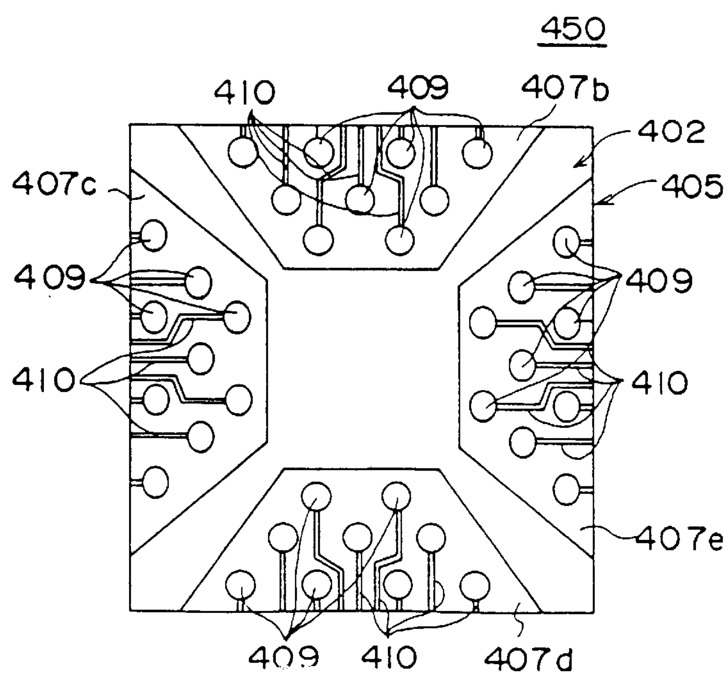
FIG. 93 is a bottom view showing the thirty-sixth embodiment of the semiconductor device.
Figure 91:
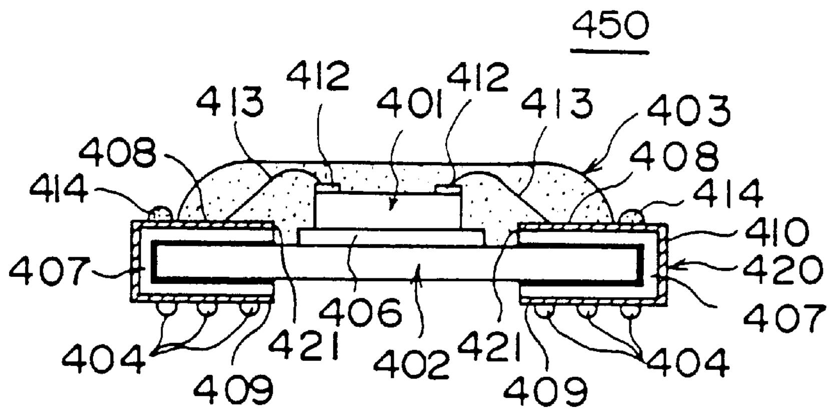
FIG. 91 is a cross sectional view showing a thirty-sixth embodiment of the semiconductor device according to the present invention.
Figure 92:
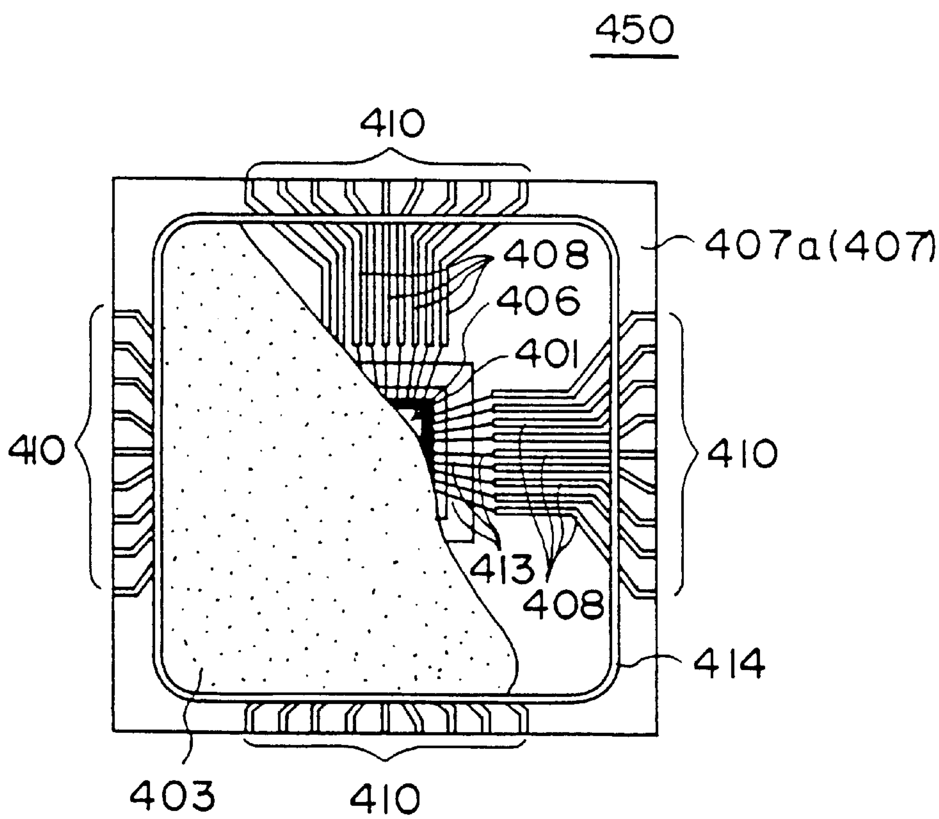
FIG. 92 is a plan view, with a part cut away, showing the thirty-sixth embodiment of the semiconductor device.
Figure 94:
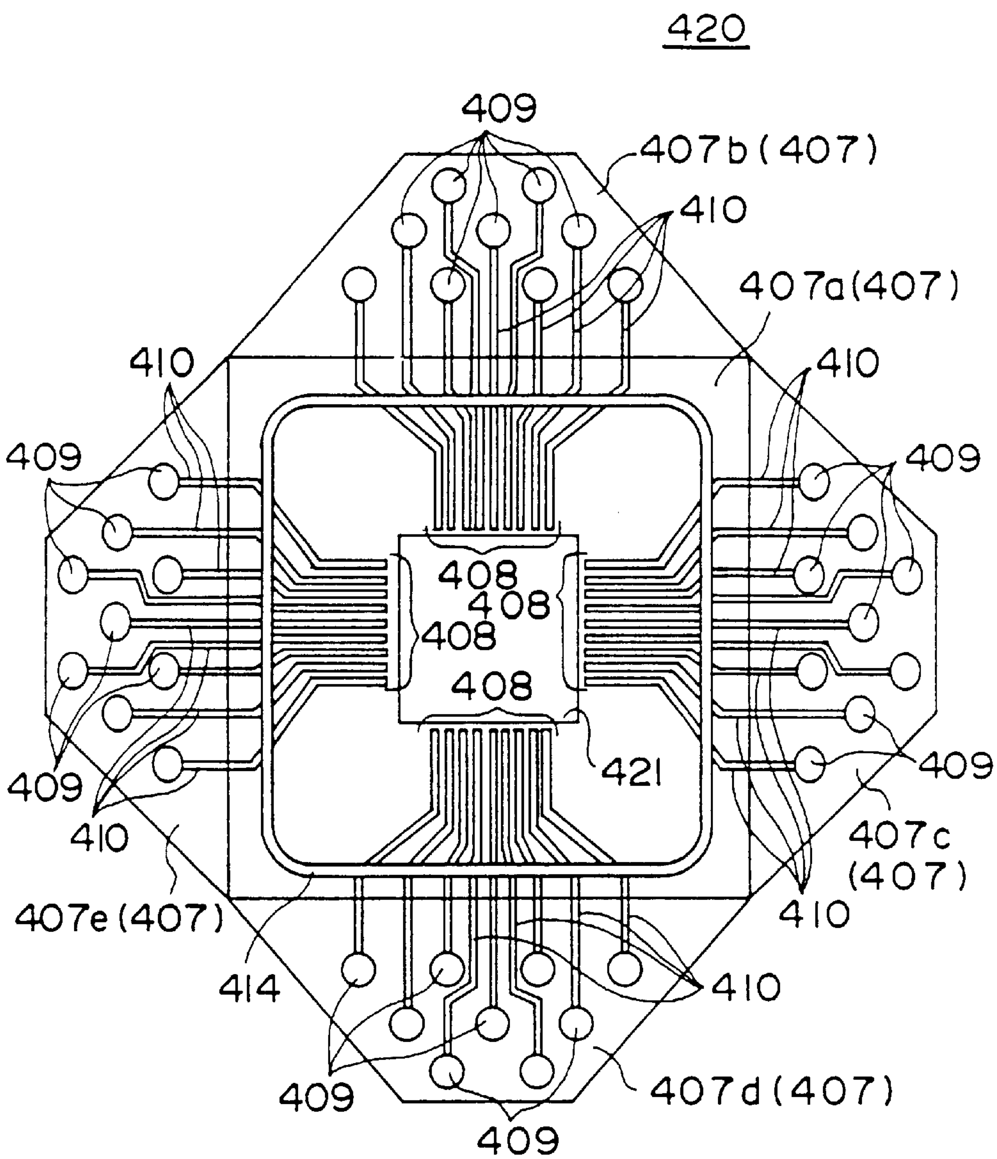
FIG. 94 is a plan view showing a developed state of a flexible printed wiring substrate used in the thirty-sixth embodiment of the semiconductor device.

FIGS. 91 through 94 respectively show a thirty-sixth embodiment of the semiconductor device according to the present invention. FIG. 91 is a cross sectional view of the thirty-sixth embodiment of the semiconductor device, and FIG. 92 is a plan view of the thirty-sixth embodiment of the semiconductor device with a part cut away. FIG. 93 is a bottom view of the thirty-sixth embodiment of the semiconductor device, and FIG. 94 is a plan view showing a developed state of a flexible printed wiring substrate of the thirty-sixth embodiment of the semiconductor device. In FIGS. 91 through 94, those parts of a semiconductor device 450 which are the same as those corresponding parts of the thirty-fifth embodiment of the semiconductor device, that is, the semiconductor device 400, are designated by the same reference numerals, and a description thereof will be omitted.

In the thirty-fifth embodiment of the semiconductor device, when arranging the flexible printed wiring substrate 405 on the semiconductor element mounting substrate 402, the semiconductor element mounting substrate 402 is placed on the base portion 407$a$, and each of the extensions 407$b$ through 407$e$ are bent upwards and folded along the semiconductor element mounting substrate 402, so that the flexible printed wiring substrate 405 wraps the semiconductor element mounting substrate 402 inside. In other words, in the thirty-fifth embodiment of the semiconductor device, the flexible printed wiring substrate 405 wraps the semiconductor element mounting substrate 402 from underneath.

On the other hand, according to the thirty-sixth embodiment of the semiconductor device, namely, the semiconductor device 450 shown in FIGS. 91 through 93, a flexible printed wiring substrate 420 wraps the semiconductor element mounting substrate 402 from above.

For this reason, the flexible printed wiring substrate 420 used in this thirty-sixth embodiment of the semiconductor device has the electrode portions 408, the external connecting terminal portions 409 and the wiring portions 410 formed on the top surface of the flexible printed wiring substrate 420 as shown in FIG. 94. In addition, the electrode portions 408 are located at the base portion 407$a$ of the base member 407, and the external connecting terminal portions 409 are located at each of the corresponding extensions 407$b$ through 407$e$. The wiring portions 410 are located so as to extend from the base portion 407$a$ to each of the extensions 407$b$ through 407$e$.

A semiconductor element inserting opening 421 is formed at a central position of the base portion 407$a$ as shown in FIGS. 91 and 94. Since the flexible printed wiring substrate 420 wraps the semiconductor element mounting substrate 402 from above in this embodiment of the semiconductor device, it is necessary to expose the semiconductor element 401 at the upper surface portion of the flexible printed wiring substrate 420 in order to arrange the wires 413. The semiconductor element inserting opening 421 is provided to enable such exposure of the semiconductor element 401.

Hence, in the state where the flexible printed wiring substrate 420 is arranged on the semiconductor element mounting substrate 402, it is possible to insert the semiconductor element 401 through the semiconductor element inserting opening 421 so that the semiconductor element 401 is exposed at the top surface of the flexible printed wiring substrate 420, and the wires 413 can be arranged between the electrode portions 408 and the semiconductor element 401.

The size of the semiconductor element inserting opening 421 is set with a high precision to become the same as the external size of the semiconductor element 401. For this reason, in the state where the semiconductor element 401 is inserted through the semiconductor element inserting opening 421, it is possible to position the semiconductor element 401 and the flexible printed wiring substrate 420. In addition, the position where the semiconductor element inserting opening 421 is formed and the positions where the wiring portions 410 are formed are also set with a high precision. Accordingly, the positions of the semiconductor element 401 and the wiring portions 410 are aligned with a high precision in the state where the semiconductor element 401 is inserted through the semiconductor element inserting opening 421.

The flexible printed wiring substrate 420 having the above described construction is fixed to the semiconductor element mounting substrate 402 by use of the epoxy or silicone adhesive agent 411, similarly to the thirty-fifth embodiment of the semiconductor device.

Each of the extensions 407*b* through 407*e* of the flexible printed wiring substrate 420 are bent downwards and folded along the semiconductor element mounting substrate 402 by placing the base portion 407*a* on the top portion of the semiconductor element mounting substrate 402 and are bonded and fixed to the semiconductor element mounting substrate 402. Thus, the flexible printed wiring substrate 402 wraps the semiconductor element mounting substrate 402 inside from above.

In the state where the flexible printed wiring substrate 420 is arranged on the semiconductor element mounting substrate 402, the semiconductor element 401 is exposed at the top surface of the flexible printed wiring substrate 420 via the semiconductor element inserting opening 421. The electrode portions 408 are located at portions in the vicinity of the semiconductor element 401, and the external connecting terminal portions 409 are located on the lower portion of the semiconductor element mounting substrate 402, that is, at portions which confront the mounting substrate when mounting the semiconductor device 450 on the mounting substrate. The wiring portions 410 connect the electrode portions 408 and the external connecting terminal portions 409 via the side surfaces of the semiconductor element mounting substrate 402.

Because the semiconductor device 450 has the construction described above, the semiconductor element 401 and the wiring portions 410 can be aligned with a high precision in the state where the semiconductor element 401 is inserted through the semiconductor element inserting opening 421. Thus, the electrode pads 412 formed on the semiconductor element 401 and the electrode portions 410 formed on the flexible printed wiring substrate 420 can positively be electrically connected. Of course, this embodiment of the semiconductor device can also obtain effects similar to those obtainable in the thirty-fifth embodiment of the semiconductor device described above.

Next, a description will be given of a twelfth embodiment of the method of producing the semiconductor device according to the present invention, by referring to FIGS. 95A through 106C. In this twelfth embodiment of the method, it is assumed for the sake of convenience that the thirty-fifth embodiment of the semiconductor device, that is, the semiconductor device 400, is produced.

The semiconductor device producing operation for producing the semiconductor device 400 generally includes a flexible printed wiring substrate forming process (flexible wiring substrate forming process), a flexible printed wiring substrate arranging process (flexible wiring substrate arranging process), a semiconductor element mounting process, a resin encapsulating process and an external connecting terminal forming process. A description will hereunder be given with respect to each of these processes.

When producing the semiconductor device 400, the flexible printed wiring substrate forming process is first carried out. FIG. 95A is a diagram for explaining this flexible printed wiring substrate forming process. As shown in FIG. 95A, the base member 407 which is made of a flexible polyimide system resin is press-molded into a predetermined shape by the flexible printed wiring substrate forming process. In addition, a copper film is deposited on the press-molded base member 407, and this copper film is patterned into a predetermined shape by an etching or the like. The surface of the patterned copper film is gold-plated. As a result, the electrode portions 408 which electrically connect to the semiconductor element 401, the external connecting terminal portions 409 on which the bumps 404 are provided in the external connecting terminal forming process that will be described later, and the wiring portions 410 which integrally connect the electrode portions 408 and the external connecting terminal portions 409 are respectively formed on the rear surface of the base member 407.

Next, unwanted portions of the base member 407 having the electrode portions 408, the external connecting terminal portions 409 and the wiring portions 410 are removed by press-molding. Hence, the flexible printed wiring substrate 405 shown in FIG. 90 having the base portion 407*a* and the extensions 407*b* through 407*e* is formed.

Thereafter, the thermosetting epoxy or silicone adhesive agent 411 is coated on the surface of the flexible printed wiring substrate 405 opposite to the surface having the electrode portions 408, the external connecting terminal portions 409 and the wiring portions 410.

Figure 95B:
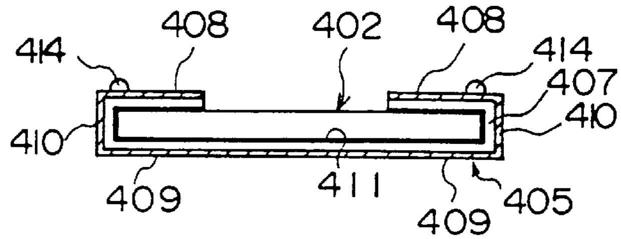

The flexible printed wiring substrate arranging process is carried out after the flexible printed wiring substrate 405 is formed as described above. FIG. 95B is a diagram for explaining the flexible printed wiring substrate arranging process. The flexible printed wiring substrate 405 is arranged on the semiconductor element mounting substrate 402 by this flexible printed wiring substrate arranging process.

When arranging the flexible printed wiring substrate 405 on the semiconductor element mounting substrate 402, the semiconductor element mounting substrate 402 is first placed on the base portion 407*a* of the flexible printed wiring substrate 405. Then, the extensions 407*b* through 407*e* provided on the outer periphery of the base portion 407*a* are bent upwards and folded along the outer peripheral surface of the semiconductor element mounting substrate 402.

Next, a thermal (or heating) process is carried out to harden the adhesive agent 411, so that the flexible printed wiring substrate 405 is adhered on the semiconductor element mounting substrate 402. As a result, the flexible printed wiring substrate 405 wraps the semiconductor element mounting substrate 402 inside from underneath. Furthermore, a dam member 414 is arranged at a predetermined position of the flexible printed wiring substrate 405 above the semiconductor element mounting substrate 402. For example, the dam member 414 is made of epoxy system solder resist or the like.

In the state where the flexible printed wiring substrate 405 is arranged on the semiconductor element mounting substrate 402, the semiconductor element 401 on the semiconductor element mounting substrate 402 is exposed.

Figure 95C:
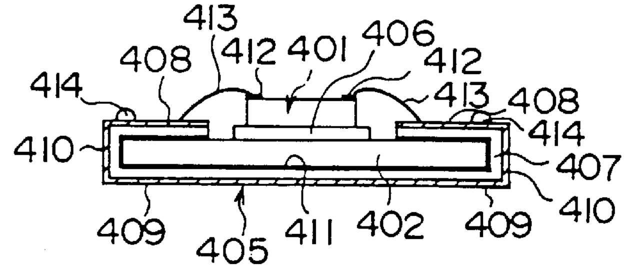

After the flexible printed wiring substrate arranging process ends, the semiconductor element mounting process is carried out. FIG. 95C is a diagram for explaining the semiconductor element mounting process.

In the semiconductor element mounting process, the semiconductor element 401 is first fixed at a portion of the semiconductor element mounting substrate 402 exposed from the flexible printed wiring substrate 405, by use of the die-bonding material 406. Then, the wires 413 are arranged between the electrode pads 412 on the semiconductor element 401 and the electrode portions 408 on the flexible printed wiring substrate 405 using the wire-bonding equipment. The wire-bonding can positively be carried out because the electrode portions 408 are arranged at positions adjacent to the semiconductor element 401.

Figure 95D:
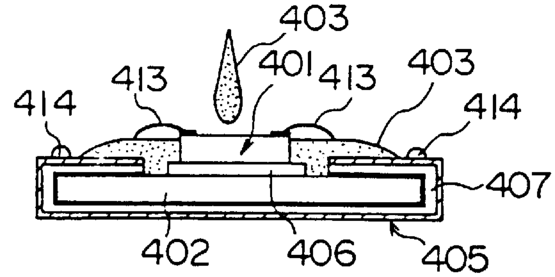

The resin encapsulating process is carried out after the semiconductor element mounting process ends. FIG. 95D is a diagram for explaining the resin encapsulating process. In this embodiment of the method, the resin encapsulating process fills the thermosetting epoxy system encapsulating resin 403 by potting. The encapsulating resin 403 is supplied on the semiconductor element 401 by potting, and thereafter, a thermal (or heating) process is carried out to harden the encapsulating resin 403. As a result, the semiconductor element 401, the wires 413 and the like are protected by the encapsulating resin 403.

Figure 103:
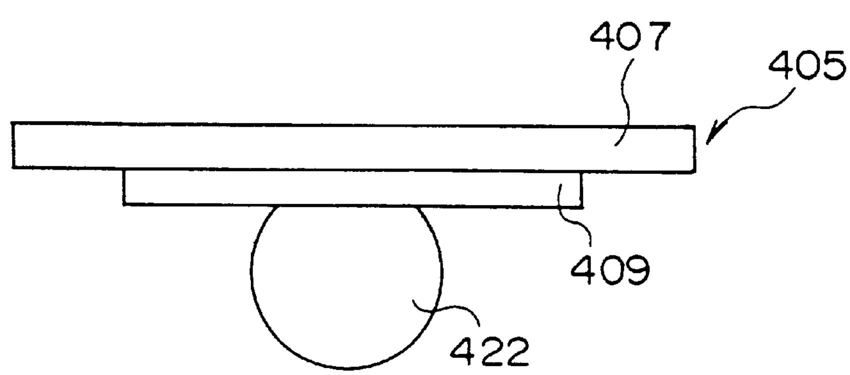
FIG. 103 is a diagram for explaining a solder bump forming method of the external connecting terminal forming process.

The external connecting terminal forming process is carried out after the resin encapsulating process ends. In this embodiment of the method, the solder bumps 404 are used as the external connecting terminals. The solder bumps 404 are arranged on the external connecting terminal portions 409 formed on the flexible printed wiring substrate 405. As a method of arranging the solder bumps 404 on the external connecting terminal portions 409, it is possible to employ a method of arranging the solder bumps 404 on the external connecting terminal portions 409 by a thermal (or heating) process as shown in FIG. 103, for example. The material used for the bumps 404 is of course not limited to solder, and for example, it is also possible to use a copper ball coated with solder as the bump 404.

Figure 95E:
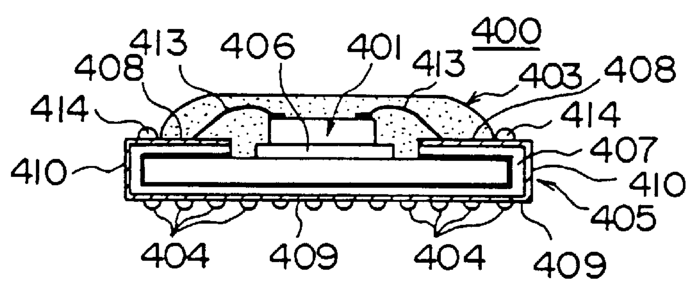
Figure 95F:
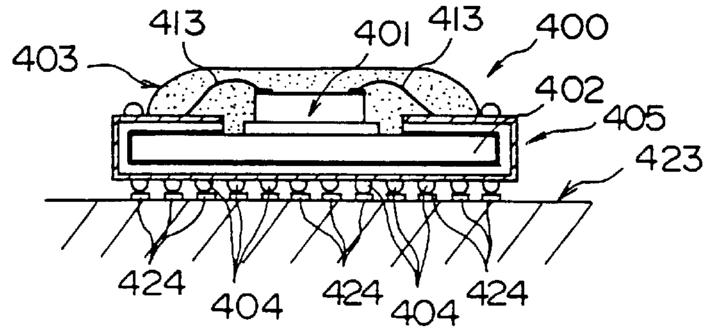

The semiconductor device 400 shown in FIG. 95E is formed by carrying out the external connecting terminal forming process. In addition, FIG. 95F shows a state where the semiconductor device 400 is mounted on a mounting substrate 423. In FIG. 95F, connecting electrodes 424 are formed on the mounting substrate 423 and connect to the solder bumps 404.

When producing the semiconductor device 400 in this embodiment of the method, the electrode portions 408, the external connecting terminal portions 409 and the wiring portions 410 can easily be formed on the base portion 407 in the flexible printed wiring substrate forming process by employing the printed wiring technique, for example. In addition, the semiconductor element mounting substrate 402 can easily be wrapped in the flexible printed wiring substrate arranging process, because the flexible printed wiring substrate 405 simply needs to be bent and folded along the semiconductor element mounting substrate 402. Therefore, it is possible to produce the semiconductor device 400 with ease at a low cost.

FIGS. 96A through 96C and FIGS. 97A through 97D are diagrams for explaining particular methods of carrying out the flexible printed wiring substrate arranging process.

Figure 96A:
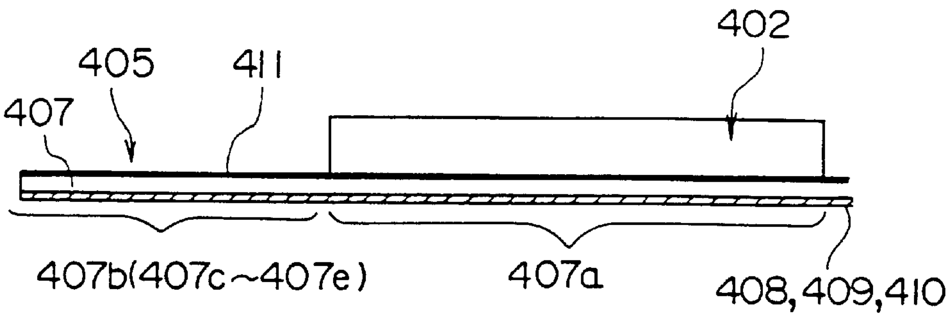
FIGS. 96A through 96C respectively are diagrams for explaining a method of carrying out a flexible printed wiring substrate arranging process.
Figure 96B:
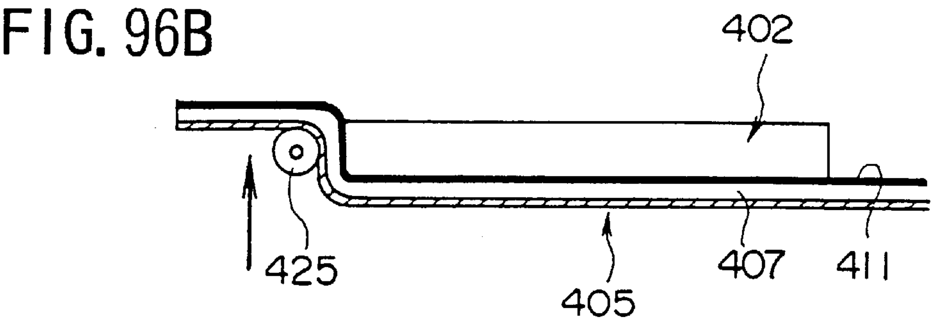
Figure 96C:
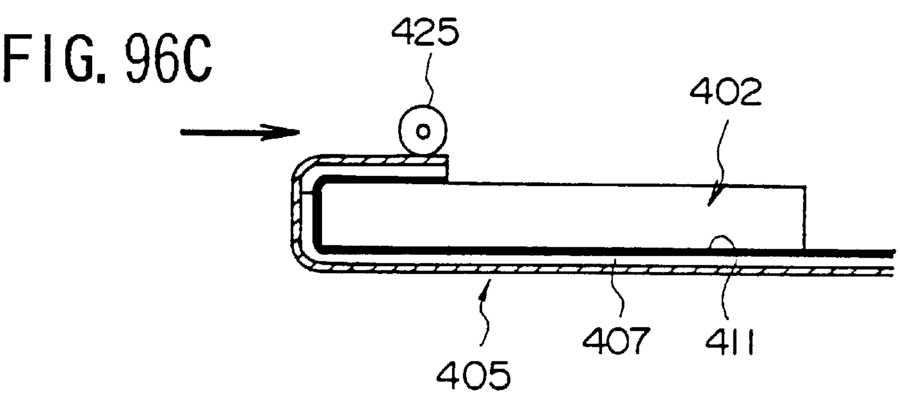

The method shown in FIGS. 96A through 96C arranges the flexible printed wiring substrate 405 on the semiconductor element mounting substrate 402 by use of a movable roller 425. More particularly, the semiconductor element mounting substrate 402 is placed on the base portion 407*a* of the flexible printed wiring substrate 405 as shown in FIG. 96A. Then, the roller 425 is first moved upwards along the external shape of the semiconductor element mounting substrate 402 as shown in FIG. 96B, and the roller 425 is thereafter moved horizontally along the external shape of the semiconductor element mounting substrate 402 as shown in FIG. 96C. In FIGS. 96B and 96C, the moving direction of the roller 425 is indicated by an arrow. As a result, the flexible printed wiring substrate 405 is arranged on the semiconductor element mounting substrate 402.

Therefore, by using the roller 425 and folding the flexible printed wiring substrate 405 during the flexible printed wiring substrate arranging process, it is possible to positively arrange the flexible printed wiring substrate 405 on the semiconductor element mounting substrate 402 by a simple operation.

On the other hand, the method shown in FIGS. 97A through 97D arranges the flexible printed wiring substrate 405 on the semiconductor element mounting substrate 402 by use of a mold 426 and movable rollers 427.

The mold 426 is made up of an upper mold 428 and a lower mold 429. The upper mold 428 has a planar shape that is approximately the same as that of the semiconductor element mounting substrate 402. The lower mold 429 has a cavity 430 with a shape that takes into consideration the external shape of the semiconductor element mounting substrate 402 and the thickness of the flexible printed wiring substrate 405. The upper mold 428 is moved into the cavity 430 of the lower mold 429 by a pressing unit (not shown). The rollers 427 are arranged above the lower mold 429 and are movable in directions of arrows in FIG. 97B.

Figure 97A:
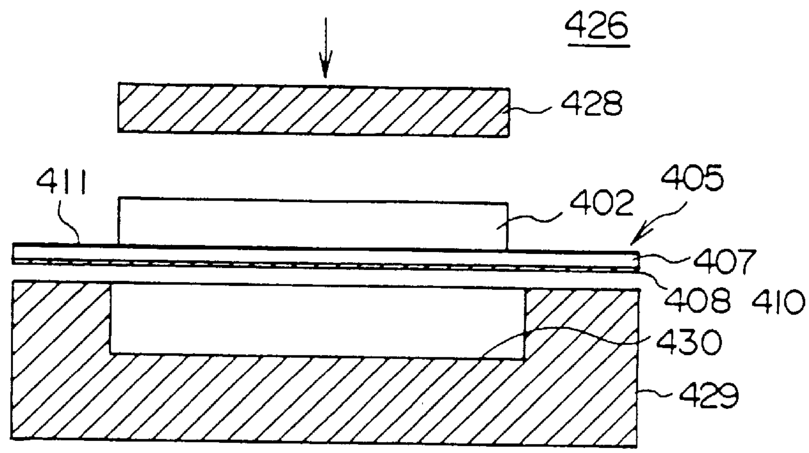
FIGS. 97A through 97D respectively are diagrams for explaining another method of carrying out the flexible printed wiring substrate arranging process.

In order to arrange the flexible printed wiring substrate 405 on the semiconductor element mounting substrate 402 using the mold 426 and the movable rollers 427, the flexible printed wiring substrate 405 having the semiconductor element mounting substrate 402 placed at a predetermined position thereon is arranged on top of the lower mold 429 as shown in FIG. 97A, so that the semiconductor element mounting substrate 402 is positioned to a location corresponding to the position of the cavity 430.

Figure 97B:
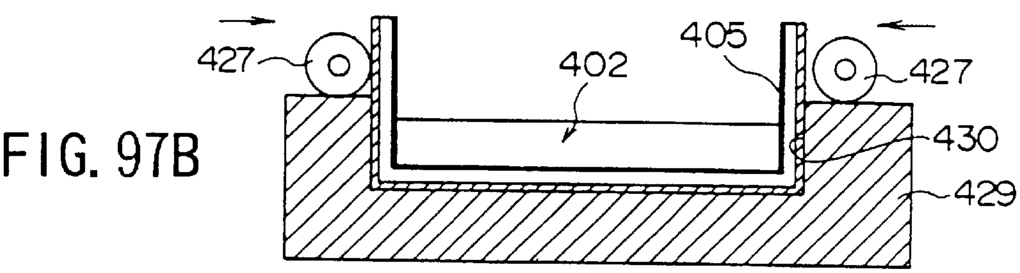

Next, the pressing unit is operated so as to lower the upper mold 428, and consequently, the semiconductor element mounting substrate 402 is pushed into the cavity 430 of the lower mold 429. As a result, the flexible printed wiring substrate 405 is bent at right angles as shown in FIG. 97B as the semiconductor element mounting substrate 402 enters the cavity 430.

Figure 97C:
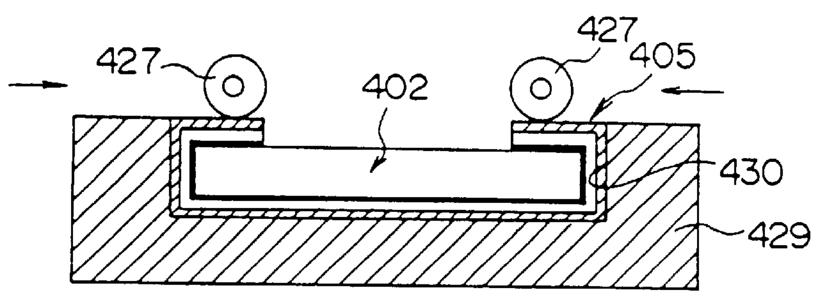
Figure 97D:
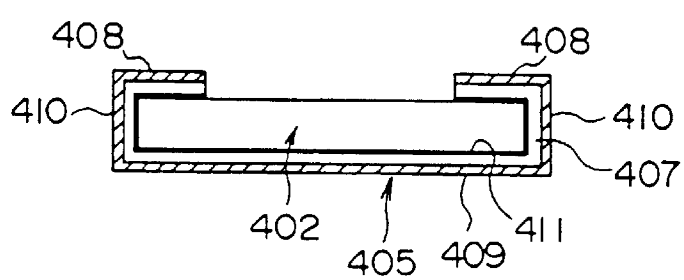

Then, as shown in FIG. 97C, each roller 427 is moved horizontally, so as to fold the portions of the flexible printed wiring substrate 405 extending vertically from the lower mold 429. As a result, the flexible printed wiring substrate 405 is folded so as to wrap the semiconductor element mounting substrate 402 inside. Next, the semiconductor element mounting substrate 402 and the folded flexible printed wiring substrate 405 are removed from the mold 426 in one piece. Hence, as shown in FIG. 97D, the obtained flexible printed wiring substrate 405 is arranged on the semiconductor element mounting substrate 402 so as to wrap the semiconductor element mounting substrate 402 inside.

According to this method, it is possible to bend and fold the flexible printed wiring substrate 405 with a high precision during the flexible printed wiring substrate arranging process by use of the mold 426. For this reason, in the semiconductor element mounting process that is carried out after the flexible printed wiring substrate arranging process, it is possible to electrically connect the semiconductor element 401 and the flexible printed wiring substrate 405 with a high accuracy.

FIGS. 98 through 102 are diagrams for explaining modifications of the resin encapsulating process described above. In the resin encapsulating process described above, the potting is used as an example of the method of filling the encapsulating resin 403. On the other hand, the modifications described hereunder in conjunction with FIGS. 98 through 102 fill the encapsulating resin 403 using transfer molding.

Figure 98:
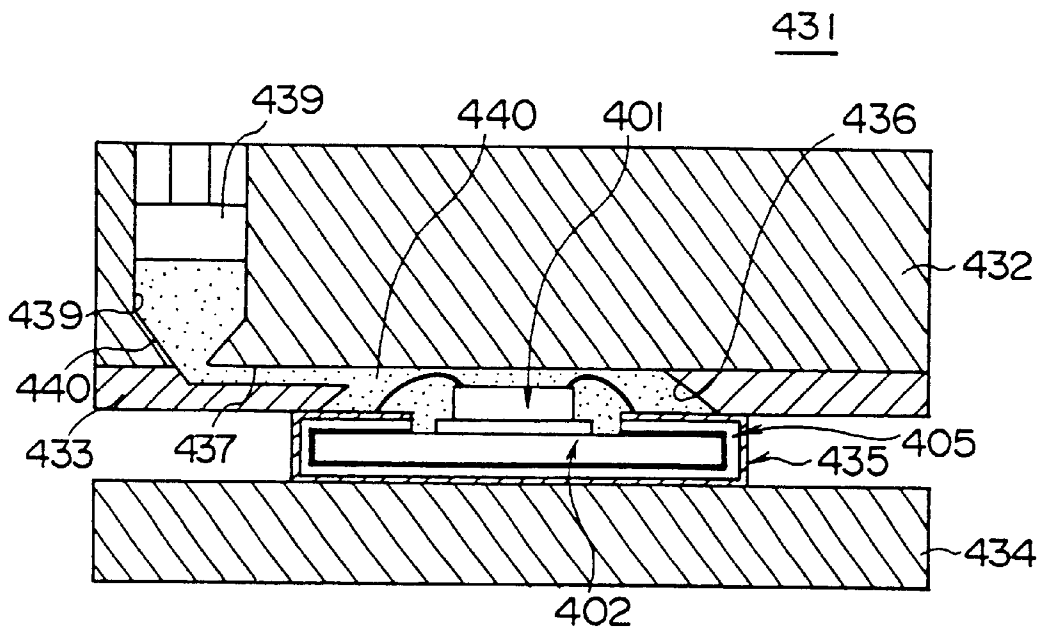
FIG. 98 is a cross sectional view for explaining a first modification of a resin encapsulating process of the method of producing the semiconductor device.

First, a description will be given of a first modification of the resin encapsulating process, by referring to FIG. 98. In FIG. 98, a transfer molding pressing unit 431 includes a plate molding lower mold 434, a plate molding intermediate mold 433, and a plate molding upper mold 432 which are heated to a predetermined temperature by a heater (not shown) or the like.

A semiconductor device assembly 435 which is obtained by carrying out the processes up to the semiconductor element mounting process is loaded between the intermediate mold 433 and the lower mold 434 and clamped with a predetermined pressure. A cavity 436 having a predetermined shape and a runner portion 437 are formed in the intermediate mold 433. In addition, a plunger pot 438 and a plunger 439 are disposed in the upper mold 432.

When the semiconductor device assembly 435 is loaded as described above, a tablet made up of press-molded powder of an encapsulating resin 440 is pre-heated to a semi-melted state by an infrared ray heater or the like. The semi-melted tablet is inserted into the plunger pot 438 of the upper mold 432.

Figure 99:
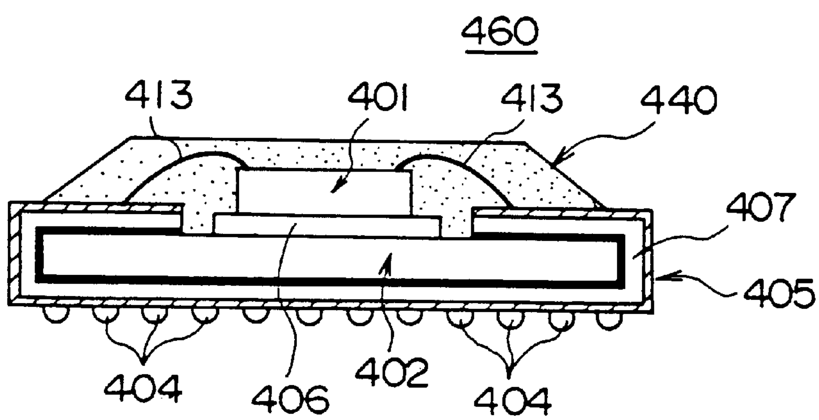
FIG. 99 is a cross sectional view showing a semiconductor device produced by the resin encapsulating process shown in FIG. 98.

Thereafter, the encapsulating resin 440 in the plunger pot 438 is pressed by the plunger 439, and the encapsulating resin 440 is introduced into the cavity 436 via the runner portion 437. As a result, the semiconductor element 401, the wires 413 and the like are encapsulated by the encapsulating resin 440. FIG. 99 shows a semiconductor device 460 which is produced by the resin encapsulating process described above.

In the first modification of the resin encapsulating process, the encapsulating resin 440 can be formed by the transfer molding. Compared to the potting, the transfer molding can improve the stability of the dimensions of the encapsulating resin and also improve the reliability of the encapsulating resin. Therefore, it is possible to obtain the semiconductor device 460 having a high quality according to this first modification of the resin encapsulating process.

Figure 100:
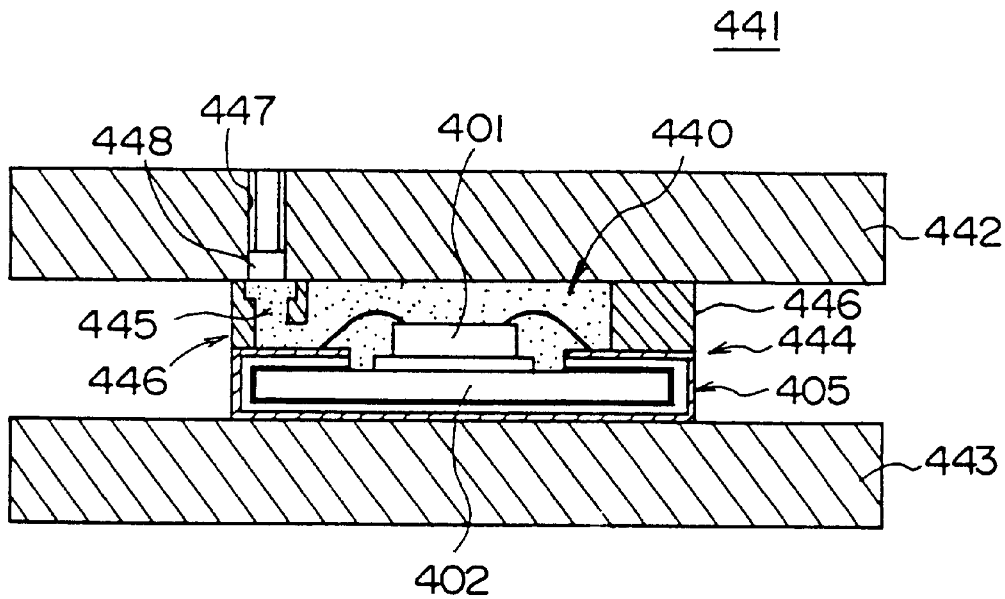
FIG. 100 is a cross sectional view for explaining a second modification of the resin encapsulating process of the method of producing the semiconductor device.

Next, a description will be given of the second modification of the resin encapsulating process, by referring to FIG. 100. In FIG. 100, a transfer molding pressing unit 441 includes a plate molding lower mold 433 and a plate molding upper mold 442 which are heated to a predetermined temperature by a heater (not shown) or the like.

In this modification, a semiconductor device assembly 444 includes a frame body 446 having a resin filling hole 445 with a diameter of 1 mm to 10 mm. This frame body 446 is arranged on top of the flexible printed wiring substrate 405 (above the semiconductor element mounting substrate 402) which is folded, by carrying out a frame body arranging process after the semiconductor element mounting process.

In addition, the upper mold 442 includes a plunger pot 447 having approximately the same diameter as the resin filling hole 445, and a plunger 448 provided within the plunger pot 447.

The semiconductor device assembly 444 having the frame body 446 is loaded between the upper mold 442 and the lower mold 443, in a state where the resin filling hole 445 and the plunger pot 447 are positioned.

When the semiconductor device assembly 444 is loaded as described above, the tablet made up of the press-molded powder of the encapsulating resin 440 is pre-heated to a semi-melted state by an infrared ray heater or the like. The semi-melted tablet is inserted into the plunger pot 447 of the upper mold 442.

Figure 101:
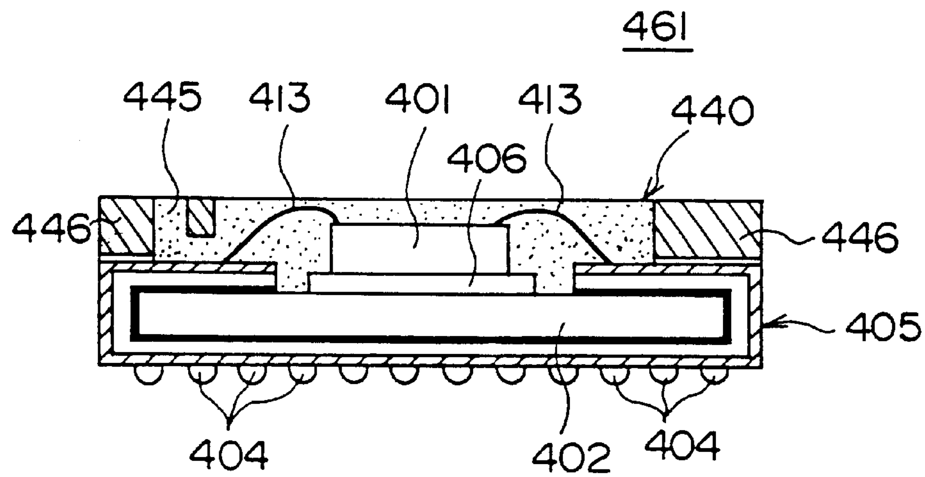
FIG. 101 is a cross sectional view showing a semiconductor device produced by the resin encapsulating process shown in FIG. 100.

Thereafter, the encapsulating resin 440 in the plunger pot 447 is pressed by the plunger 448, and the encapsulating resin 440 is introduced directly into the resin filling hole 445 provided in the frame body 446. As a result, the encapsulating resin 440 is introduced into the space that is formed within the frame body 446, and the semiconductor element 401 located within this space, the wires 413 and the like are encapsulated by the encapsulating resin 440. FIG. 101 shows a semiconductor device 461 which is produced by the resin encapsulating process described above.

Figure 102:
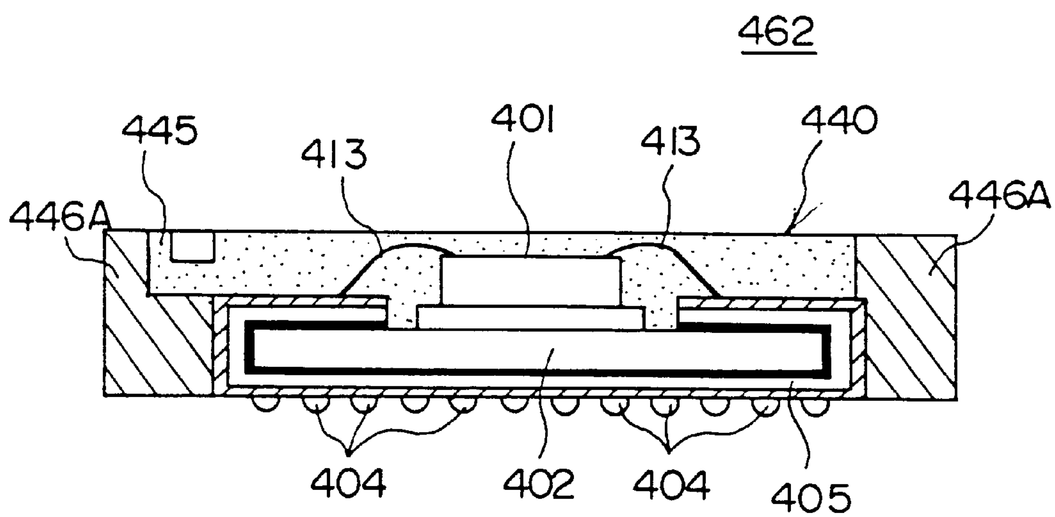
FIG. 102 is a cross sectional view showing a modification of the semiconductor device produced by the resin encapsulating process shown in FIG. 100.

The semiconductor device assembly 444 shown in FIG. 100 has the frame body 446 arranged above the semiconductor element mounting substrate 402. However, this frame body 446 may be arranged to surround the semiconductor element mounting substrate 402. FIG. 102 shows a semiconductor device 462 which is produced by carrying out the resin encapsulating process with respect to a semiconductor device assembly having a frame body 446A arranged so as to surround the semiconductor element mounting substrate 402.

According to the second modification of the resin encapsulating process employing the transfer molding and described above with reference to FIGS. 100 through 102, it is unnecessary to provide the intermediate mold 433 unlike the first modification of the resin encapsulating process described with reference to FIGS. 98 and 99. In addition, it is possible to improve the utilization efficiency of the encapsulating resin 440 because there is no residual encapsulating resin 440 remaining within the runner portion 437 and no surplus encapsulating resin 440 is required. Moreover, it is easier to cope with a size modification of the semiconductor device assembly 444, and the single mold 441 can be used for semiconductor device assemblies having various sizes. Furthermore, it is also possible to reduce the cost of the mold because there is no need to provide the intermediate mold 433.

Figure 104:
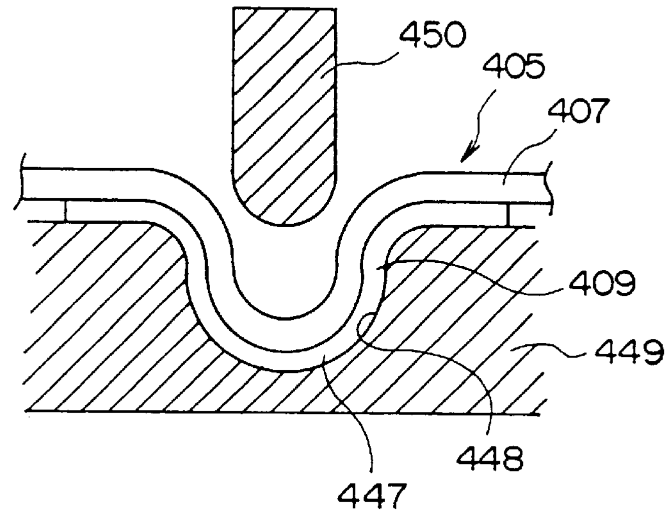
FIG. 104 is a cross sectional view for explaining a first modification of the external connecting terminal forming process.
Figure 105:
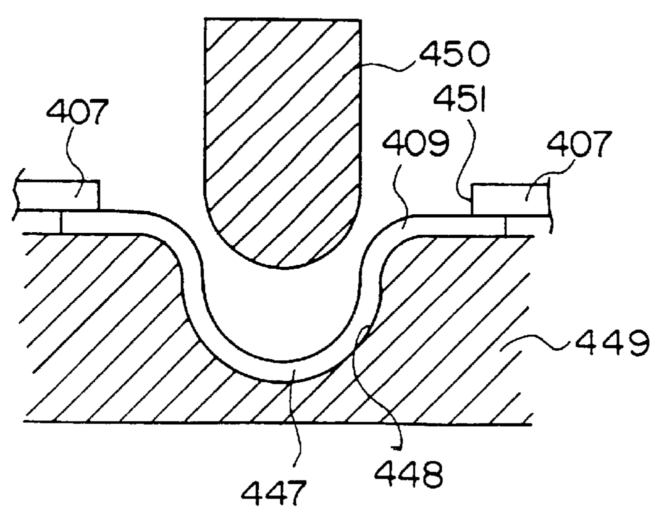
FIG. 105 is a cross sectional view for explaining a second modification of the external connecting terminal forming process.

FIGS. 104 through 106 are diagrams for explaining modifications of the external connecting terminal forming process.

According to the external connecting terminal forming process of the twelfth embodiment of the method of producing the semiconductor device, the solder balls 422 are provided on the external connecting terminal portions 409 using paste or the like. Thereafter, a thermal (or heating) process is carried out to melt the solder balls 422, so as to form the solder bumps 404.

On the other hand, according to a first modification of the external connecting terminal forming process shown in FIG. 104, the external connecting terminals are formed by mechanical bumps 447. The mechanical bumps 447 is formed by use of a die 449 and a punch 450. The die 449 has a recess 448 at a position where the external connecting terminal portion 409 is to be formed, and the punch 450 has a shape such that the punch 450 can enter within the recess 448 in the die 449. The flexible printed wiring substrate 405 is loaded on the die 449, and the punch 450 press-molds the external connecting terminal portion 409 in the downward direction. As a result, the base member 407 and the external connecting terminal portions 409 forming the flexible printed wiring substrate 405 are resiliently deformed in one operation, thereby forming a plurality of mechanical bumps 447.

By forming the external connecting terminals by the mechanical bumps 447, it is possible to form the external connecting terminals with ease because only a simple press-molding is required.

According to a second modification of the external connecting terminal forming process shown in FIG. 105, a penetrating hole 451 is formed in the base member 407 in advance at a position where the mechanical bump 447 is to be formed. Hence, only the external connecting terminal portion 409 is resiliently deformed by the punch 450, and the base member 407 will not be deformed. For this reason, it is possible to form the mechanical bumps 447 with ease and with a high precision.

Figure 106A:
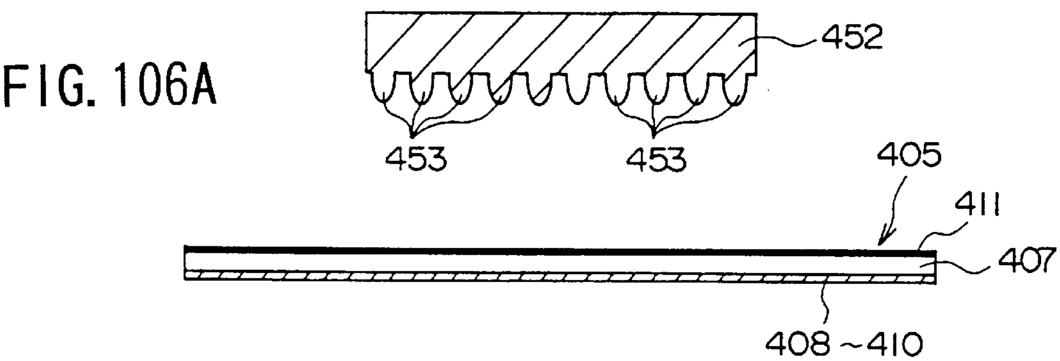
FIGS. 106A through 106C respectively are diagrams for explaining a third modification of the external connecting terminal forming process.
Figure 106B:
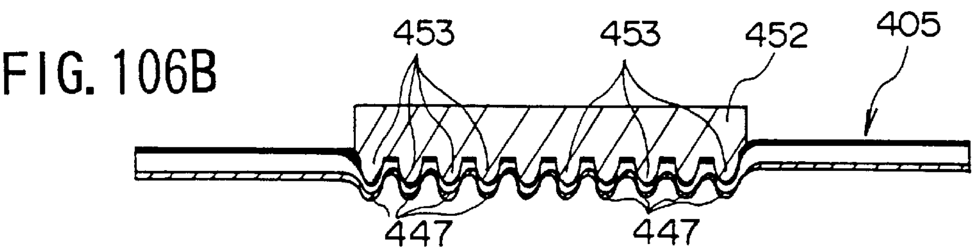
Figure 106C:
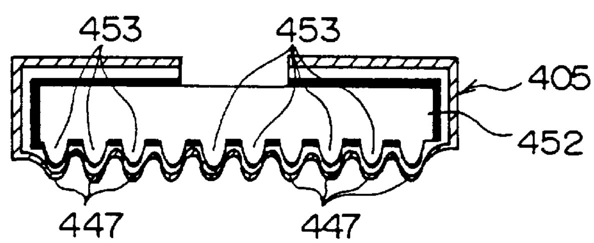

In addition, according to a third modification of the external connecting terminal forming process shown in FIGS. 106A through 106C, projections 453 are formed on a semiconductor element mounting substrate 452 at positions corresponding to the positions where the mechanical bumps 447 are to be formed. The mechanical bumps 447 are formed by the projections 453.

When forming the mechanical bumps 447 in this third modification, the projections 453 are formed on the semiconductor element mounting substrate 452 in advance as shown in FIG. 106A at positions corresponding to the positions where the mechanical bumps 447 are to be formed. Because the semiconductor element mounting substrate 452 is made of a metal, the projections 453 can be formed in a relatively simple manner with a high precision.

Then, as shown in FIG. 106B, the semiconductor element mounting substrate 452 is arranged on the flexible printed wiring substrate 405, and in this state, the semiconductor element mounting substrate 452 is pushed strongly against the flexible printed wiring substrate 405 using the pressing unit or the like. As a result, the projections 453 formed on the semiconductor element mounting substrate 452 function similarly to the punch 450 shown in FIGS. 104 and 105. In other words, as shown in FIG. 106C, a plurality of mechanical bumps 447 are formed in one operation.

According to this third modification of the external connecting terminal forming process, the mechanical bumps 447 can be formed in one operation using the semiconductor element mounting substrate 452 having the projections 453, and it is possible to simplify the production process and also reduce the production cost. In addition, after the mechanical bumps 447 are formed, the projections 453 remain in the state where the projections 453 are inserted within the mechanical bumps 447, and the reliability of the mechanical bumps 447 can be improved in that the projections 453 prevent deformation of the mechanical bumps 447 after the formation.

Next, a description will be given of other embodiments of the semiconductor device according to the presert invention, by referring to FIGS. 107A through 117.

Figure 107A:
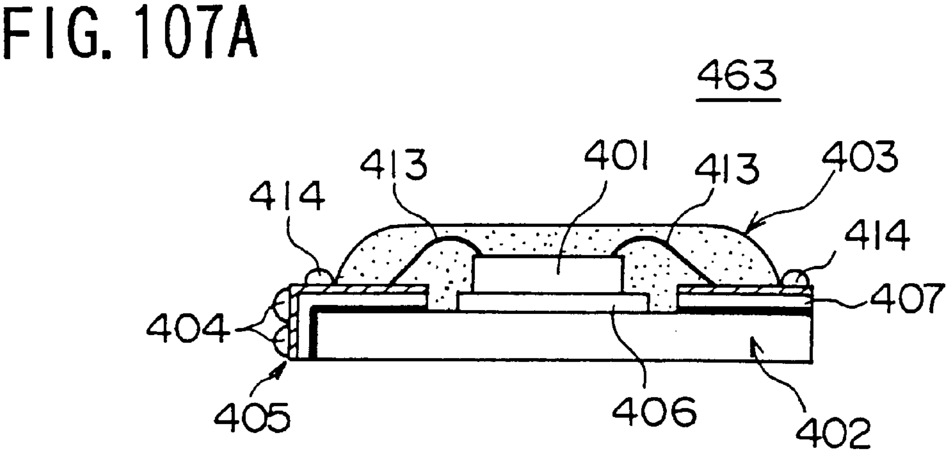
FIGS. 107A and 107B respectively are cross sectional views showing a thirty-seventh embodiment of the semiconductor device according to the present invention.
Figure 107B:
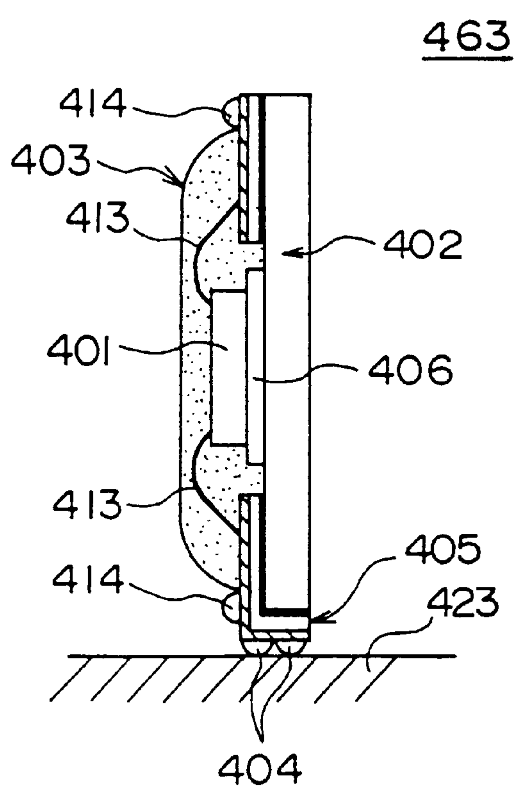

FIGS. 107A and 107B respectively are cross sectional views showing a thirty-seventh embodiment of the semiconductor device according to the present invention. A semiconductor device 463 shown in FIGS. 107A and 107B is characterized in that the flexible printed wiring substrate 405 is only arranged on the top surface of the semiconductor element mounting substrate 402 (that is, on the surface where the semiconductor element 401 is mounted) and on one of the four side surfaces of the semiconductor element mounting substrate 402, and that the bumps 404 are formed on the flexible printed wiring substrate 405 at the side surface portion of the semiconductor element mounting substrate 402.

According to the semiconductor device 463, it is possible to mount the semiconductor device 463 on the mounting substrate 423 in the standing position as shown in FIG. 107B. Hence, it is possible to mount the semiconductor device 463 on the mounting substrate 423 with a high density, and the mounting efficiency of the semiconductor device 463 with respect to the mounting substrate 423 can be improved.

Figure 108:
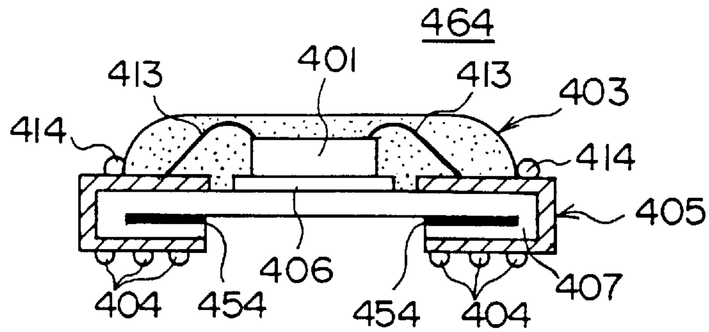
FIG. 108 is a cross sectional view showing a thirty-eighth embodiment of the semiconductor device according to the present invention.

FIG. 108 is a cross sectional view showing a thirty-eighth embodiment of the semiconductor device according to the present invention. A semiconductor device 464 shown in FIG. 108 has the semiconductor element 401 arranged directly on the flexible printed wiring substrate 405, thereby eliminating the need for the semiconductor element mounting substrate 402. According to this semiconductor device 464, the semiconductor element 401 is mounted on the base member 407 of the flexible printed wiring substrate 405 using the die-bonding material 406.

In addition, in this embodiment of the semiconductor device, the flexible printed wiring substrate 405 is bent downwards and folded, so that the bumps 404 formed at the external connecting terminal portions 409 are located on the bottom surface side. An adhesive agent 454 is provided at parts where portions of the base member 407 confront each other, so as to prevent the folded portions of the flexible printed wiring substrate 405 from opening or unfolding.

Because the semiconductor device 464 does not require the semiconductor element mounting substrate 402, it is possible to reduce the number of parts and accordingly reduce the production cost of the semiconductor device 464. In addition, it is possible to make the semiconductor device 464 thin by an amount corresponding to the semiconductor element mounting substrate 402 which is eliminated.

Figure 109:
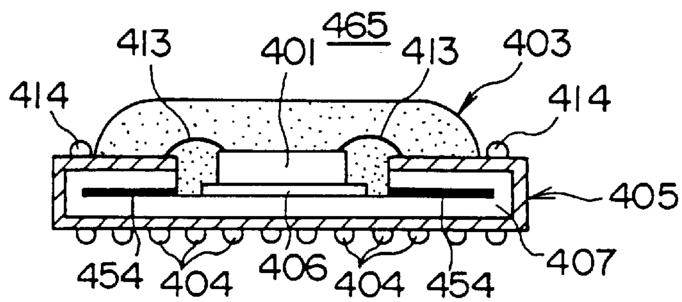
FIG. 109 is a cross sectional view showing a thirty-ninth embodiment of the semiconductor device according to the present invention.

FIG. 109 is a cross sectional view showing a thirty-ninth embodiment of the semiconductor device according to the present invention. A semiconductor device 465 shown in FIG. 109 has a construction which is basically the same as that of the semiconductor device 464 shown in FIG. 108. However, in this thirty-ninth embodiment of the semiconductor device, the flexible printed wiring substrate 405 is bent upwards and folded.

Therefore, the flexible printed wiring substrate 405 may be bent and folded in either the upward or downward direction. In either case, it is possible to reduce the production cost and to reduce the thickness of the semiconductor device.

The semiconductor device 464 shown in FIG. 108 has an advantage in that the precision of the patterns on the bonding side can be maintained. On the other hand, the semiconductor device 465 shown in FIG. 109 has an advantage in that the precision of the pattern on the bump side can be maintained.

Figure 110:
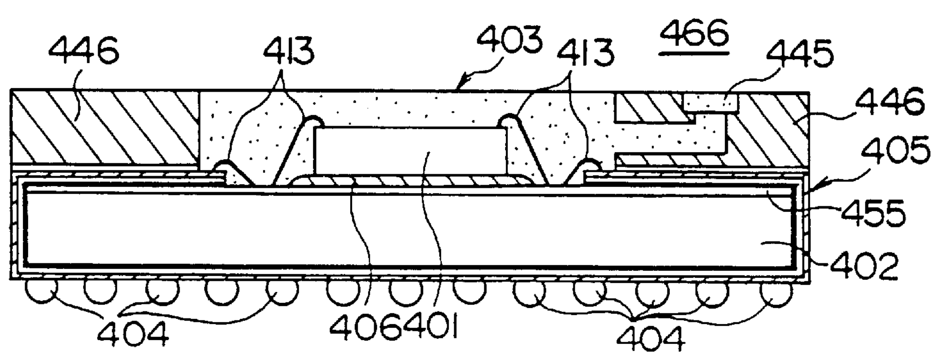
FIG. 110 is a cross sectional view showing a fortieth embodiment of the semiconductor device according to the present invention.

FIG. 110 is a cross sectional view showing a fortieth embodiment of the semiconductor device according to the present invention. A semiconductor device 466 shown in FIG. 110 is characterized in that a thin film wiring layer 455 is formed on the top surface of the semiconductor element mounting substrate 402. This thin film wiring layer 455 is made up of an insulator layer and a conductor layer (both not shown) that is patterned into a predetermined pattern. The insulator layer and the conductor layer may be provided in a plurality of levels to form a multi-level structure. In this embodiment of the semiconductor device, the electrical connection between the flexible printed wiring substrate 405 and the thin film wiring layer 455 and the electrical connection between the thin film wiring layer 455 and the semiconductor element 401 are both made by the wires 413.

The thin film wiring layer 455 has large area, and a relatively large marginal space for providing other conductor patterns exists on the thin film wiring layer 455. Hence, a conductor layer having a low inductance may be formed on the thin film wiring layer 455 and used as power supply and ground electrodes, for example. In addition, it is possible to form active elements such a resistors and capacitors on the thin film wiring layer 455, so that the characteristic of the semiconductor device 466 is improved.

The material forming the semiconductor element mounting substrate 402 is not limited to metals such as copper and aluminum, and it is possible to use ceramics such as aluminum nitride and alumina. Further, the material forming the insulator layer of the thin film wiring layer 455 may be selected from materials such as polyimide, epoxy resin, and organic materials such as benzocyclobutene (BCB). Such an insulator material may be spin coated on the top surface of the semiconductor element mounting substrate 402 and then subjected to a thermal process. In addition, the material forming the conductor layer of the thin film wiring layer 455 may be selected from materials such as copper and aluminum. Such a conductive material may be formed on the semiconductor element mounting substrate 402 by evaporation or vapor deposition, sputtering and plating. It is also possible to form the semiconductor device 466 as a multichip module (MCM) by mounting a plurality of semiconductor elements on the thin film wiring layer 455.

Figure 111:
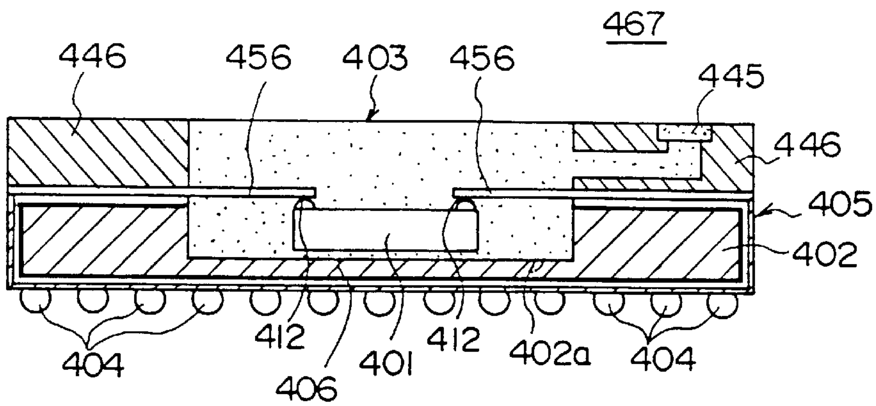
FIG. 111 is a cross sectional view showing a forty-first embodiment of the semiconductor device according to the present invention.

FIG. 111 is a cross sectional view showing a forty-first embodiment of the semiconductor device according to the present invention.

In the embodiments of the semiconductor device described above, the electrical connection between the semiconductor element 401 and the flexible printed wiring substrate 405 is made by the wires 413. However, in a semiconductor device 467 shown in FIG. 111, the electrical connection between the semiconductor element 401 and the flexible printed wiring substrate 405 is made by the TAB technique.

On the other hand, in this embodiment of the semiconductor device, a recess 402*a* is formed in the semiconductor element mounting substrate 402 so as to match or align the height position of a TAB tape 456 and the height position of the electrode pads 412 formed on the semiconductor element 401. The semiconductor element 401 is down set at the bottom portion of the recess 402*a*.

Figure 112:
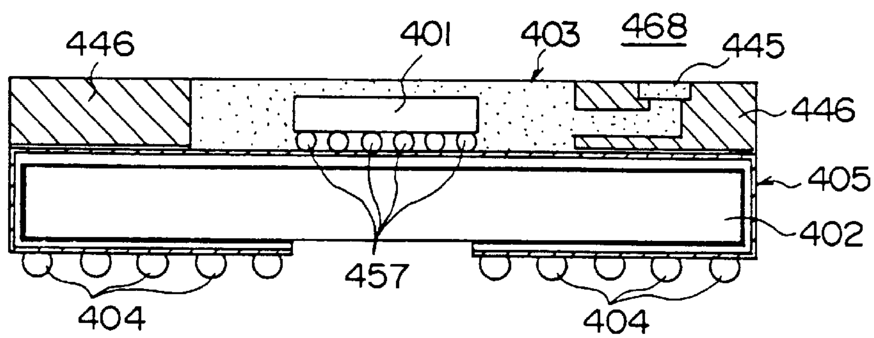
FIG. 112 is a cross sectional view showing a forty-second embodiment of the semiconductor device according to the present invention.

FIG. 112 is a cross sectional view showing a forty-second embodiment of the semiconductor device according to the present invention.

A semiconductor device 468 shown in FIG. 112 is characterized in that the semiconductor element 401 is directly connected to the flexible printed wiring substrate 405 by flip-chip bonding. For this reason, element mounting bumps 457 for mounting the semiconductor element 401 are formed on the lower surface of the semiconductor element 401. In addition, the flexible printed wiring substrate 405 has element connecting electrodes (not shown) formed on top of the semiconductor element mounting substrate 402 at a portion corresponding to the position where the semiconductor element 401 is to be mounted in the other embodiments.

The semiconductor element 401 is connected face down with respect to the flexible printed wiring substrate 405 so that the element mounting bumps 457 on the semiconductor element 401 connected to the element connecting electrodes on the flexible printed wiring substrate 405. In other words, the semiconductor element 401 is directly connected to the flexible printed wiring substrate 405. In this embodiment of the semiconductor device, it is possible to adapt to high-density semiconductor elements 401 because the element mounting bumps 457 can be arranged with a high density.

FIGS. 113 through 117 are cross sectional views showing other embodiments of the semiconductor device according to the present invention having the form of the so-called chip-size package, wherein the size of the semiconductor device is approximately the same as the size of the semiconductor element 401.

Figure 113:
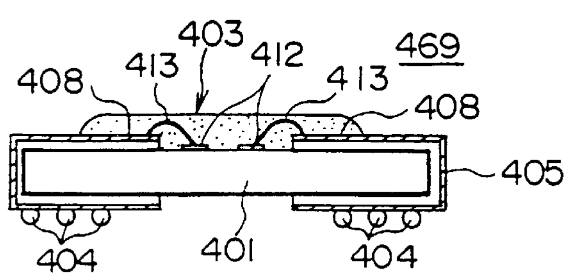
FIG. 113 is a cross sectional view showing a forty-third embodiment of the semiconductor device according to the present invention.

FIG. 113 is a cross sectional view showing a forty-third embodiment of the semiconductor device according to the present invention.

A semiconductor device 469 shown in FIG. 113 is characterized in that the flexible printed wiring substrate 405 wraps the semiconductor element 401 directly from above. The electrode pads 412 of the semiconductor element 401 are arranged on the top surface of the semiconductor element 401 at a central portion thereof, and the electrode pads 412 and the electrode portions 408 formed on the flexible printed wiring substrate 405 are electrically connected by the wires 413. The encapsulating resin 403 is provided above the electrode pads 412 and the wires 413.

The semiconductor device 469 can be made small to realize the chip-size package, since the flexible printed wiring substrate 405 is arranged to directly wrap the semiconductor element 401 inside.

Generally, in the chip-size package having a packaging area approximately equal to the area of the semiconductor element in the plan view, it was necessary to provide external connecting terminals (corresponding to the bumps 404 of this embodiment) on the side where the electrode pads of the semiconductor element are provided. This is because the conventional chip-size package structure did not imagine drawing the wiring connected to he electrode pads of the semiconductor element around the rear surface of the semiconductor element. For this reason, it was essential to provide a wire-bonding area on the conventional chip-size package, and the density with which the bumps may be arranged was limited. In addition, since it was necessary to provide bumps that are higher than the height of the wire-bonded wire loops, it was impossible to connect the wiring connected to the external connecting terminals to the electrode pads 412 by wire-bonding.

However, according to the semiconductor device 469 shown in FIG. 113, the wiring is drawn around the rear surface of the semiconductor element 401 by use of the flexible printed wiring substrate 405, and the bumps 404 are formed on the rear surface side. Hence, it is possible to connect the electrode pads 412 and the electrode portions 408 which are formed on the flexible printed wiring substrate 405 by the wire-bonding, and the electrical connection of the electrode pads 412 and the electrode portions 408 can be realized with ease.

Figure 114:
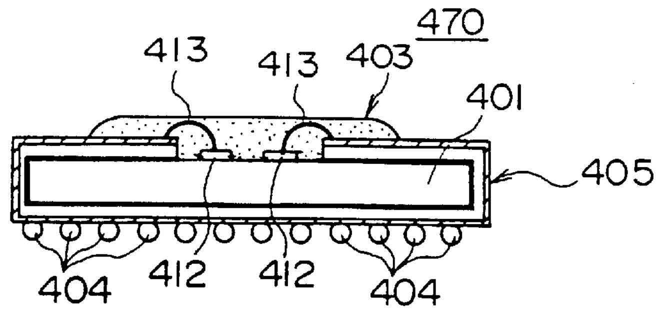
FIG. 114 is a cross sectional view showing a forty-fourth embodiment of the semiconductor device according to the present invention.

FIG. 114 is a cross sectional view showing a forty-fourth embodiment of the semiconductor device according to the present invention.

A semiconductor device 470 shown in FIG. 114 has a construction which is basically the same as that of the semiconductor device 469 shown in FIG. 113. However, in the semiconductor device 470, the flexible printed wiring substrate 405 wraps the semiconductor element 401 inside from underneath the semiconductor element 401.

Therefore, the flexible printed wiring substrate 405 may be arranged to wrap the semiconductor element 401 inside from above or from underneath the semiconductor element 401. In either case, it is possible to obtain the effects of the forty-third embodiment of the semiconductor device described above.

Figure 115:
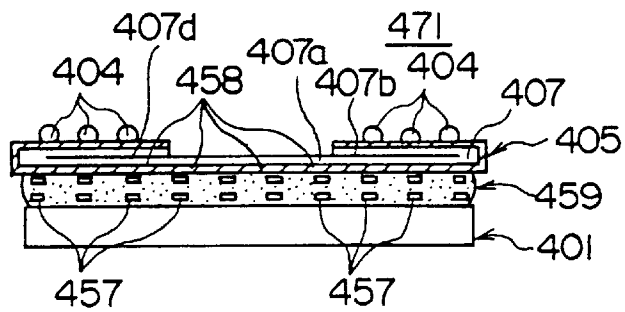
FIG. 115 is a cross sectional view showing a forty-fifth embodiment of the semiconductor device according to the present invention.

FIG. 115 is a cross sectional view showing a forty-fifth embodiment of the semiconductor device according to the present invention.

In a semiconductor device 471 shown in FIG. 115, the extensions 407*b* through 407*e* (only 407*b* and 407*d* shown in FIG. 115) of the flexible printed wiring substrate 405 are bent upwards and folded. The folded extensions 407*b* through 407*e* are bonded to the base portion 407*a* using the adhesive agent 454. In addition, element connecting electrodes 458 are formed on the base portion 407*a* at a portion corresponding to the position where the element mounting bumps 457 of the semiconductor element 401 are formed.

The flexible printed wiring substrate 405 and the semiconductor element 401 are bonded by an anisotropic conductive resin 459. This anisotropic conductive resin 459 includes conductive metal powder that is mixed into a resin having an adhesive characteristic, and electrical conductivity only occurs in the direction in which the anisotropic conductive resin 459.

When mounting the semiconductor element 401 on the flexible printed wiring substrate 405 in this embodiment of the semiconductor device, the semiconductor element 401 is fixed by pushing it against the flexible printed substrate 405. For this reason, the element mounting bumps 457 and the element connecting electrodes 458 are electrically connected by the anisotropic conductive resin 459. At the same time, the semiconductor element 401 and the flexible printed wiring substrate 405 are mechanically bonded by the adhesion provided by the anisotropic conductive resin 459.

Therefore, according to the semiconductor device 471, it is possible to simultaneously achieve the electrical connection and the mechanical connection (or bonding) by simply connecting the semiconductor element 401 to the flexible printed wiring substrate 405 via the anisotropic conductive resin 459. As a result, it is possible to produce the semiconductor device 471 with ease by a simple process.

Figure 116:
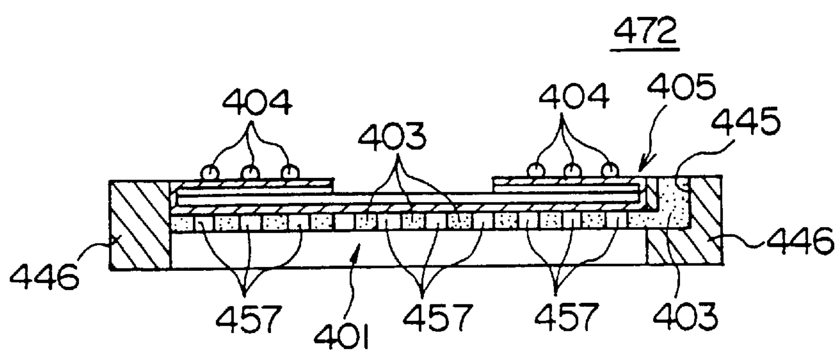
FIG. 116 is a cross sectional view showing a forty-sixth embodiment of the semiconductor device according to the present invention.

FIG. 116 is a cross sectional view showing a forty-sixth embodiment of the semiconductor device according to the present invention.

A semiconductor device 472 shown in FIG. 116 uses a flexible printed wiring substrate 405 having a construction similar to that used in the semiconductor device 471 shown in FIG. 115. This semiconductor device 472 is characterized in that the semiconductor element 401 is connected to the flexible printed wiring substrate 405 by flip-chip bonding. Unlike the forty-fifth embodiment of the semiconductor device, this embodiment of the semiconductor device does not use the anisotropic conductive resin 459. Instead, the semiconductor element 401 is electrically connected to the flexible printed wiring substrate 405 by melting and connecting the element mounting bumps 457 to the element connecting electrodes (not shown).

In addition, the frame body 446 having the resin filling hole 445 is arranged on the outer peripheral position of the semiconductor element 401 and the flexible printed wiring substrate 405. The encapsulating resin 403 is filled into a space between the semiconductor element 401 and the flexible printed wiring substrate 405 via the resin filling hole 445. Because the encapsulating resin 403 fills the space between the semiconductor element 401 and the flexible printed wiring substrate 405, it is possible to improve the reliability of the connecting portion connecting the semiconductor element 401 and the flexible printed wiring substrate 405.

Figure 117:
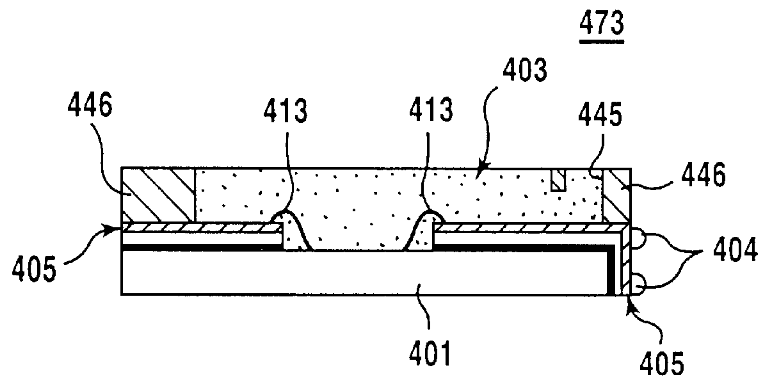
FIG. 117 is a cross sectional view showing a forty-seventh embodiment of the semiconductor device according to the present invention.

FIG. 117 is a cross sectional view showing a forty-seventh embodiment of the semiconductor device according to the present invention.

In a semiconductor device 473 shown in FIG. 117, the flexible printed wiring substrate 405 is only arranged at a predetermined position (excluding the position of the electrode pads 412) on the top surface of the semiconductor element 401 and at one of the four side surfaces of the semiconductor element 401. In addition, the bumps 404 are formed on the flexible printed wiring substrate 405 at a position corresponding to the side surface portion of the semiconductor element 401. Moreover, by providing the frame body 446, the electrode pads 412 and the wires 413 are protected by the encapsulating resin 403 that is formed by transfer molding.

This semiconductor device 473 can be mounted on the mounting substrate in a standing position. For this reason, it is possible to mount the semiconductor device 473 that is formed as the chip-size package with a high mounting density with respect to the mounting substrate. It is also possible to further improve the reliability of the semiconductor device 473.

Next, a description will be given of a fifth aspect of the present invention.

Figure 118:
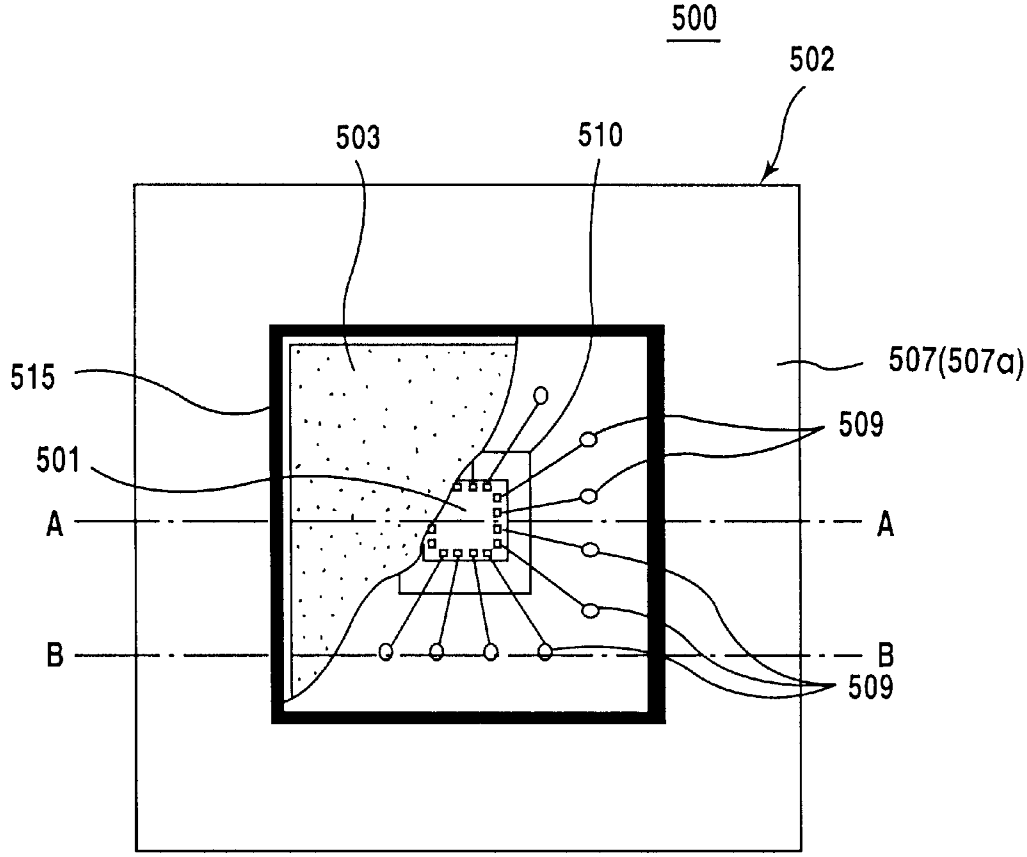
FIG. 118 is a plan view, with a part cut away, showing a forty-eighth embodiment of the semiconductor device according to the present invention.
Figure 119:
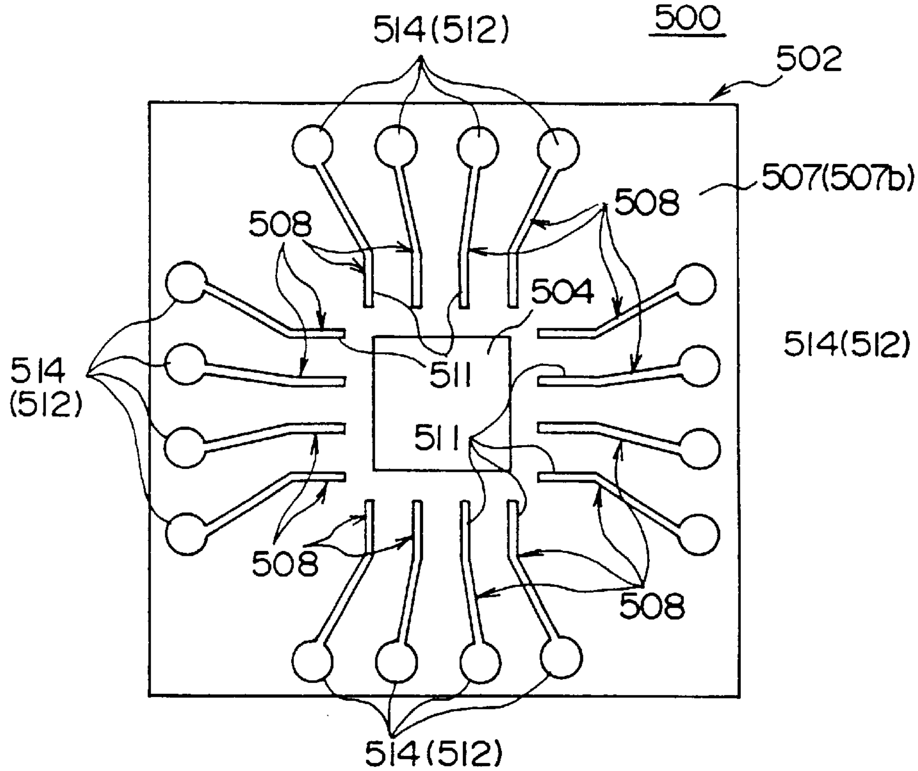
Figure 120:
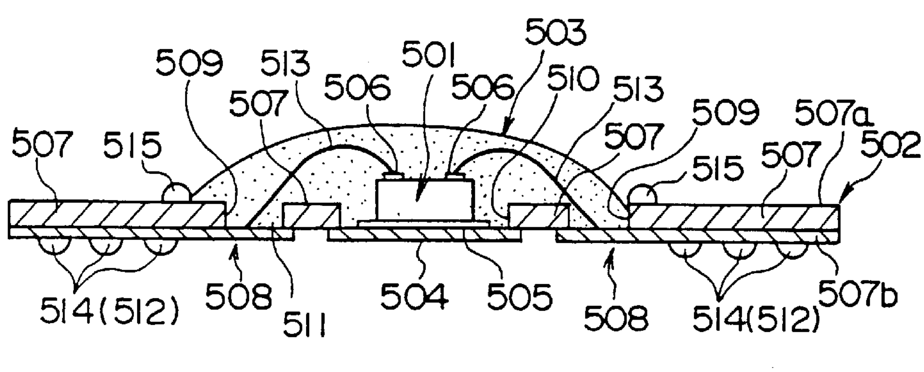
Figure 121:
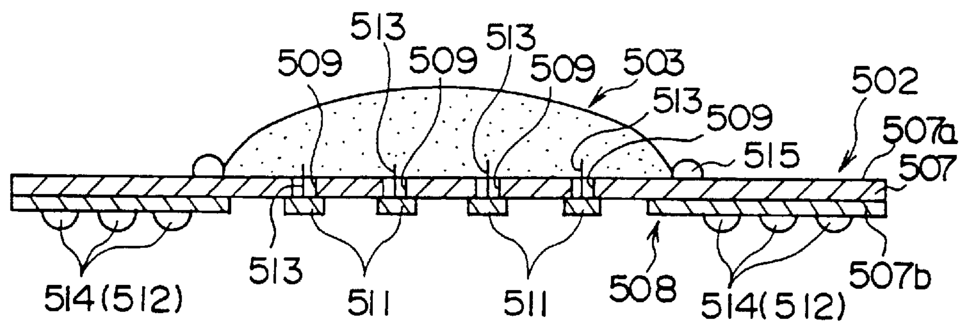

FIGS. 118 through 122B show a forty-eighth embodiment of the semiconductor device employing the fifth aspect of the present invention. FIG. 118 is a plan view, with a part cut away, showing the forty-eighth embodiment of the semiconductor device according to the present invention. FIG. 119 is a bottom view of the forty-eighth embodiment of the semiconductor device. FIG. 120 is a cross sectional view along a line A—A in FIG. 118, and FIG. 121 is a cross sectional view along a line B—B in FIG. 118.

A semiconductor device 500 shown in FIGS. 118 through 121 generally includes a semiconductor element 501, a semiconductor element mounting substrate 502, and an encapsulating resin 503.

The semiconductor element 501 is fixed on the upper portion of a stage 504 which forms the semiconductor element mounting substrate 502 by use of a die-bonding material 505, as may be seen from FIG. 120. Electrode pads 506 are provided on the top surface of the semiconductor element 501.

The semiconductor element mounting substrate 502 includes a base member 508 made of an insulator material, and a single first lead wiring layer 508 which is formed on a surface 507*b* of the base member 507 opposite to a surface 507*a* on which the semiconductor element 501 is mounted.

Wire penetrating holes 508 are formed in the base member 507 in the vicinity of the position where the semiconductor element 501 is provided. The number of wire penetrating holes 509 is the same as the number of electrode pads 506. In FIGS. 120 and 121, the wire penetrating holes 506 are shown slightly enlarged compared to FIG. 118. In addition, a semiconductor arranging hole 510 is formed in the base member 507 at the position where the semiconductor element 501 is provided. As will be described later, the stage 504 is formed on the surface 507*b* of the base member 507. Thus, the semiconductor element 501 which is mounted on the stage 504 is arranged on the side of the surface 507*a* via the semiconductor arranging hole 510.

The first lead wiring layer 508 includes inner lead portions 511 and outer lead portions 512. Each inner lead portion 511 extends to a portion below the corresponding wire inserting hole 509, and covers the wire inserting hole 509 from underneath. Hence, when the wire inserting hole 509 is viewed from the side of the surface 507*a*, the inner lead portion 511 is positioned at the bottom portion of the wire inserting hole 509 and closes the wire inserting hole 509.

The inner lead portions 511 and the electrode pads 506 on the semiconductor element 501 are connected via wires 513. Although the electrode pads 506 are located on the side of the surface 507*a* of the base member 507 and the inner lead portions 511 are located on the side of the surface 507*b* of the base member 5077, it is possible to electrically connect the inner lead portions 511 and the electrode pads 506 using the wires 513 by providing the wire inserting holes 509.

FIGS. 122A and 122B respectively are a cross sectional view and a perspective view on an enlarged scale showing the connection of the inner lead portion 511 and the wire 513. As shown in FIGS. 122A and 122B, the wire 513 is connected to the inner lead portion 511 located at the bottom of the wire inserting hole 509 in a state where the wire 513 is inserted into the wire inserting hole 509.

On the other hand, the outer lead portions 512 are located in the vicinity of the outer peripheral edge of the base member 507. As will be described later, each outer lead portion 512 is subjected to a plastic deformation process or the like, so that the part of the outer lead portion 512 which projects from the surface 507*b* forms a mechanical bump 514. Since the outer lead portions 512 and the mechanical bumps 514 are made up of the same parts, reference will hereunder be given with respect to the mechanical bumps 514. The inner lead portions 511 and the mechanical bumps 514 are integrally connected to form the first lead wiring layer 508. For this reason, the mechanical bumps 514 are electrically connected to the semiconductor element 501 when the inner lead portions 511 are electrically connected to the electrode pads 506 of the semiconductor element 501 by the wires 513.

In this embodiment of the semiconductor device, the encapsulating resin 503 is formed by potting, so as to encapsulate the semiconductor element 501, the wire inserting holes 509, the semiconductor arranging hole 510, the wires 513 and the like. Since the inner lead portions 511 are positioned at the bottom of the wire inserting holes 509 and the stage 504 is arranged at the bottom of the semiconductor arranging hole 510, it is possible to prevent the encapsulating resin 503 from leaking via the holes 509 and 510 to the side of the surface 507*b* of the base member 507.

Accordingly, it is possible to prevent the encapsulating resin 503 from adhering on the mechanical bumps 514 via the wire inserting holes 509 or the like, and the positive electrical connection of the mechanical bumps 514 can be maintained. As shown in FIGS. 120 and 121, a dam member 515 is provided on the surface 507*a* of the base member 507 for the purpose of preventing the encapsulating resin 503 from flowing over a predetermined range on the surface 507*a*.

As described above, in the semiconductor device 500, the first lead wiring layer 508 having the mechanical bumps 514 is formed on the surface 507*b* of the base member 507. For this reason, when forming the mechanical bumps 514, it becomes unnecessary to provide holes that would be required in the base member 507 if the first lead wiring layer 508 were formed on the surface 507*a*, and the mechanical bumps 514 can be formed with ease. Further, because the first lead wiring layer 508 has a single-layer structure, it is possible to more positively form the mechanical bumps 514 with a high precision compared to the case shown in FIGS. 22A through 22C where the mechanical bumps are formed with respect to a wiring layer having the multi-level structure.

FIG. 123 is a perspective view showing a modification of the forty-eighth embodiment of the semiconductor device.

According to the semiconductor device 500 described above, the first lead wiring layer 508 is only formed on the surface 507*b* of the base member 507.

However, according to a semiconductor device 600 shown in FIG. 123, a second lead wiring layer 516 is formed on the surface 507*a* of the base member 507.

When the second lead wiring layer 516 is provided on the surface 507*a* of the base member 507, it is necessary to draw out the second lead wiring layer 516 on the side of the surface 507*b* so as to electrically connect the second lead wiring layer 516 and the first lead wiring layer 508. In this modification of the forty-eighth embodiment, mechanical bumps for interlayer connection are formed at the outer lead portions of the second lead wiring layer 516. In addition, bump penetrating holes 518 are formed in the base member 507 so that the mechanical bumps 517 can project towards the surface 507*b*. As a result, it is possible to electrically connect the second lead wiring layer 516 and the first lead wiring layer 508 as shown in FIG. 123.

Because the semiconductor device 600 has the second lead wiring layer 516 provided on the surface. 507*a* of the base member in addition to the first lead wiring layer 508 provided on the surface 507*b*, it is possible to improve the freedom with which the wiring is drawn around. Thus, it is possible to cope with high-density semiconductor element 501.

In addition, since the first lead wiring layer 508 and the second lead wiring layer 516 are electrically connected by use of the mechanical bumps 517, it is possible to easily and positively connect the first and second lead wiring layers 508 and 516 electrically at a low cost.

FIG. 124 is a diagram showing the mechanical bumps 514 of the semiconductor device 600. In the particular case shown in FIG. 124, mechanical bumps 514*a* for signal wiring are formed at the outer peripheral portion of the base member 507 using the second lead wiring layer 516. On the other hand, mechanical bumps 514*b* for power supply or ground are formed at the inner portion of the base member 507 using the first lead wiring layer 508.

By intensively arranging the common mechanical bumps 514*b* for the power supply or ground, for example, it is possible to make the first lead wiring layer 508 continuous as a full coated layer for the power supply or ground. FIG. 124 shows the case where the first lead wiring layer 508 is the full coated layer. In this case, it is possible to reduce the inductance of the first lead wiring layer 508, and the electrical characteristics of the semiconductor device 600 can be improved.

Next, a description will be given of a thirteenth embodiment of the method of producing the semiconductor device according to the present invention, by referring to FIGS. 125A through 125L. This embodiment of the method produces the semiconductor device 500 described above. The semiconductor device producing operation for producing the semiconductor device 500 generally includes a substrate forming process, a semiconductor element mounting process, a resin encapsulating process, and a conductive metal layer forming process. A description will hereunder be given with respect to each of these processes.

First, the substrate forming process will be described with reference to FIGS. 125A through 125F. FIGS. 125A through 125F are diagrams for explaining the substrate forming process in the forming sequence. The semiconductor element mounting substrate 502 is formed by this substrate forming process.

Figure 125A:
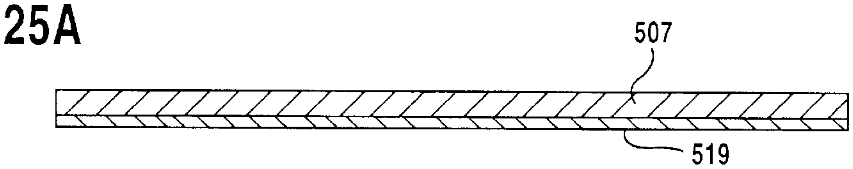

When forming the semiconductor element mounting substrate 502, the plate-shaped base member 507 made of an insulator material is prepared as shown in FIG. 125A. A rear surface of this base member 507 is coated with an adhesive agent 519. For example, the base member 507 may be made of an epoxy system resin, and the adhesive agent 519 may be made of a thermosetting epoxy system or silicone system adhesive agent.

Figure 125B:
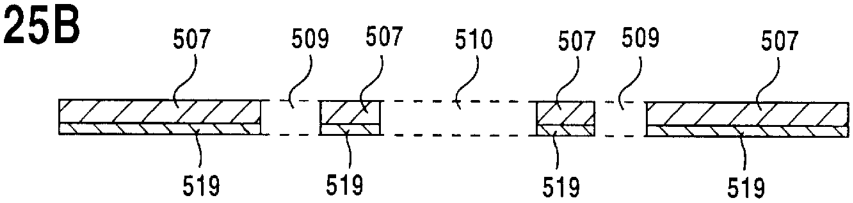
Figure 125C:
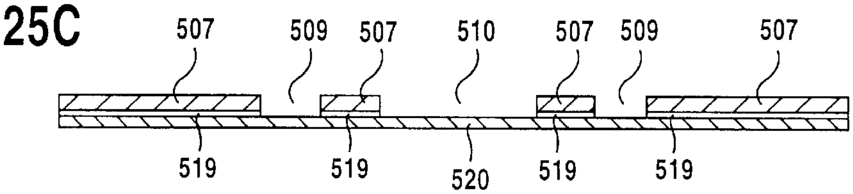

Next, a press punching is carried out with respect to the base member 507 which is coated with the adhesive agent 519, so that the wire inserting holes 509 and the semiconductor arranging hole 510 are formed in one operation as shown in FIG. 125B. When the wire inserting holes 509 and the semiconductor arranging hole 510 are formed in this manner, a copper film 520 which becomes the first lead wiring layer 508 is adhered on the entire rear surface of the base member 507 via the adhesive agent 519, as shown in FIG. 125C.

Figure 125D:
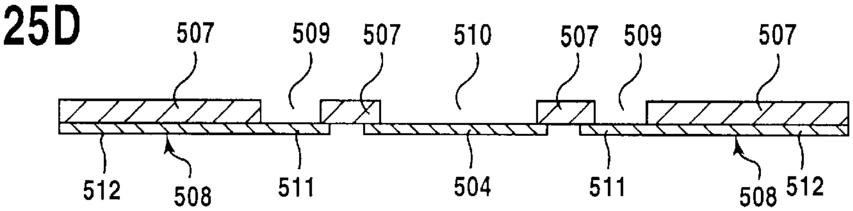

Then, a thermal process is carried out to harden the adhesive agent 519 so as to positively adhere the copper film 520 on the base member 507. An etching process is thereafter carried out to remove unwanted portions of the copper film 520, so that the first lead wiring layer 508 and the stage 504 are formed in one operation. FIG. 125D shows the base member 507 that is formed with the first lead wiring layer 508 and the stage 504. In this state, the inner lead portions 511 of the first lead wiring layer 508 close the wire inserting holes 509, and the stage 504 similarly closes the semiconductor arranging hole 510.

Figure 125E:
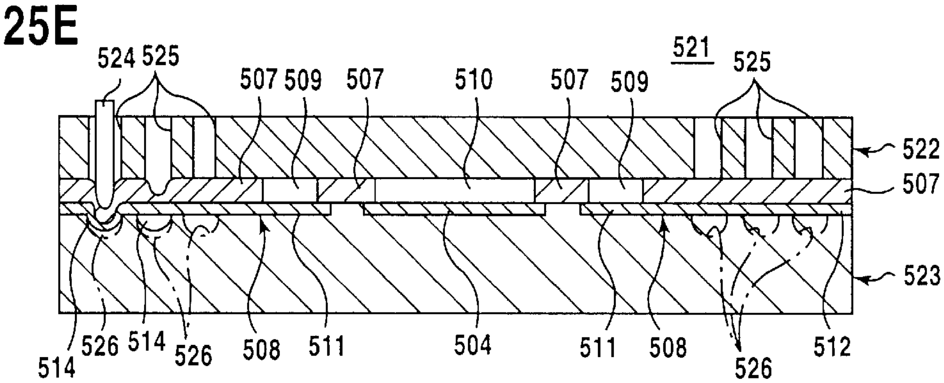

After the first lead wiring layer 508 and the stage 504 are formed in the above described manner, the mechanical bumps 514 are formed at the outer lead portions 512 of the first lead wiring layer 508. When forming the mechanical bumps 514, the base member 507 is loaded onto a mechanical bump forming mold 521 as shown in FIG. 125E.

The mechanical bump forming mold 521 is made up of an upper mold 522 and a lower mold 523, and a guide hole 525 is formed in the upper mold 522 at a position corresponding to the position where the mechanical bump 514 is to be formed. A punch 524 is inserted through and is guided by the guide hole 525. A hemispherical cavity 526 is formed in the lower mold 523 at a position corresponding to the position where the mechanical bump 514 is to be formed.

The base member 507 is set in the mechanical bump forming mold 521 so as to be sandwiched between the upper mold 522 and the lower mold 523. Then, the punch 524 is moved downwards within the guide hole 525 by a pressing unit (not shown). As a result, the outer lead portion 512 is press-molded against the cavity 526, thereby forming the mechanical bump 514. By providing a plurality of punches 524 equal to the number of mechanical bumps 514 to be formed, it is possible to form a plurality of mechanical bumps 514 in one operation.

Figure 125F:
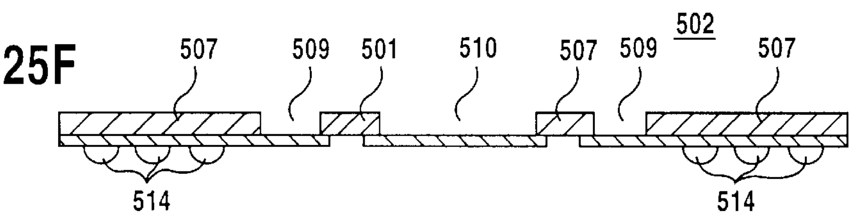

By carrying out the series of processes described above, the semiconductor element mounting substrate 502 shown in FIG. 125F is formed.

Figure 125G:
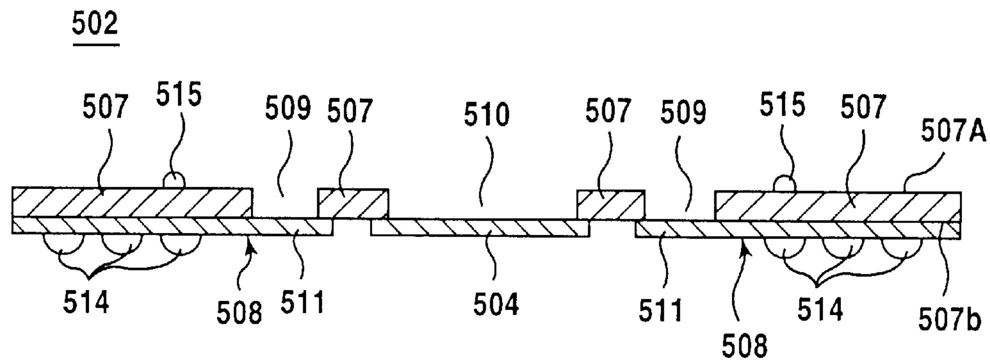
Figure 125H:
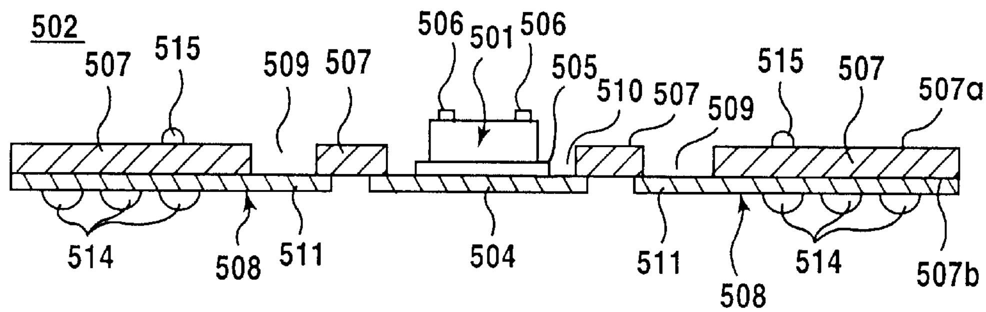
Figure 125I:
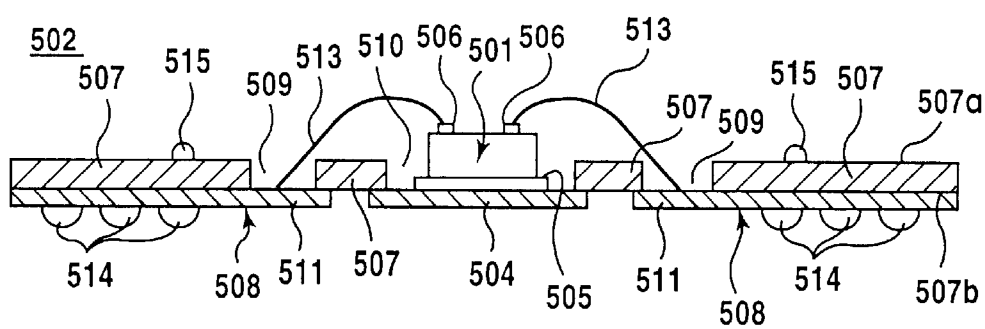

After the substrate forming process described in conjunction with FIGS. 125A through 125F ends, the semiconductor element mounting process is carried out. FIGS. 125G through 125I are diagrams for explaining the semiconductor element mounting process in the forming sequence.

In the semiconductor element mounting process, the dam member 515 is first formed at a predetermined position on the base member 507 which forms the semiconductor element mounting substrate 502, as shown in FIG. 125G. Then, as shown in FIG. 125H, the semiconductor element 501 is mounted on the upper portion of the stage 504 using the die-bonding material 505.

In the state where the semiconductor element 501 is mounted on the stage 504, the top surface of the semiconductor element 501 having the electrode pads 506 projects upwards from the surface 507*a* of the base member 507 via the semiconductor arranging hole 509.

As described above, when the semiconductor element 501 is mounted on the top portion of the stage 504, the wires 513 are provided between the electrode pads 506 on the top surface of the semiconductor element 501 and the inner lead portions 511 of the first lead wiring layer 508, as shown in FIG. 125I, using the wire-bonding equipment. In this state, due to the provision of the wire inserting holes 509, the wires 513 are connectable to the inner lead portions 511 from the side of the surface 507*a*. Accordingly, even if the first lead wiring layer 508 is provided on the surface 507*b* of the base member 507, it is possible to positively connect the wires 513 with respect to the inner lead portions 511.

By carrying out the series of processes described above, the semiconductor element 501 is mounted on the semiconductor element mounting substrate 502 and the semiconductor element mounting process ends.

Figure 125J:
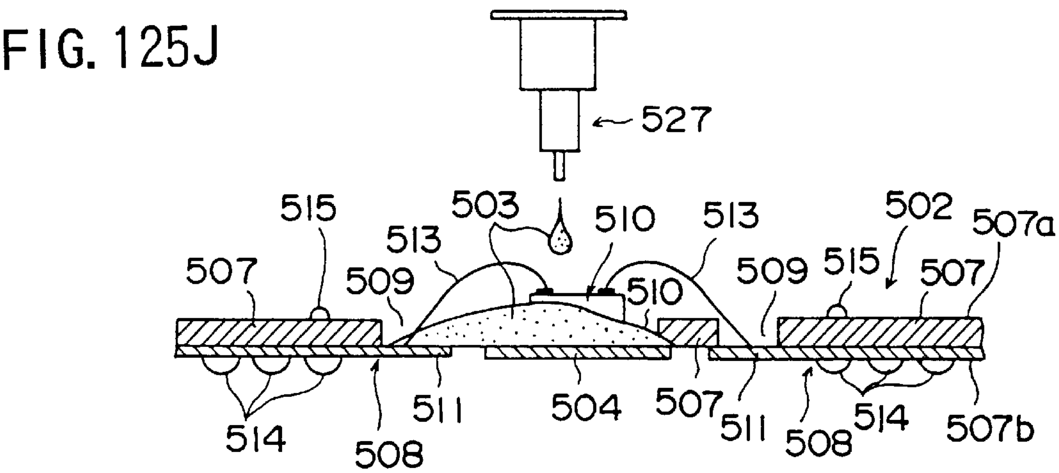
Figure 125K:
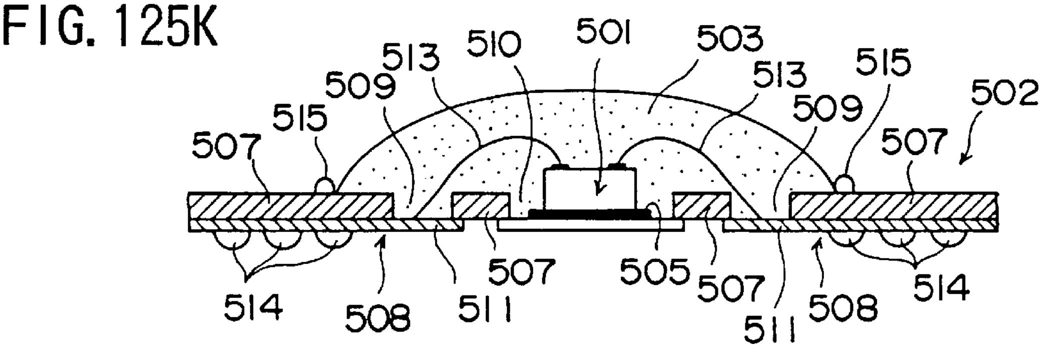

After the semiconductor element mounting process ends, the resin encapsulating process is carried out. FIGS. 125J and 125K are diagrams for explaining the resin encapsulating process. In this embodiment of the method, the encapsulating resin 503 is filled by potting. Hence, as shown in FIG. 125J, the encapsulating resin 503 is filled by potting towards the semiconductor element 501 from a nozzle 527. As a result, the semiconductor element 501, the wires 513, the inner lead portions 511 and the like are encapsulated by the encapsulating resin 503.

As described above, the inner lead portions 511 are provided at the bottom of the wire inserting holes 509, and the stage 504 is provided at the bottom of the semiconductor arranging hole 510. Hence it is possible to prevent the encapsulating resin 503 from leaking to the side of the surface 508*b* via the holes 509 and 510. The encapsulating resin 503 will thus not adhere on the mechanical bumps 514, and the electrical connection between the mechanical bumps 514 and the mounting substrate can be made positively. In addition, it becomes unnecessary to carry out a process of removing the encapsulating resin 503 adhered on the mechanical bumps 514. FIG. 125K shows the semiconductor element mounting substrate 502 in a state where the resin encapsulating process has ended and the encapsulating resin 503 is provided.

Figure 125L:
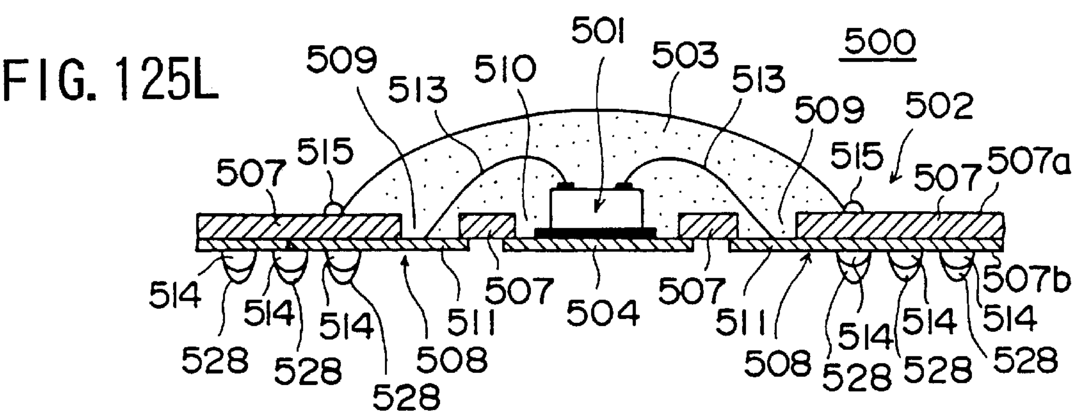

After the resin encapsulating process ends, the conductive metal layer forming process is carried out. FIG. 125L is a diagram for explaining the conductive metal layer forming process. This conductive metal layer forming process fixes a conductive metal layer 528 on the surface of the mechanical bumps 514. The corrosion of the mechanical bumps 514 is prevented by the conductive metal layer 528. In addition, it is possible to improve the electrical connection between the mechanical bumps 514 and the mounting substrate on which the semiconductor device 500 is mounted. For the sake of convenience, a more detailed description related to the conductive metal layer forming process will be given later in the specification.

FIGS. 126A through 126C are diagrams for explaining a modification of the resin encapsulating process.

In this modification of the resin encapsulating process, the encapsulating resin 503 is filled by transfer molding. FIG. 126A shows the semiconductor element mounting substrate 502 used in this modification in a state where the semiconductor element mounting process has ended. As shown in FIG. 126A, no dam member 515 is provided in this modification.

The semiconductor element mounting substrate 502 is loaded into a transfer molding pressing unit 529 shown in FIG. 126B, and a transfer molding process is carried out. The transfer molding pressing unit 529 includes a plate molding upper mold 530, a first plate molding intermediate mold 531, a second plate molding intermediate mold 532, a third plate molding intermediate mold 533, and a plate molding lower mold 534 which are heated to a predetermined temperature by a heater (not shown).

The semiconductor element mounting substrate 502 with respect to which the semiconductor element mounting process has ended is loaded between the second plate molding intermediate mold 532 and the third plate molding intermediate mold 533 and is clamped with a predetermined pressure. A cavity 535 having a predetermined shape and a runner portion 536 are formed in the second plate molding intermediate mold 532. In addition, a plunger pot 537 and a plunger 538 are disposed in the plate molding upper mold 530. Furthermore, recesses 539 for receiving the mechanical bumps 514 are formed in the top surface of the third plate molding intermediate mold 533. By providing the recesses 539 in the third plate molding intermediate mold 533, it is possible to positively load the semiconductor element mounting substrate 502 on the transfer molding pressing unit 529 in a horizontal position without unwanted inclination, even if the semiconductor element mounting substrate 502 has the projecting mechanical bumps 524 on the lower portion thereof. As a result, it is possible to prevent the encapsulating resin from adhering on the mechanical bumps 514.

When the semiconductor element mounting substrate 502 is loaded into the transfer molding pressing unit 529 as described above, a tablet made up of press-molded powder of the encapsulating resin 503 is pre-heated to a semi-melted state by an infrared ray heater or the like. The semi-melted tablet is inserted into the plunger pot 537 of the upper mold 530.

Thereafter, the encapsulating resin 503 in the plunger pot 537 is pressed by the plunger 538, and the encapsulating resin 503 is introduced into the cavity 535 via the runner portion 536. As a result, the semiconductor element 501, the wires 513 and the like are encapsulated by the encapsulating resin 503.

FIG. 126C shows a semiconductor device 601 which is produced by the resin encapsulating process described above. By forming the encapsulating resin 503 by the transfer molding as described above, it is possible to improve the dimension accuracy and reliability of the semiconductor device 601.

FIGS. 127 through 130 are diagrams showing a forty-ninth embodiment of the semiconductor device according to the present invention. FIG. 127 is a plan view, with a part cut away, showing the forty-ninth embodiment of the semiconductor device, and FIG. 128 is a bottom view of the forty-ninth embodiment of the semiconductor device. FIG. 129 is a cross sectional view along a line A—A in FIG. 127, and FIG. 130 is a cross sectional view along a line B—B in FIG. 127. In FIGS. 127 through 130, those parts which are the same as those corresponding parts of the semiconductor device 500 described above are designated by the same reference numerals, and a description thereof will be omitted.

In this embodiment of the semiconductor device, a semiconductor device 602 shown in FIGS. 127 through 130 has a frame body 540 provided at the upper portion of the semiconductor element mounting substrate 502, and the encapsulating resin 503 is filled by transfer molding.

For example, the frame body 540 is made of a metal such as aluminum. The frame body 540 has a resin filling hole 541 which has an approximate L-shaped cross section, as shown in FIG. 129. One end of the resin filling hole 541 opens at the top surface of the frame body 540, and the other end of the resin filling hole 541 opens at the inner peripheral side surface of the frame body 540. The frame body 540 is fixed to the top portion of the semiconductor element mounting substrate 502 by an adhesive agent 542.

Because the frame body 540 is provided on the semiconductor element mounting substrate 502, the frame body 540 and the semiconductor element mounting substrate 502 cooperate to form a space 543 with a closed bottom. The semiconductor element 501, the wires 513 and the like are arranged within this space 543. The encapsulating resin 503 fills this space 543, so as to protect the semiconductor element 501, the wires 513 and the like by the encapsulating resin 503.

In this embodiment of the semiconductor device, wire inserting openings 544 are formed at the outer peripheral portion of the stage 504 as shown in FIGS. 127 and 128. The wire inserting opening 544 is essentially the same as the wire inserting holes 509 provided in the forty-eighth embodiment of the semiconductor device when the wire inserting holes 509 are connected as a single frame-shaped opening. The inner lead portions 511 of the first lead wiring layer 508 are exposed to the side of the surface 507*a* at the wire inserting openings 544, and the wires 513 are connected to the inner lead portions 511 via the wiring inserting openings 544. As will be described later, the encapsulating resin 503 which is filled into the space 543 via the resin filling hole 541 also fills the rear surface side (surface 507*b*) of the base member 507 via the wire inserting openings 544.

Next, a description will be given of a fourteenth embodiment of the method of producing the semiconductor device according to the present invention, by referring to FIGS. 131A through 131E. In this embodiment of the method, it is assumed that the semiconductor device 602 described above is produced. First, a frame body arranging process is carried out when producing the semiconductor device 602. FIG. 131A is a diagram for explaining the frame body arranging process. As shown in FIG. 131A, the frame body 540 which already has the resin filling hole 541 and the like formed therein by another process is fixed on the semiconductor element mounting substrate 502 by the adhesive agent 542 by this frame body arranging process. The semiconductor element mounting substrate 502 used is prepared in advance by the substrate forming process described above in conjunction with FIGS. 125A through 125F. In this embodiment of the method, however, the substrate forming process forms the wire inserting openings 544 described above in place of the wire inserting holes 509 in a stage corresponding to that shown in FIG. 125B.

A semiconductor element mounting process is carried out after the frame body arranging process ends. As shown in FIG. 131B, the semiconductor element 501 is mounted on the top portion of the stage 504 by the die-bonding material 505. When the semiconductor element mounting process ends, a wiring process is carried out as shown in FIG. 131C. In other words, the wires 513 are provided between the electrode pads 506 of the semiconductor element 501 and the inner lead portions 511. The semiconductor element mounting substrate 502 which is obtained after the wiring process ends will hereunder be referred to as a semiconductor device assembly 550.

A resin filling process is carried out after the wiring process ends. FIG. 131D is a diagram for explaining the resin filling process. In FIG. 131D, a transfer molding pressing unit 545 includes a plate molding upper mold 546 and a plate molding lower mold 547 which are heated to a predetermined temperature by a heater (not shown) or the like. Press bases 548 and 549 respectively press against the molds 546 and 547.

The semiconductor device assembly 550 is loaded into the transfer molding pressing unit 545 in an upside-down position. As described above, the resin filling hole 541 having a diameter of approximately 1 mm to 10 mm is formed in the surface of the frame body 540 of the semiconductor device assembly 550. In addition, the lower mold 547 is provided with a plunger pot 551 having approximately the same diameter as the resin filling hole 541, and a plunger 552 disposed in the plunger pot 551. In the state where the semiconductor device assembly 550 is loaded into the transfer mold pressing unit 545, the resin filling hole 541 communicates to the plunger pot 551.

Recesses 539 for receiving the mechanical bumps 514 are formed at a predetermined position of the upper mold 546, so as to prevent unwanted inclination of the semiconductor device assembly 550 in the loaded state. As a result, it is possible to prevent the encapsulating resin 503 from adhering on the mechanical bumps 514.

When the semiconductor device assembly 550 is loaded into the transfer molding pressing unit 545 as described above, a tablet made up of press-molded powder of the encapsulating resin 503 is pre-heated to a semi-melted state by an infrared ray heater or the like. The semi-melted tablet is inserted into the plunger pot 551 of the lower mold 547. Thereafter, the encapsulating resin 503 in the plunger pot 551 is pressed by the plunger 552, and the encapsulating resin 503 is introduced directly into the resin filling hole 541 in the frame body 540.

As a result, the encapsulating resin 503 is introduced within the space 543 inside the frame 540, and the semiconductor element 501, the wires 513 and the like are encapsulated by the encapsulating resin 503. FIG. 131E shows the semiconductor device 602 which is produced using the resin encapsulating process described above.

By using the transfer molding to provide the encapsulating resin 503, it is possible to improve the utilization efficiency of the encapsulating resin 503, and it is possible to cope with semiconductor device assemblies having various sizes by a single transfer molding pressing unit 545 (that is, a single mold). In addition, the construction of the mold can be simplified and the cost of the mold itself can be reduced because the space 543 within the frame body 540 functions as a cavity of the mold.

FIGS. 132A through 132D are diagrams for explaining a modification of the fourteenth embodiment of the method of producing the semiconductor device according to the present invention.

Figure 132A:
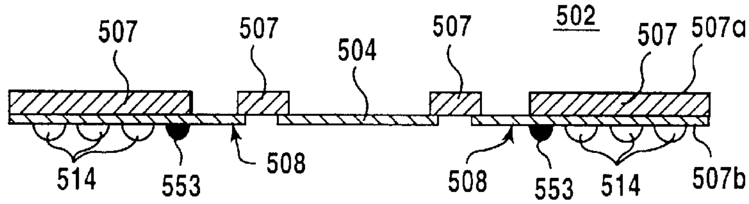

In this modification of the fourteenth embodiment of the method, a dam member 553 is provided on the semiconductor element mounting substrate 502 as shown in FIG. 132A before carrying out the frame body arranging process. The dam member 553 is provided in a frame-shape on the surface 507*b* of the semiconductor element mounting substrate 502. The dam member 553 is located at a position on the inner side of the position where the mechanical bumps 514 are formed.

Figure 132B:
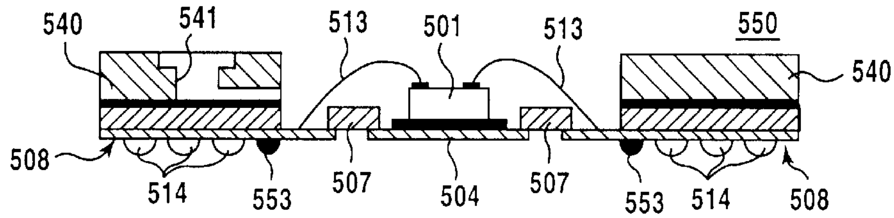

The frame body arranging process, the semiconductor element mounting process and the wiring process are respectively carried out with respect to the semiconductor element mounting substrate 502 which having the dam member 553, as shown in FIG. 132B. As a result, the semiconductor device assembly 550 is obtained.

Next, the semiconductor device assembly 550 is loaded into the transfer molding pressing unit 545, and the resin filling process is carried out.

In the state where the semiconductor device assembly 550 is loaded into the transfer molding pressing unit 545, the dam member 553 of the semiconductor element mounting substrate 502 makes contact with the upper mold 546. As described above, the wire inserting openings 544 are formed in the base member 507, and thus, the encapsulating resin 503 which is filled also flows to the rear surface side of the semiconductor element mounting substrate 502.

However, the dam member 553 is formed on the rear surface side (surface 507*b*) of the semiconductor element mounting substrate 502 at the position on the inner side of the mechanical bumps 514. For this reason, the dam member 553 prevents the encapsulating resin 503 from flowing towards the mechanical bumps 514. Accordingly, it is possible to positively prevent the encapsulating resin 503 from adhering on the mechanical bumps 514. FIG. 132D shows a semiconductor device 603 which is produced by this modification of the method.

FIG. 133 is a cross sectional view showing a fiftieth embodiment of the semiconductor device according to the present invention.

A semiconductor device 604 shown in FIG. 133 is characterized in that a metal cap 554 is provided on top portion of the semiconductor device 602 described above in conjunction with FIGS. 127 through 130. This metal cap 554 is fixed on the frame body 540 by an adhesive agent 555 after the frame body 540 is arranged by the frame body arranging process and before the resin filling process is carried out. A hole 556 is formed in the metal cap 554 at a position corresponding to the position of the resin filling hole 541 in the frame body 540. In the resin filling process, the encapsulating resin 503 is filled into the space 543 via the holes 556 and 541.

Figure 132C:
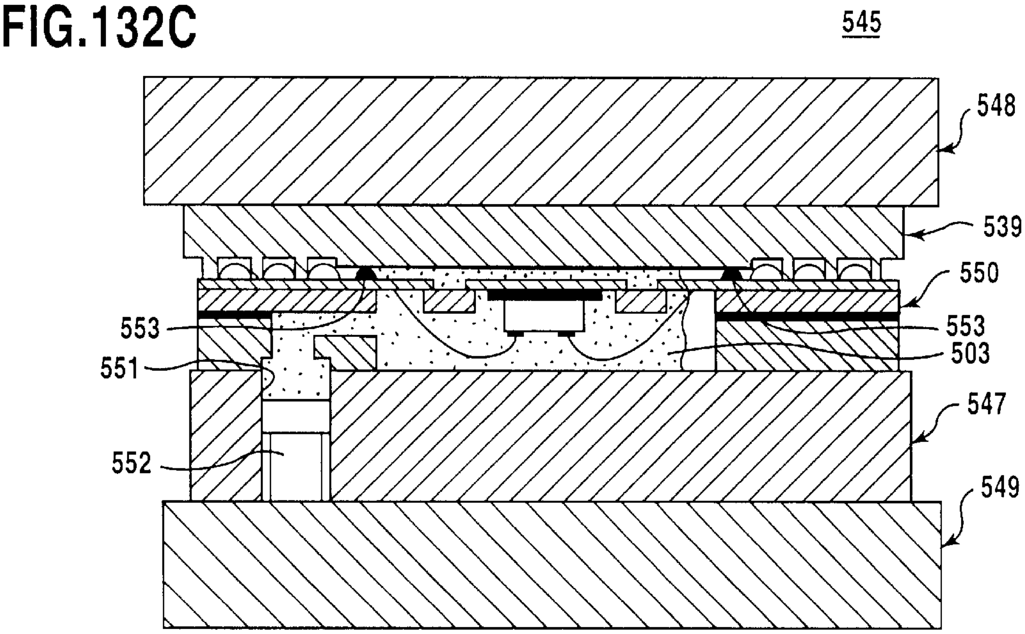
Figure 132D:
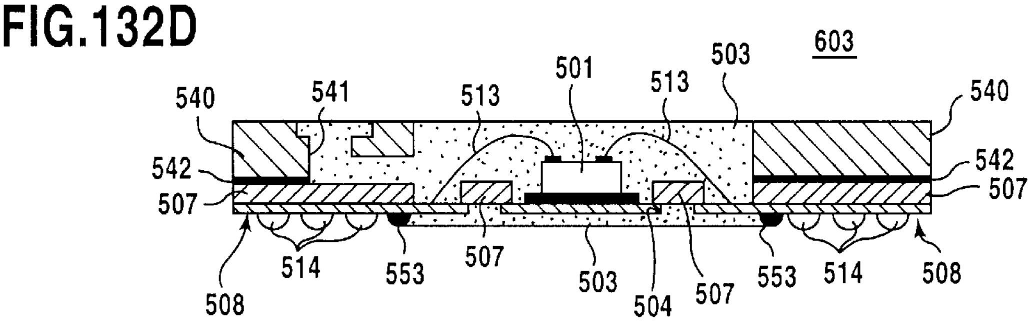

By providing the metal cap 554 on the frame body 540 before carrying out the resin filling process, it is possible to prevent the encapsulating resin 503 from making direct contact with the lower mold 547 in FIGS. 131D and 132C during the resin filling process.

Generally, in the resin filling process, a mold release agent or lubricant is coated on portions of the mold and resin making direct contact, so as to improve the mold release. However, by providing the metal cap 554 as in this embodiment of the semiconductor device, it is possible to prevent direct contact between the encapsulating resin 503 and the lower mold 547, thereby making it possible to reduce the amount of mold release agent or lubricant that is used. In addition, it is also possible to improve the heat radiation characteristic by selecting the material used for the metal cap 554 to a material having a good heat conductivity. The material used for the cap 554 is of course not limited to metals, and ceramics or the like may be used instead. It is also possible to adhere the cap 554 at the same time as the resin encapsulating process, instead of fixing the cap 554 by the adhesive agent 555. In this case, the adhesive agent 555 becomes unnecessary, and the cost of the semiconductor device 604 can be reduced.

FIG. 134 is a cross sectional view showing a fifty-first embodiment of the semiconductor device according to the present invention.

Similarly to the semiconductor device 604 shown in FIG. 133, a semiconductor device 605 has a metal cap 557 provided on the top portion of the frame body 540. In addition, a resin filling hole 558 is provided in the metal cap 557 at a predetermined position confronting the space 543.

By providing the resin filling hole 558 in the metal cap 557 at the predetermined position confronting the space 543, it becomes unnecessary to form the resin filling hole 541 in the frame body 540. The resin filling hole 541 in the frame body 540 must have the L-shape due to the construction of the mold and the location of the space 543, thereby making it troublesome to form the resin filling hole 541. However, in this embodiment of the semiconductor device, no such resin filling hole 541 is required in the frame body 540. The resin filling hole 558 in the plate-shaped metal cap 557 can easily be formed by the simple process of forming a hole. As a result, the semiconductor device 605 can be produced with ease. Moreover, since the resin filling hole 558 does not have a bent or curved shape, it is possible to improve the flow of the encapsulating resin 503 that is filled.

Next, a description will be given of various embodiments of the conductive metal layer forming process, by referring to FIGS. 135A through 140D. The conductive metal layer forming process forms the conductive metal layer on the surface of the mechanical bumps 514.

FIGS. 135A through 135F are diagrams for explaining a first embodiment of the conductive metal layer forming process.

In this embodiment of the conductive metal layer forming process, the conductive metal layer 528 is formed on the surface of the mechanical bumps 514 by plating. In this embodiment, a part of the conductive metal layer forming process overlaps the substrate forming process, and the conductive metal layer forming process is carried out after carrying out the substrate forming process described above in conjunction with FIGS. 125A through 125D. Hence, a description will be given with respect to the processes carried out after the process shown in FIG. 125D ends, by referring to FIGS. 135A through 135F.

Figure 135A:
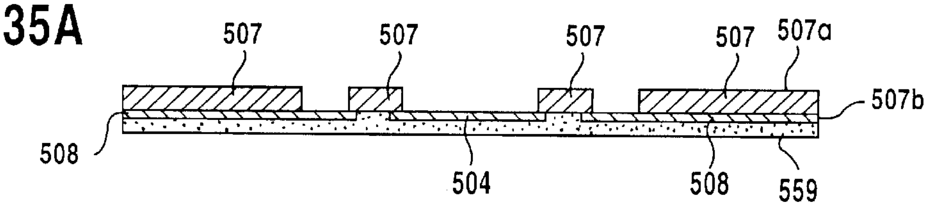

The first lead wiring layer 508 is formed on the surface 507*b* of the base member by carrying out the processes up to that shown in FIG. 125D. Then, as shown in FIG. 135A, a plating resist 559 is coated on the entire surface 507*b* of the base member 507 including the portions formed with the first lead wiring layer 508.

Figure 135B:
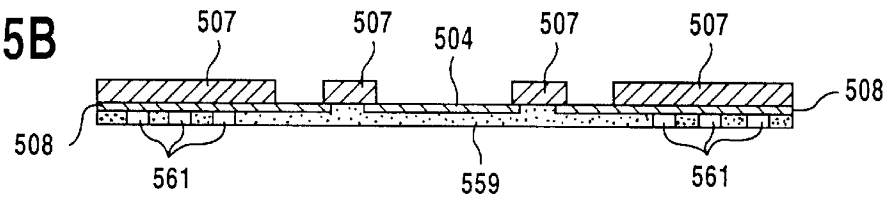

After the plating resist 559 is coated on the surface 507*b* of the base member 507, the plating resist 559 at predetermined positions where the mechanical bumps 514 are to be formed is removed as shown in FIG. 135B. The removed portions are indicated by a reference numeral 561.

Figure 135C:
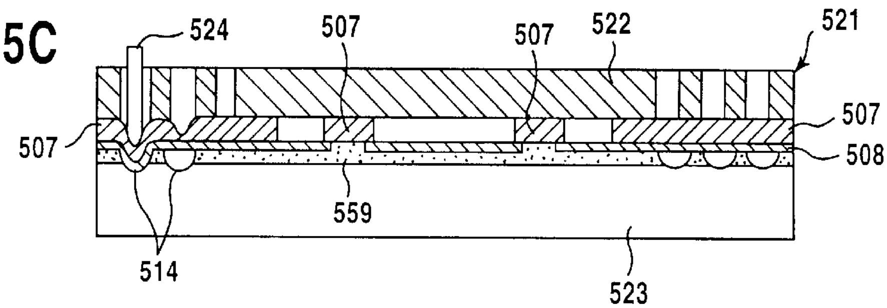

After the plating resist 559 is removed from the predetermined positions where the mechanical bumps 514 are to be formed, the mechanical bumps 514 are formed as shown in FIG. 135C. The mechanical bumps 514 are formed using the mechanical bump forming mold 521, similarly as in the case described above in conjunction with FIG. 125E. A description on the particular method used to form the mechanical bumps 514 will be omitted because the method described above may be employed.

Figure 135D:
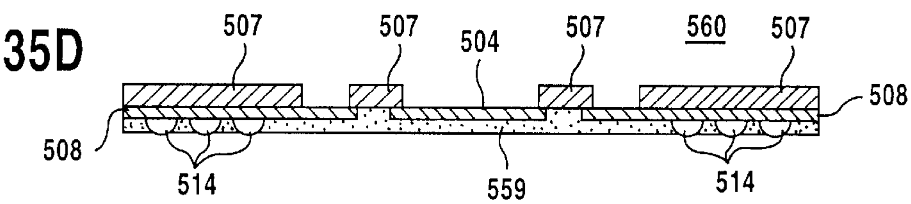

FIG. 135D shows a semiconductor element mounting substrate 560 having the mechanical bumps 514. In this state, the plating resist 559 covers the surface 507*b* of the base member 507 excluding the positions where the mechanical bumps 514 are formed. In other words, only the mechanical bumps 514 are exposed from the plating resist 559.

Figure 135E:
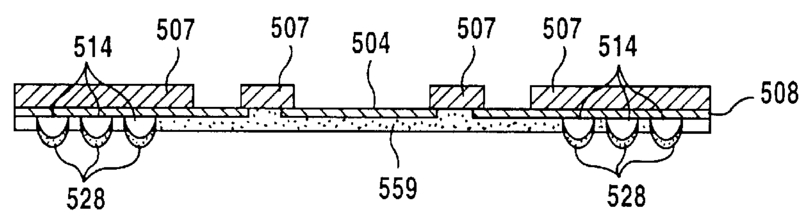
Figure 135F:
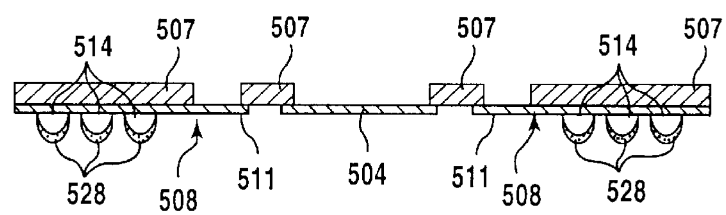

Next, a plating process is carried out with respect to the semiconductor element mounting substrate 560 having the mechanical bumps 514. This plating process is carried out by electroplating, for example. As described above, only the mechanical bumps 514 are exposed from the plating resist 559 on the rear surface side of the semiconductor element mounting substrate 560. For this reason, it is possible to form the conductive metal layer 528 on only the surface of the mechanical bumps 514 when the rear surface side of the semiconductor element mounting substrate 560 is submerged into a plating solution. FIG. 135E shows a state where the conductive metal layer 528 is formed only on the surface of the mechanical bumps 514 by the plating process.

A removal process is carried out to remove the plating resist 559 after the conductive metal layer 528 is formed on the surface of the mechanical bumps 514. As a result, the semiconductor element mounting substrate 560 shown in FIG. 135F having the conductive metal layer 528 formed on the surface of the mechanical bumps 514 is obtained.

In this first embodiment of the conductive metal layer forming process, the conductive metal layer 528 can be formed on the surface of the mechanical bumps 514 using the general plating technique. For this reason, the conductive metal layer 528 can be formed at a low cost. Further, it is possible to simplify the process of producing the semiconductor device because the conductive metal layer forming process and the substrate forming process can be carried out simultaneously, that is, as one operation.

FIGS. 136A through 138 are diagrams for explaining a second embodiment of the conductive metal layer forming process.

Figure 136A:
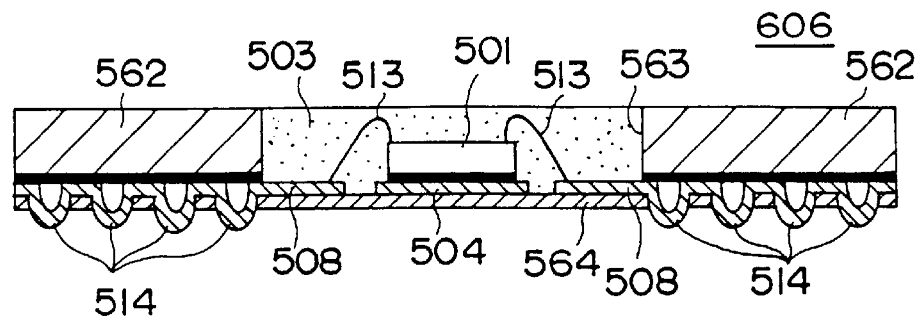

FIG. 136A shows a semiconductor device 606 which is used for this embodiment of the conductive metal layer forming process. The semiconductor device 606 shown in FIG. 136A has a thick base member 562 which is thicker than the base member 507 and also functions as the cavity, similarly to the frame body 540. The encapsulating resin 503 fills a space 563 formed inside the thick base member 562. An insulator layer 564 is formed on the lower portion of the first lead wiring layer 508 that is formed with the mechanical bumps 514. Holes are formed in the insulator layer 564 at positions where the mechanical bumps 514 are formed, so that the mechanical bumps 514 are exposed to the outside and project from the insulator layer 564 via the holes.

Figure 136B:
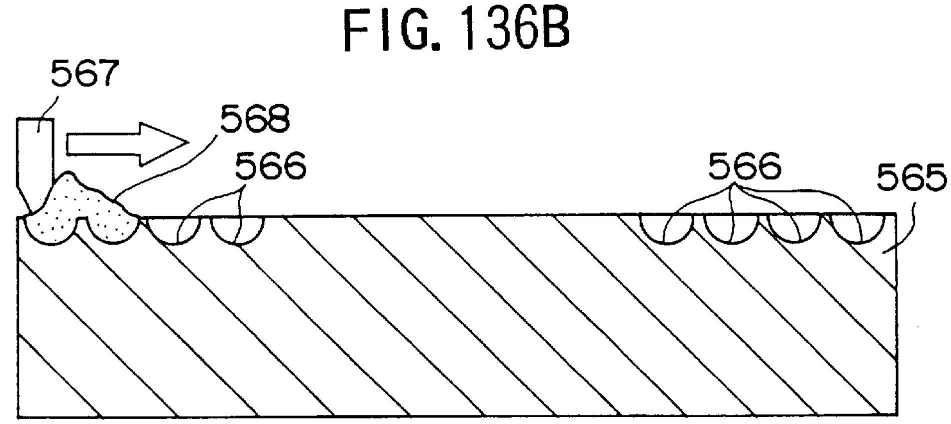

A metal layer forming jig 565 shown in FIG. 136B is used to form the conductive metal layer 528 on the mechanical bumps 514 of the semiconductor device 606. Hemispherical recesses 566 are formed on the metal layer forming jig 565 at positions corresponding to the mechanical bumps 514.

As shown in FIG. 136B, a squeegee 567 is used to fill a paste 568 in the recesses 566 of the metal layer forming jig 565. The operation of filling the paste 568 into the recesses 566 can be carried out with ease by placing the paste 568 on the metal layer forming jig 565 and moving the squeegee 567 in the direction of an arrow in FIG. 136B. The amount of the paste 568 to be filled into each recess 566 is determined by the volume of each recess 566, and thus, the amount of the paste 568 filled in each of the recesses 566 can be made uniform by making the volume of each of the recesses 566 uniform in advance. In this embodiment of the conductive metal layer forming process, solder paste is used as the paste 568.

Figure 136C:
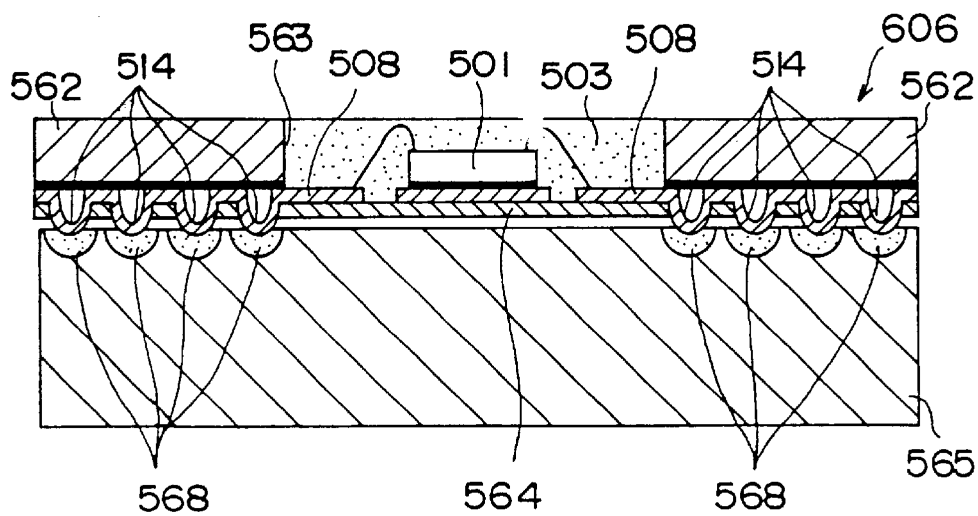
Figure 136D:
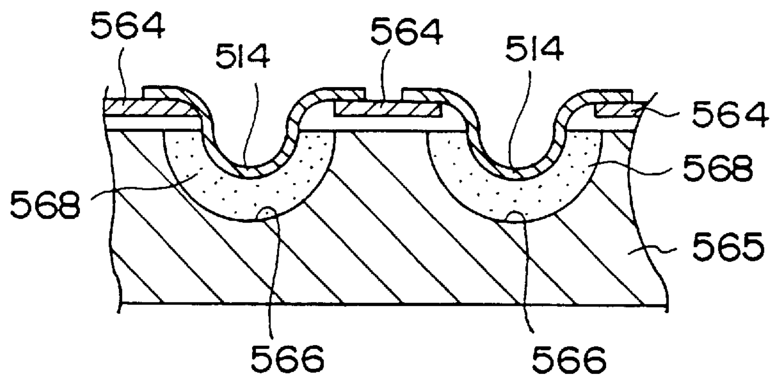

After the solder paste 568 fills each of the recesses 566, the semiconductor device 606 is loaded on top of the metal layer forming jig 565 as shown in FIG. 136C. Since the positions of the recesses 566 correspond to the positions of the mechanical bumps 514, the mechanical bumps 514 enter within the corresponding recesses 566 when the semiconductor device 606 is loaded onto the metal layer forming jig 565. FIG. 136D is a cross sectional view on an enlarged scale showing the state where the mechanical bumps 514 have entered the corresponding recesses 566 of the metal layer forming jig 565.

Figure 136E:
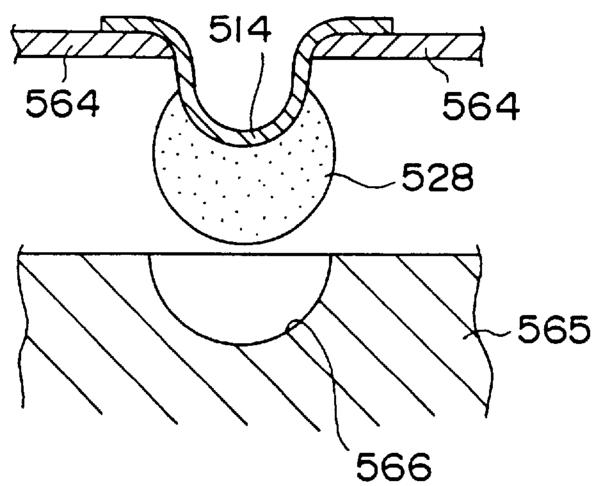
Figure 136F:
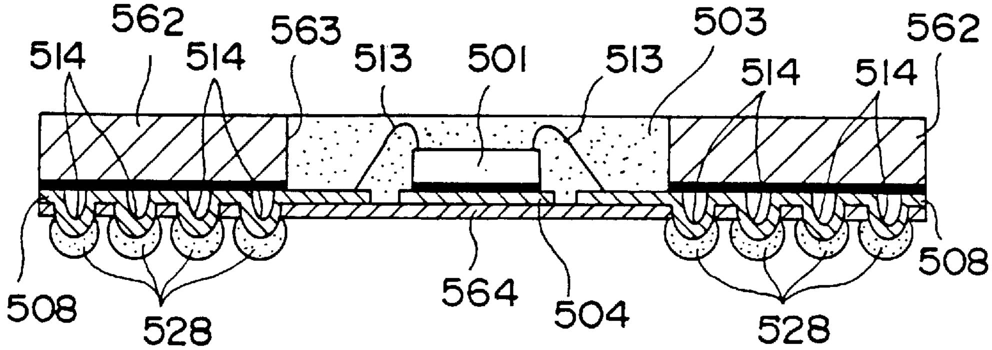

Next, a heating process is carried out using a heater (not shown) provided within the metal layer forming jig 565. As a result, the solder paste 568 within the recesses 566 melt and adhere on the mechanical bumps 514. Thereafter, the semiconductor device 606 is removed from the metal layer forming jig 565. In this case, the material used for the mechanical bumps 514 has a good bonding characteristic with the solder paste 568 as compared to the material used for the metal layer forming jig 565. For this reason, the solder paste 568 within the recesses 566 is separated from the metal layer forming jig 565 in a state where the solder paste 568 is adhered on the surface of the mechanical bumps 514 as shown in FIG. 136E when the semiconductor device 606 is removed from the metal layer forming jig 565. Therefore, it is possible to form the conductive metal layer 528 made of solder (paste) on the surface of the mechanical bumps 514 as shown in FIG. 136F by carrying out the conductive metal layer forming process described above.

According to this embodiment of the conductive metal layer forming process, the amount of the conductive metal layer 528 formed on each of the mechanical bumps 514 can be adjusted to become uniform by adjusting the volume of each of the recesses 566 in the metal layer forming jig 565. For this reason, it is possible to suppress inconsistencies in the amount of the conductive metal layer 528 formed on the mechanical bumps 514. In addition< the process of producing the semiconductor device 606 can be simplified because the conductive metal layer 528 can be formed on the mechanical bumps 514 by a simple process.

In this embodiment of the conductive metal layer forming process, the paste 568 is filled into the recesses 566 using the squeegee 567. However, it is possible to drop melted solder 570 into the recesses 566 from a nozzle 569 as shown in FIG. 137.

Further, it is possible to employ a method shown in FIG. 138. In FIG. 138, a predetermined amount of a solder rod 571 is cut by a pair of rotating cutters 572*a* and 572*b*. Then, a cut solder 571*a* is melted into melted solder 571*b* by a melting apparatus 573. The melted solder 571*b* is dropped into the recesses 566 of the metal layer forming jig 565.

In addition, although this embodiment of the conductive metal layer forming process forms the conductive metal layer 528 with respect to the semiconductor device 606 having the construction shown in FIG. 136A, it is of course possible to carry out the conductive metal layer forming process similarly with respect to semiconductor devices having other constructions.

FIGS. 139A through 139F are diagrams for explaining a third embodiment of the conductive metal layer forming process.

In this embodiment of the conductive metal layer forming process, the conductive metal layer 528 is formed on the surface of the mechanical bumps 514 by screen printing. It is assumed in this embodiment that the conductive metal layer 528 is formed with respect to the semiconductor device 606 shown in FIG. 139A.

Figure 139A:
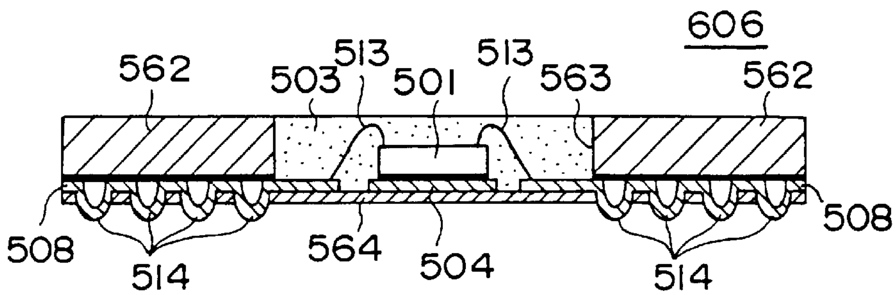
Figure 139B:
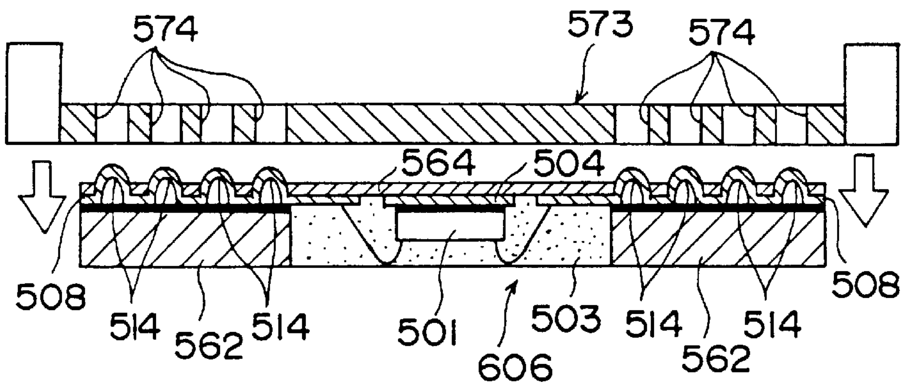

A screen 573 shown in FIG. 139B is prepared when forming the conductive metal layer 528 on the mechanical bumps 514. This screen 573 has a plurality of penetrating holes 574. The positions of the penetrating holes 574 in the screen 573 correspond to the positions where the mechanical bumps 514 are formed. The diameter of the penetrating holes 574 and the thickness of the screen 573 are appropriately selected depending on the amount of the conductive metal layer 528 that is to be formed on the mechanical bumps 514.

Figure 139C:
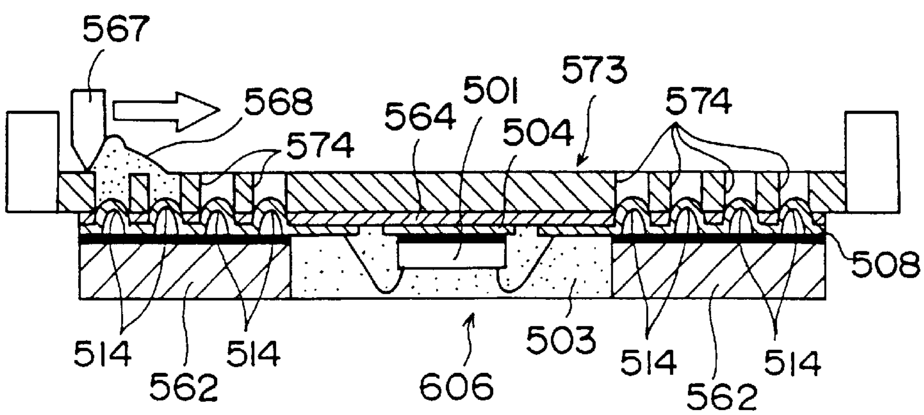

As shown in FIG. 139C, the screen 573 is arranged on the semiconductor device 606 which is disposed in an upside-down position. In this state, each mechanical bump 514 enters within the corresponding penetrating hole 574 in the screen 573. Then, the paste 568 is placed on top of the screen 573, and the paste 568 is filled into the penetrating holes 574 using the squeegee 567. The paste 568 is made of solder, for example.

Figure 139D:
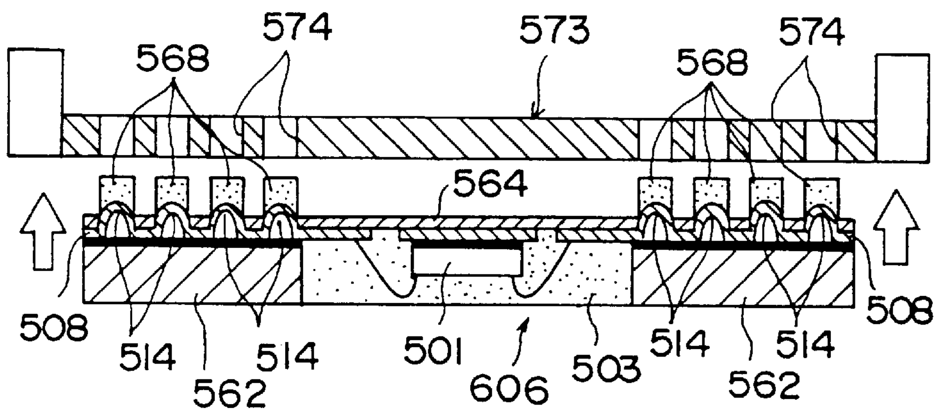

When the solder paste 568 is filled into all of the penetrating holes 574 of the screen 573, the screen 573 is removed from the semiconductor device 606 as shown in FIG. 139D. In this state, the solder paste 568 filled into the penetrating holes 574 rests on the mechanical bumps 514.

Figure 139E:
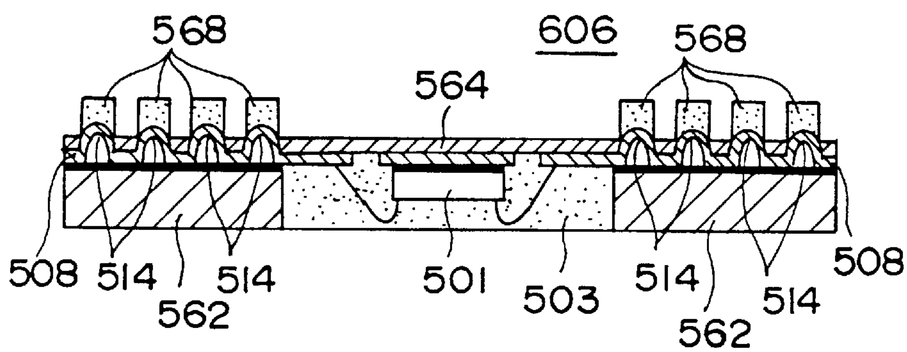
Figure 139F:
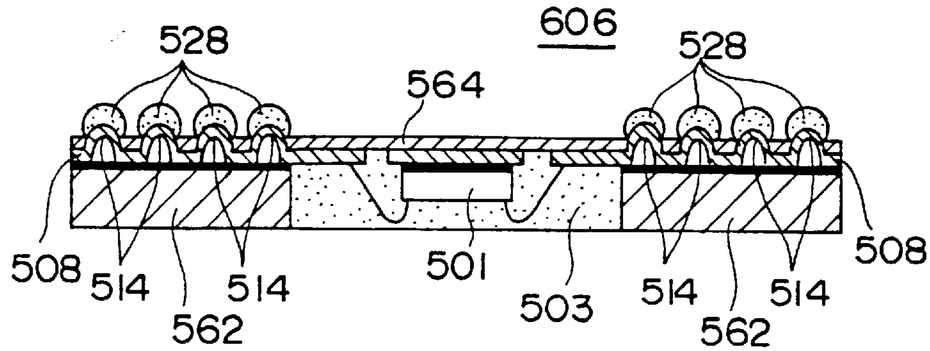

Next, as shown in FIG. 139E, a heating process is carried out with respect to the semiconductor device 606 having the solder paste 568 provided on the mechanical bumps 514. Hence, the solder paste 568 melts, and the conductive metal layer 528 made of the melted solder paste is formed on the mechanical bumps 514 as shown in FIG. 139F.

According to this embodiment of the conductive metal layer forming process, it is possible to form the conductive metal layer 528 on the mechanical bumps 524 using the popular screen printing technique. For this reason the conductive metal layer 528 can be formed on each of the plurality of mechanical bumps 514 in one operation, and it is possible to reduce the cost involved in the process of forming the conductive metal layer 528.

FIGS. 140A through 140D are diagrams for explaining a fourth embodiment of the conductive metal layer forming process.

In this embodiment of the conductive metal layer forming process, solder is used for the conductive metal layer 528, and the conductive metal layer 528 is formed on the mechanical bumps 524 by dip soldering. It is assumed in this embodiment that the conductive metal layer 528 is formed with respect to the semiconductor device 606 shown in FIG. 140A.

Figure 140A:
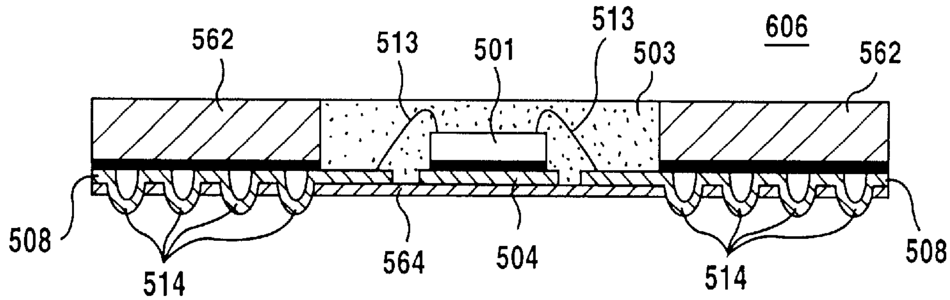
Figure 140B:
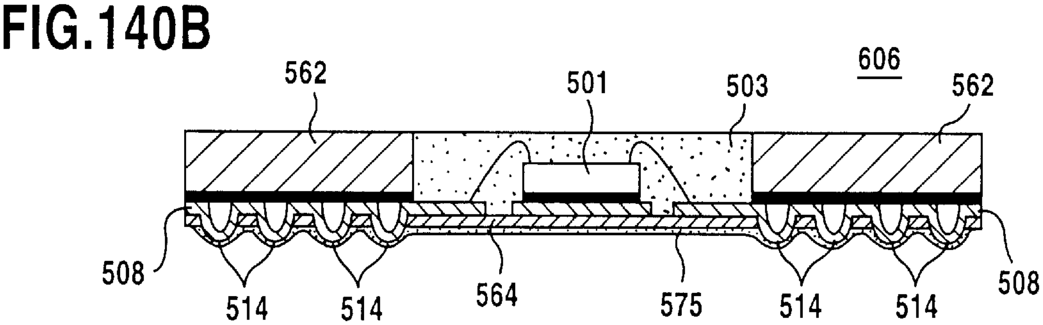

First, when forming the conductive metal layer 528 on the mechanical bumps 514, a flux material 575 is coated on the entire surface of the semiconductor device 606 on which the mechanical bumps 514 are formed, as shown in FIG. 140B.

Figure 140C:
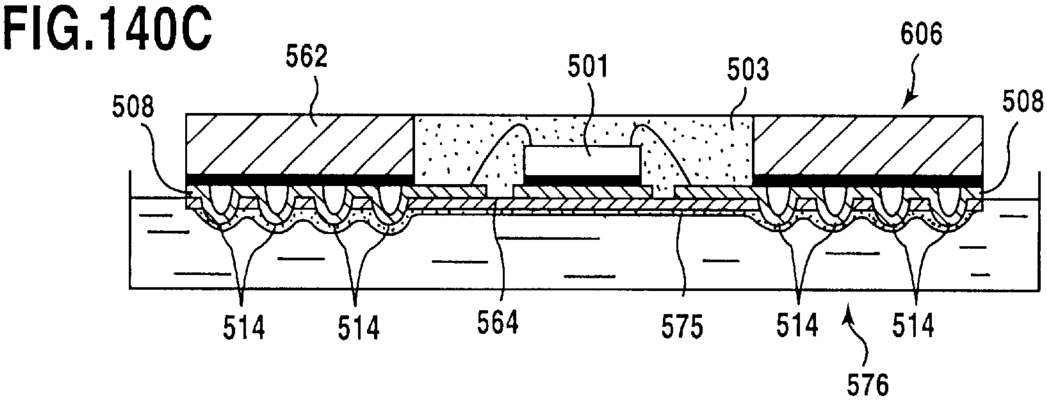
Figure 140D:
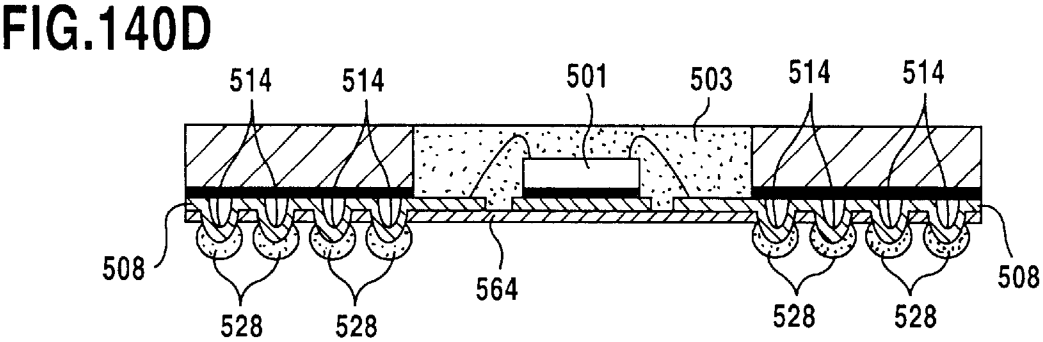

Then, the semiconductor device 606 coated with the flux material 575 is submerged into a solder tub 576 as shown in FIG. 140C. The solder tub 576 is filled with melted solder, and the solder adheres on the flux material 575 when the semiconductor device 606 is submerged into the solder tub 576. However, the surface of the semiconductor device 606 is covered by the insulator layer 564 except for the portions where the mechanical bumps 514 are formed, and thus, even if the flux material 575 is coated on the insulator layer 564 the solder will not adhere at portions other than the portions where the mechanical bumps 514 are formed. For this reason, the solder adheres only on the mechanical bumps 514, and the conductive metal layer 528 made of the solder layer is formed on the surface of the mechanical bumps 514 as shown in FIG. 140D.

According to this embodiment of the conductive metal layer forming process, the conductive metal layer 528 is formed on the mechanical bumps 514 by the dip soldering which involves only a simple process and can realize a high production efficiency. Therefore, the conductive metal layer 528 can be formed at a low cost and with a high production efficiency.

Next, a description will be given of the various materials that may be used as the adhesive agent or resin to bond the various layers of the semiconductor device and the semiconductor device unit described above.

For the sake of convenience, the adhesive agent used in the embodiment of the semiconductor device shown in FIG. 2 will be described. In FIG. 2, the insulator layer 9 bonds the base substrate 2 and the wiring layer 15, and also bonds the frame body 5 and the substrate 2 (or the wiring layer 15). The insulator layer 9 is made of an insulating adhesive agent which includes a binder resin, a solvent, and a filler. The binder resin may be a thermosetting resin or a thermoplastic resin. For example, the resin adhesive agent may be precoated on the substrate 2 or the wiring layer 15 as the insulator layer 9 and dried in advance, so as to evaporate the solvent within the resin adhesive agent. In this case, a thermal process is carried out thereafter to bond the substrate 2 and the wiring layer 15 together.

(1) Epoxy resins and maleimide system resins may be used as the thermosetting resin forming the binder resin. On the other hand, phenoxyne resins, butyrale resins and hydrogenation styrene-ethylene-butylene-styrene copolymer may be used as the thermoplastic resin forming the binder resin. In addition, the filler may be selected from alumina, aluminum nitride, boron nitride, silicon carbide and silicon oxide. The filler may include silver or copper powder as an additive if electrical conductivity is required of the resin adhesive agent.

In one embodiment, the undulations of the precoated and dried resin adhesive agent have a depth or height in a range of 3 $\mu$m to 15 $\mu$m along a direction perpendicular to the surface when the thickness of dried resin adhesive agent is 30 $\mu$m to 100 $\mu$m.

In another embodiment, the filler added to the resin adhesive agent has a filler number average particle diameter D50 of 5 $\mu$m to 30 $\mu$m, 20% particle diameter D20 value of [(D50 value)−(D50 value)·0.3] or greater, and 80% particle diameter D80 value of [(D50 value)+(D50 value)·0.3] or less.

In a further embodiment, the filler added to the resin adhesive agent is made up solely of primary particles of aluminum nitride or alumina powder.

(2) On the other hand, when using the thermoplastic resin as the binder resin, it is possible to use a reactive thermoplastic resin as a main component and a reactive silicone as a flexible agent. For example, 5 to 100 weight percent of reactive silicone is added to 100 weight percent of reactive thermoplastic resin. The reactive functional group of the reactive thermoplastic resin may include carboxyl group or maleic anhydride compound may be used, and silicone including epoxy group may be used as the reactive silicone. The epoxy equivalent of the reactive silicone may be 400 to 10000.

Examples of the reactive thermoplastic resins are hydrogenation styrene-butadiene-styrene copolymer, hydrogenation styrene-ethylene-butylene-styrene copolymer, maleic compound of hydrogenation styrene-butadiene-styrene copolymer, maleic compound of hydrogenation styrene-ethylene-butadiene-styrene copolymer, graft polyethylene maleic anhydride, converted polyethylene carboxylic acid, graft polypropylene maleic anhydride, and graft ethylene propylene rubber maleic anhydride. The heat resistivity and anti-solvency of the resin adhesive agent are improved by adding the reactive silicone to the reactive thermoplastic resin. The addition of the reactive silicone also improves the hydrophobic nature of the resin adhesive agent.

On the other hand, examples of the reactive silicones added to the reactive thermoplastic resins are silicone having amino group, alcohol converted silicone, carboxyl converted silicone, and silicone having epoxy group. In other words, it is preferable to add to the reactive thermoplastic resin a reactive silicone that can react to maleic anhydride compounds or carboxyl groups. A good adhesive characteristic is obtained of the resin adhesive agent when the reactive silicone having epoxy group is added to the reactive thermoplastic resin.

Of course, epoxy compounds may be included in the resin adhesive agent. Examples of the epoxy compounds are bisphenol A-type epoxy resin, bisphenol F-type epoxy resin, bisphenol S-type epoxy resin, novolac type epoxy resin, biphenyl type epoxy resin, naphthalene type epoxy resin, biphenol type epoxy resin, and alicyclic epoxy resin. In other words, epoxy compounds having two or more epoxy groups in one molecule may be used.

It is also possible to add an epoxy compound as a supplemental hardener. Examples of the supplemental harder are phenol system hardeners such as phenol novolac and cresol novolac, amine system hardeners such as diamines, and anhydrides.

Furthermore, it is possible to add an inorganic filler material to the resin adhesive agent. Examples of the inorganic filler material are alumina, silica, graphite, aluminum nitride, boron nitride, diamond powder, carbon silicide, silicon oxide, powders of insulators such as magnesium oxide, and powders of conductors such as silver, gold, copper and aluminum.

When diluting the resin adhesive agent by the solvent for the precoating described above, the viscosity of the resin adhesive agent is adjusted. Examples of the solvent used for the dilution are toluene, xylene, turpentine oil, and tetralin which can dissolve the reactive thermoplastic resin and the other additives.

Of course, it is also possible to add to the resin adhesive agent a catalyst such as triphenylphosphine, imidazole and imidazole compounds.

Furthermore, it is of course possible to use the various resin adhesive agents for the purpose of bonding various parts of each of the embodiments of the semiconductor device and semiconductor device unit described above.

Further, the present invention is not limited to these embodiments, but various variations and modifications may be made without departing from the scope of the present invention.

What is claimed is:

1. A semiconductor device comprising:

a semiconductor element having side surfaces;

a holding substrate holding the side surfaces of said semiconductor element;

a frame body provided on said holding substrate so as to surround said semiconductor element, said frame body having a hole which communicates to a space formed between said holding substrate and said frame body, said frame body and said holding substrate forming a housing;

a plurality of leads having inner lead portions connected to said semiconductor element and outer lead portions extending outside said frame body; and a resin filling said space and encapsulating said semiconductor element and the inner lead portions, all of said outer lead portions extending outside said housing from at least one side of said housing.

2. The semiconductor device as claimed in claim 1, wherein said holding substrate has an external shape greater than an external shape of said frame body.

3. A semiconductor device unit comprising:

a plurality of semiconductor devices; and means for connecting said semiconductor devices in a stacked arrangement having a common surface, each of said semiconductor devices comprising:

a semiconductor element having side surfaces;

a holding substrate holding the side surfaces of said semiconductor element;

a frame body provided on said holding substrate so as to surround said semiconductor element, said frame body having a hole which communicates to a space formed between said holding substrate and said frame body, said frame body and said holding substrate forming a housing;

a plurality of leads having inner lead portions connected to said semiconductor element and outer lead portions extending outside said frame body; and a resin filling said space and encapsulating said semiconductor element and the inner lead portions, all of said outer lead portions extending outside said housing from at least one side of said housing, all of the outer lead portions of each of said semiconductor devices extending from said common surface.

4. A semiconductor device comprising:

a semiconductor element;

a flexible wiring substrate wrapped around said semiconductor element, said flexible wiring substrate including a flexible base member, electrode portions formed on said base member and electrically connected to said semiconductor element, external connecting terminal portions formed on said base member and electrically connectable to an outside member, and wiring portions formed on said base member and electrically connecting said electrode portions and said external connecting terminal portions; and a resin encapsulating at least said semiconductor element, said external connecting terminal portions being intensively provided on one of outer peripheral surfaces of said semiconductor element.

5. A semiconductor device comprising:

a semiconductor element;

a flexible wiring substrate wrapped around said semiconductor element, said flexible wiring substrate including a flexible base member, electrode portions formed on said base member and electrically connected to said semiconductor element, external connecting terminal portions formed on said base member and electrically connectable to an outside member, and wiring portions formed on said base member and electrically connecting said electrode portions and said external connecting terminal portions; and a resin encapsulating at least said semiconductor element, said external connecting terminal portions comprising mechanical bumps.

6. A semiconductor device comprising:

a semiconductor element;

a semiconductor element mounting substrate having a first surface mounted with said semiconductor element, a second surface opposite to the first surface, a base member made of an insulator material, and a single-level first lead wiring layer formed on the second surface;

wires electrically connecting said semiconductor element and said first lead wiring layer;

a resin encapsulating said semiconductor element; and mechanical bumps formed on said first lead wiring layer as external connecting terminals and electrically connectable to an outside member.

7. The semiconductor device as claimed in claim 6, wherein:

said first lead wiring layer includes inner lead portions electrically connected to said semiconductor element via said wires, and outer lead portions having said mechanical bumps provided thereon, said base member includes wire inserting holes located at positions where said wires and said inner lead portions are electrically connected, said wires penetrating said wiring inserting holes and connecting to said inner lead portions via said wiring inserting holes.

8. The semiconductor device as claimed in claim 6, which further comprises:

a second lead wiring layer formed on the second surface of said base member, said second lead wiring layer being electrically connected to said first lead wiring layer and including inner lead portions connected to said wires.

9. The semiconductor device as claimed in claim 8, wherein:

said second lead wiring layer includes outer lead portions provided with mechanical bumps, said base member includes penetrating holes located at positions where said mechanical bumps are formed, and said mechanical bumps penetrate said penetrating holes and electrically connect to the outer lead portions of said first lead wiring layer.

10. The semiconductor device as claimed in claim 6, which further comprises:

a frame body provided on said semiconductor element mounting substrate and surrounding said semiconductor element with a gap formed therebetween, said frame body having a hole which communicates to a space formed between said frame body and said semiconductor element mounting substrate, said resin filling said space, so that said semiconductor element is encapsulated by said resin.

11. The semiconductor device as claimed in claim 6, which further comprises:

a conductive metal layer formed on said mechanical bumps.

* * * * *

UNITED STATES PATENT AND TRADEMARK OFFICE

CERTIFICATE OF CORRECTION

PATENT NO. : 6,379,997 B1
DATED : April 30, 2002
INVENTOR(S) : Toshimi Kawahara et al.

It is certified that error appears in the above-identified patent and that said Letters Patent is hereby corrected as shown below:

Title page,
Item [75], please amend the spelling of the fifth inventor's name as follows:

Change "Hiroyuki Ishiquro" to -- Hiroyuki Ishiguro --.

Signed and Sealed this

First Day of October, 2002

*Attest:*

JAMES E. ROGAN

*Attesting Officer* *Director of the United States Patent and Trademark Office*